United States Patent
Wang et al.

(10) Patent No.: US 9,209,115 B2
(45) Date of Patent: Dec. 8, 2015

(54) QUAD FLAT NO-LEAD (QFN) PACKAGING STRUCTURE AND METHOD FOR MANUFACTURING THE SAME

(71) Applicant: Jiangsu Changjiang Electronics Technology Co., Ltd., Wuxi (CN)

(72) Inventors: Xinchao Wang, Wuxi (CN); Zhizhong Liang, Wuxi (CN)

(73) Assignee: Jiangsu Changjiang Electronics Technology Co., Ltd., Wuxi (CN)

( * ) Notice: Subject to any disclaimer, the term of this patent is extended or adjusted under 35 U.S.C. 154(b) by 0 days.

(21) Appl. No.: 14/260,303

(22) Filed: Apr. 24, 2014

(65) Prior Publication Data
US 2014/0319664 A1  Oct. 30, 2014

Related U.S. Application Data

(63) Continuation-in-part of application No. PCT/CN2012/000018, filed on Jan. 6, 2012.

(30) Foreign Application Priority Data

Nov. 22, 2011  (CN) .......................... 2011 1 0374237

(51) Int. Cl.
| | |
|---|---|
| *H01L 21/00* | (2006.01) |
| *H01L 23/495* | (2006.01) |
| *H01L 21/48* | (2006.01) |
| *H01L 21/56* | (2006.01) |
| *H01L 23/60* | (2006.01) |
| *H01L 23/00* | (2006.01) |
| *H01L 23/31* | (2006.01) |

(52) U.S. Cl.
CPC ...... *H01L 23/49513* (2013.01); *H01L 21/4832* (2013.01); *H01L 21/561* (2013.01); *H01L 21/565* (2013.01); *H01L 23/3121* (2013.01); *H01L 23/3128* (2013.01); *H01L 23/49541* (2013.01); *H01L 23/49548* (2013.01); *H01L 23/49575* (2013.01); *H01L 23/49582* (2013.01); *H01L 23/60* (2013.01); *H01L 24/97* (2013.01); *H01L 21/568* (2013.01); *H01L 2224/32245* (2013.01); *H01L 2224/48091* (2013.01); *H01L 2224/48137* (2013.01); *H01L 2224/48245* (2013.01); *H01L 2224/48247* (2013.01); *H01L 2224/73265* (2013.01); *H01L 2224/92247* (2013.01); *H01L 2224/97* (2013.01); *H01L 2924/01322* (2013.01); *H01L 2924/07802* (2013.01); *H01L 2924/19105* (2013.01); *H01L 2924/30107* (2013.01)

(58) Field of Classification Search
USPC ..... 438/111, 112, 123, FOR. 366, FOR. 367, 438/FOR. 377, FOR. 380; 257/E23.031, 257/E23.043, E23.053, E23.054
See application file for complete search history.

(56) References Cited

U.S. PATENT DOCUMENTS

2007/0141756 A1*  6/2007  Iitani et al. .................... 438/123
2010/0258921 A1*  10/2010  Chien et al. ................... 257/676

*Primary Examiner* — Jasmine Clark
(74) *Attorney, Agent, or Firm* — Matthias Scholl, PC; Matthias Scholl

(57) ABSTRACT

A quad flat no-lead (QFN) packaging structure. The QFN packaging structure includes a metal substrate, a first outer die pad formed on the metal substrate, and a first die coupled to a top surface of the first outer die pad. The QFN packaging structure also includes a plurality of I/O pads formed on the metal substrate, and a first metal layer containing a plurality of inner leads corresponding to the plurality of I/O pads and extending to proximity of the die. The first metal layer is formed on the metal substrate by a multi-layer electrical plating process such that a lead pitch of the plurality of inner leads is significantly reduced. Further, the QFN packaging structure includes metal wires connecting die and the plurality of inner leads, and a second metal layer formed on a back surface of the plurality of I/O pads and the die pad.

13 Claims, 80 Drawing Sheets

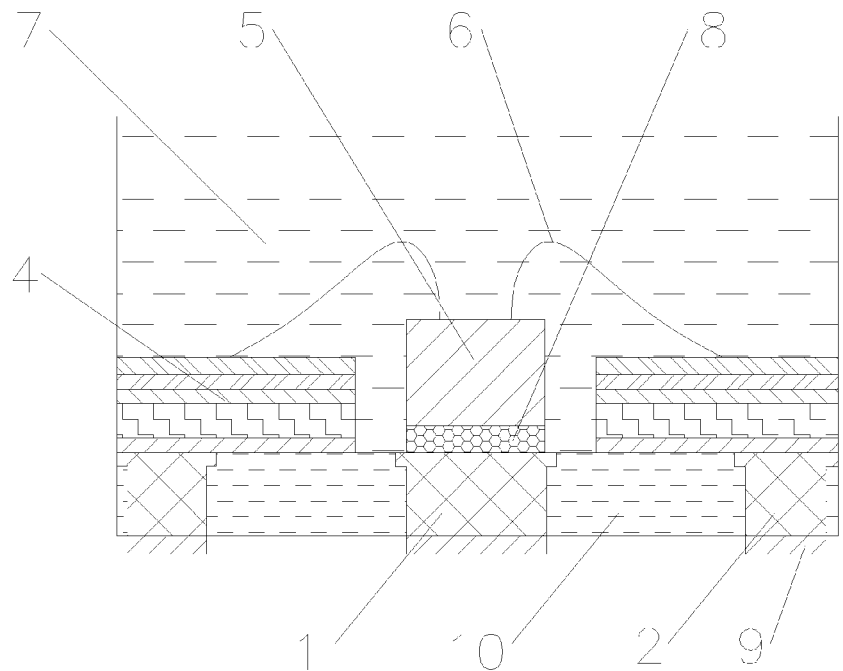
FIG. 16
FIG. 17
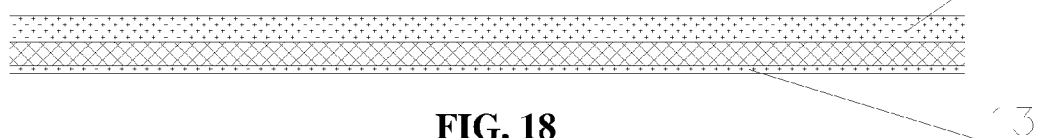
FIG. 18
FIG. 19
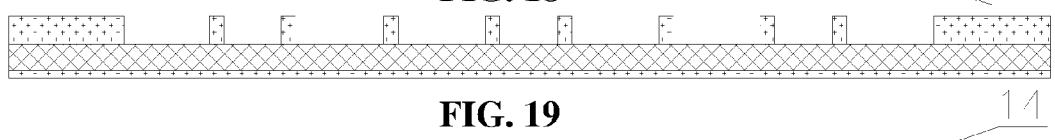
FIG. 20
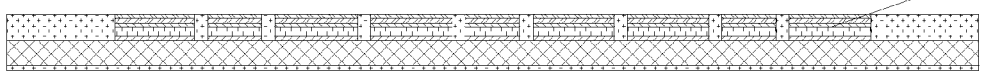
FIG. 21

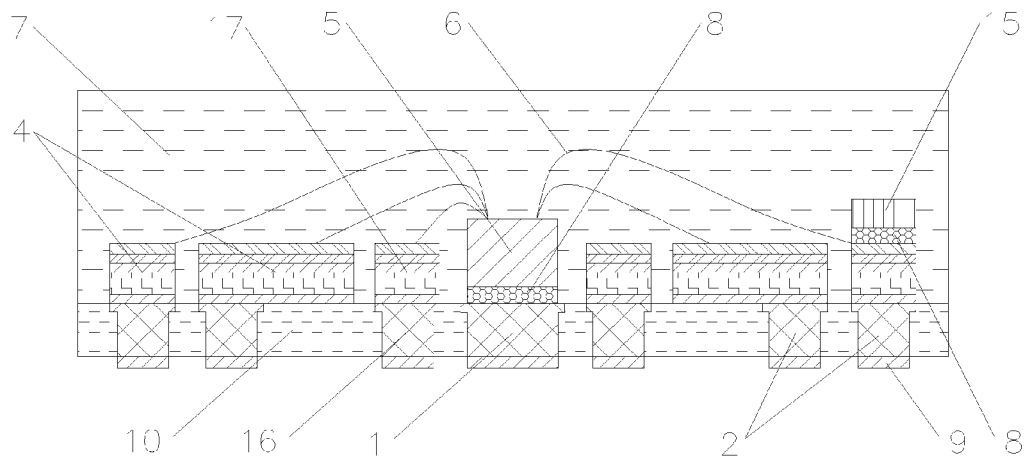
FIG. 247
FIG. 248
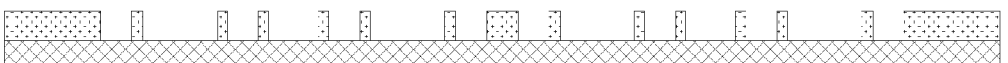
FIG. 249
FIG. 250
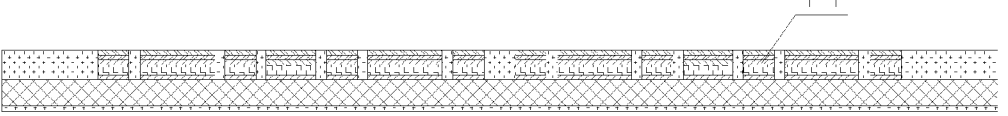
FIG. 251
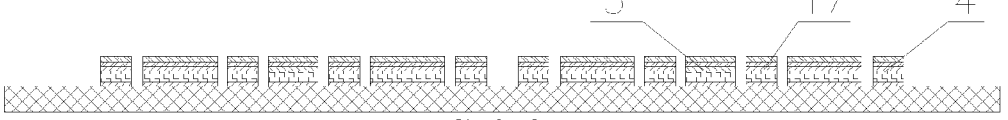
FIG. 252

FIG. 265
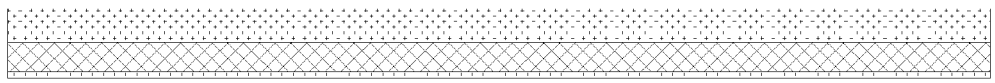
FIG. 266
FIG. 267
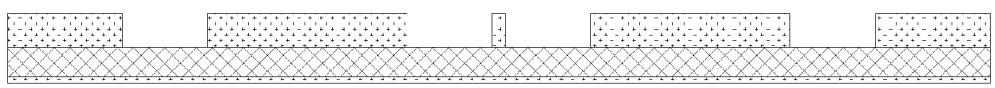
FIG. 268
FIG. 269
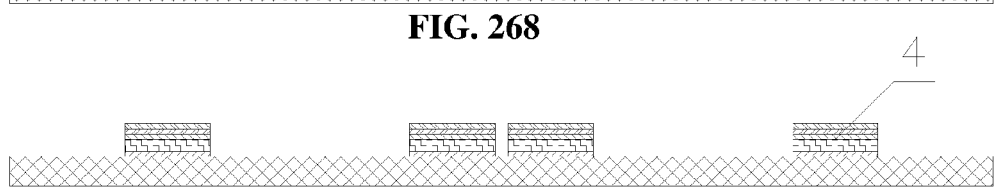
FIG. 270
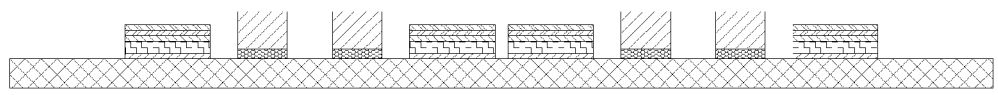
FIG. 271
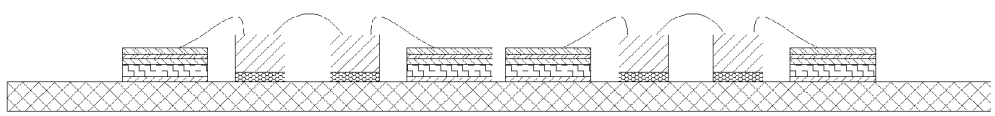
FIG. 272
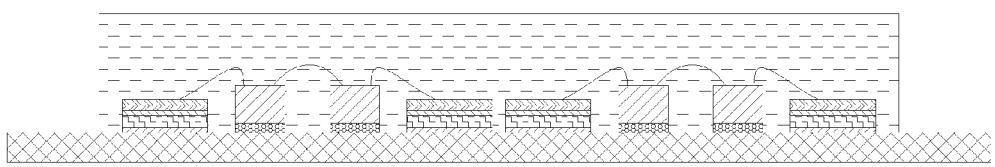

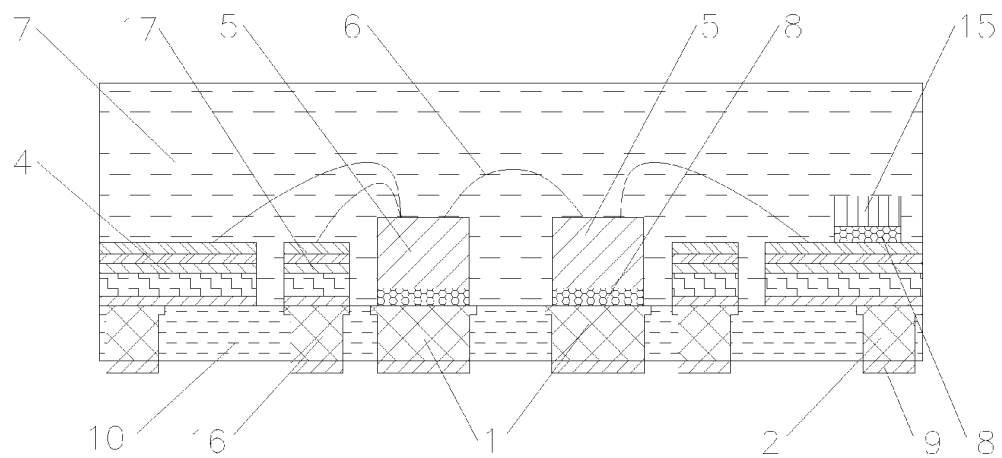
FIG. 379
FIG. 380
FIG. 381
FIG. 382
FIG. 383
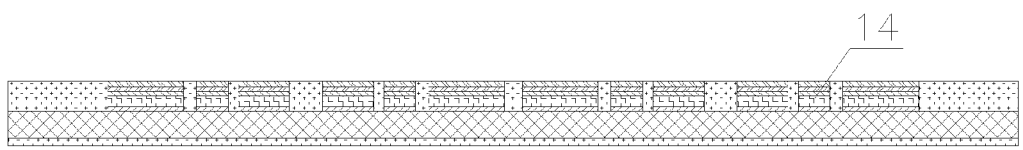
FIG. 384
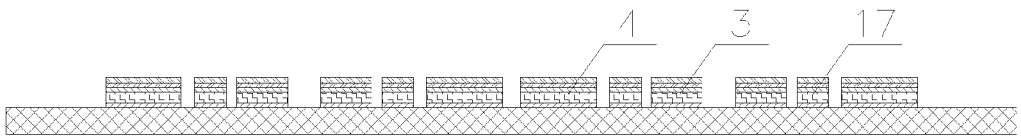

QUAD FLAT NO-LEAD (QFN) PACKAGING STRUCTURE AND METHOD FOR MANUFACTURING THE SAME

CROSS-REFERENCE TO RELATED APPLICATIONS

This application is a continuation-in-part of International Patent Application No. PCT/CN2012/000018 with an international filing date of Jan. 6, 2012, designating the United States, and further claims priority benefits to Chinese Patent Application No. 201110374237.2 filed Nov. 22, 2011. The contents of all of the aforementioned applications, including any intervening amendments thereto, are incorporated herein by reference. Inquiries from the public to applicants or assignees concerning this document or the related applications should be directed to: Matthias Scholl P. C., Attn.: Dr. Matthias Scholl Esq., 14781 Memorial Drive, Suite 1319, Houston, Tex. 77079.

BACKGROUND OF THE INVENTION

1. Field of the Invention

The present invention relates to the field of semiconductor assembly or packaging, and more particularly to a quad flat no-lead (QFN) packaging structure and method for manufacturing the same.

2. Description of the Related Art

Conventionally, two types of lead frame structures are used in semiconductor packaging processes. For the first type, as shown in FIG. 529, after performing chemical etching and electrical plating (or simply plating) on the metal substrate, a layer of high-temperature resistant film is affixed on the back surface of the metal substrate to form the lead frame carrier to be used in the packaging process.

For the second type, as shown in FIG. 531, chemical half etching is first performed on the back surface of the metal substrate, and the chemically half etched areas are sealed with encapsulation material. Further, chemical half etching for inner leads is performed on the top surface of the metal substrate and followed by plating on the surface of inner leads of the lead frame so as to complete the lead frame.

However, both of these two types of lead frames have certain disadvantages in the packaging process. For example, for the first type, the disadvantages include:

1) Because an expensive high-temperature film must be affixed on the back surface of the metal substrate, the manufacturing cost is directly increased;

2) In the die attaching process of the packaging process, also because a high-temperature resistant film must be affixed on the back surface of the metal substrate, only epoxy is used in the die attaching process, and certain techniques such as the eutectic process or soft solder technique cannot be used, which greatly limits choices of available products;

3) In the wire bonding process of the packaging process, also because a high-temperature resistant film must be affixed on the back surface of the metal substrate and the high-temperature resistant film is a kind of soft material, the wire bonding parameters become unstable, which seriously impacts on the quality of wire bonding and the reliability and stability of the product; and 4) In the molding process, also because a high-temperature resistant film must be affixed on the back surface of the metal substrate, the molding pressure during the molding process causes certain mold bleeding between the lead frame and the high-temperature resistant film, which changes a conductive metal lead into an insulated lead, as shown in FIG. 50 (certain metal leads on the left side of the drawing are insulated by bleeding material).

For the second type conventional lead frame structure, the disadvantages include:

1) Because the etching process was carried out twice, manufacturing cost is increased;

2) Because the composition of the lead frame is metal material and compound, when operated in a high and low temperature environment, the lead frame is warping due to the different expansion and shrinkage stress of the different materials;

3) The warpage of the lead frame impacts the accuracy of die attaching process and affects the production yield due to the impact on the smooth transferring of the warping lead frames in the die attaching process;

4) The warpage of the lead frame also impacts the alignment accuracy of the wire bonding and also affects the production yield due to the impact on the smooth transferring of the warping lead frames in the wire bonding process; and 5) Because the inner leads on the top surface of the lead frame are formed using etching technique, the width of the inner leads might have to be greater than 100 µm and the distance between two adjacent inner leads also must have to be greater than 100 µm. Thus, it is difficult to achieve high density for the inner leads.

SUMMARY OF THE INVENTION

In view of the above-described problems, it is one objective of the invention to provide a quad flat no-lead (QFN) packaging structure. The QFN packaging structure comprises a metal substrate, a first outer die pad formed on the metal substrate, and a first die coupled to a top surface of the first outer die pad. The QFN packaging structure also comprises a plurality of I/O pads formed on the metal substrate, and a first metal layer containing a plurality of inner leads corresponding to the plurality of I/O pads and extending to proximity of the die. The first metal layer is formed on the metal substrate by a multi-layer electrical plating process such that a lead pitch of the plurality of inner leads is significantly reduced. Further, the QFN packaging structure comprises metal wires connecting die and the plurality of inner leads, and a second metal layer formed on a back surface of the plurality of I/O pads and the die pad. The die, the plurality of inner leads, and metal wires are sealed with a molding compound.

It is another objective of the invention to provide a method for manufacturing a QFN packaging structure. The method comprises providing a metal substrate, forming a first photoresist film on a top surface of the metal substrate, and forming a plating pattern in the first photoresist film using photolithography. The method also comprises forming a first metal layer containing a plurality of inner leads by a multi-layer electrical plating process using the plating pattern in the first photoresist film as a mask, such that a lead pitch of the plurality of inner leads is significantly reduced. Further, the method comprises attaching a die in a predetermined region on the top surface of the metal substrate and connecting die and the plurality of inner leads using metal wires by a wire bonding process. The method also comprises sealing the die, the plurality of inner leads, and metal wires with a molding compound, and etching the metal substrate from a back surface of the metal substrate to form an outer die pad and a plurality of I/O pads corresponding to the plurality of inner leads. The outer die pad corresponds to the predetermined area mounted with the die. In addition, the method comprises forming a second metal layer on a back surface of the plurality of I/O pads and the outer die pad.

BRIEF DESCRIPTION OF THE DRAWINGS

FIG. 16 is a cross-sectional view of an exemplary QFN packaging structure in accordance with one embodiment of the invention;

FIG. 17 illustrates a step of an exemplary process for manufacturing another exemplary QFN packaging structure in accordance with one embodiment of the invention in which a metal substrate is provided for the lead frame manufacturing and packaging process;

FIG. 18 illustrates another step of the exemplary process for manufacturing the exemplary QFN packaging structure in which layers of photoresist film are formed on the top surface and the back surface of the metal substrate, respectively;

FIG. 19 illustrates another step of the exemplary process for manufacturing the exemplary QFN packaging structure in which portions of the photoresist film on the top surface of the metal substrate are removed to form a pattern by photolithography;

FIG. 20 illustrates another step of the exemplary process for manufacturing the exemplary QFN packaging structure in which a multi-layer plating process is performed to form a first metal layer containing an inner die pad and inner leads in the areas of the metal substrate exposed by the plating pattern in the photoresist film;

FIG. 21 illustrates another step of the exemplary process for manufacturing the exemplary QFN packaging structure in which the remaining photoresist film on the top surface of the metal substrate is removed and inner leads are formed on the metal substrate;

FIG. 120 illustrates another step of the exemplary process for manufacturing the exemplary QFN packaging structure in which the remaining photoresist film on the top surface of the metal substrate is removed and inner leads are formed on the metal substrate;

FIG. 121 illustrates another step of the exemplary process for manufacturing the exemplary QFN packaging structure in which one or more passive devices are coupled between the inner leads using a conductive or non-conductive adhesive material;

FIG. 122 illustrates another step of the exemplary process for manufacturing the exemplary QFN packaging structure in which a die is attached on the top surface of the inner die pad in a die attaching process;

FIG. 123 illustrates another step of the exemplary process for manufacturing the exemplary QFN packaging structure in which the top surface of the die and the top surface of the inner leads are connected with metal wires and the die is also attached to the top surface of the inner electrostatic discharge ring in a wire bonding process;

FIG. 124 illustrates another step of the exemplary process for manufacturing the exemplary QFN packaging structure in which the inner leads, the die, and the metal wires are encapsulated using an encapsulation material;

FIG. 125 illustrates another step of the exemplary process for manufacturing the exemplary QFN packaging structure in which a layer of photoresist film is formed on the top surface of the metal substrate and another layer of photoresist film is formed on the back surface of the metal substrate;

FIG. 126 illustrates another step of the exemplary process for manufacturing the exemplary QFN packaging structure in which exposure, development, and etching are carried out on the photoresist film formed on the back surface of the metal substrate to form an etching pattern in the photoresist film;

FIG. 127 illustrates another step of the exemplary process for manufacturing the exemplary QFN packaging structure in which an etching process is performed on the areas of the metal substrate exposed by the etching pattern in the photoresist film on the back surface of the metal substrate to form etched areas, an outer die pad, and I/O pads;

FIG. 128 illustrates another step of the exemplary process for manufacturing the exemplary QFN packaging structure in which the remaining photoresist film on the back surface of the metal substrate is removed to expose the etched areas on the back surface of the metal substrate and the photoresist film on the top surface of the metal substrate is also removed;

FIG. 129 illustrates another step of the exemplary process for manufacturing the exemplary QFN packaging structure in which the etched areas on the back surface of the metal substrate are filled with a sealant;

FIG. 130 illustrates another step of the exemplary process for manufacturing the exemplary QFN packaging structure in which a plating process is performed on the bottom surface of the outer die pad and the I/O pads to form a second metal layer;

FIG. 131 illustrates another step of the exemplary process for manufacturing the exemplary QFN packaging structure in which the plurality of finished encapsulated components formed on the metal substrate is cut into individual packaged integrated circuits (ICs) or individual QFN packaging structures in a package sawing process;

Figure 132:
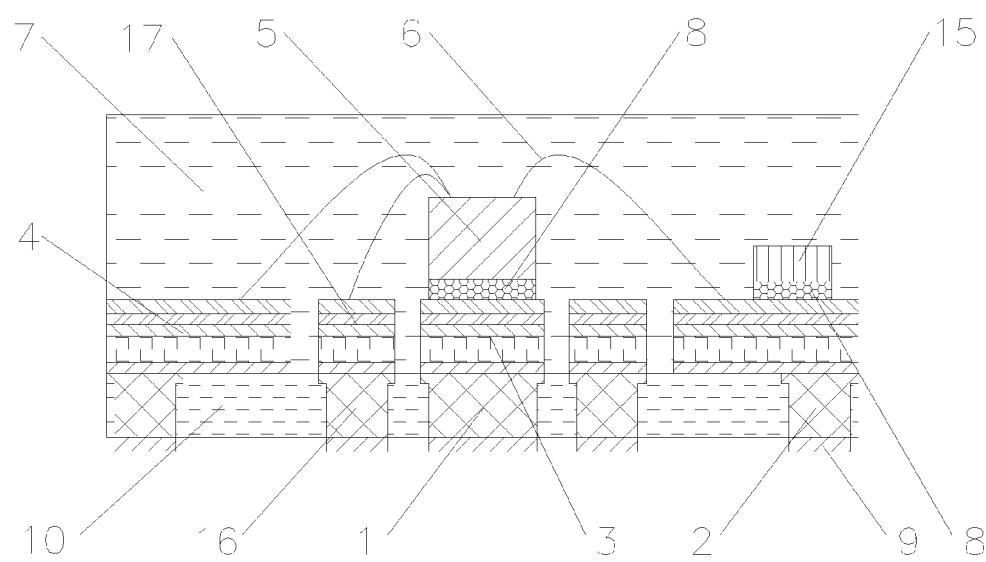
Figure 133:
Figure 134:
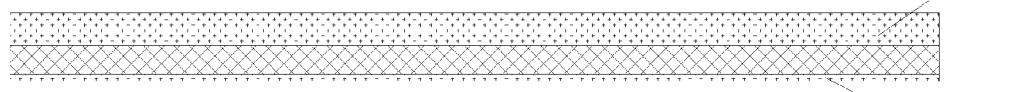
Figure 135:
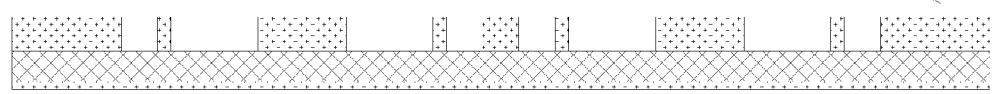
Figure 136:
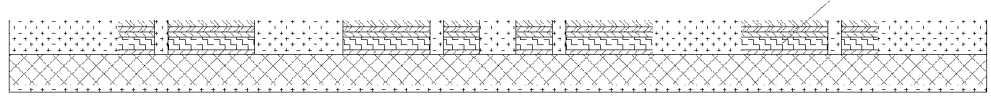
Figure 137:
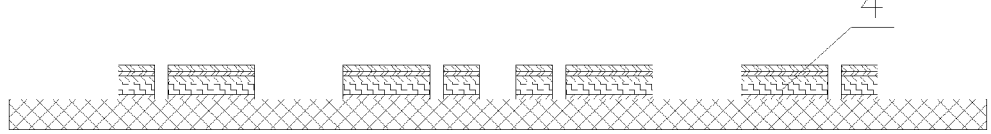
Figure 138:
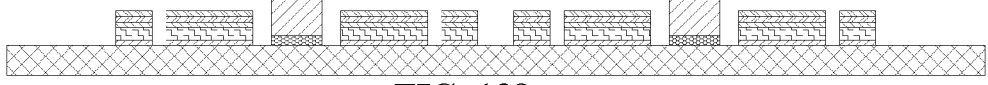
Figure 139:
Figure 140:
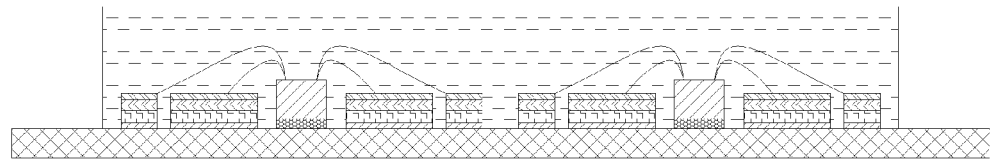
Figure 141:
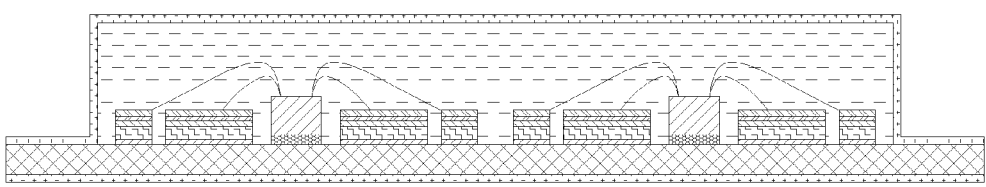
Figure 142:
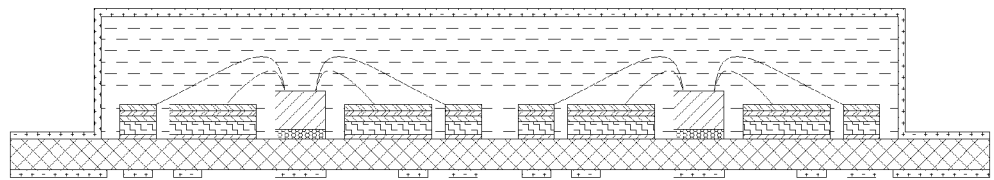
Figure 143:
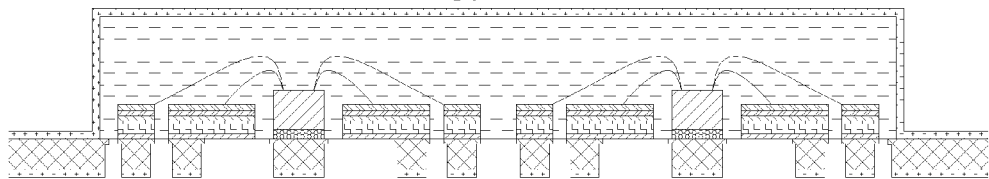
Figure 144:
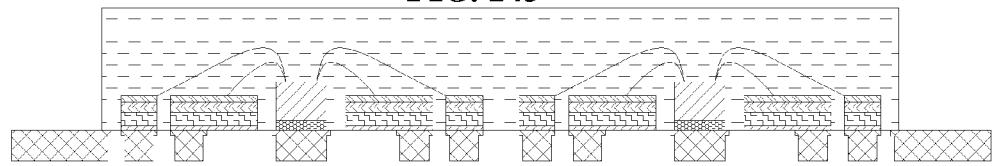
Figure 145:
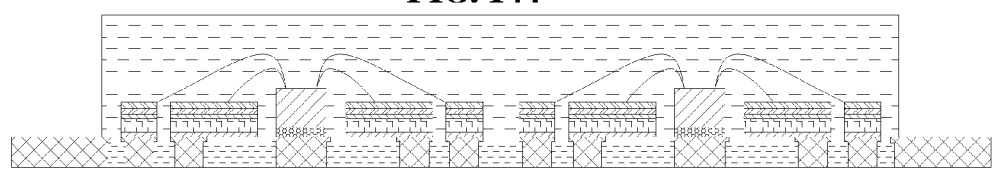
Figure 146:
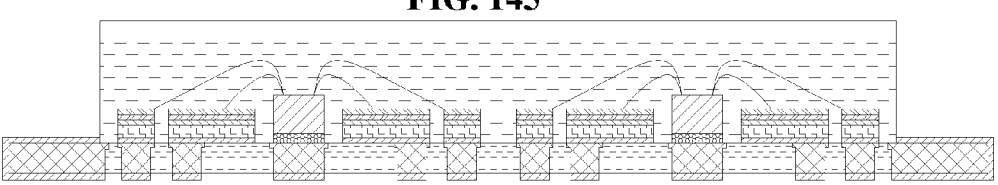
Figure 147:
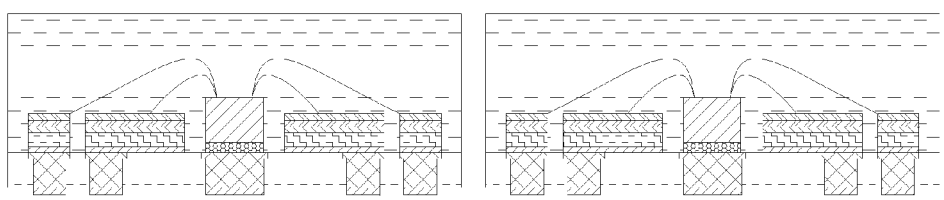
Figure 148:
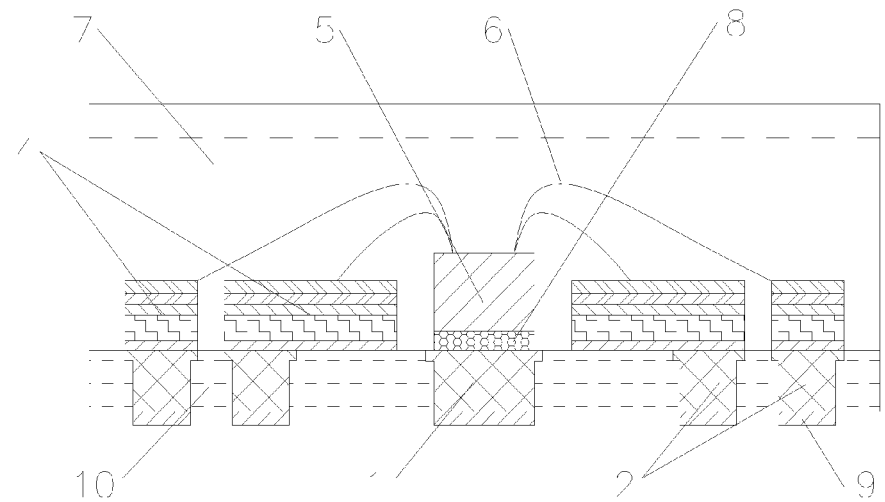
Figure 149:
Figure 150:
Figure 151:
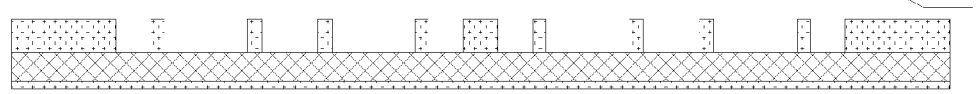
Figure 152:
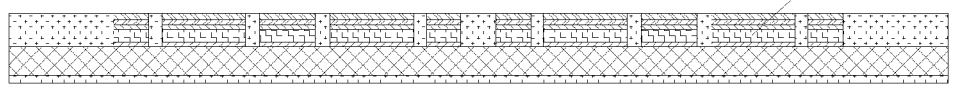
Figure 153:
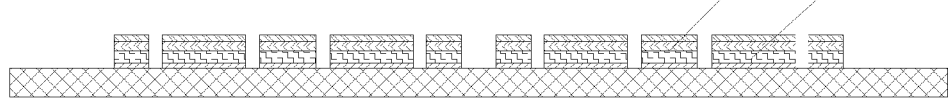
Figure 154:
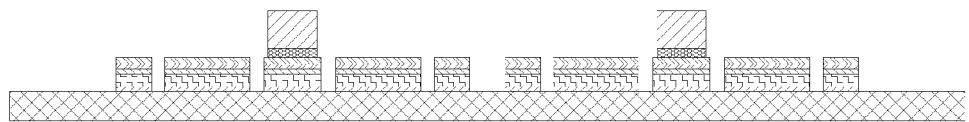
Figure 155:
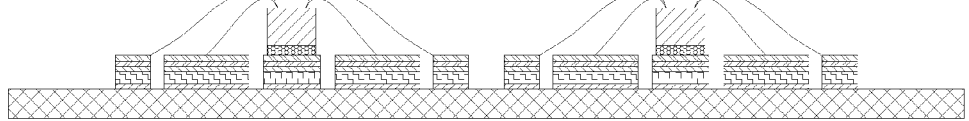
Figure 156:
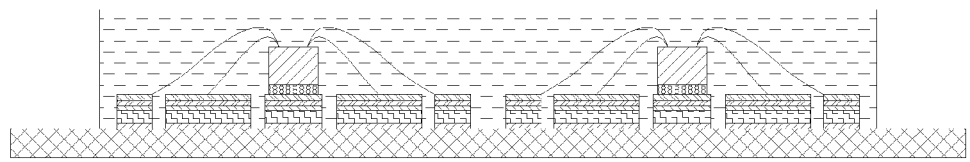
Figure 157:
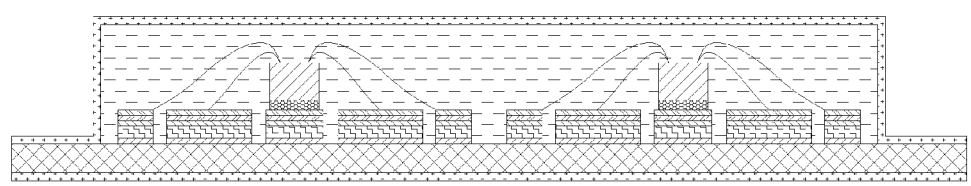
Figure 158:
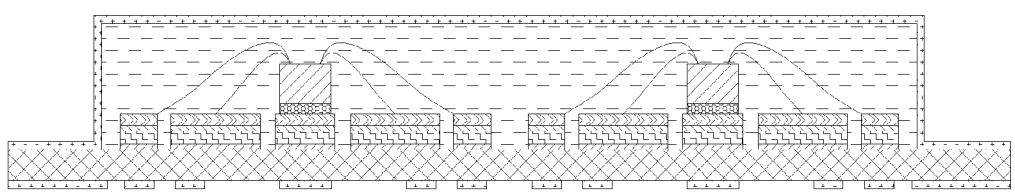
Figure 159:
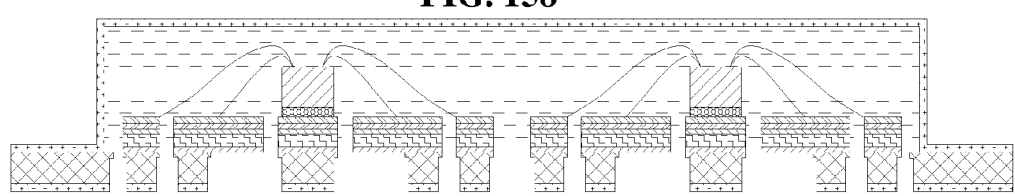
Figure 160:
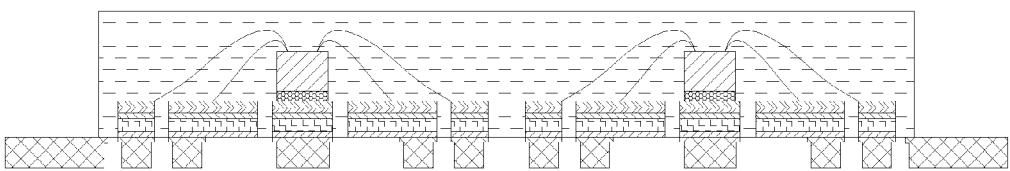
Figure 161:
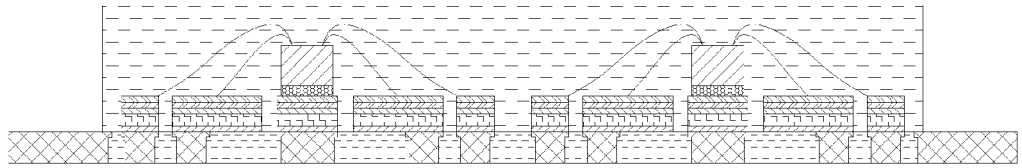
Figure 162:
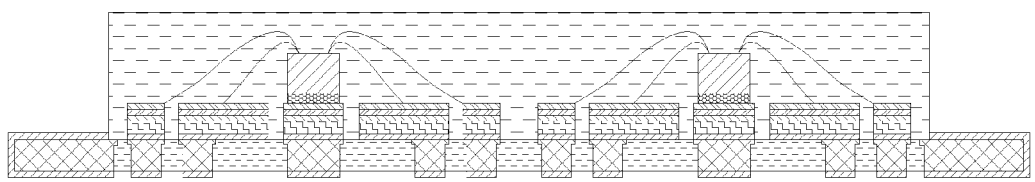
Figure 163:
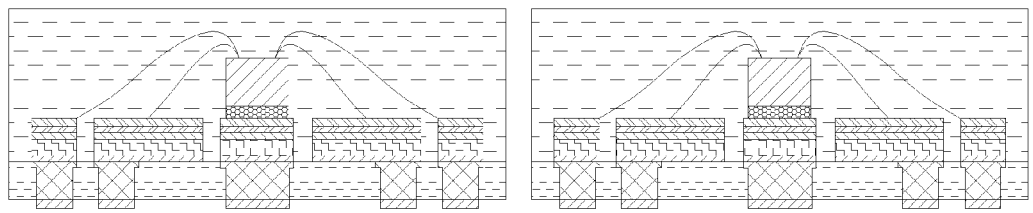
Figure 164:
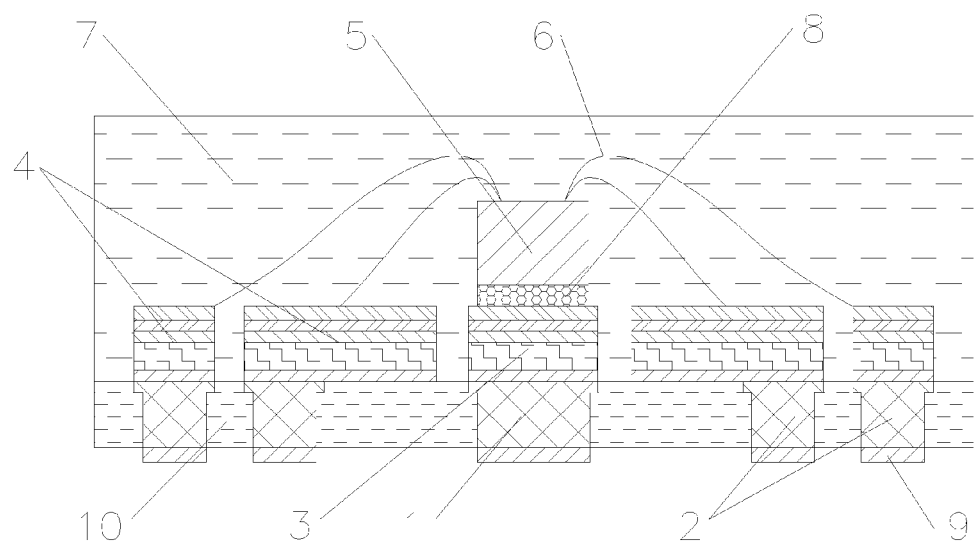
Figure 165:
Figure 166:
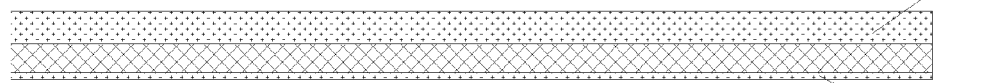
Figure 167:
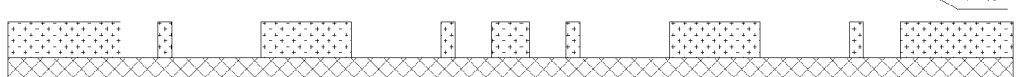
Figure 168:
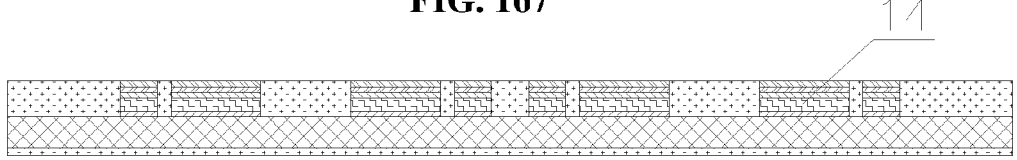
Figure 169:
Figure 170:
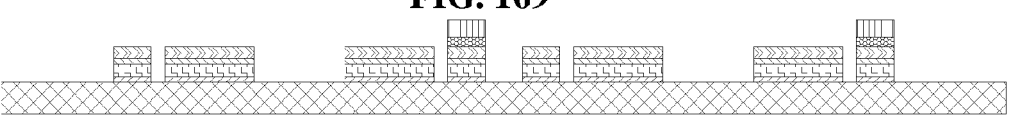
Figure 171:
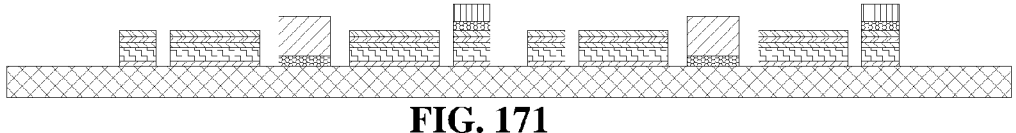
Figure 172:
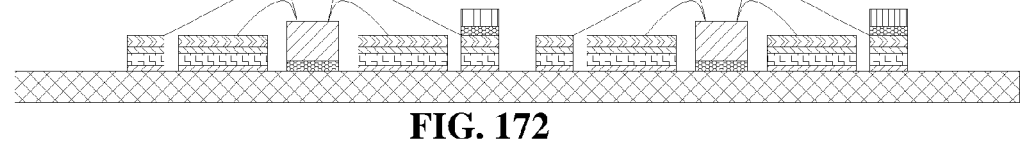
Figure 173:
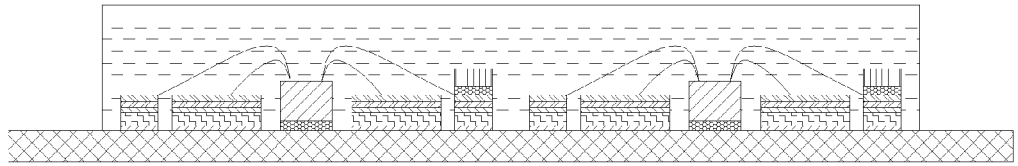
Figure 174:
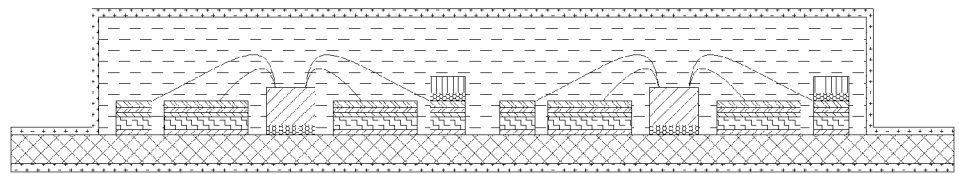
Figure 175:
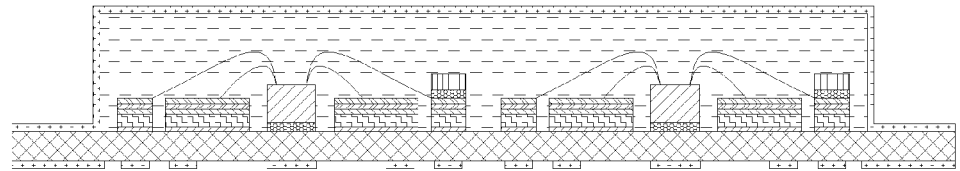
Figure 176:
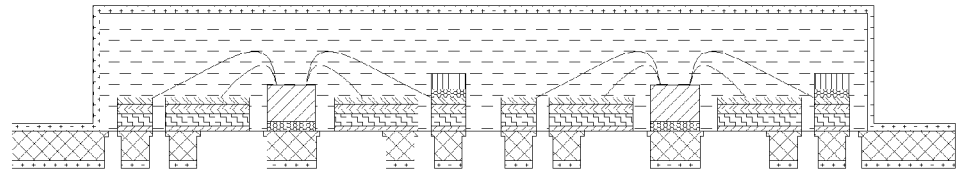
Figure 177:
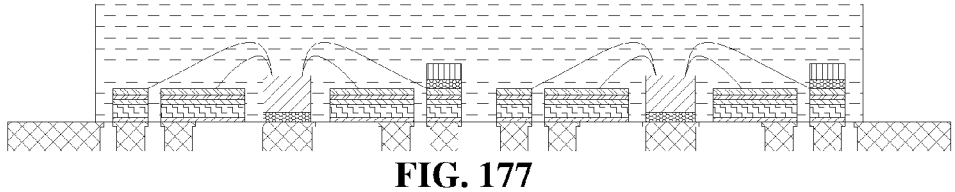
Figure 178:
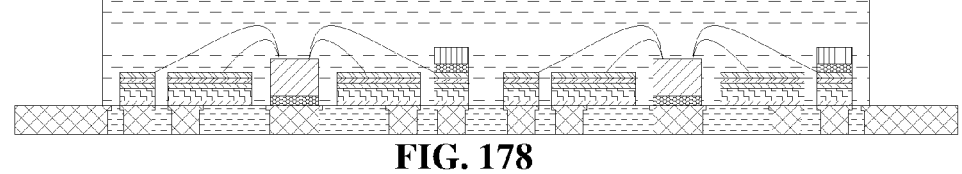
Figure 179:
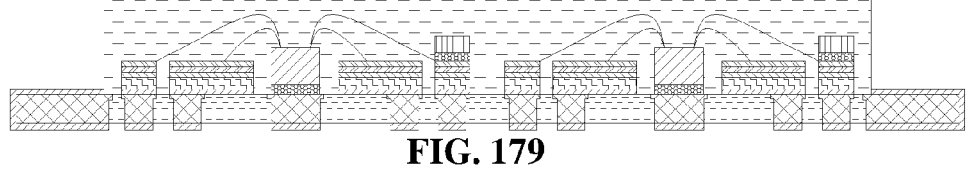
Figure 180:
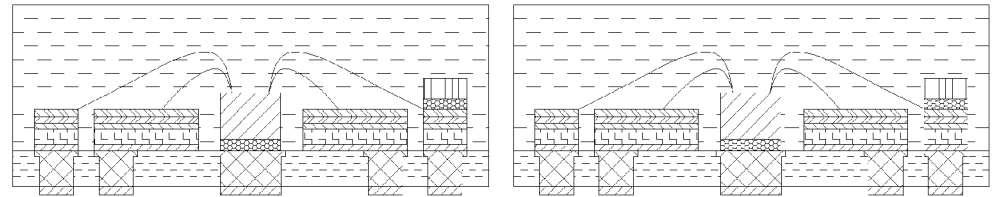
Figure 181:
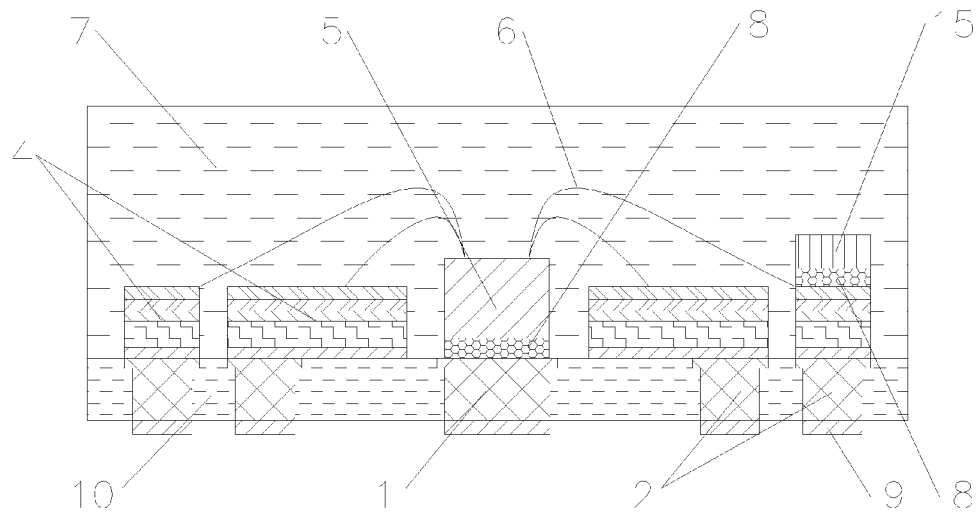
Figure 182:
Figure 183:
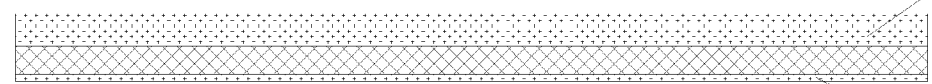
Figure 184:
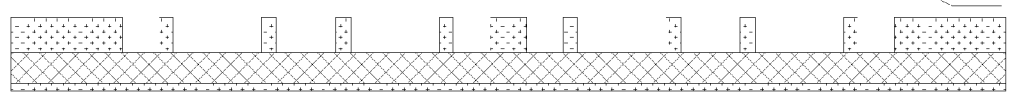
Figure 185:
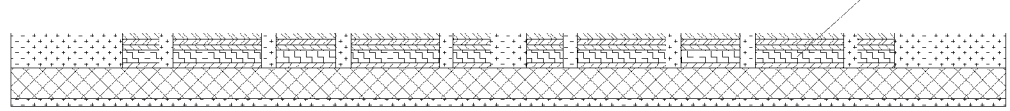
Figure 186:
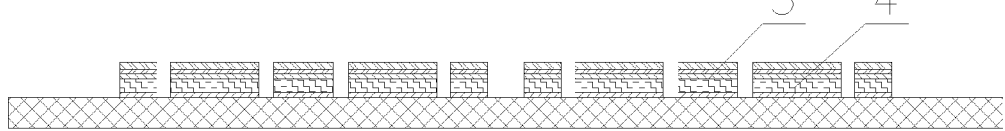
Figure 187:
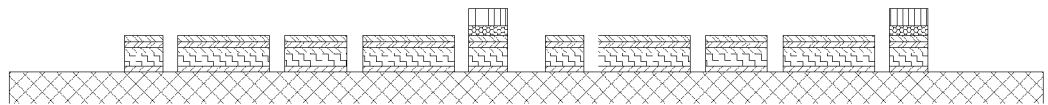
Figure 188:
Figure 189:
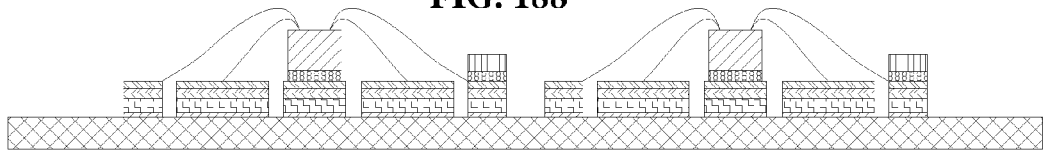
Figure 190:
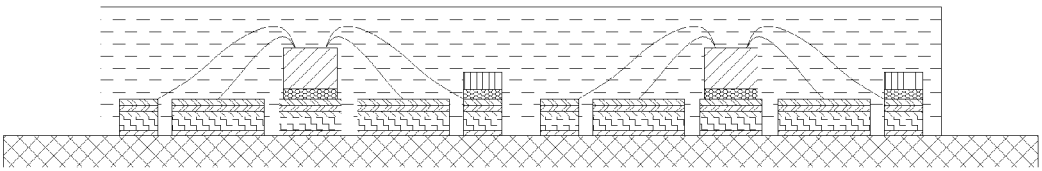
Figure 191:
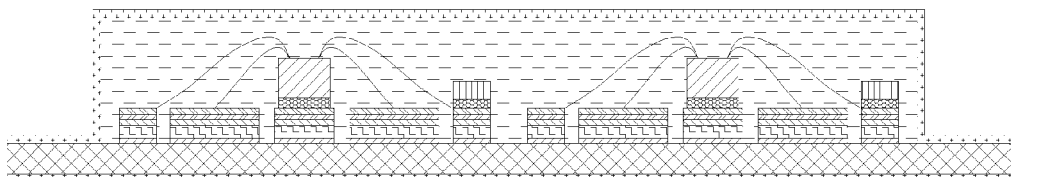
Figure 192:
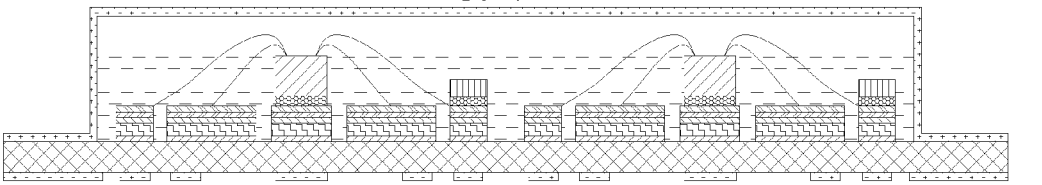
Figure 193:
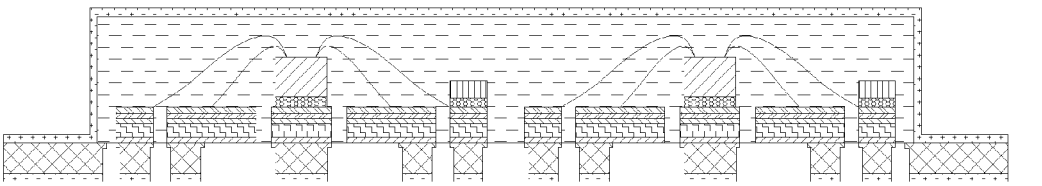
Figure 194:
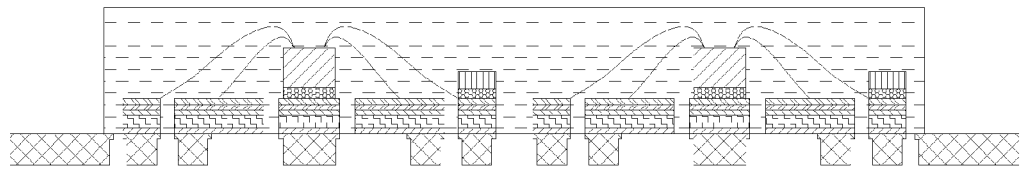
Figure 195:
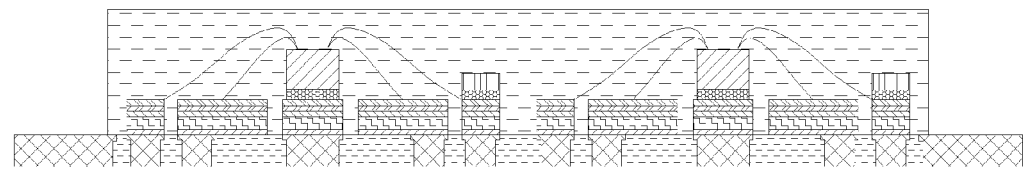
Figure 196:
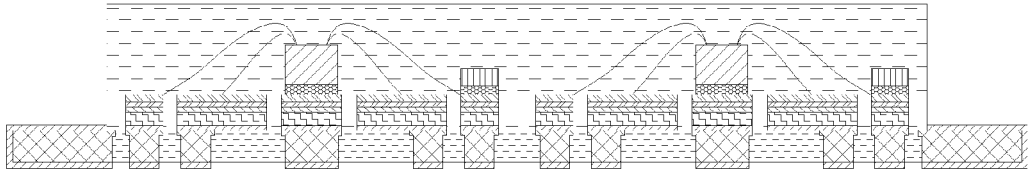
Figure 197:
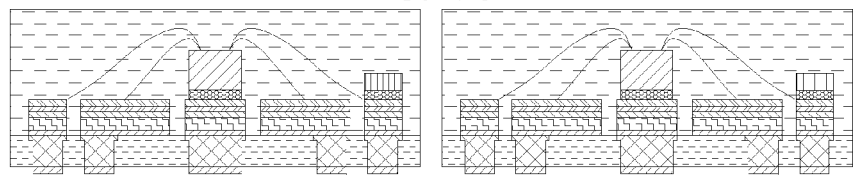
Figure 198:
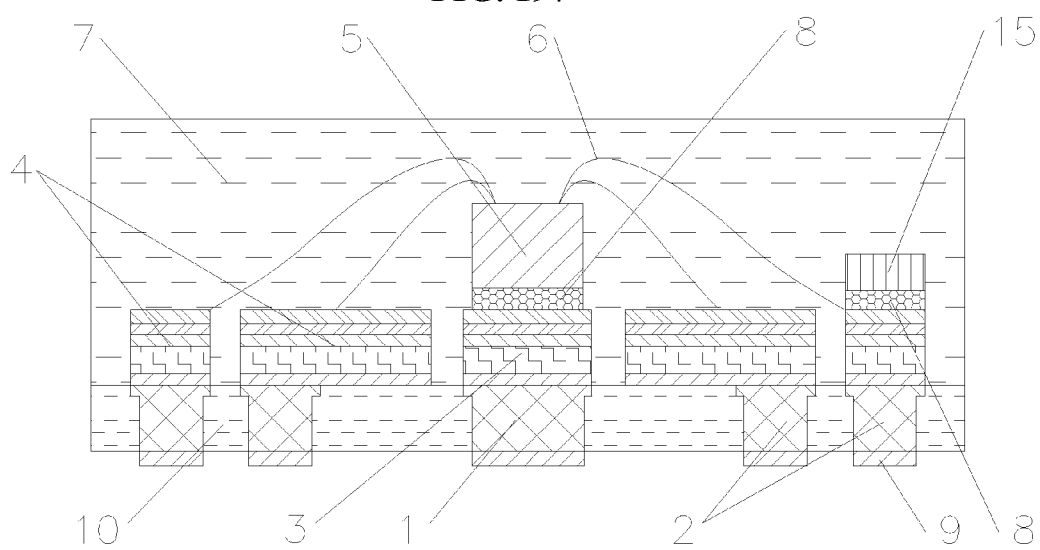
Figure 199:
Figure 200:
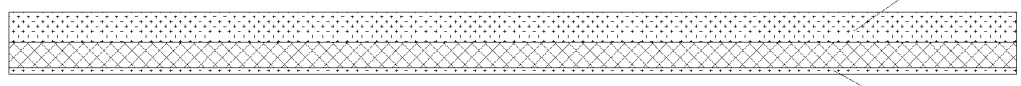
Figure 201:
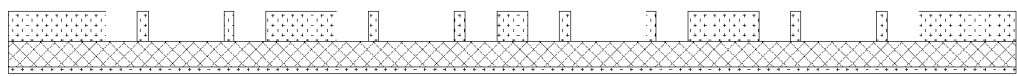
Figure 202:
Figure 203:
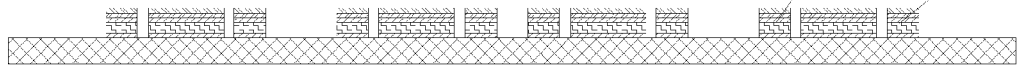
Figure 204:
Figure 205:
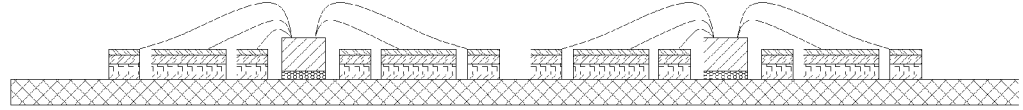
Figure 206:
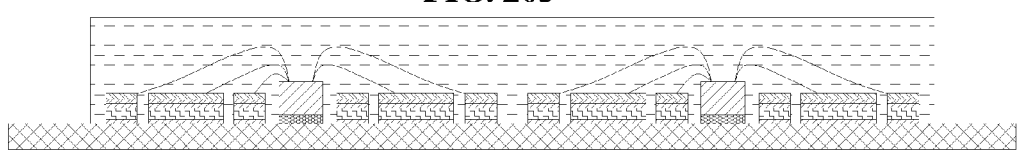
Figure 207:
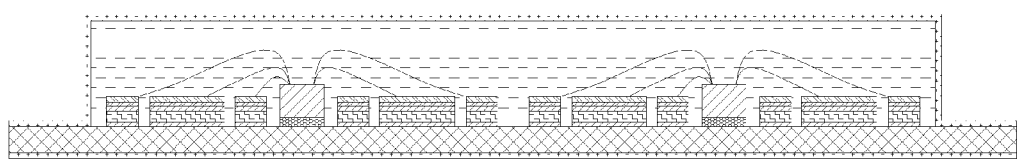
Figure 208:
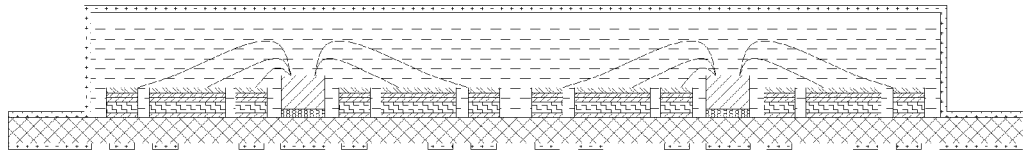
Figure 209:
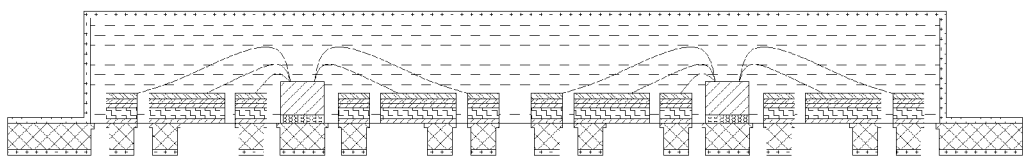
Figure 210:
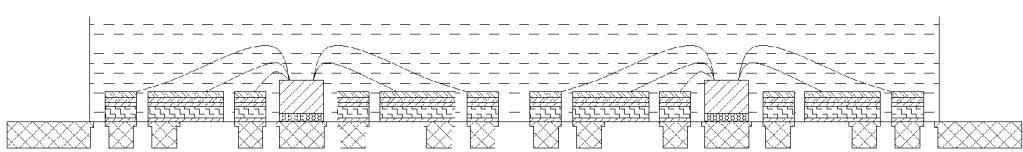
Figure 211:
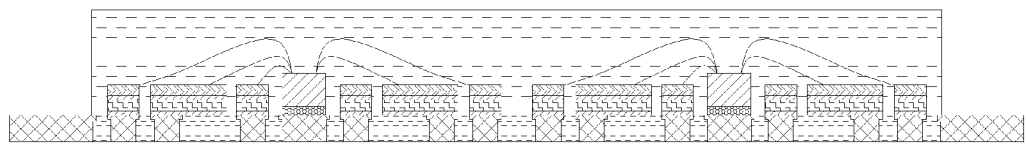
Figure 212:
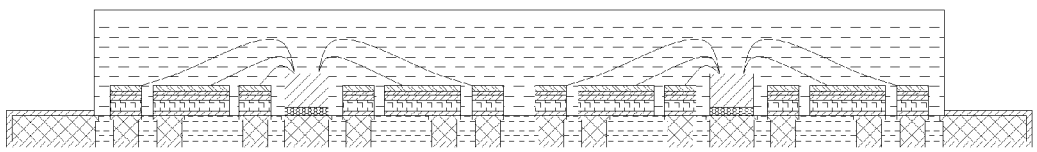
Figure 213:
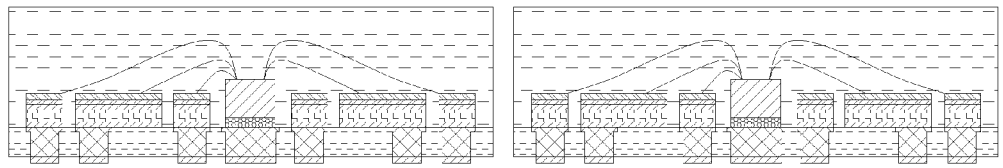
Figure 214:
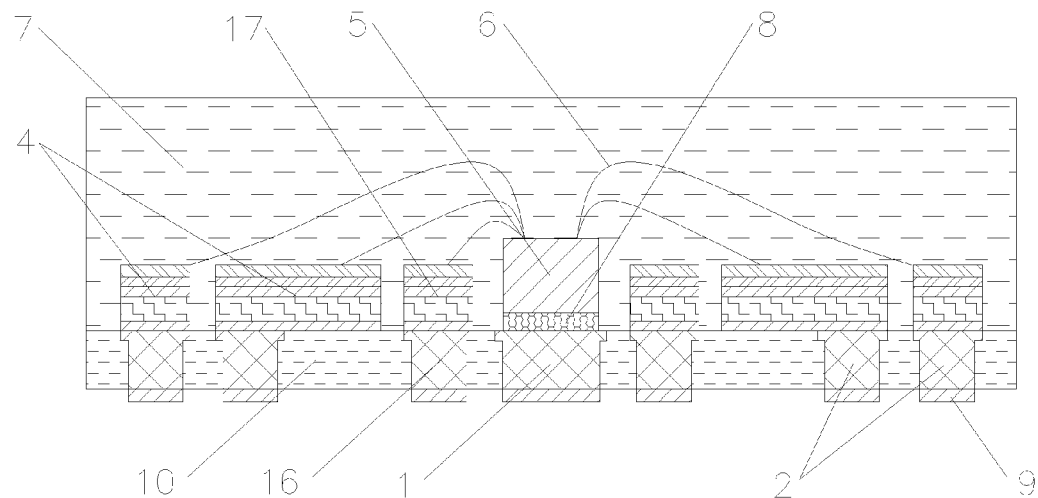
Figure 215:
Figure 216:
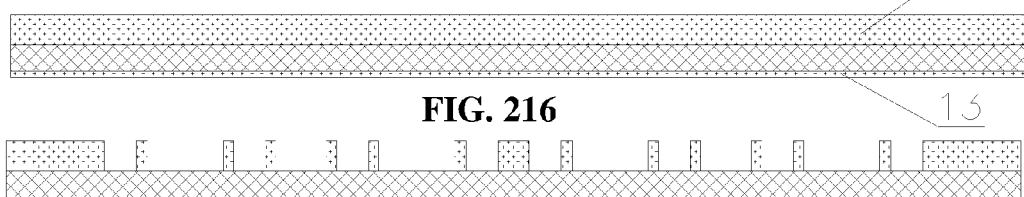
Figure 217:
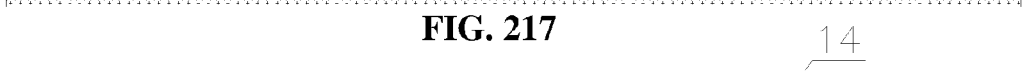
Figure 218:
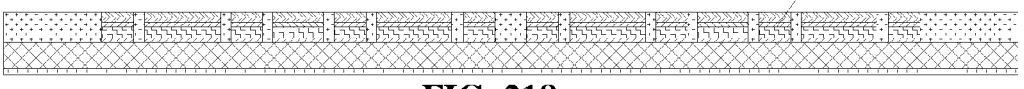
Figure 219:
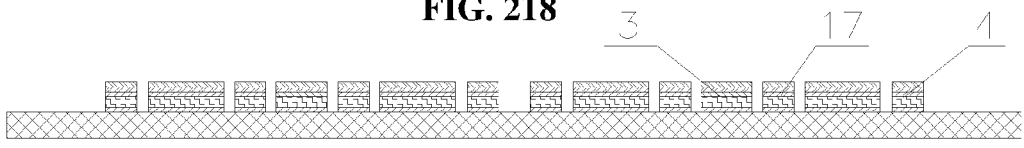
Figure 220:
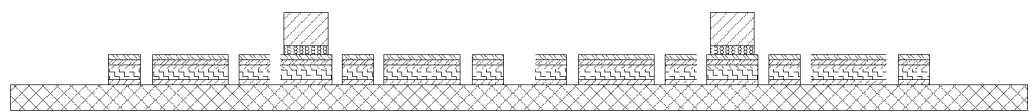
Figure 221:
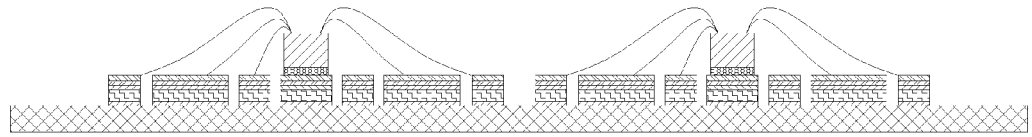
Figure 222:
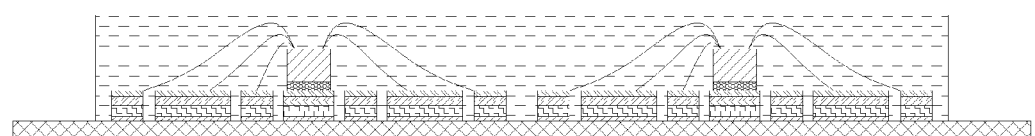
Figure 223:
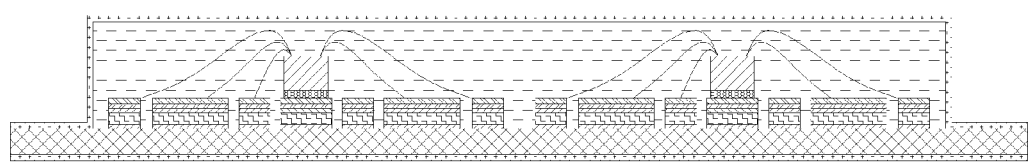
Figure 224:
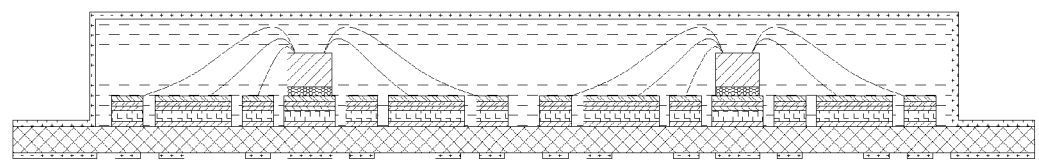
Figure 225:
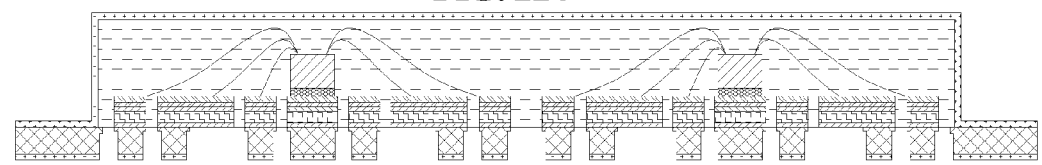
Figure 226:
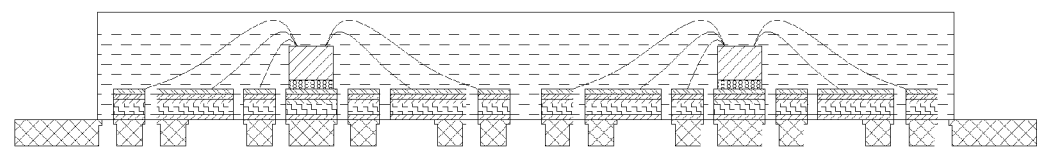
Figure 227:
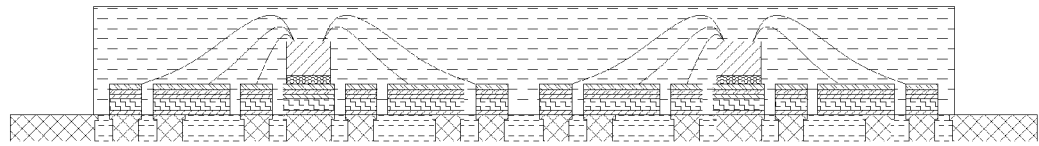
Figure 228:
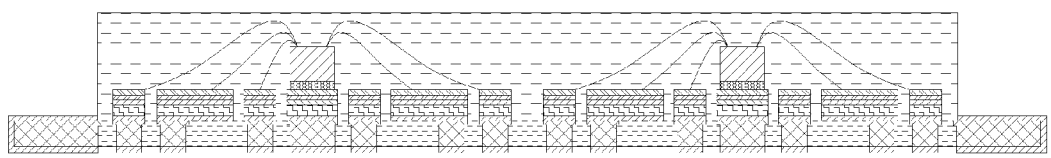
Figure 229:
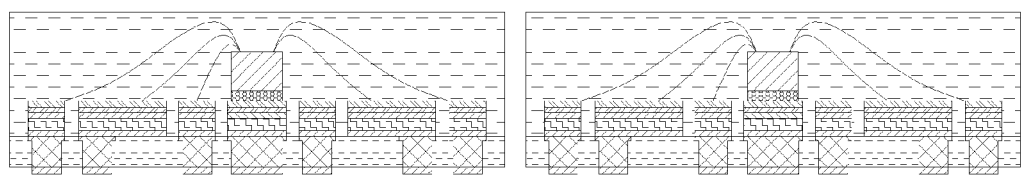
Figure 230:
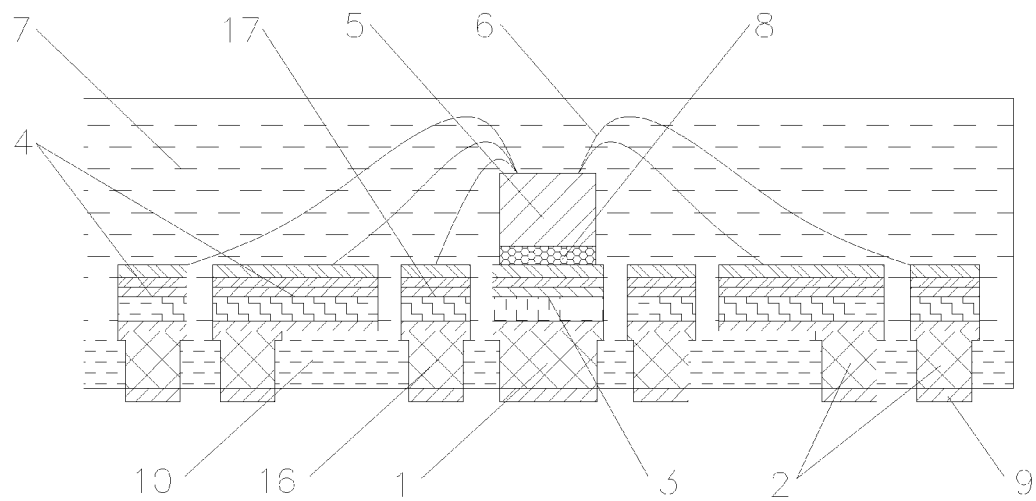
Figure 231:
Figure 232:
Figure 233:
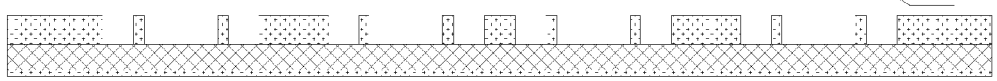
Figure 234:
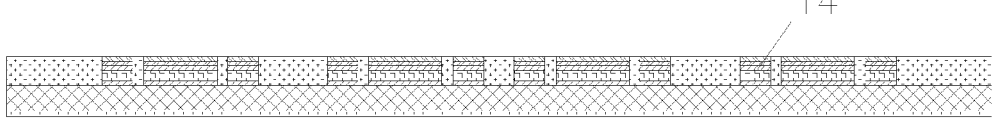
Figure 235:
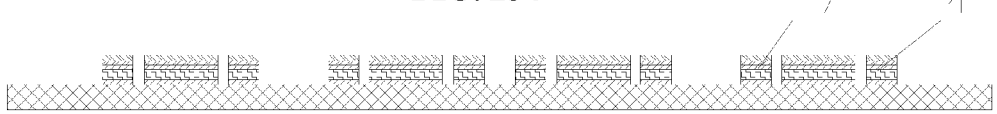
Figure 236:
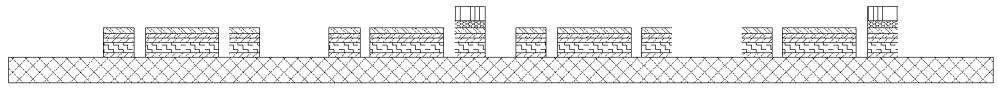
Figure 237:
Figure 238:
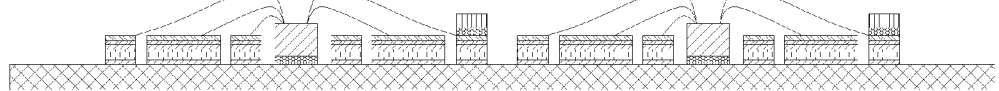
Figure 239:
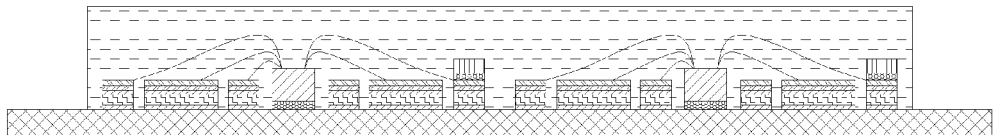
Figure 240:
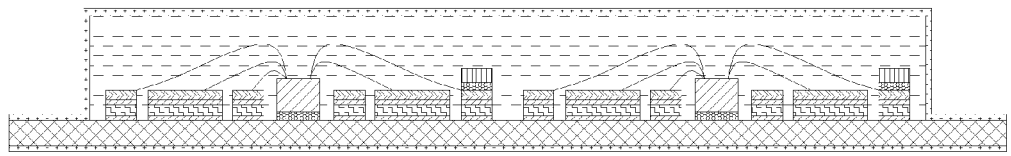
Figure 241:
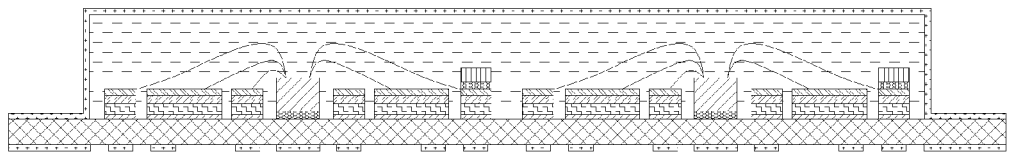
Figure 242:
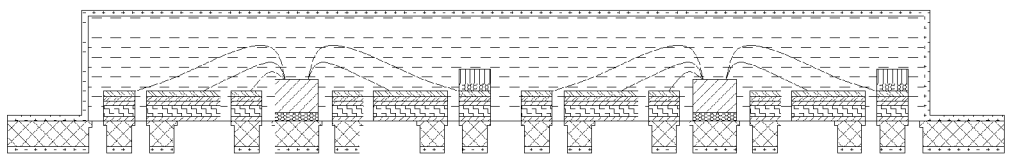
Figure 243:
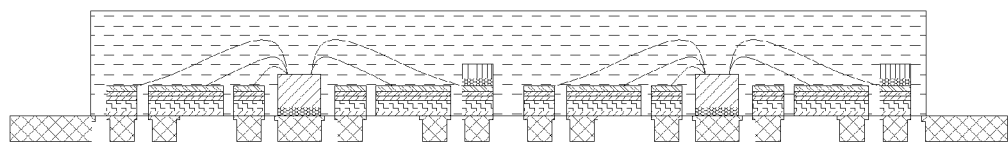
Figure 244:
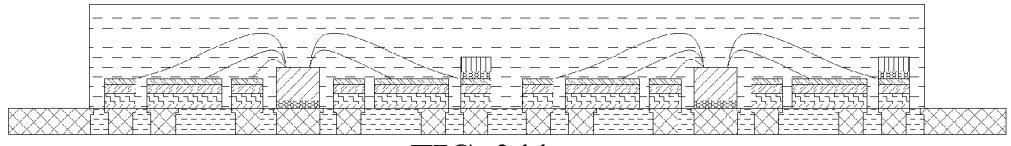
Figure 245:
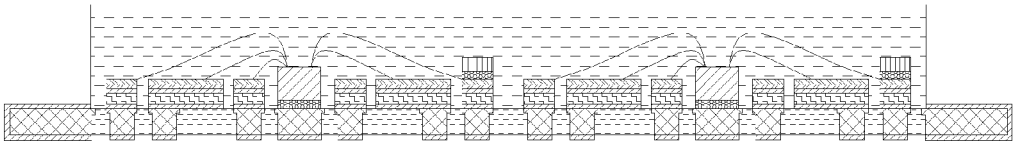
Figure 246:
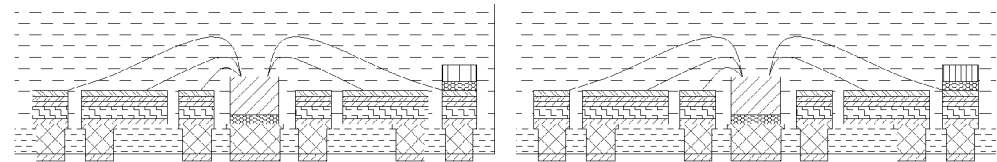
Figure 253:
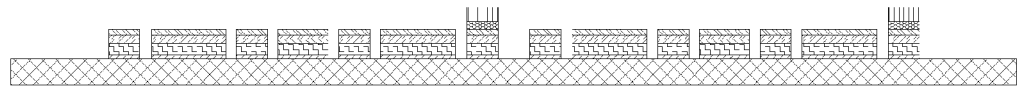
Figure 254:
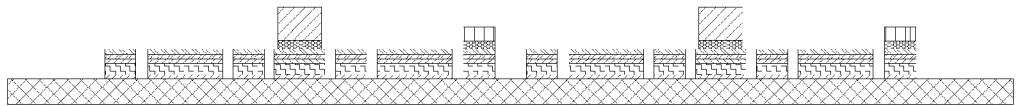
Figure 255:
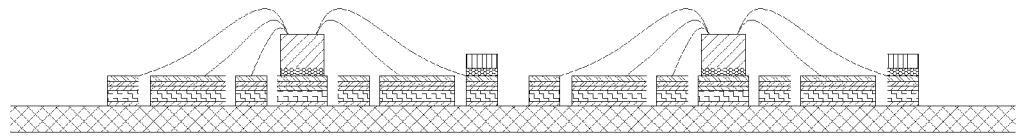
Figure 256:
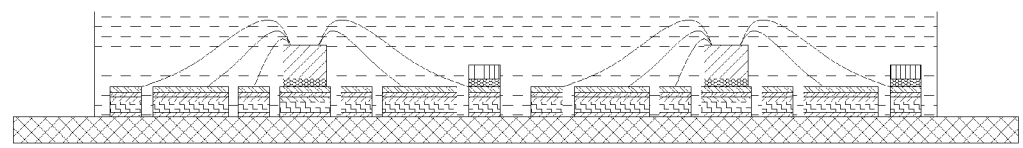
Figure 257:
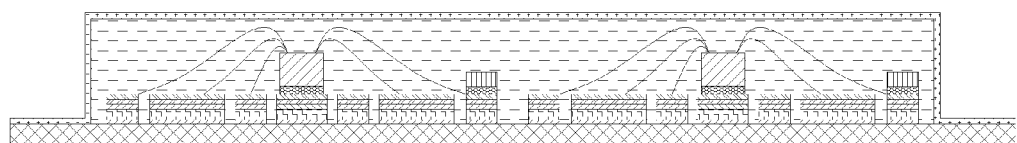
Figure 258:
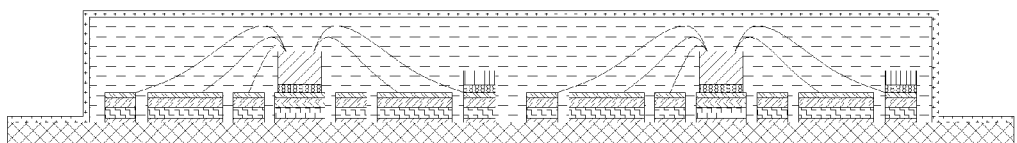
Figure 259:
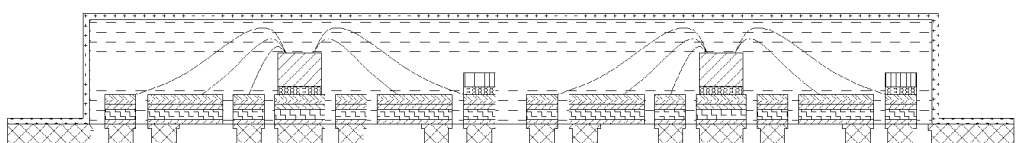
Figure 260:
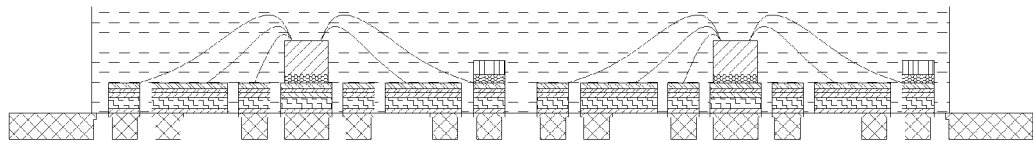
Figure 261:
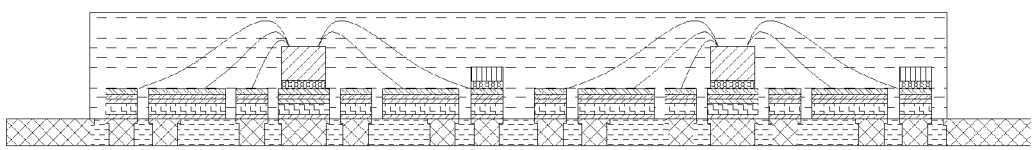
Figure 262:
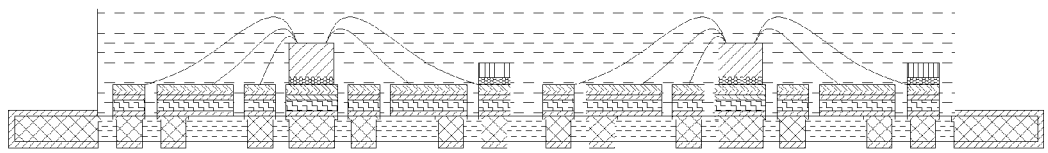
Figure 263:
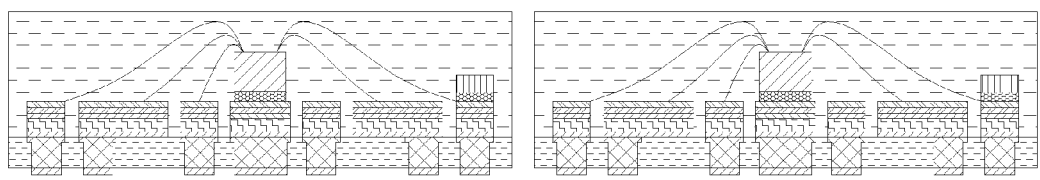
Figure 264:
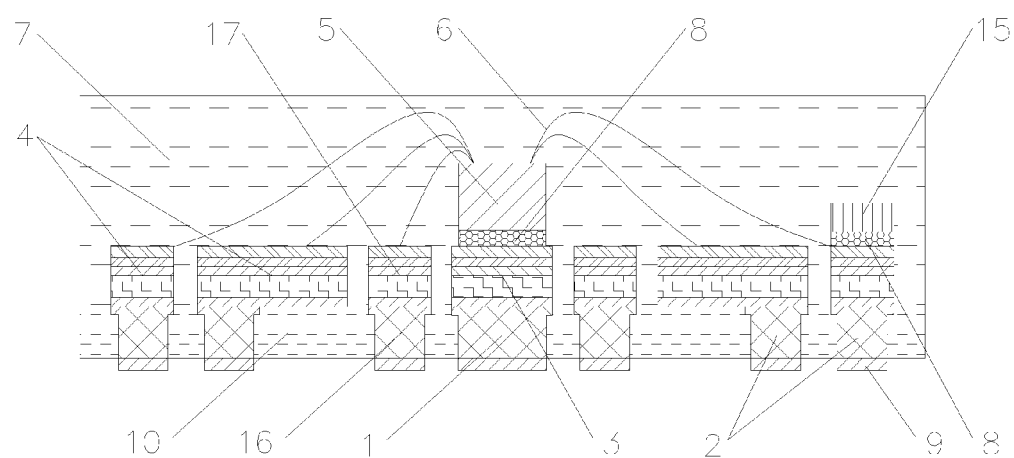
Figure 273:
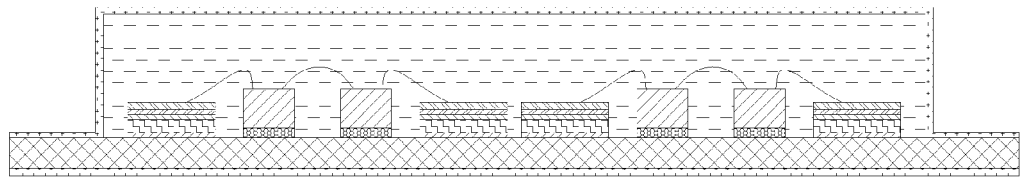
Figure 274:
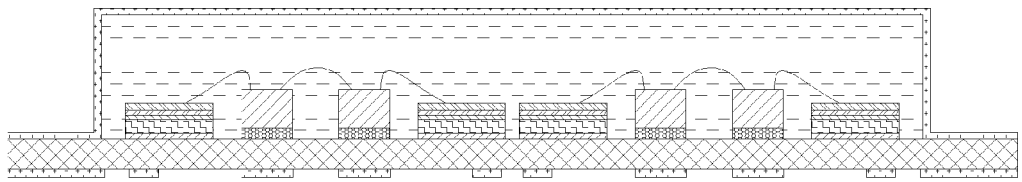
Figure 275:
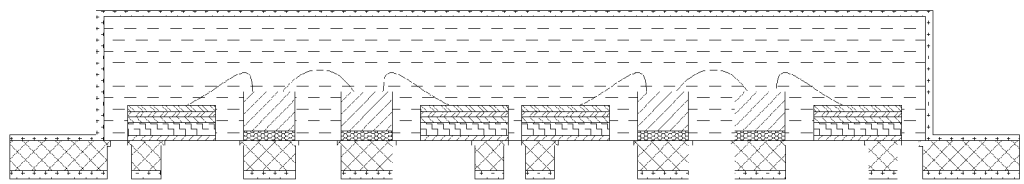
Figure 276:
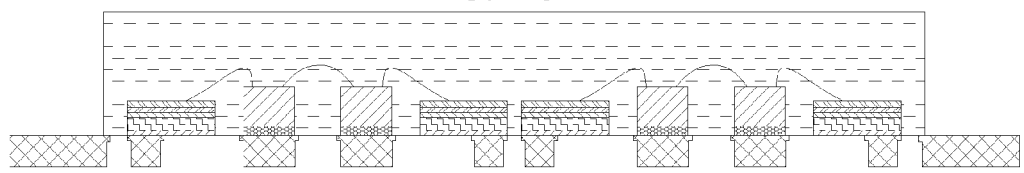
Figure 277:
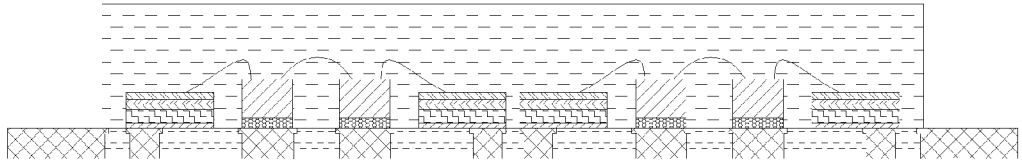
Figure 278:
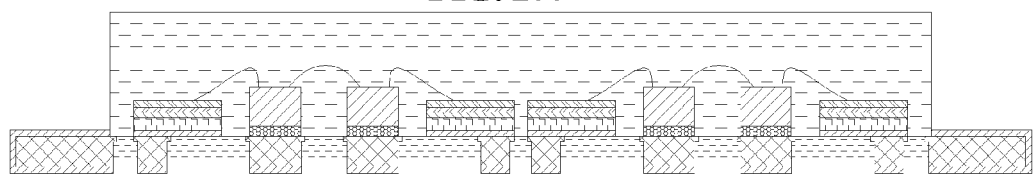
Figure 279:
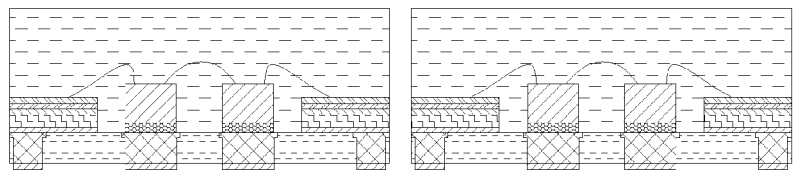
Figure 280:
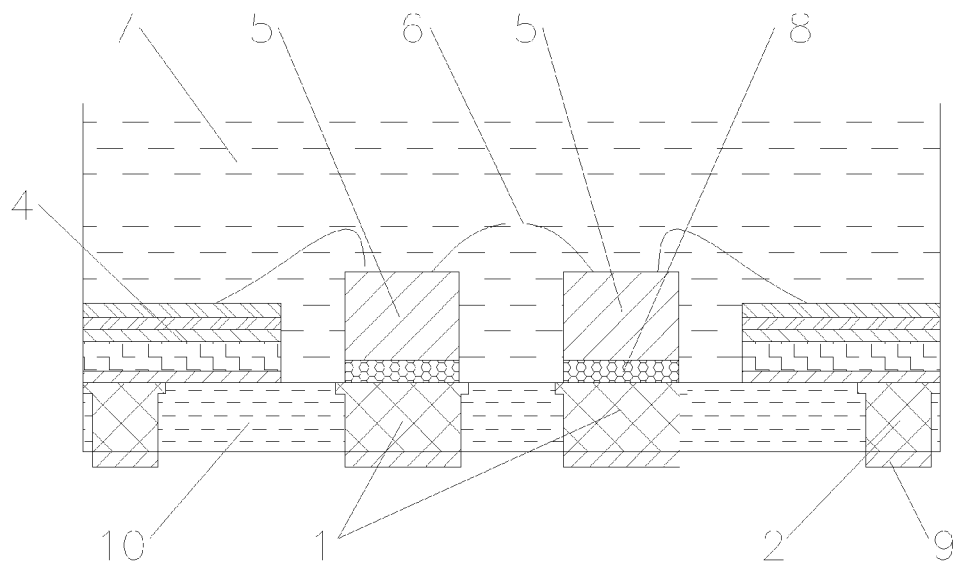
Figure 281:
Figure 282:
Figure 283:
Figure 284:
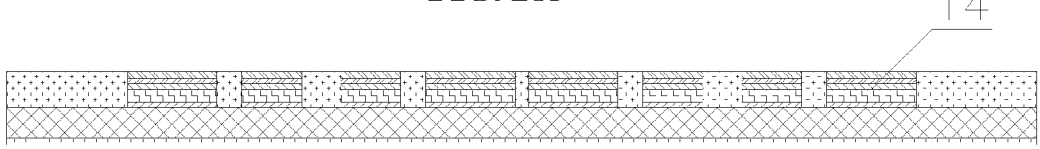
Figure 285:
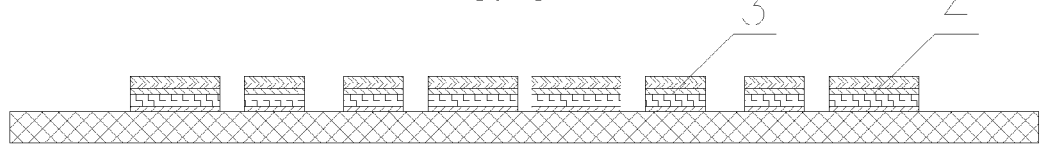
Figure 286:
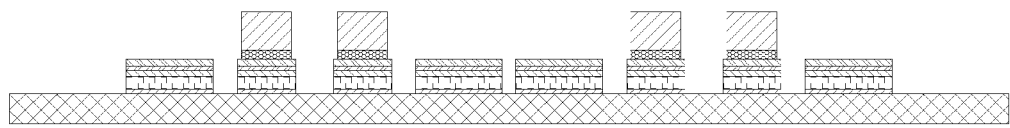
Figure 287:
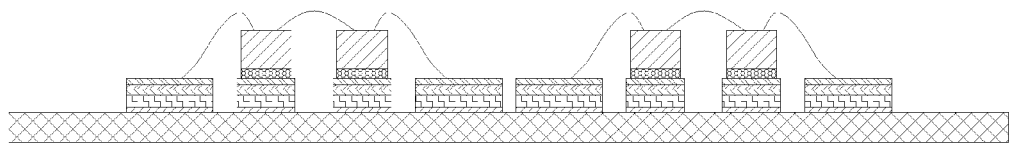
Figure 288:
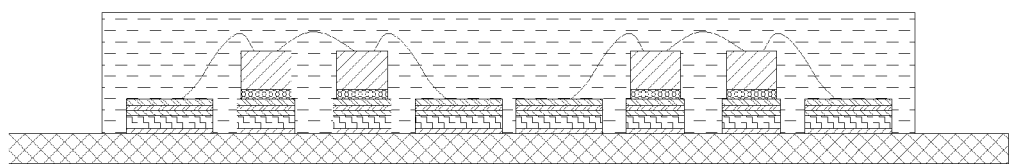
Figure 289:
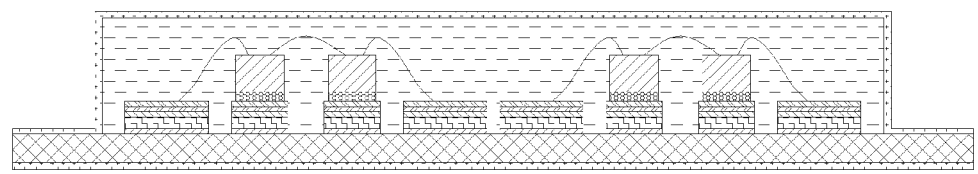
Figure 290:
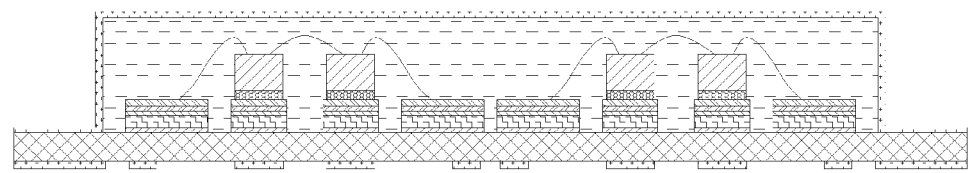
Figure 291:
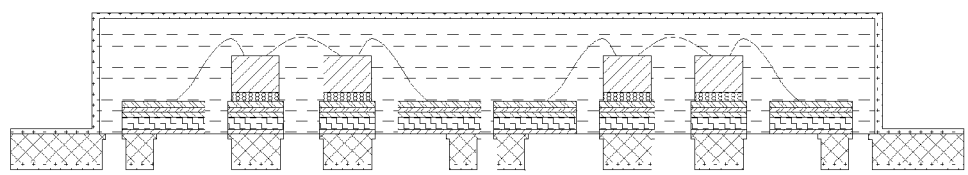
Figure 292:
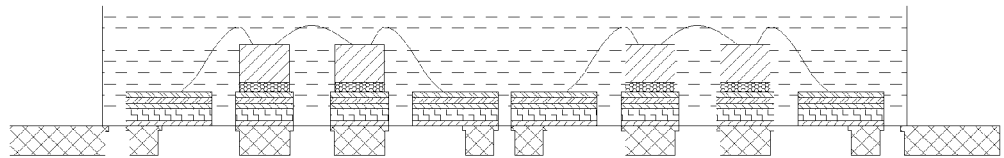
Figure 293:
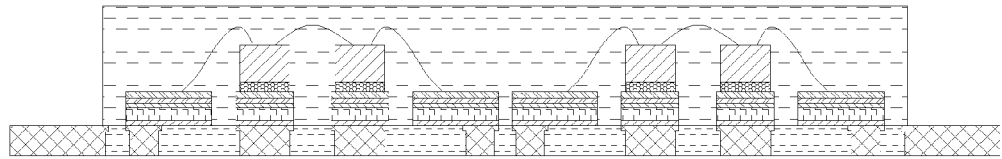
Figure 294:
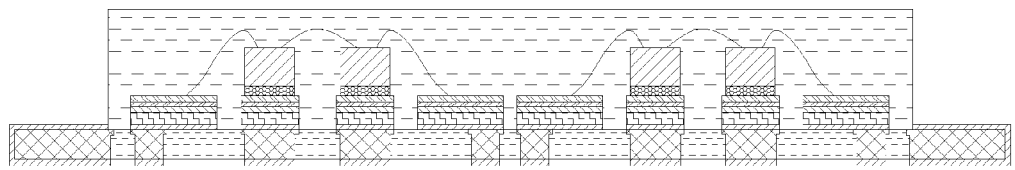
Figure 295:
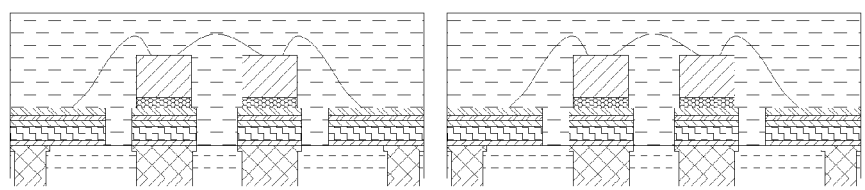
Figure 296:
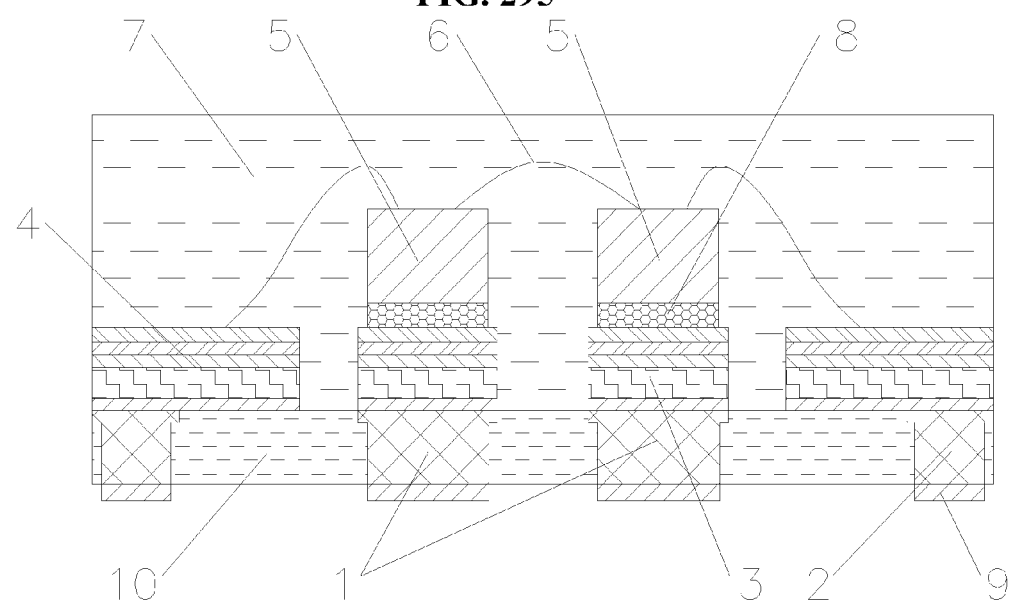
Figure 297:
Figure 298:
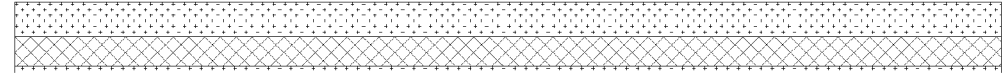
Figure 299:
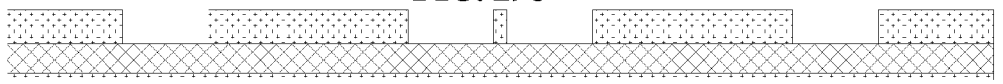
Figure 300:
Figure 301:
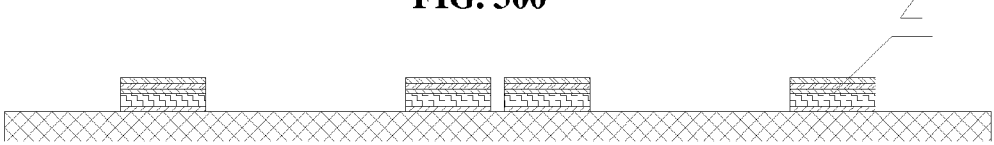
Figure 302:
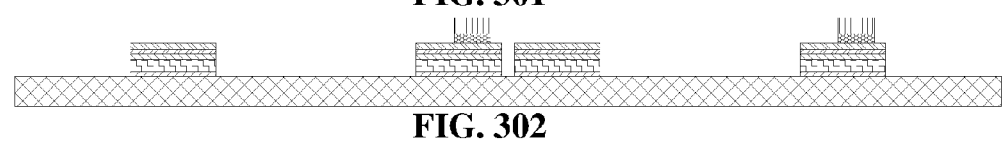
Figure 303:
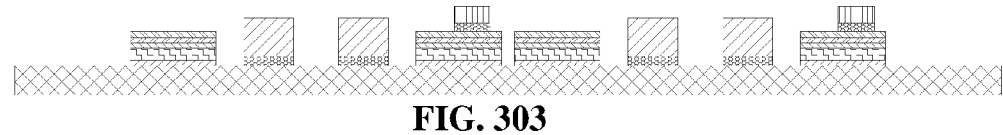
Figure 304:
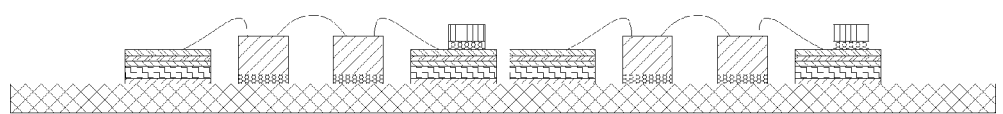
Figure 305:
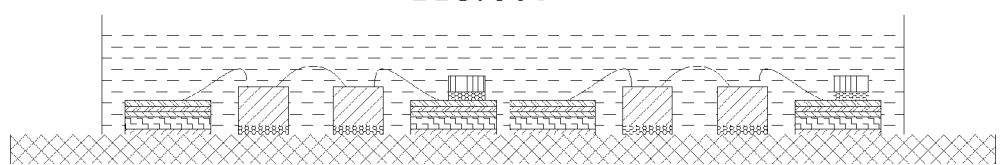
Figure 306:
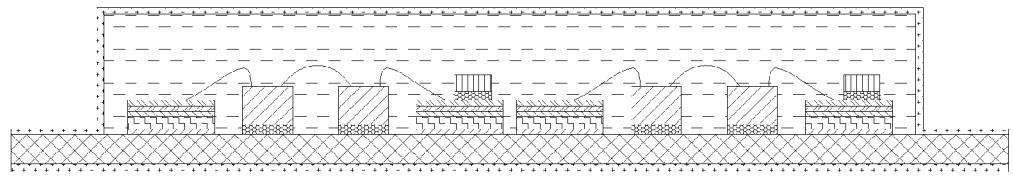
Figure 307:
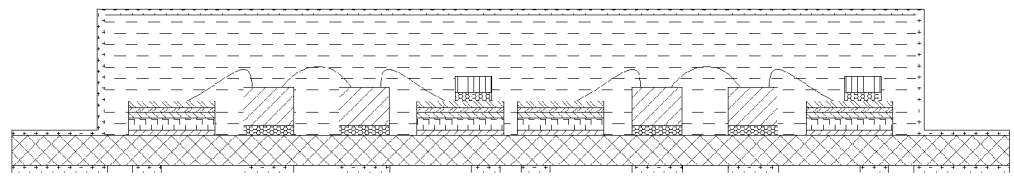
Figure 308:
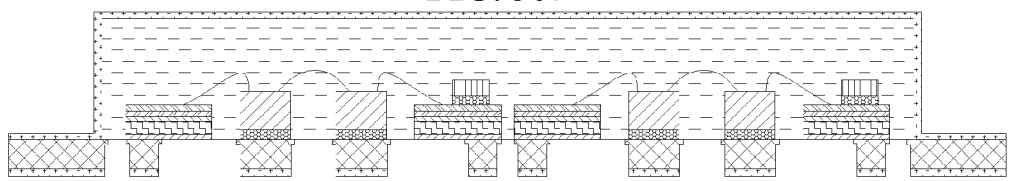
Figure 309:
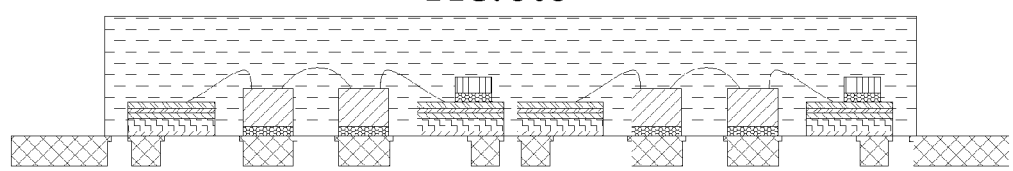
Figure 310:
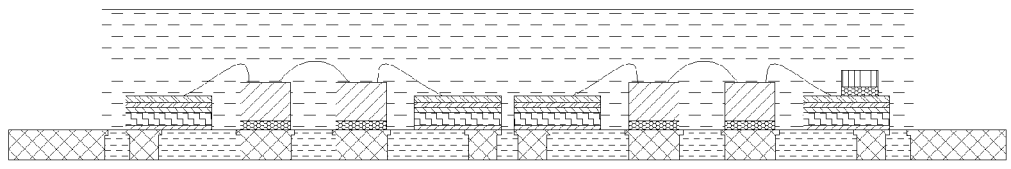
Figure 311:
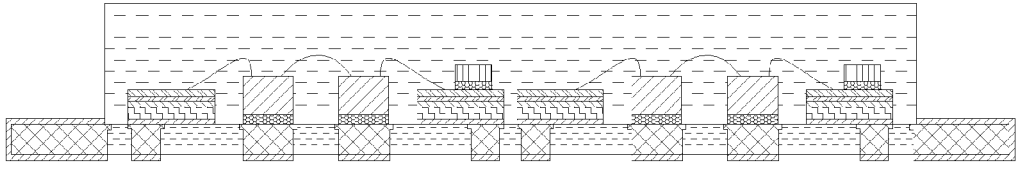
Figure 312:
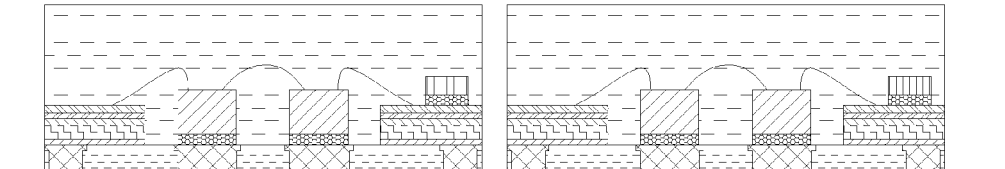
Figure 313:
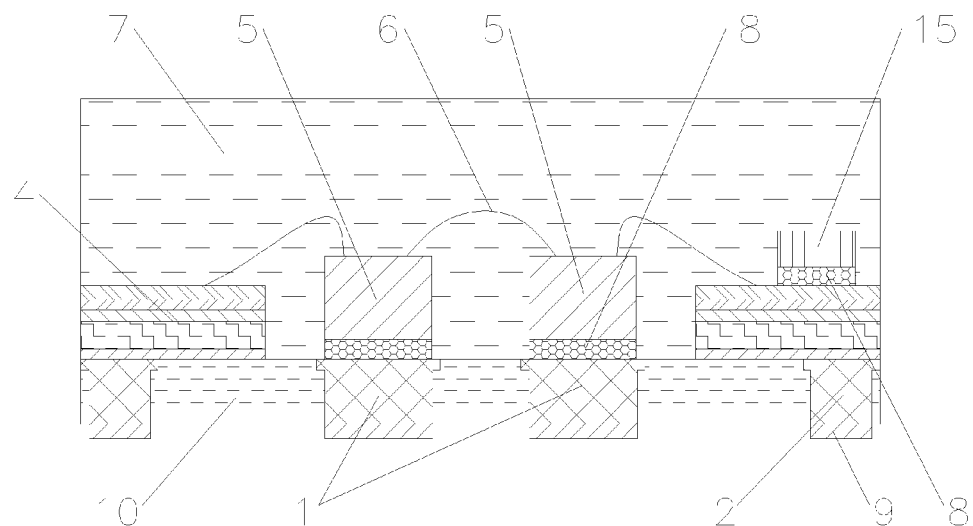
Figure 314:
Figure 315:
Figure 316:
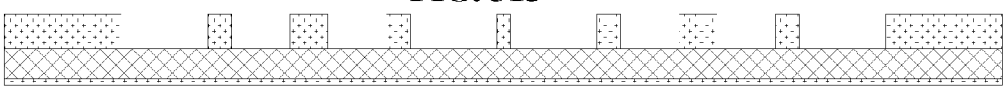
Figure 317:
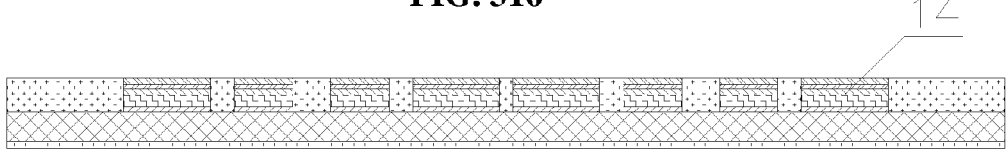
Figure 318:
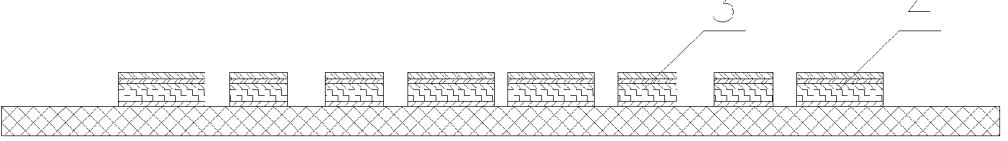
Figure 319:
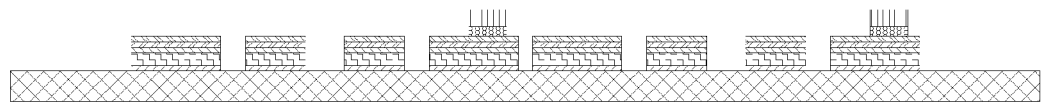
Figure 320:
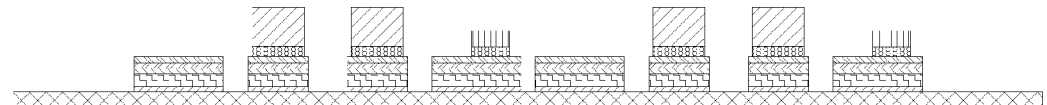
Figure 321:
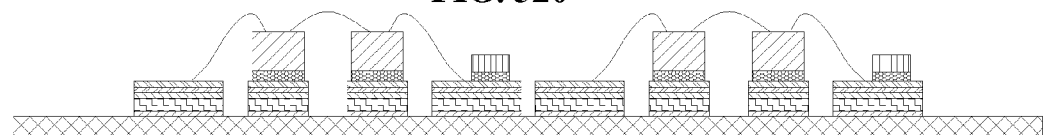
Figure 322:
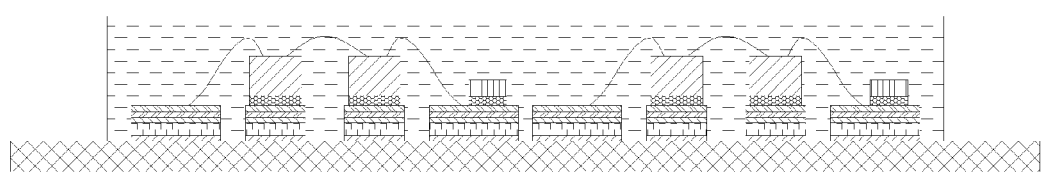
Figure 323:
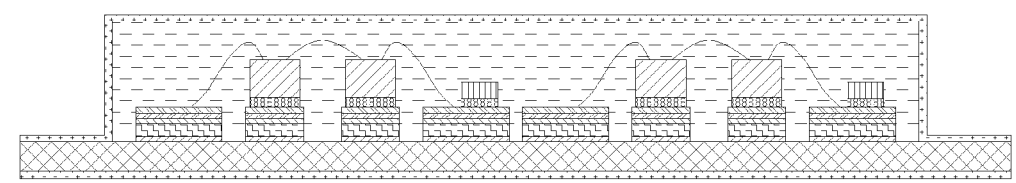
Figure 324:
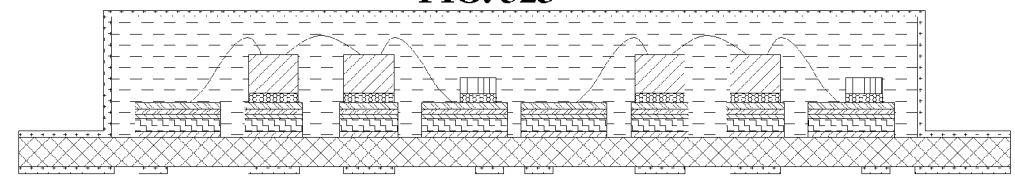
Figure 325:
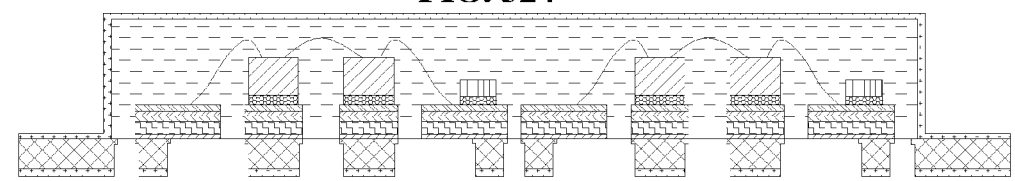
Figure 326:
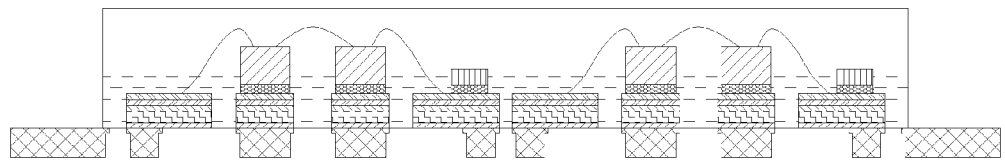
Figure 327:
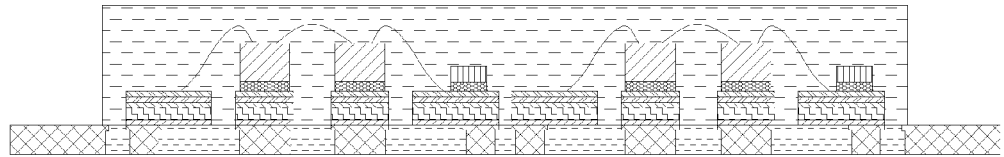
Figure 328:
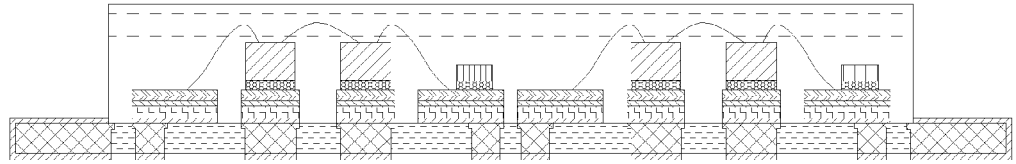
Figure 329:
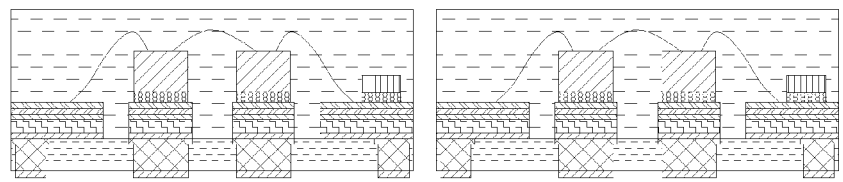
Figure 330:
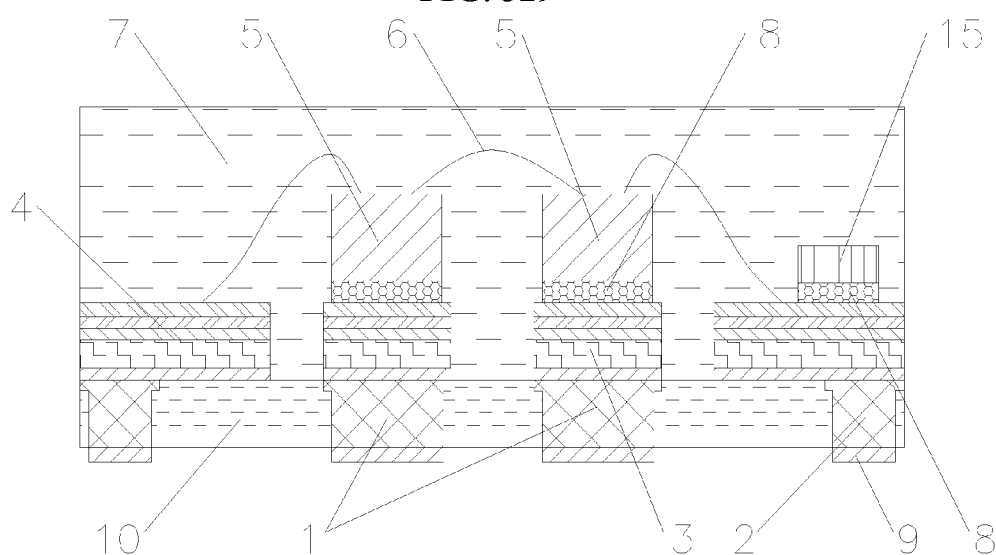
Figure 331:
Figure 332:
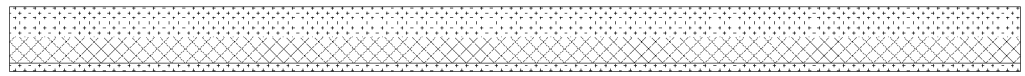
Figure 333:
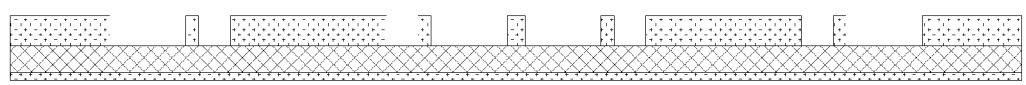
Figure 334:
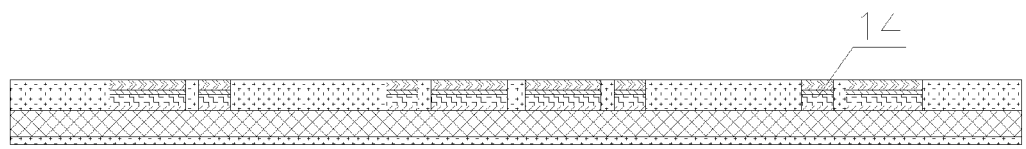
Figure 335:
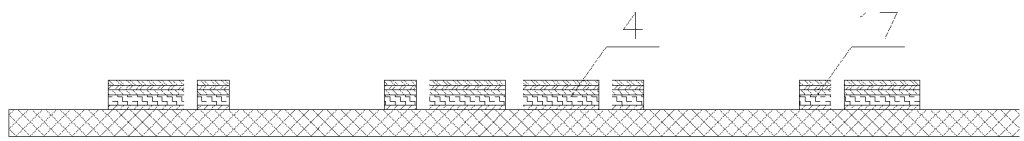
Figure 336:
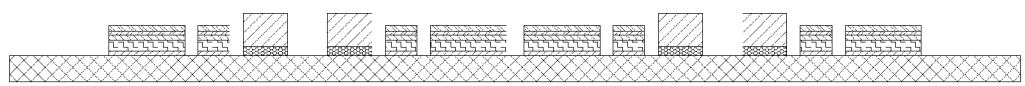
Figure 337:
Figure 338:
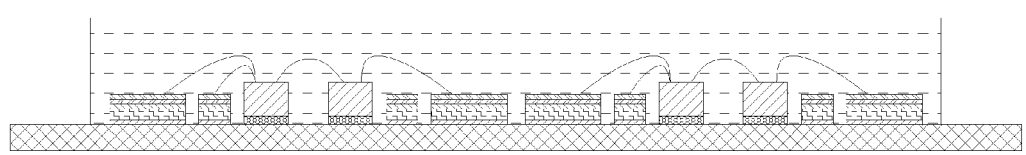
Figure 339:
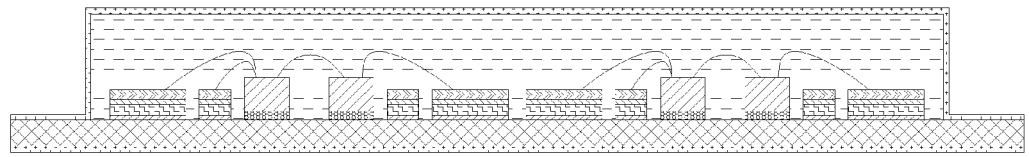
Figure 340:
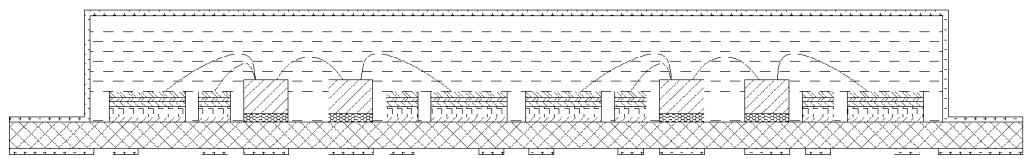
Figure 341:
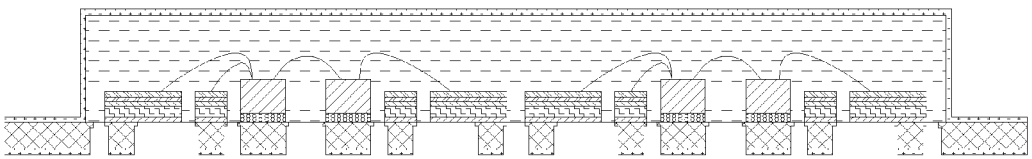
Figure 342:
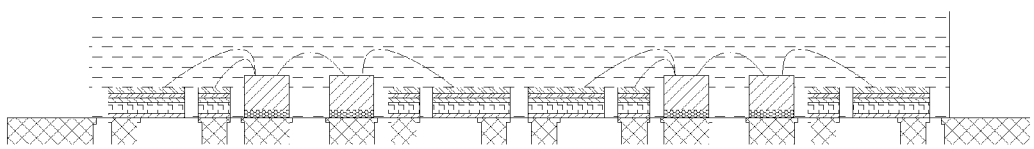
Figure 343:
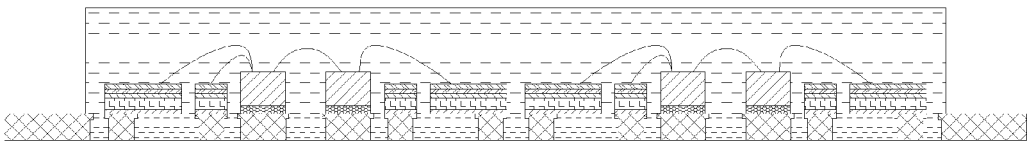
Figure 344:
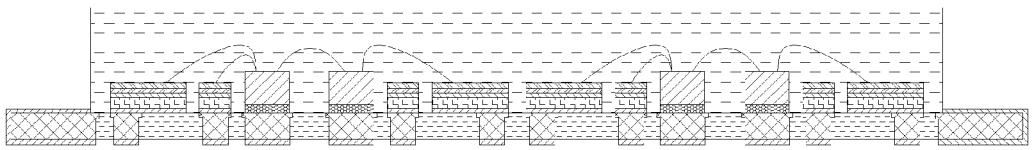
Figure 345:
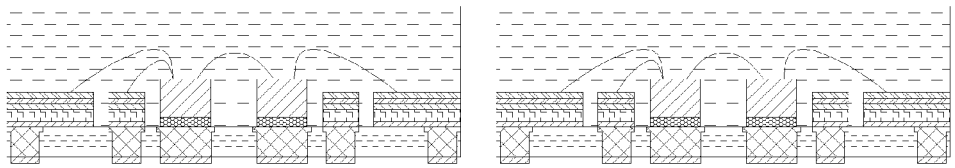
Figure 346:
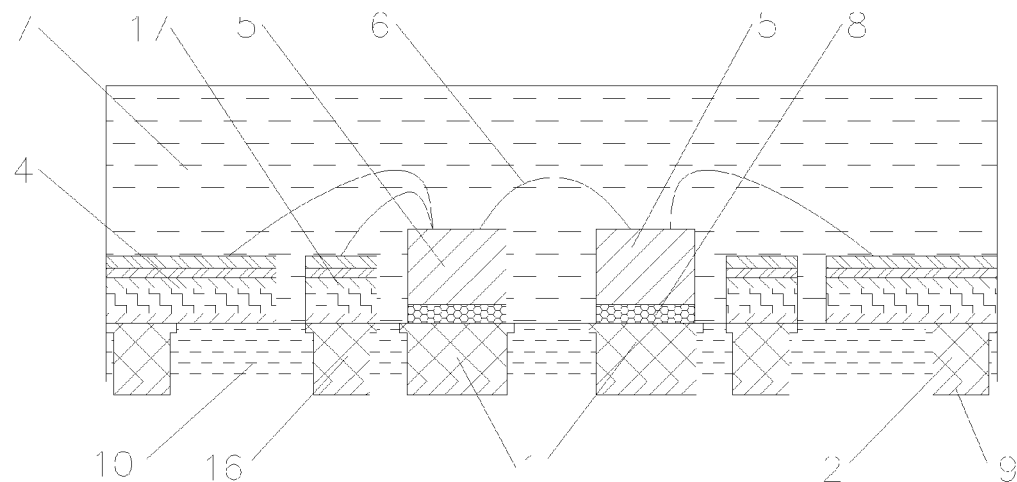
Figure 347:
Figure 348:
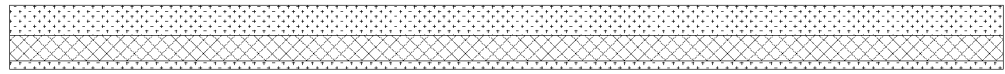
Figure 349:
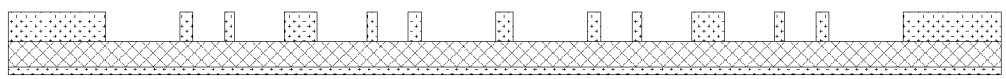
Figure 350:
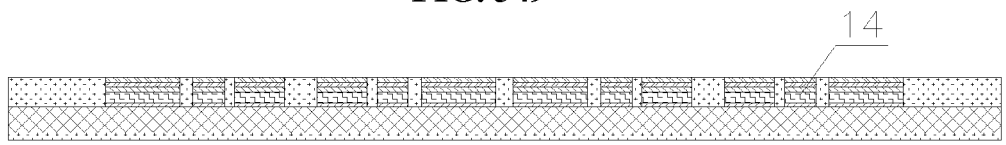
Figure 351:
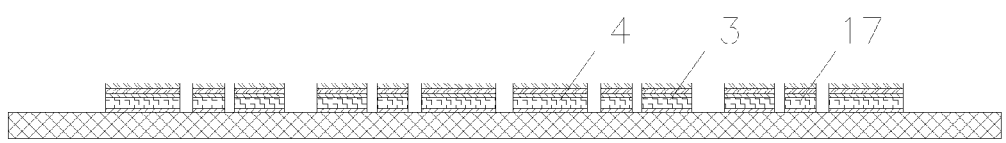
Figure 352:
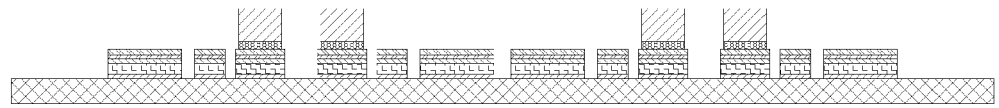
Figure 353:
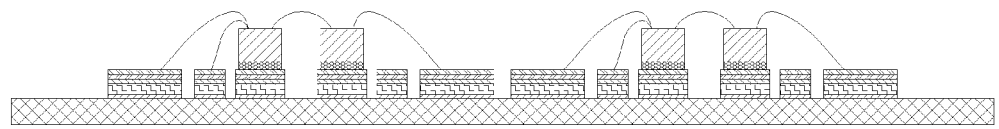
Figure 354:
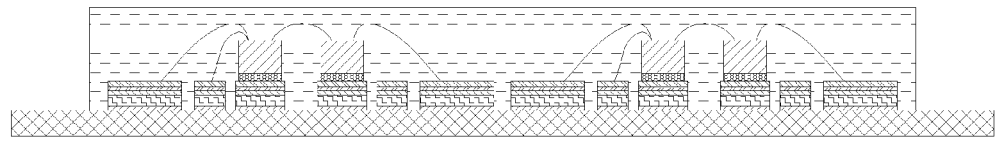
Figure 355:
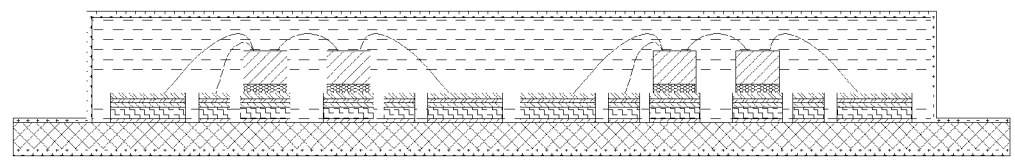
Figure 356:
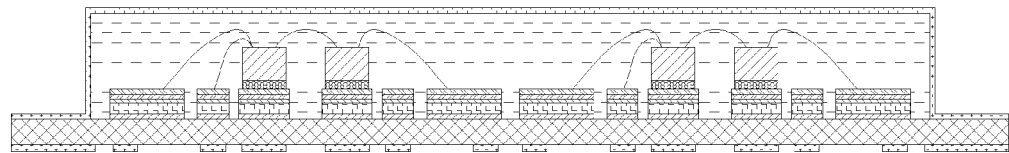
Figure 357:
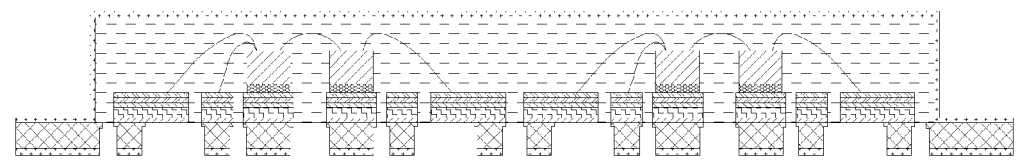
Figure 358:
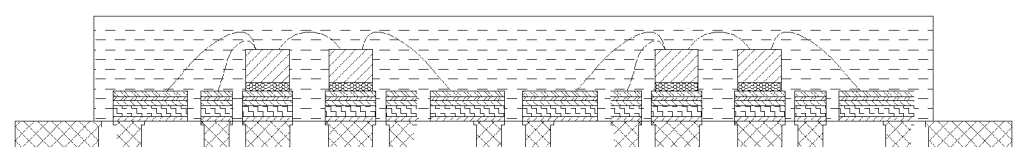
Figure 359:
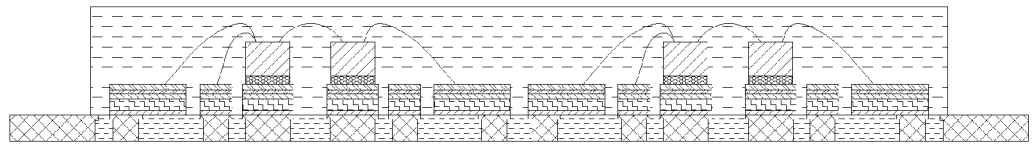
Figure 360:
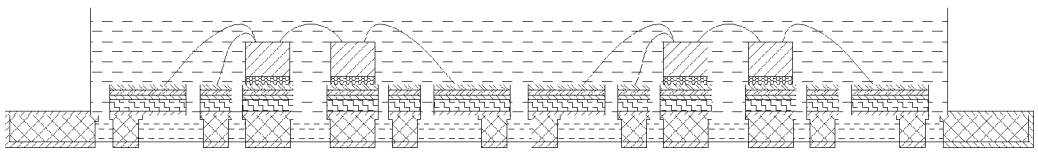
Figure 361:
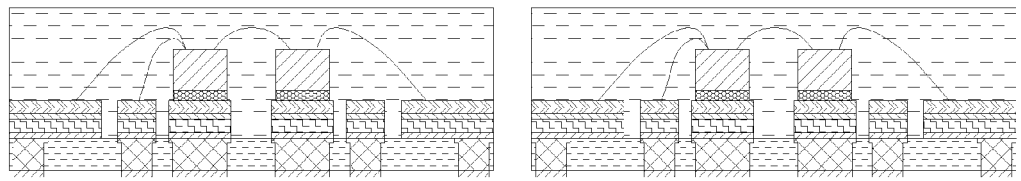
Figure 362:
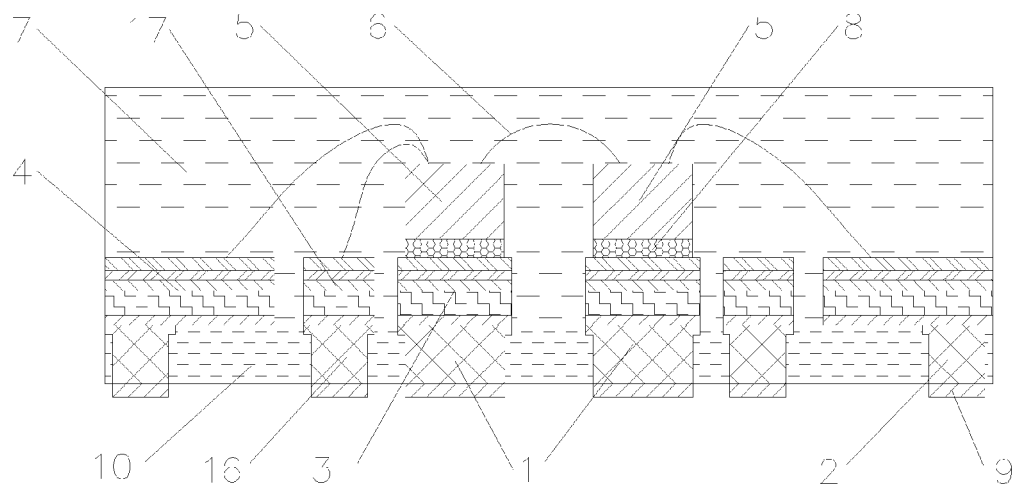
Figure 363:
Figure 364:
Figure 365:
Figure 366:
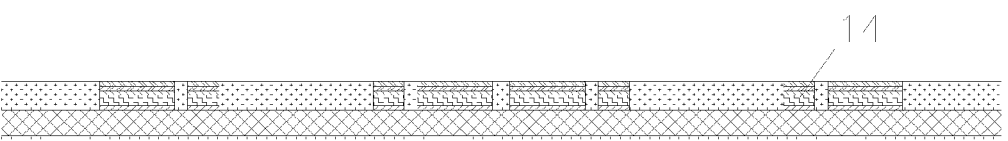
Figure 367:
Figure 368:
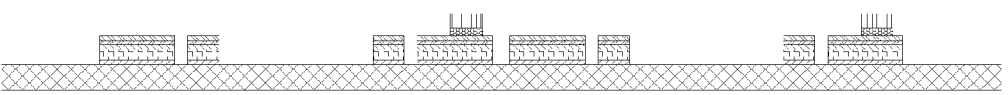
Figure 369:
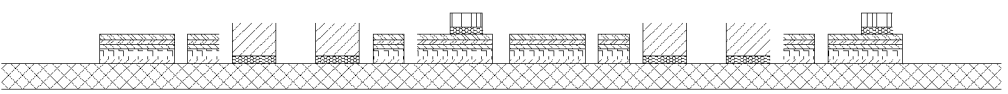
Figure 370:
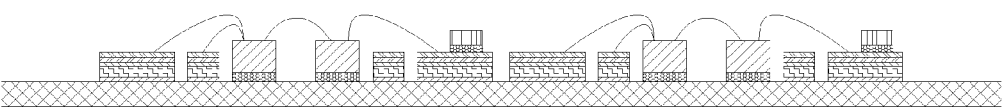
Figure 371:
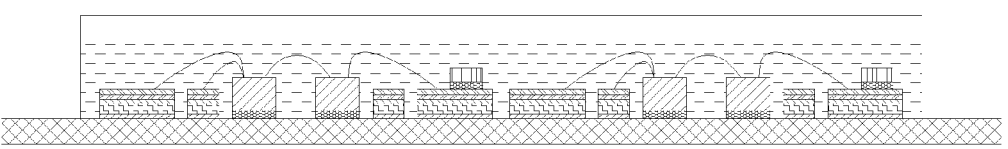
Figure 372:
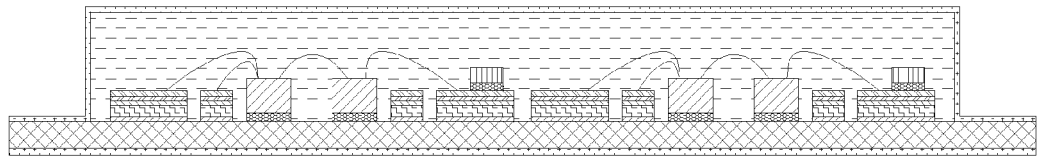
Figure 373:
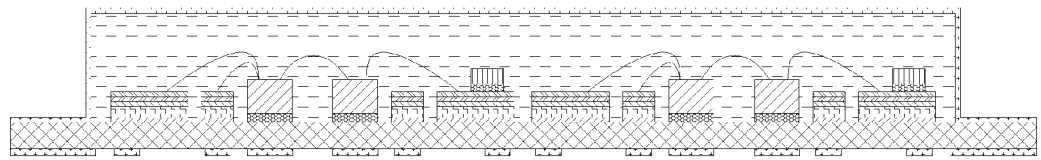
Figure 374:
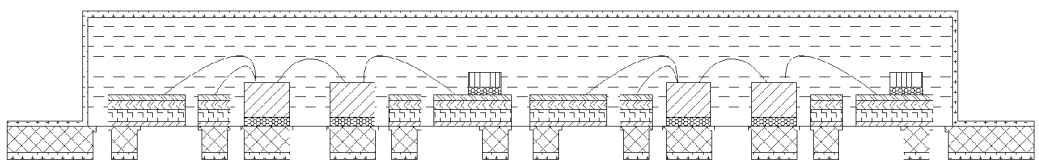
Figure 375:
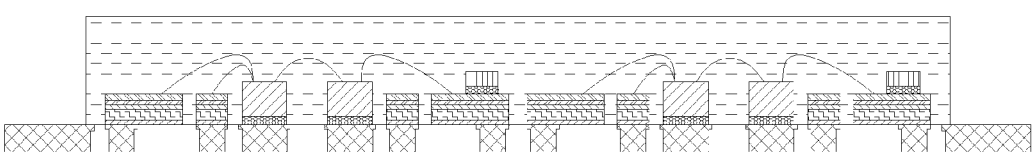
Figure 376:
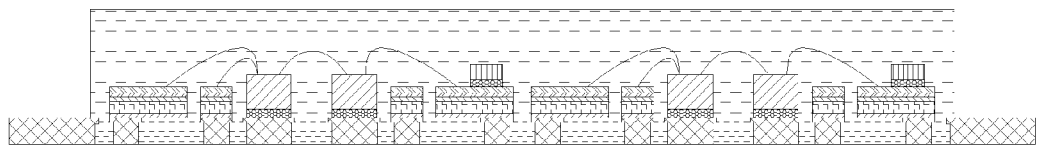
Figure 377:
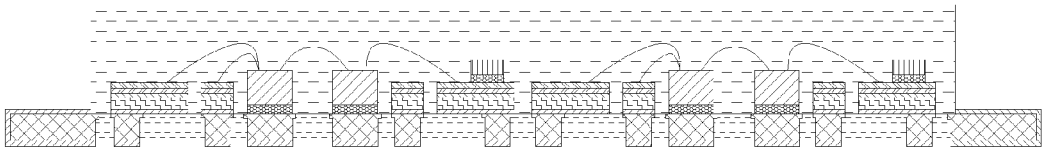
Figure 378:
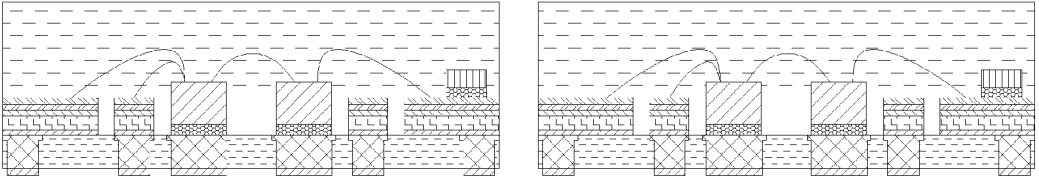
Figure 385:
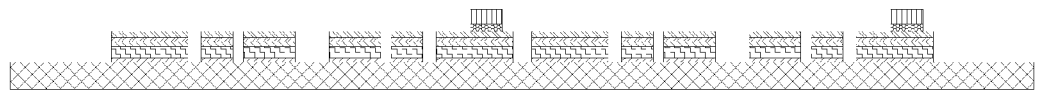
Figure 386:
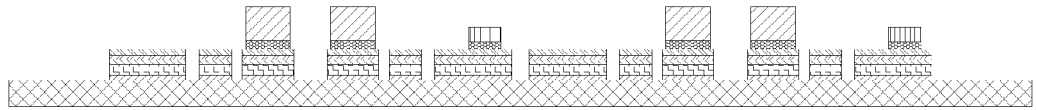
Figure 387:
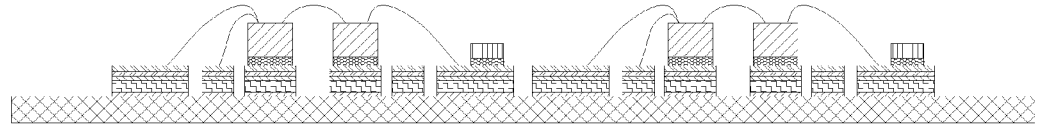
Figure 388:
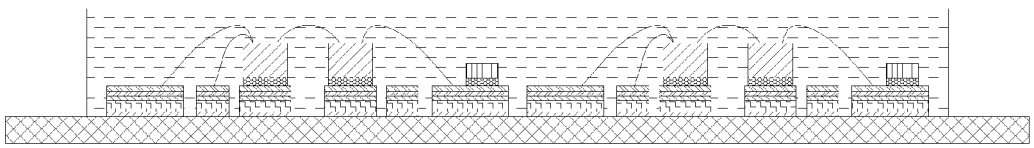
Figure 389:
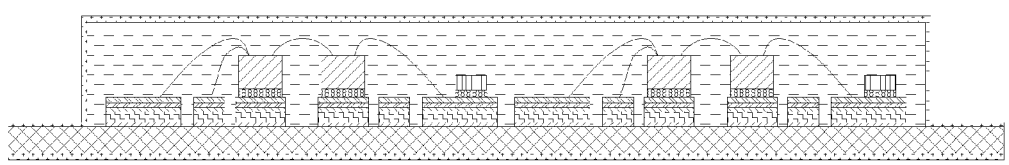
Figure 390:
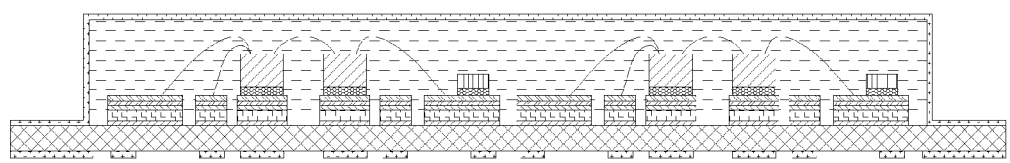
Figure 391:
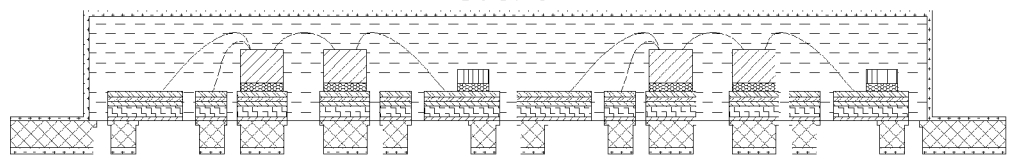
Figure 392:
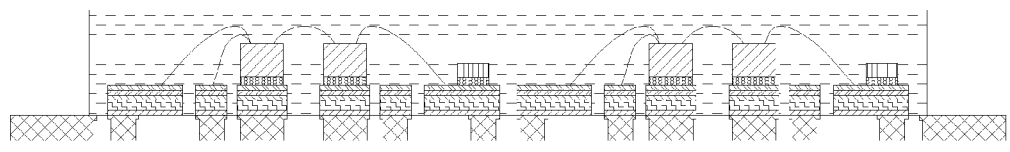
Figure 393:
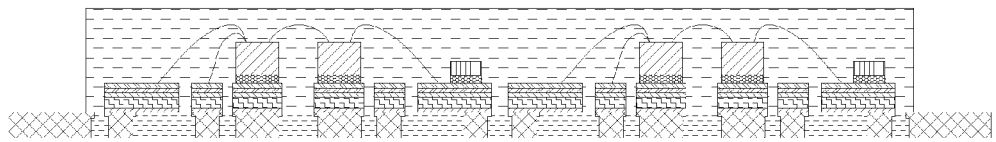
Figure 394:
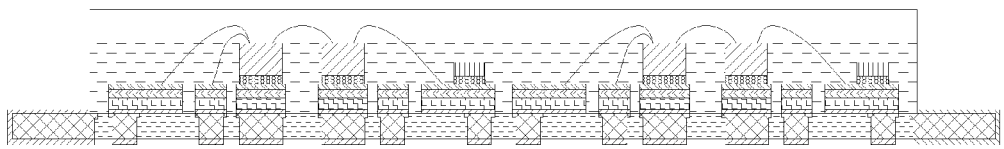
Figure 395:
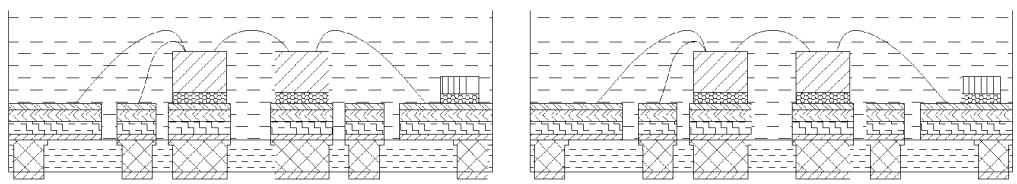
Figure 396:
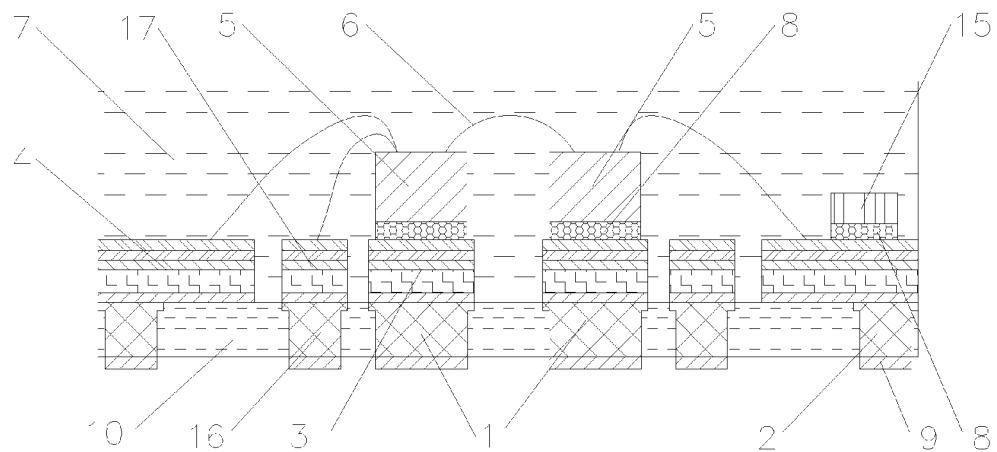
Figure 397:
Figure 398:
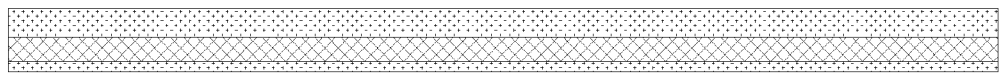
Figure 399:
Figure 400:
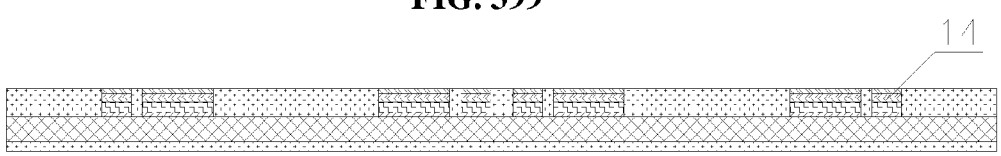
Figure 401:
Figure 402:
Figure 403:
Figure 404:
Figure 405:
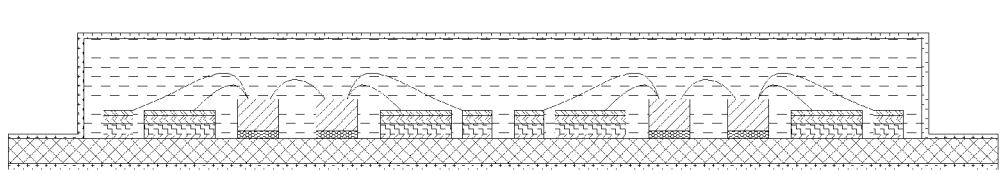
Figure 406:
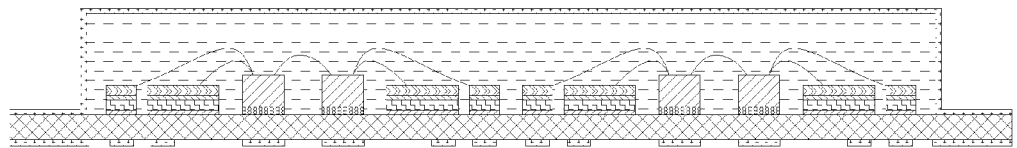
Figure 407:
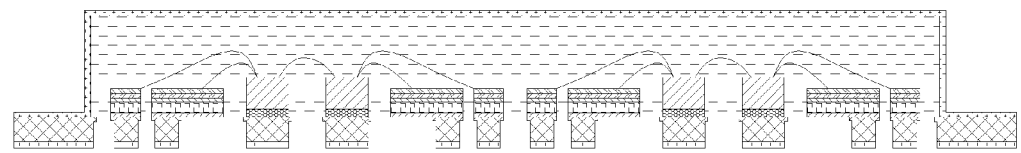
Figure 408:
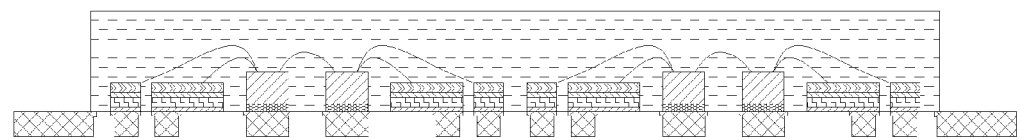
Figure 409:
Figure 410:
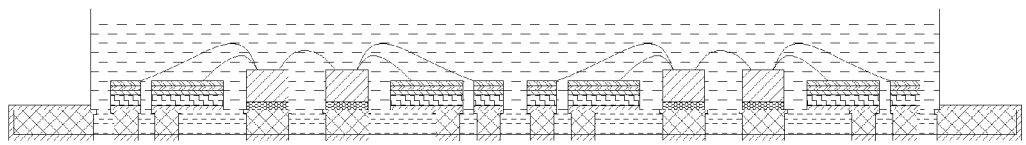
Figure 411:
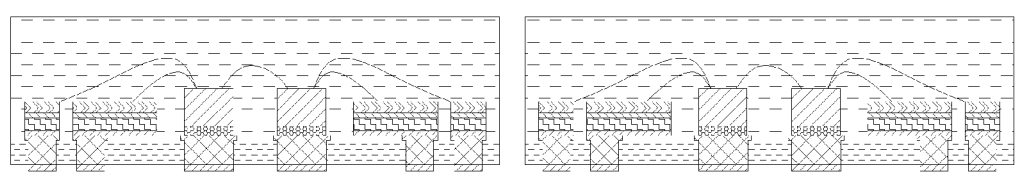
Figure 412:
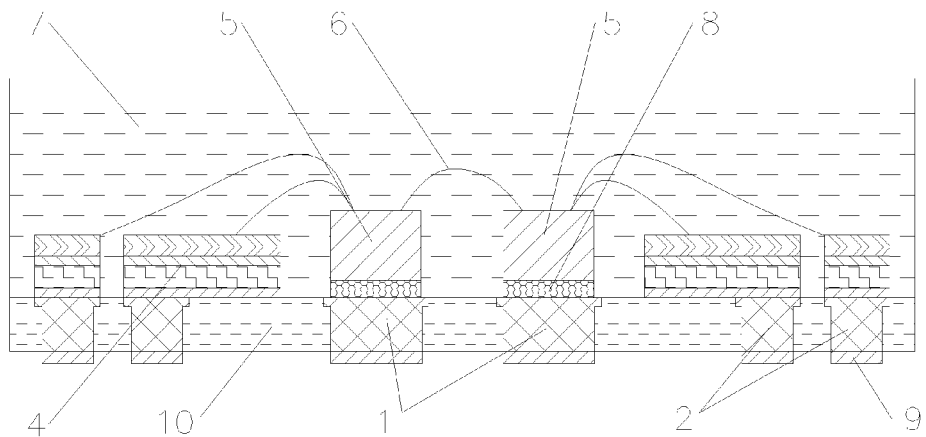
Figure 413:
Figure 414:
Figure 415:
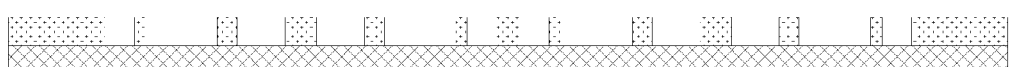
Figure 416:
Figure 417:
Figure 418:
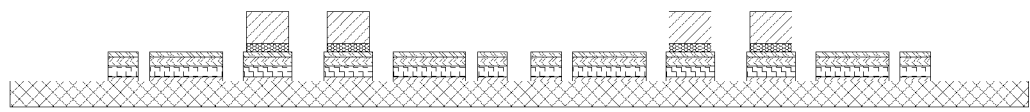
Figure 419:
Figure 420:
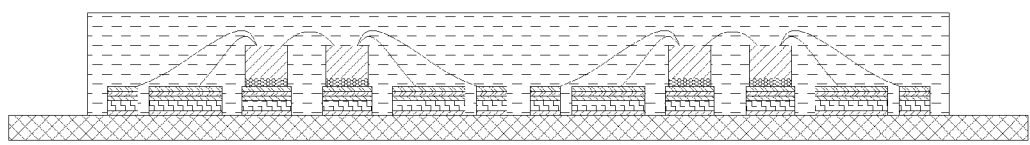
Figure 421:
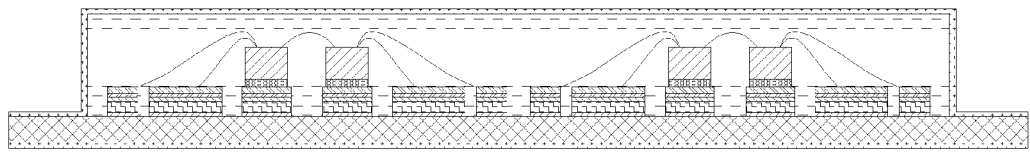
Figure 422:
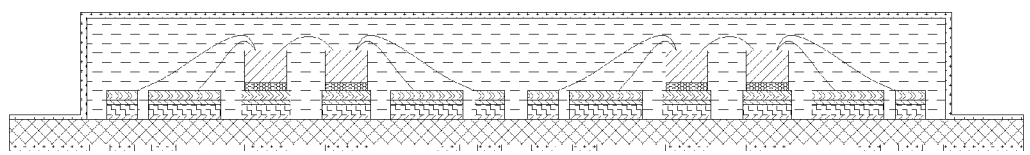
Figure 423:
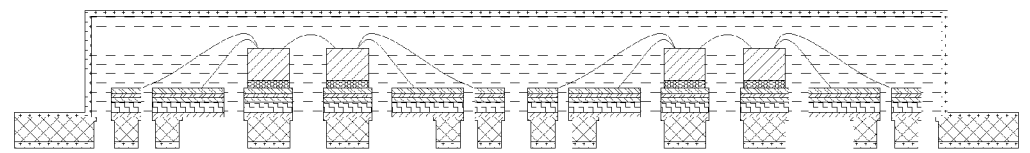
Figure 424:
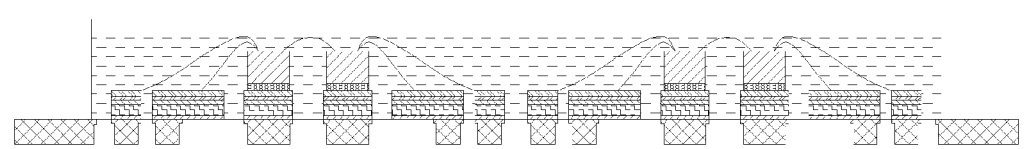
Figure 425:
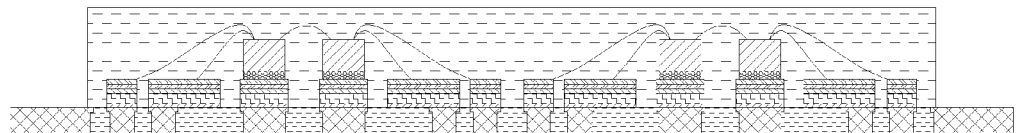
Figure 426:
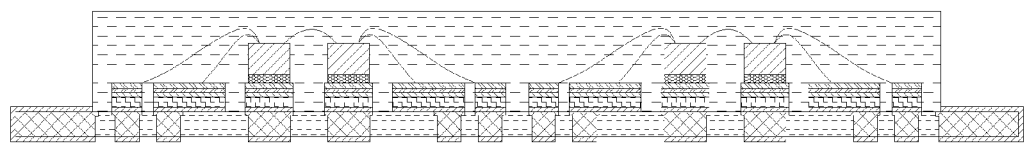
Figure 427:
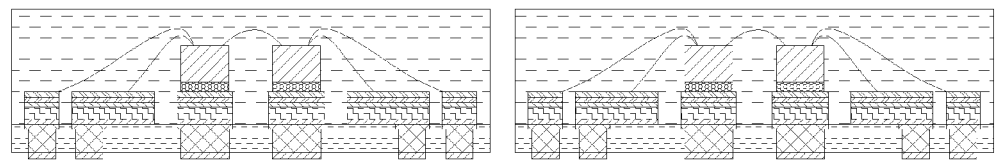
Figure 428:
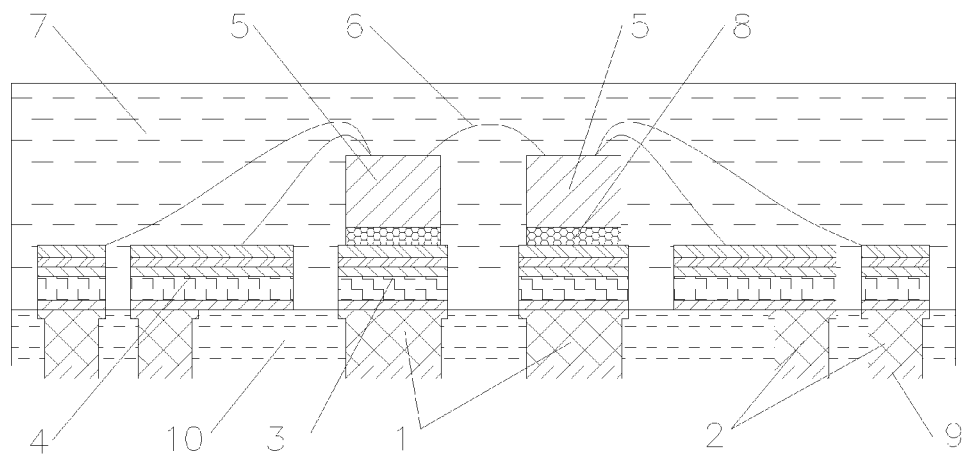
Figure 429:
Figure 430:
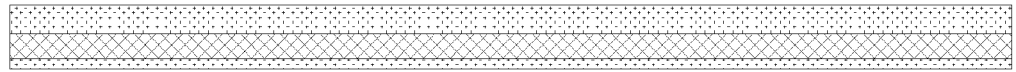
Figure 431:
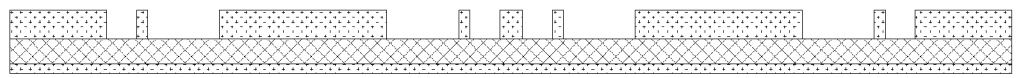
Figure 432:
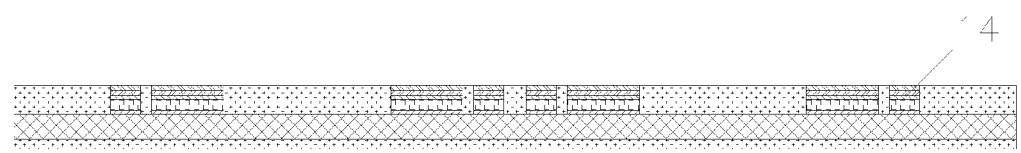
Figure 433:
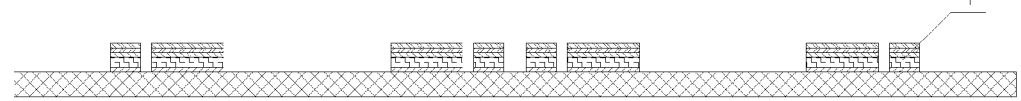
Figure 434:
Figure 435:
Figure 436:
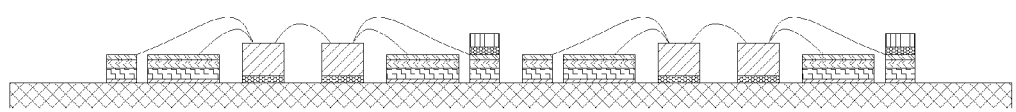
Figure 437:
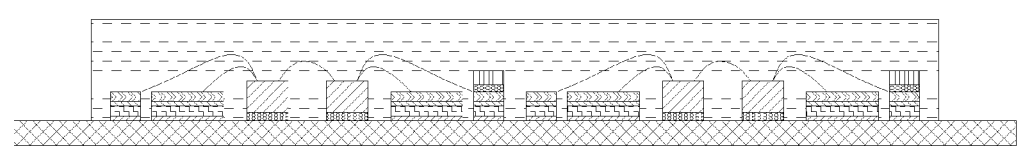
Figure 438:
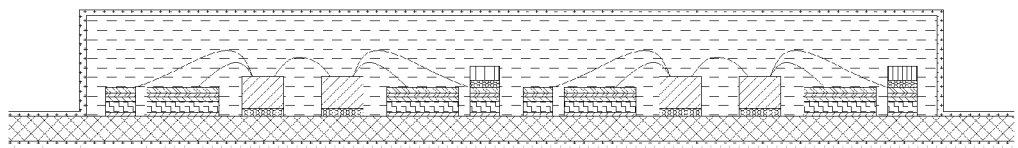
Figure 439:
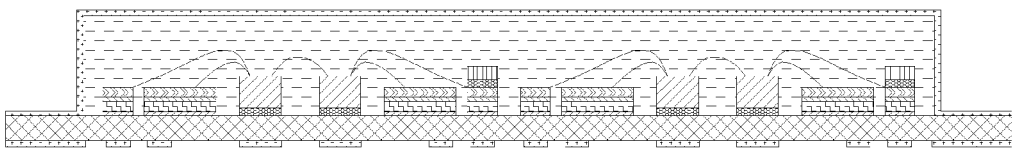
Figure 440:
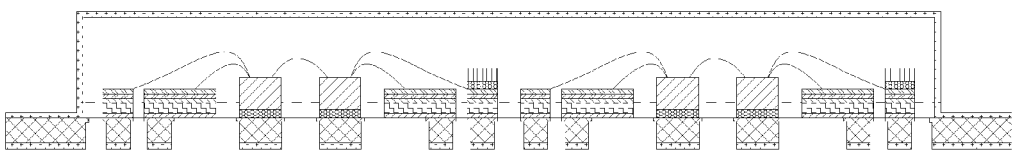
Figure 441:
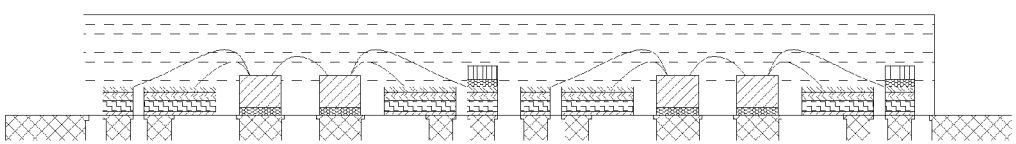
Figure 442:
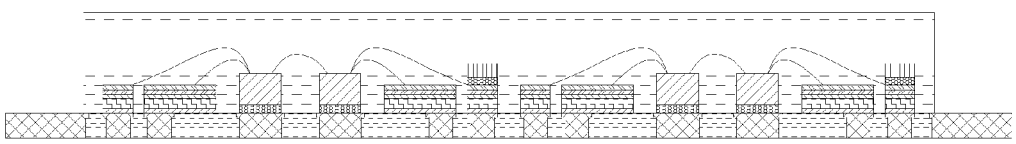
Figure 443:
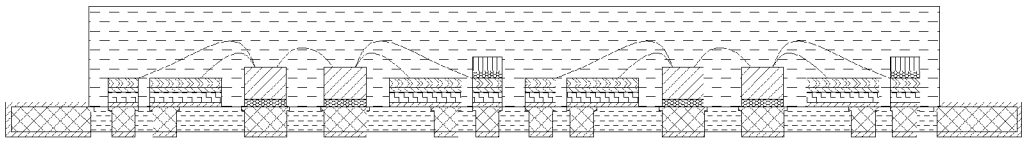
Figure 444:
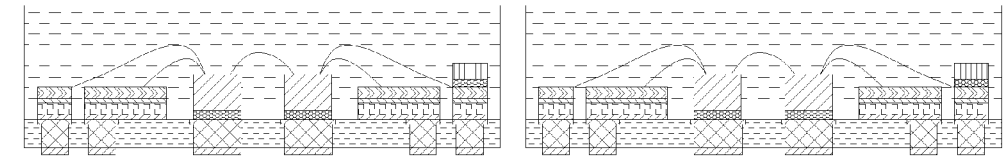
Figure 445:
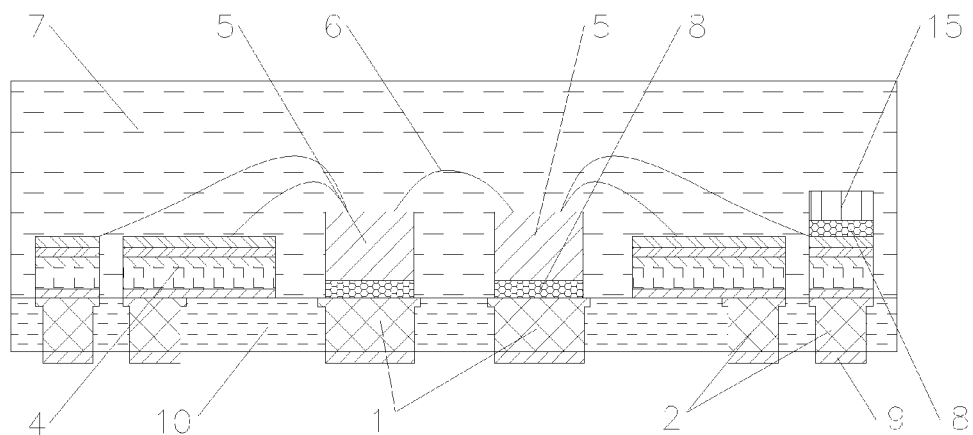
Figure 446:
Figure 447:
Figure 448:
Figure 449:
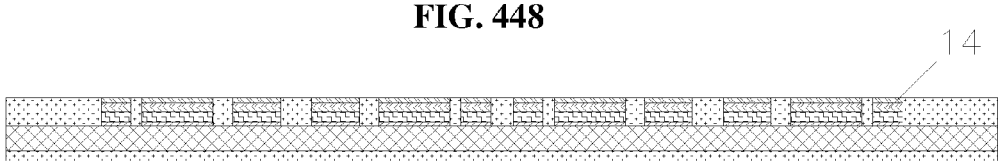
Figure 450:
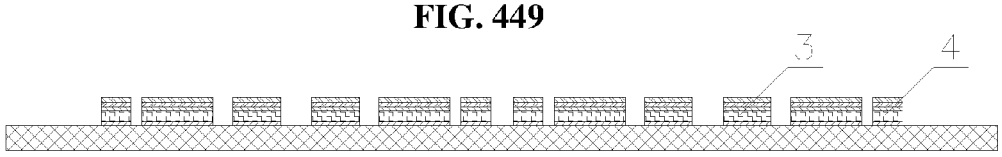
Figure 451:
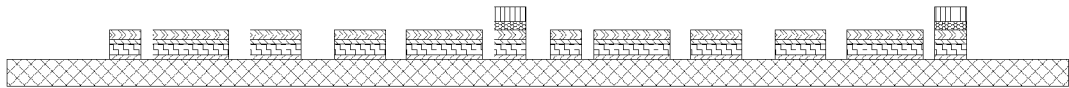
Figure 452:
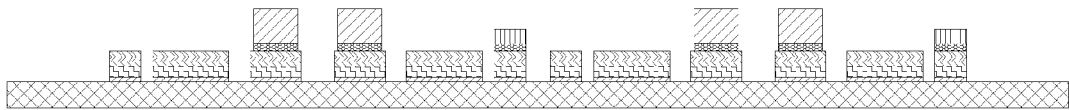
Figure 453:
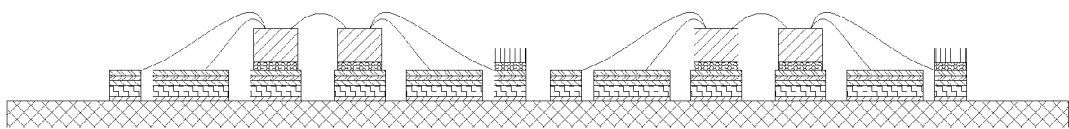
Figure 454:
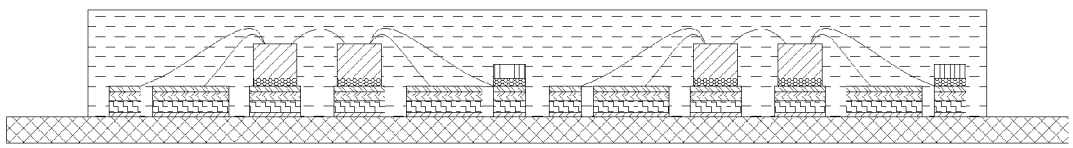
Figure 455:
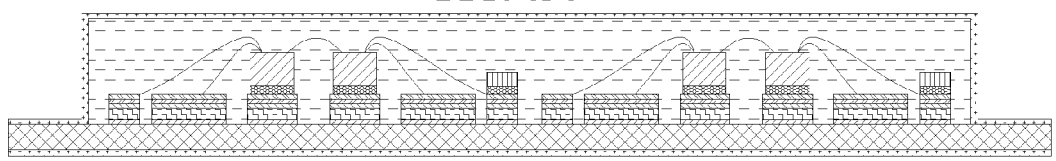
Figure 456:
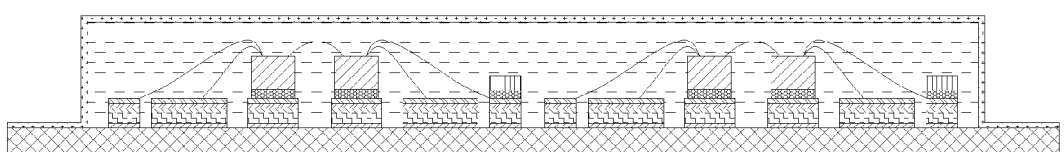
Figure 457:
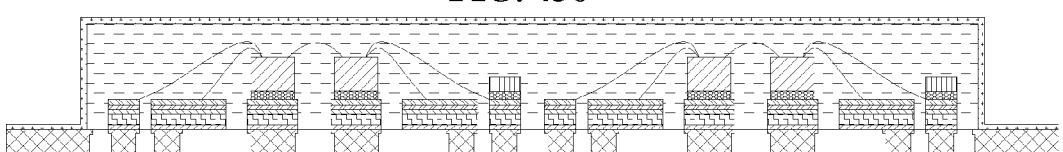
Figure 458:
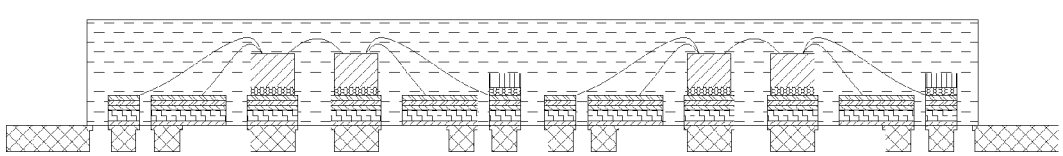
Figure 459:
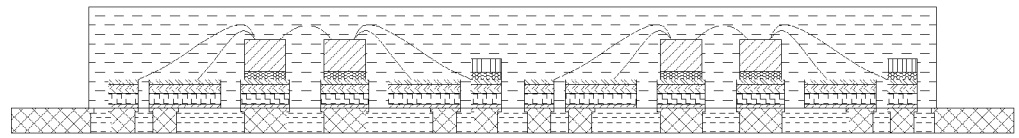
Figure 460:
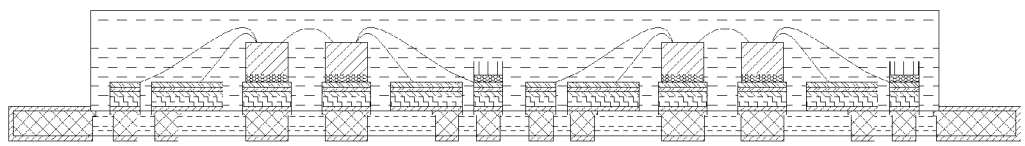
Figure 461:
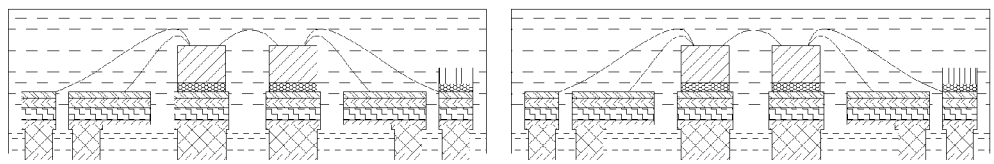
Figure 462:
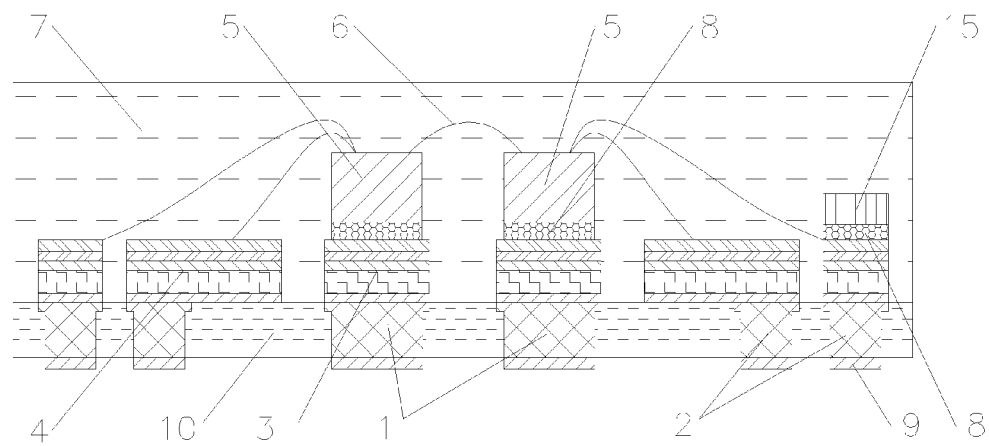
Figure 463:
Figure 464:
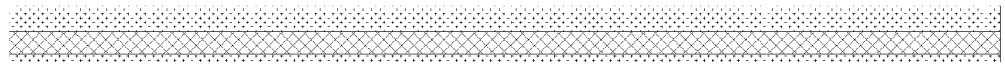
Figure 465:
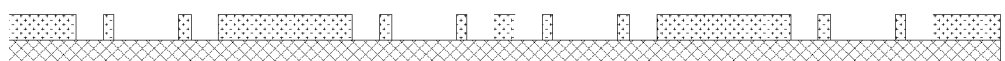
Figure 466:
Figure 467:
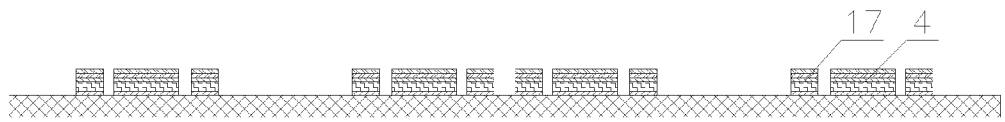
Figure 468:
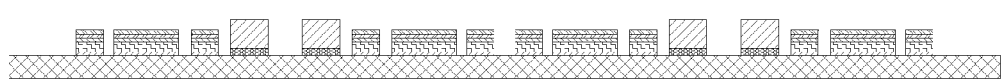
Figure 469:
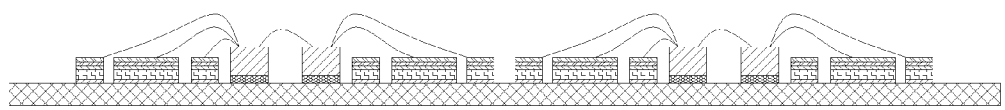
Figure 470:
Figure 471:
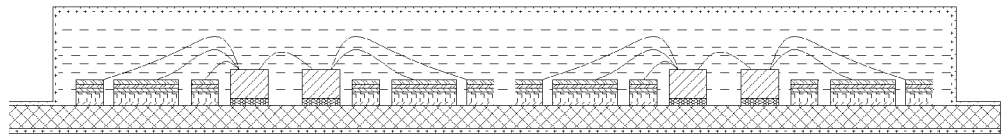
Figure 472:
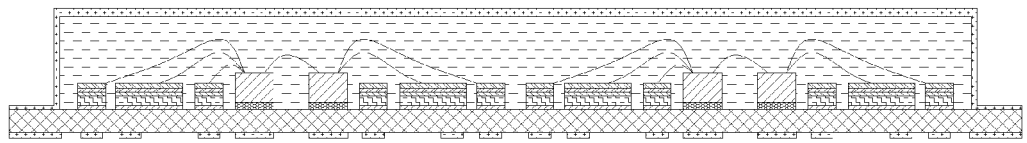
Figure 473:
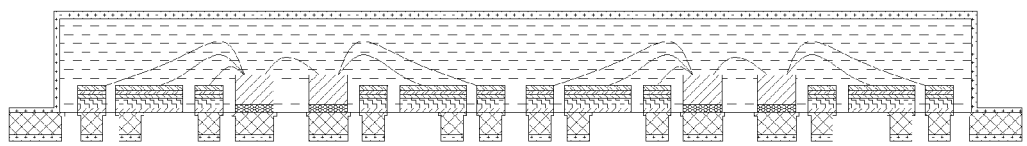
Figure 474:
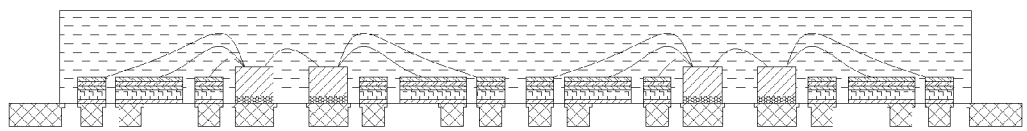
Figure 475:
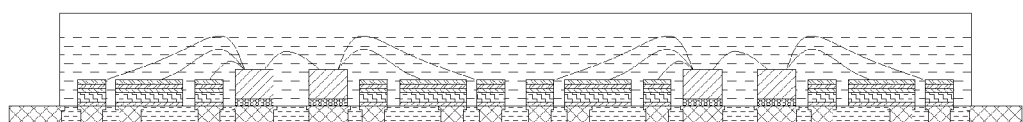
Figure 476:
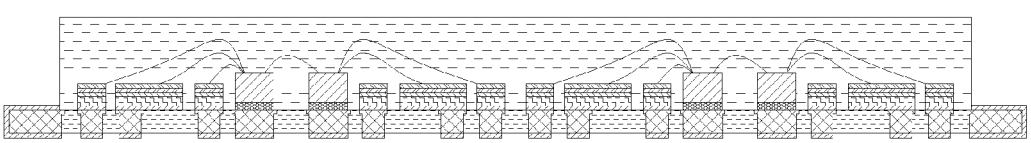
Figure 477:
Figure 478:
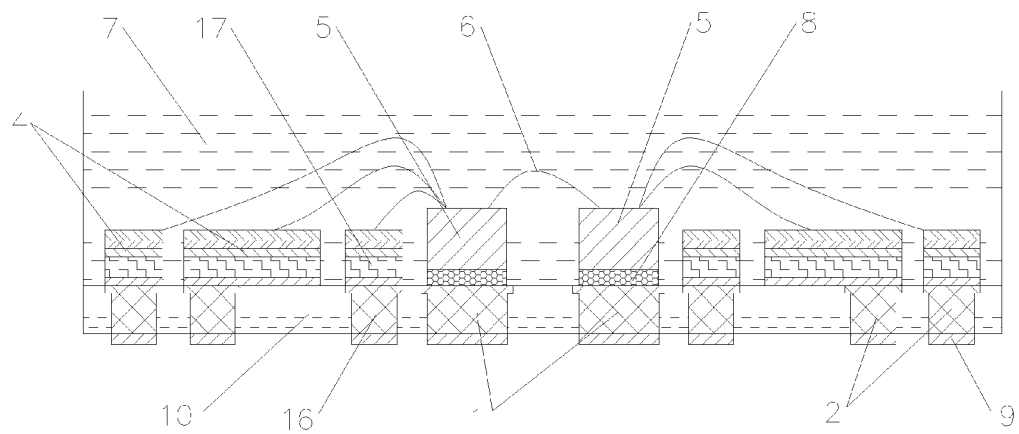
Figure 479:
Figure 480:
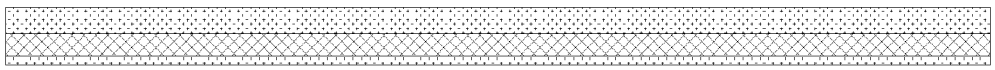
Figure 481:
Figure 482:
Figure 483:
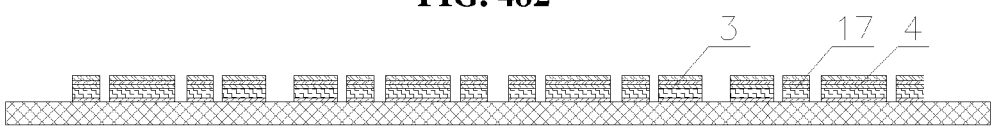
Figure 484:
Figure 485:
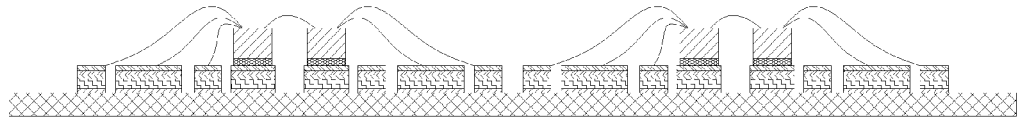
Figure 486:
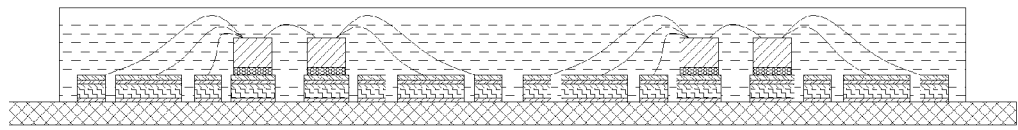
Figure 487:
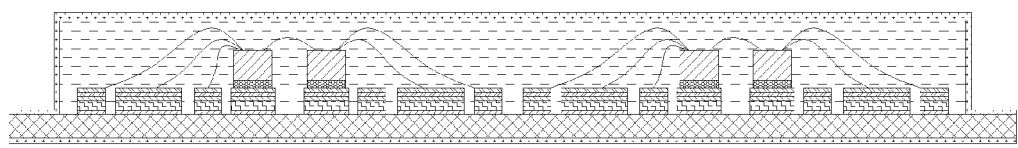
Figure 488:
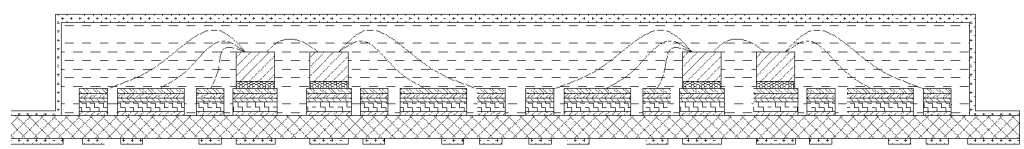
Figure 489:
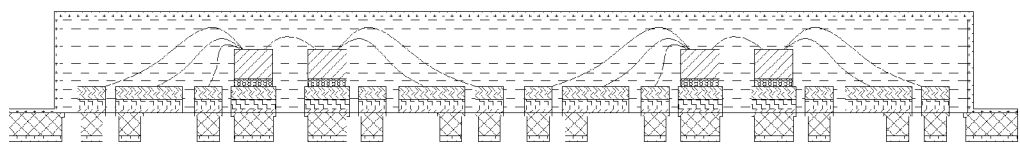
Figure 490:
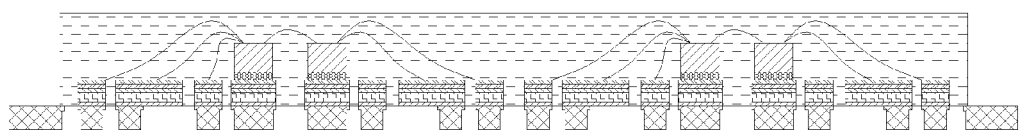
Figure 491:
Figure 492:
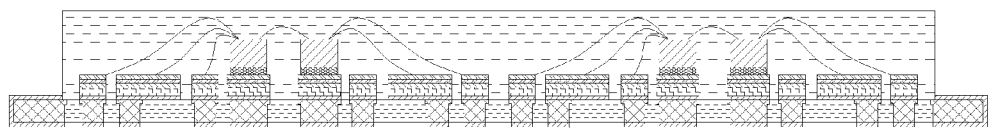
Figure 493:
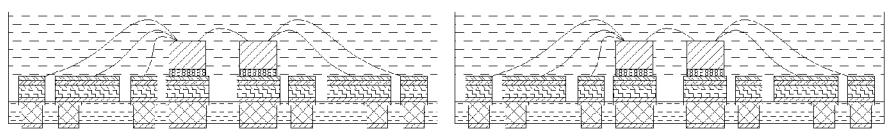
Figure 494:
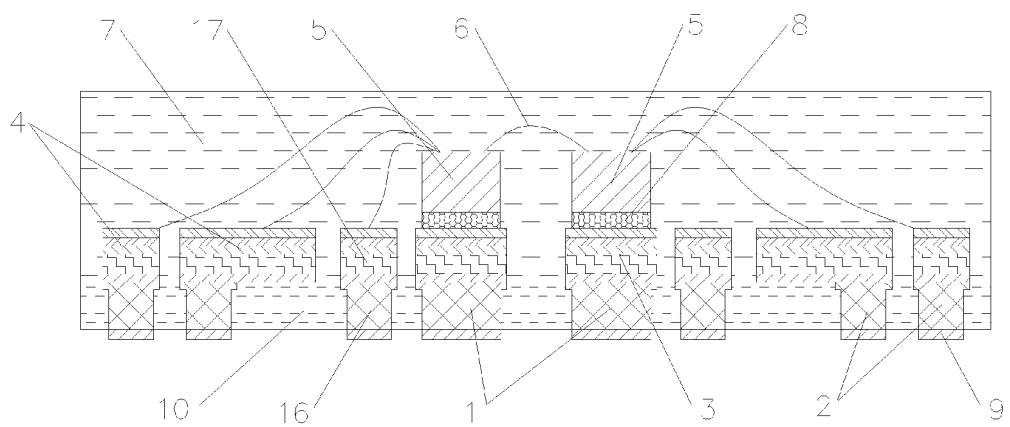
Figure 495:
Figure 496:
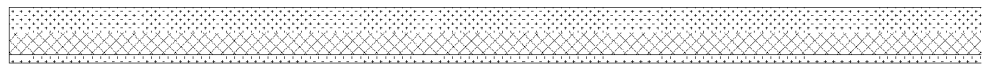
Figure 497:
Figure 498:
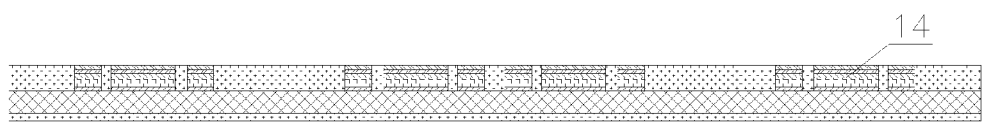
Figure 499:
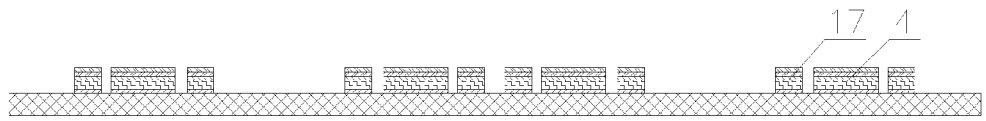
Figure 500:
Figure 501:
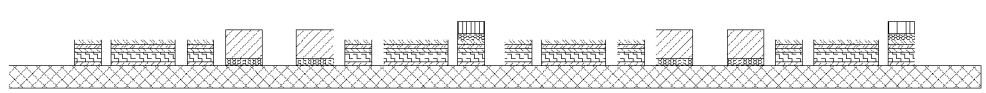
Figure 502:
Figure 503:
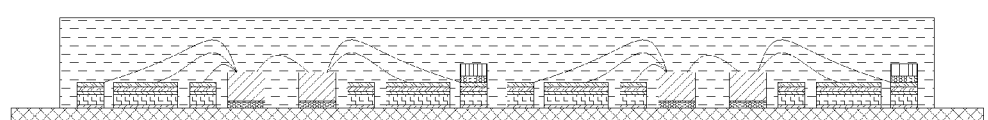
Figure 504:
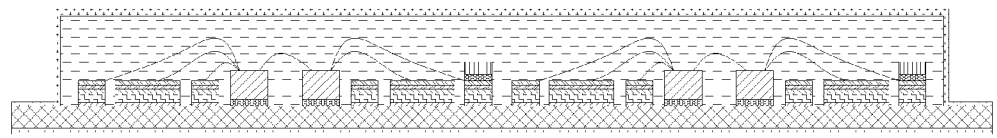
Figure 505:
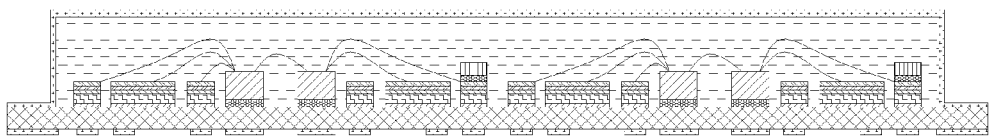
Figure 506:
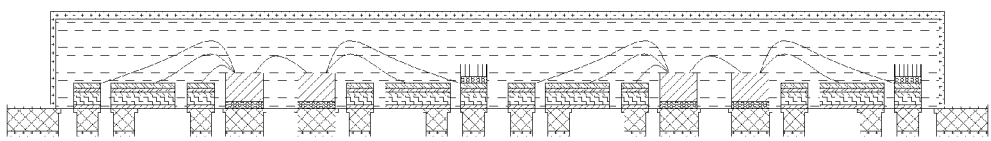
Figure 507:
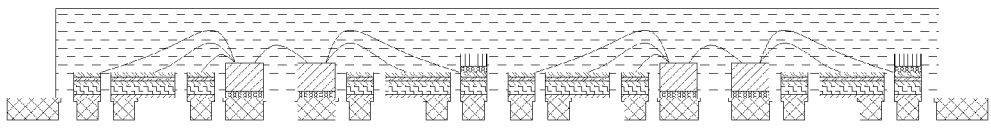
Figure 508:
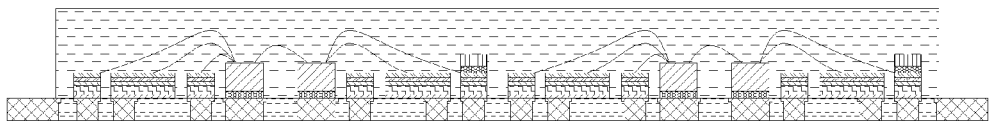
Figure 509:
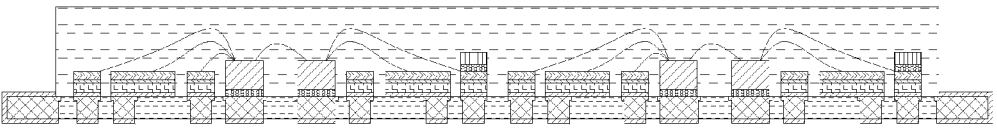
Figure 510:
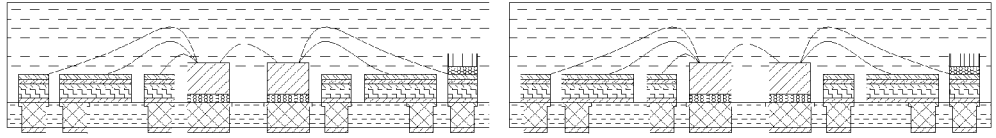
Figure 511:
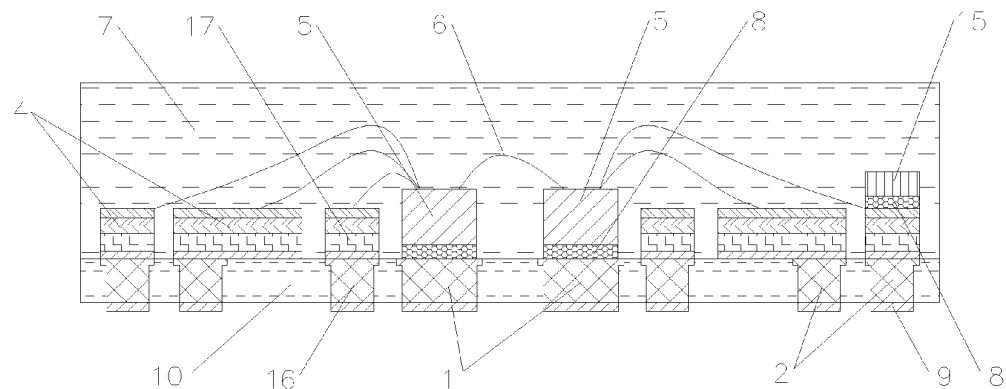
Figure 512:
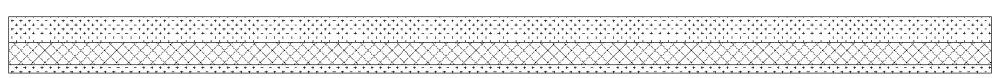
Figure 513:
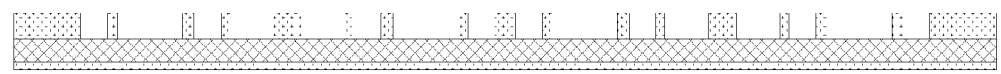
Figure 514:
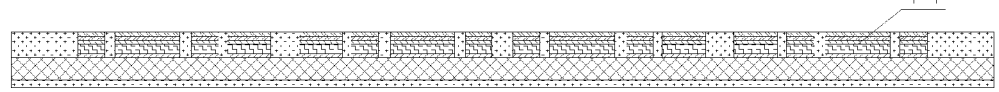
Figure 515:
Figure 517:
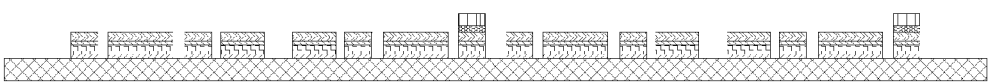
Figure 518:
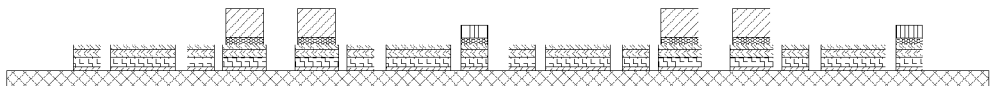
Figure 519:
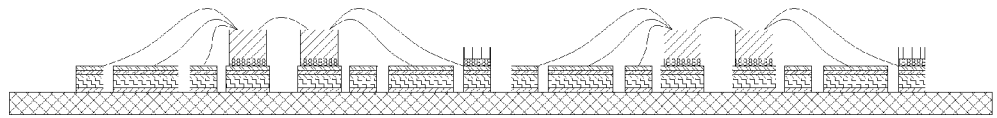
Figure 520:
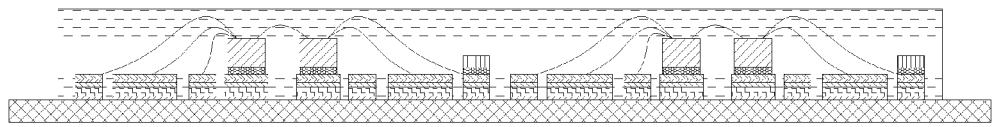
Figure 521:
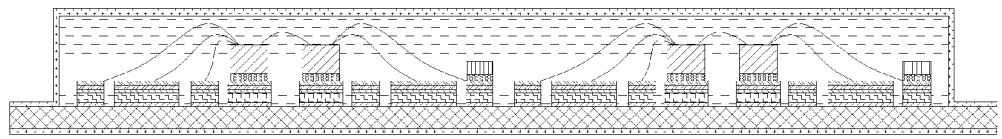
Figure 522:
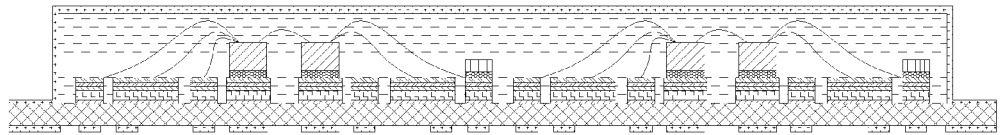
Figure 523:
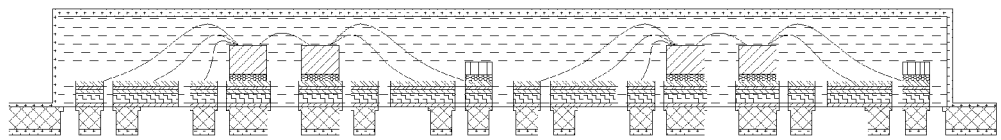
Figure 524:
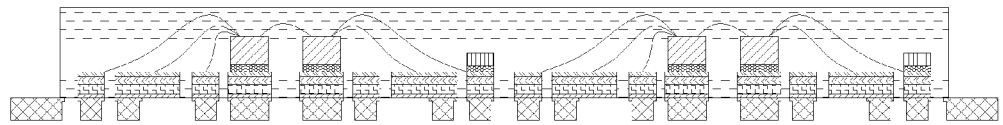
Figure 525:
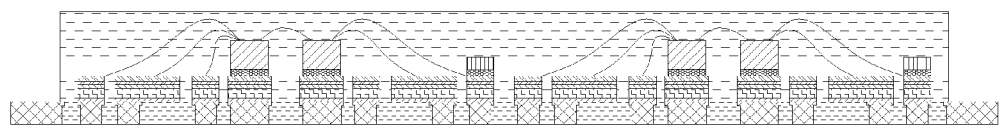
Figure 526:
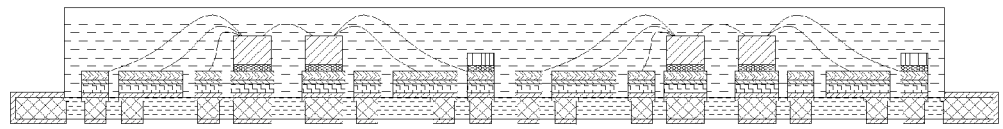
Figure 527:
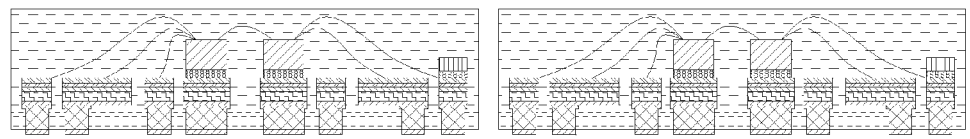
Figure 528:
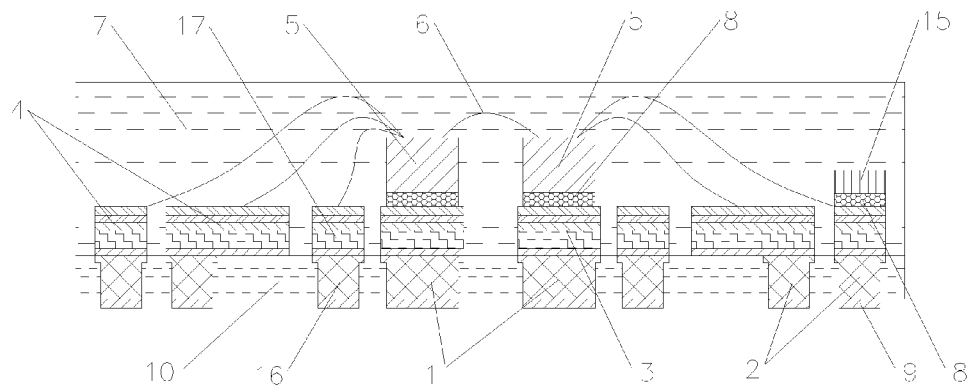
Figure 529:
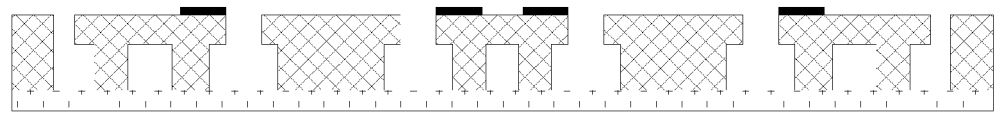
Figure 530:
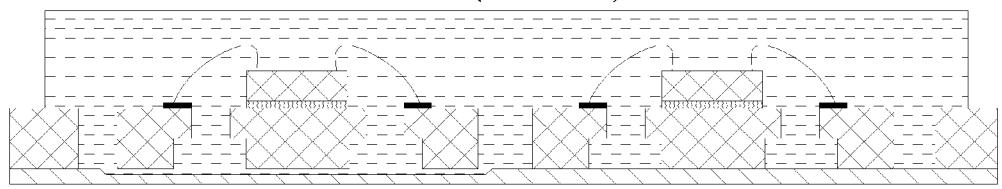
Figure 531:
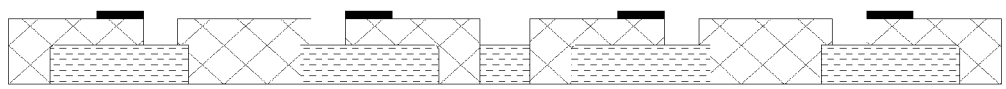

FIG. 132 is a cross-sectional view of another exemplary QFN packaging structure in accordance with one embodiment of the invention;

FIG. 133 illustrates a step of an exemplary process for manufacturing another exemplary QFN packaging structure in accordance with one embodiment of the invention in which a metal substrate is provided for the lead frame manufacturing and packaging process;

FIG. 134 illustrates another step of the exemplary process for manufacturing the exemplary QFN packaging structure in which layers of photoresist film are formed on the top surface and the back surface of the metal substrate, respectively;

FIG. 135 illustrates another step of the exemplary process for manufacturing the exemplary QFN packaging structure in which portions of the photoresist film on the top surface of the metal substrate are removed to form a pattern by photolithography;

FIG. 136 illustrates another step of the exemplary process for manufacturing the exemplary QFN packaging structure in which a multi-layer plating process is performed to form a first metal layer containing an inner die pad and inner leads arranged in a multiple ring configuration in the areas of the metal substrate exposed by the plating pattern in the photoresist film;

FIG. 137 illustrates another step of the exemplary process for manufacturing the exemplary QFN packaging structure in which the remaining photoresist film on the top surface of the metal substrate is removed and inner leads are formed on the metal substrate;

FIG. 138 illustrates another step of the exemplary process for manufacturing the exemplary QFN packaging structure in which a die is attached on a predetermined die area of the metal substrate in a die attaching process;

FIG. 139 illustrates another step of the exemplary process for manufacturing the exemplary QFN packaging structure in which the top surface of the die and the top surface of the inner leads are connected with metal wires in a wire bonding process;

FIG. 140 illustrates another step of the exemplary process for manufacturing the exemplary QFN packaging structure in which the inner leads, the die, and the metal wires are encapsulated using an encapsulation material;

FIG. 141 illustrates another step of the exemplary process for manufacturing the exemplary QFN packaging structure in which a layer of photoresist film is formed on the top surface of the metal substrate and another layer of photoresist film is formed on the back surface of the metal substrate;

FIG. 142 illustrates another step of the exemplary process for manufacturing the exemplary QFN packaging structure in which exposure, development, and etching are carried out on the photoresist film formed on the back surface of the metal substrate to form an etching pattern in the photoresist film;

FIG. 143 illustrates another step of the exemplary process for manufacturing the exemplary QFN packaging structure in which an etching process is performed on the areas of the metal substrate exposed by the etching pattern in the photoresist film on the back surface of the metal substrate to form etched areas, an outer die pad, and I/O pads;

FIG. 144 illustrates another step of the exemplary process for manufacturing the exemplary QFN packaging structure in which the remaining photoresist film on the back surface of the metal substrate is removed to expose the etched areas on the back surface of the metal substrate and the photoresist film on the top surface of the metal substrate is also removed;

FIG. 145 illustrates another step of the exemplary process for manufacturing the exemplary QFN packaging structure in which the etched areas on the back surface of the metal substrate are filled with a sealant;

FIG. 146 illustrates another step of the exemplary process for manufacturing the exemplary QFN packaging structure in which a plating process is performed on the bottom surface of the outer die pad and the I/O pads to form a second metal layer;

FIG. 147 illustrates another step of the exemplary process for manufacturing the exemplary QFN packaging structure in which the plurality of finished encapsulated components formed on the metal substrate is cut into individual packaged integrated circuits (ICs) or individual QFN packaging structures in a package sawing process;

FIG. 148 is a cross-sectional view of another exemplary QFN packaging structure in accordance with one embodiment of the invention;

FIG. 149 illustrates a step of an exemplary process for manufacturing another exemplary QFN packaging structure in accordance with one embodiment of the invention in which a metal substrate is provided for the lead frame manufacturing and packaging process;

FIG. 150 illustrates another step of the exemplary process for manufacturing the exemplary QFN packaging structure in which layers of photoresist film are formed on the top surface and the back surface of the metal substrate, respectively;

FIG. 151 illustrates another step of the exemplary process for manufacturing the exemplary QFN packaging structure in which portions of the photoresist film on the top surface of the metal substrate are removed to form a pattern by photolithography;

FIG. 152 illustrates another step of the exemplary process for manufacturing the exemplary QFN packaging structure in which a multi-layer plating process is performed to form a first metal layer containing an inner die pad and inner leads in the areas of the metal substrate exposed by the plating pattern in the photoresist film;

FIG. 153 illustrates another step of the exemplary process for manufacturing the exemplary QFN packaging structure in which the remaining photoresist film on the top surface of the metal substrate is removed and inner leads are formed on the metal substrate;

FIG. 154 illustrates another step of the exemplary process for manufacturing the exemplary QFN packaging structure in which a die is attached on the top surface of the inner die pad in a die attaching process;

FIG. 155 illustrates another step of the exemplary process for manufacturing the exemplary QFN packaging structure in which the top surface of the die and the top surface of the inner leads are connected with metal wires in a wire bonding process;

FIG. 156 illustrates another step of the exemplary process for manufacturing the exemplary QFN packaging structure in which the inner leads, the die, and the metal wires are encapsulated using an encapsulation material;

FIG. 157 illustrates another step of the exemplary process for manufacturing the exemplary QFN packaging structure in which a layer of photoresist film is formed on the top surface of the metal substrate and another layer of photoresist film is formed on the back surface of the metal substrate;

FIG. 158 illustrates another step of the exemplary process for manufacturing the exemplary QFN packaging structure in which exposure, development, and etching are carried out on the photoresist film formed on the back surface of the metal substrate to form an etching pattern in the photoresist film;

FIG. 159 illustrates another step of the exemplary process for manufacturing the exemplary QFN packaging structure in which an etching process is performed on the areas of the metal substrate exposed by the etching pattern in the photoresist film on the back surface of the metal substrate to form etched areas, an outer die pad, and I/O pads;

FIG. 160 illustrates another step of the exemplary process for manufacturing the exemplary QFN packaging structure in which the remaining photoresist film on the back surface of the metal substrate is removed to expose the etched areas on the back surface of the metal substrate and the photoresist film on the top surface of the metal substrate is also removed;

FIG. 161 illustrates another step of the exemplary process for manufacturing the exemplary QFN packaging structure in which the etched areas on the back surface of the metal substrate are filled with a sealant;

FIG. 162 illustrates another step of the exemplary process for manufacturing the exemplary QFN packaging structure in which a plating process is performed on the bottom surface of the outer die pad and the I/O pads to form a second metal layer;

FIG. 163 illustrates another step of the exemplary process for manufacturing the exemplary QFN packaging structure in which the plurality of finished encapsulated components formed on the metal substrate is cut into individual packaged integrated circuits (ICs) or individual QFN packaging structures in a package sawing process;

FIG. 164 is a cross-sectional view of another exemplary QFN packaging structure in accordance with one embodiment of the invention;

FIG. 165 illustrates a step of an exemplary process for manufacturing another exemplary QFN packaging structure in accordance with one embodiment of the invention in which a metal substrate is provided for the lead frame manufacturing and packaging process;

FIG. 166 illustrates another step of the exemplary process for manufacturing the exemplary QFN packaging structure in which layers of photoresist film are formed on the top surface and the back surface of the metal substrate, respectively;

FIG. 167 illustrates another step of the exemplary process for manufacturing the exemplary QFN packaging structure in which portions of the photoresist film on the top surface of the metal substrate are removed to form a pattern by photolithography;

FIG. 168 illustrates another step of the exemplary process for manufacturing the exemplary QFN packaging structure in which a multi-layer plating process is performed to form a first metal layer containing an inner die pad and inner leads arranged in a multiple ring configuration in the areas of the metal substrate exposed by the plating pattern in the photoresist film;

FIG. 169 illustrates another step of the exemplary process for manufacturing the exemplary QFN packaging structure in which the remaining photoresist film on the top surface of the metal substrate is removed and inner leads are formed on the metal substrate;

FIG. 170 illustrates another step of the exemplary process for manufacturing the exemplary QFN packaging structure in which one or more passive devices are coupled between the inner leads using conductive or non-conductive adhesive material;

FIG. 171 illustrates another step of the exemplary process for manufacturing the exemplary QFN packaging structure in which a die is attached on a predetermined die area of the metal substrate in a die attaching process;

FIG. 172 illustrates another step of the exemplary process for manufacturing the exemplary QFN packaging structure in which the top surface of the die and the top surface of the inner leads are connected with metal wires in a wire bonding process;

FIG. 173 illustrates another step of the exemplary process for manufacturing the exemplary QFN packaging structure in which the inner leads, the die, and the metal wires are encapsulated using an encapsulation material;

FIG. 174 illustrates another step of the exemplary process for manufacturing the exemplary QFN packaging structure in which a layer of photoresist film is formed on the top surface of the metal substrate and another layer of photoresist film is formed on the back surface of the metal substrate;

FIG. 175 illustrates another step of the exemplary process for manufacturing the exemplary QFN packaging structure in which exposure, development, and etching are carried out on the photoresist film formed on the back surface of the metal substrate to form an etching pattern in the photoresist film;

FIG. 176 illustrates another step of the exemplary process for manufacturing the exemplary QFN packaging structure in which an etching process is performed on the areas of the metal substrate exposed by the etching pattern in the photoresist film on the back surface of the metal substrate to form etched areas, an outer die pad, and I/O pads;

FIG. 177 illustrates another step of the exemplary process for manufacturing the exemplary QFN packaging structure in which the remaining photoresist film on the back surface of the metal substrate is removed to expose the etched areas on the back surface of the metal substrate and the photoresist film on the top surface of the metal substrate is also removed;

FIG. 178 illustrates another step of the exemplary process for manufacturing the exemplary QFN packaging structure in which the etched areas on the back surface of the metal substrate are filled with a sealant;

FIG. 179 illustrates another step of the exemplary process for manufacturing the exemplary QFN packaging structure in which a plating process is performed on the bottom surface of the outer die pad and the I/O pads to form a second metal layer;

FIG. 180 illustrates another step of the exemplary process for manufacturing the exemplary QFN packaging structure in which the plurality of finished encapsulated components formed on the metal substrate is cut into individual packaged integrated circuits (ICs) or individual QFN packaging structures in a package sawing process;

FIG. 181 is a cross-sectional view of another exemplary QFN packaging structure in accordance with one embodiment of the invention;

FIG. 182 illustrates a step of an exemplary process for manufacturing another exemplary QFN packaging structure in accordance with one embodiment of the invention in which a metal substrate is provided for the lead frame manufacturing and packaging process;

FIG. 183 illustrates another step of the exemplary process for manufacturing the exemplary QFN packaging structure in which layers of photoresist film are formed on the top surface and the back surface of the metal substrate, respectively;

FIG. 184 illustrates another step of the exemplary process for manufacturing the exemplary QFN packaging structure in which portions of the photoresist film on the top surface of the metal substrate are removed to form a pattern by photolithography;

FIG. 185 illustrates another step of the exemplary process for manufacturing the exemplary QFN packaging structure in which a multi-layer plating process is performed to form a first metal layer containing an inner die pad and inner leads in the areas of the metal substrate exposed by the plating pattern in the photoresist film;

FIG. 186 illustrates another step of the exemplary process for manufacturing the exemplary QFN packaging structure in which the remaining photoresist film on the top surface of the metal substrate is removed and inner leads are formed on the metal substrate;

FIG. 187 illustrates another step of the exemplary process for manufacturing the exemplary QFN packaging structure in which one or more passive devices are coupled between the inner leads using conductive or non-conductive adhesive material;

FIG. 188 illustrates another step of the exemplary process for manufacturing the exemplary QFN packaging structure in which a die is attached on the top surface of the inner die pad in a die attaching process;

FIG. 189 illustrates another step of the exemplary process for manufacturing the exemplary QFN packaging structure in which the top surface of the die and the top surface of the inner leads are connected with metal wires in a wire bonding process;

FIG. 190 illustrates another step of the exemplary process for manufacturing the exemplary QFN packaging structure in which the inner leads, the die, and the metal wires are encapsulated using an encapsulation material;

FIG. 191 illustrates another step of the exemplary process for manufacturing the exemplary QFN packaging structure in which a layer of photoresist film is formed on the top surface of the metal substrate and another layer of photoresist film is formed on the back surface of the metal substrate;

FIG. 192 illustrates another step of the exemplary process for manufacturing the exemplary QFN packaging structure in which exposure, development, and etching are carried out on the photoresist film formed on the back surface of the metal substrate to form an etching pattern in the photoresist film;

FIG. 193 illustrates another step of the exemplary process for manufacturing the exemplary QFN packaging structure in which an etching process is performed on the areas of the metal substrate exposed by the etching pattern in the photoresist film on the back surface of the metal substrate to form etched areas, an outer die pad, and I/O pads;

FIG. 194 illustrates another step of the exemplary process for manufacturing the exemplary QFN packaging structure in which the remaining photoresist film on the back surface of the metal substrate is removed to expose the etched areas on the back surface of the metal substrate and the photoresist film on the top surface of the metal substrate is also removed;

FIG. 195 illustrates another step of the exemplary process for manufacturing the exemplary QFN packaging structure in which the etched areas on the back surface of the metal substrate are filled with a sealant;

FIG. 196 illustrates another step of the exemplary process for manufacturing the exemplary QFN packaging structure in which a plating process is performed on the bottom surface of the outer die pad and the I/O pads to form a second metal layer;

FIG. 197 illustrates another step of the exemplary process for manufacturing the exemplary QFN packaging structure in which the plurality of finished encapsulated components formed on the metal substrate is cut into individual packaged integrated circuits (ICs) or individual QFN packaging structures in a package sawing process;

FIG. 198 is a cross-sectional view of another exemplary QFN packaging structure in accordance with one embodiment of the invention;

FIG. 199 illustrates a step of an exemplary process for manufacturing another exemplary QFN packaging structure in accordance with one embodiment of the invention in which a metal substrate is provided for the lead frame manufacturing and packaging process;

FIG. 200 illustrates another step of the exemplary process for manufacturing the exemplary QFN packaging structure in which layers of photoresist film are formed on the top surface and the back surface of the metal substrate, respectively;

FIG. 201 illustrates another step of the exemplary process for manufacturing the exemplary QFN packaging structure in which portions of the photoresist film on the top surface of the metal substrate are removed to form a pattern by photolithography;

FIG. 202 illustrates another step of the exemplary process for manufacturing the exemplary QFN packaging structure in which a multi-layer plating process is performed to form a first metal layer containing an inner leads and an inner electrostatic discharge ring in the areas of the metal substrate exposed by the plating pattern in the photoresist film;

FIG. 203 illustrates another step of the exemplary process for manufacturing the exemplary QFN packaging structure in which the remaining photoresist film on the top surface of the metal substrate is removed and inner leads are formed on the metal substrate;

FIG. 204 illustrates another step of the exemplary process for manufacturing the exemplary QFN packaging structure in which a die is attached on a predetermined die area of the metal substrate in a die attaching process;

FIG. 205 illustrates another step of the exemplary process for manufacturing the exemplary QFN packaging structure in which the top surface of the die and the top surface of the inner leads are connected with metal wires and the die is also attached at the top surface of the inner electrostatic discharge ring in a wire bonding process;

FIG. 206 illustrates another step of the exemplary process for manufacturing the exemplary QFN packaging structure in which the inner leads, the die, and the metal wires are encapsulated using an encapsulation material;

FIG. 207 illustrates another step of the exemplary process for manufacturing the exemplary QFN packaging structure in which a layer of photoresist film is formed on the top surface of the metal substrate and another layer of photoresist film is formed on the back surface of the metal substrate;

FIG. 208 illustrates another step of the exemplary process for manufacturing the exemplary QFN packaging structure in which exposure, development, and etching are carried out on the photoresist film formed on the back surface of the metal substrate to form an etching pattern in the photoresist film;

FIG. 209 illustrates another step of the exemplary process for manufacturing the exemplary QFN packaging structure in which an etching process is performed on the areas of the metal substrate exposed by the etching pattern in the photoresist film on the back surface of the metal substrate to form etched areas, an outer die pad, and I/O pads;

FIG. 210 illustrates another step of the exemplary process for manufacturing the exemplary QFN packaging structure in which the remaining photoresist film on the back surface of the metal substrate is removed to expose the etched areas on the back surface of the metal substrate and the photoresist film on the top surface of the metal substrate is also removed;

FIG. 211 illustrates another step of the exemplary process for manufacturing the exemplary QFN packaging structure in which the etched areas on the back surface of the metal substrate are filled with a sealant;

FIG. 212 illustrates another step of the exemplary process for manufacturing the exemplary QFN packaging structure in which a plating process is performed on the bottom surface of the outer die pad and the I/O pads to form a second metal layer;

FIG. 213 illustrates another step of the exemplary process for manufacturing the exemplary QFN packaging structure in which the plurality of finished encapsulated components formed on the metal substrate is cut into individual packaged integrated circuits (ICs) or individual QFN packaging structures in a package sawing process;

FIG. 214 is a cross-sectional view of another exemplary QFN packaging structure in accordance with one embodiment of the invention;

FIG. 215 illustrates a step of an exemplary process for manufacturing another exemplary QFN packaging structure in accordance with one embodiment of the invention in which a metal substrate is provided for the lead frame manufacturing and packaging process;

FIG. 216 illustrates another step of the exemplary process for manufacturing the exemplary QFN packaging structure in which layers of photoresist film are formed on the top surface and the back surface of the metal substrate, respectively;

FIG. 217 illustrates another step of the exemplary process for manufacturing the exemplary QFN packaging structure in which portions of the photoresist film on the top surface of the metal substrate are removed to form a pattern by photolithography;

FIG. 218 illustrates another step of the exemplary process for manufacturing the exemplary QFN packaging structure in which a multi-layer plating process is performed to form a first metal layer containing an inner die pad, inner leads, and an electrostatic discharge ring in the areas of the metal substrate exposed by the plating pattern in the photoresist film;

FIG. 219 illustrates another step of the exemplary process for manufacturing the exemplary QFN packaging structure in which the remaining photoresist film on the top surface of the metal substrate is removed and inner leads are formed on the metal substrate;

FIG. 220 illustrates another step of the exemplary process for manufacturing the exemplary QFN packaging structure in which a die is attached on the top surface of the inner die pad in a die attaching process;

FIG. 221 illustrates another step of the exemplary process for manufacturing the exemplary QFN packaging structure in which the top surface of the die and the top surface of the inner leads are connected with metal wires and the die is also attached at the top surface of the inner electrostatic discharge ring in a wire bonding process;

FIG. 222 illustrates another step of the exemplary process for manufacturing the exemplary QFN packaging structure in which the inner leads, the die, and the metal wires are encapsulated using an encapsulation material;

FIG. 223 illustrates another step of the exemplary process for manufacturing the exemplary QFN packaging structure in which a layer of photoresist film is formed on the top surface of the metal substrate and another layer of photoresist film is formed on the back surface of the metal substrate;

FIG. 224 illustrates another step of the exemplary process for manufacturing the exemplary QFN packaging structure in which exposure, development, and etching are carried out on the photoresist film formed on the back surface of the metal substrate to form an etching pattern in the photoresist film;

FIG. 225 illustrates another step of the exemplary process for manufacturing the exemplary QFN packaging structure in which an etching process is performed on the areas of the metal substrate exposed by the etching pattern in the photoresist film on the back surface of the metal substrate to form etched areas, an outer die pad, and I/O pads;

FIG. 226 illustrates another step of the exemplary process for manufacturing the exemplary QFN packaging structure in which the remaining photoresist film on the back surface of the metal substrate is removed to expose the etched areas on the back surface of the metal substrate and the photoresist film on the top surface of the metal substrate is also removed;

FIG. 227 illustrates another step of the exemplary process for manufacturing the exemplary QFN packaging structure in which the etched areas on the back surface of the metal substrate are filled with a sealant;

FIG. 228 illustrates another step of the exemplary process for manufacturing the exemplary QFN packaging structure in which a plating process is performed on the bottom surface of the outer die pad and the I/O pads to form a second metal layer;

FIG. 229 illustrates another step of the exemplary process for manufacturing the exemplary QFN packaging structure in which the plurality of finished encapsulated components formed on the metal substrate is cut into individual packaged integrated circuits (ICs) or individual QFN packaging structures in a package sawing process;

FIG. 230 is a cross-sectional view of another exemplary QFN packaging structure in accordance with one embodiment of the invention;

FIG. 231 illustrates a step of an exemplary process for manufacturing another exemplary QFN packaging structure in accordance with one embodiment of the invention in which a metal substrate is provided for the lead frame manufacturing and packaging process;

FIG. 232 illustrates another step of the exemplary process for manufacturing the exemplary QFN packaging structure in which layers of photoresist film are formed on the top surface and the back surface of the metal substrate, respectively;

FIG. 233 illustrates another step of the exemplary process for manufacturing the exemplary QFN packaging structure in which portions of the photoresist film on the top surface of the metal substrate are removed to form a pattern by photolithography;

FIG. 234 illustrates another step of the exemplary process for manufacturing the exemplary QFN packaging structure in which a multi-layer plating process is performed to form a first metal layer containing inner leads and an inner electrostatic discharge ring in the areas of the metal substrate exposed by the plating pattern in the photoresist film;

FIG. 235 illustrates another step of the exemplary process for manufacturing the exemplary QFN packaging structure in which the remaining photoresist film on the top surface of the metal substrate is removed and inner leads are formed on the metal substrate;

FIG. 236 illustrates another step of the exemplary process for manufacturing the exemplary QFN packaging structure in which one or more passive devices are coupled between inner leads 4 using conductive or non-conductive adhesive material;

FIG. 237 illustrates another step of the exemplary process for manufacturing the exemplary QFN packaging structure in which a die is attached on a predetermined die area of the metal substrate in a die attaching process;

FIG. 238 illustrates another step of the exemplary process for manufacturing the exemplary QFN packaging structure in which the top surface of the die and the top surface of the inner leads are connected with metal wires and the die is also attached at the top surface of the inner electrostatic discharge ring in a wire bonding process;

FIG. 239 illustrates another step of the exemplary process for manufacturing the exemplary QFN packaging structure in which the inner leads, the die, and the metal wires are encapsulated using an encapsulation material;

FIG. 240 illustrates another step of the exemplary process for manufacturing the exemplary QFN packaging structure in which a layer of photoresist film is formed on the top surface of the metal substrate and another layer of photoresist film is formed on the back surface of the metal substrate;

FIG. 241 illustrates another step of the exemplary process for manufacturing the exemplary QFN packaging structure in which exposure, development, and etching are carried out on the photoresist film formed on the back surface of the metal substrate to form an etching pattern in the photoresist film;

FIG. 242 illustrates another step of the exemplary process for manufacturing the exemplary QFN packaging structure in which an etching process is performed on the areas of the metal substrate exposed by the etching pattern in the photoresist film on the back surface of the metal substrate to form etched areas, an outer die pad, and I/O pads;

FIG. 243 illustrates another step of the exemplary process for manufacturing the exemplary QFN packaging structure in which the remaining photoresist film on the back surface of the metal substrate is removed to expose the etched areas on the back surface of the metal substrate and the photoresist film on the top surface of the metal substrate is also removed;

FIG. 244 illustrates another step of the exemplary process for manufacturing the exemplary QFN packaging structure in which the etched areas on the back surface of the metal substrate are filled with a sealant;

FIG. 245 illustrates another step of the exemplary process for manufacturing the exemplary QFN packaging structure in which a plating process is performed on the bottom surface of the outer die pad and the I/O pads to form a second metal layer;

FIG. 246 illustrates another step of the exemplary process for manufacturing the exemplary QFN packaging structure in which the plurality of finished encapsulated components formed on the metal substrate is cut into individual packaged integrated circuits (ICs) or individual QFN packaging structures in a package sawing process;

FIG. 247 is a cross-sectional view of another exemplary QFN packaging structure in accordance with one embodiment of the invention;

FIG. 248 illustrates a step of an exemplary process for manufacturing another exemplary QFN packaging structure in accordance with one embodiment of the invention in which a metal substrate is provided for the lead frame manufacturing and packaging process;

FIG. 249 illustrates another step of the exemplary process for manufacturing the exemplary QFN packaging structure in which layers of photoresist film are formed on the top surface and the back surface of the metal substrate, respectively;

FIG. 250 illustrates another step of the exemplary process for manufacturing the exemplary QFN packaging structure in which portions of the photoresist film on the top surface of the metal substrate are removed to form a pattern by photolithography;

FIG. 251 illustrates another step of the exemplary process for manufacturing the exemplary QFN packaging structure in which a multi-layer plating process is performed to form a first metal layer containing an inner die pad, inner leads, and an inner discharge ring in the areas of the metal substrate exposed by the plating pattern in the photoresist film;

FIG. 252 illustrates another step of the exemplary process for manufacturing the exemplary QFN packaging structure in which the remaining photoresist film on the top surface of the metal substrate is removed and inner leads are formed on the metal substrate;

FIG. 253 illustrates another step of the exemplary process for manufacturing the exemplary QFN packaging structure in which one or more passive devices are coupled between inner leads 4 using conductive or non-conductive adhesive material;

FIG. 254 illustrates another step of the exemplary process for manufacturing the exemplary QFN packaging structure in which a die is attached on the top surface of the inner die pad in a die attaching process;

FIG. 255 illustrates another step of the exemplary process for manufacturing the exemplary QFN packaging structure in which the top surface of the die and the top surface of the inner leads are connected with metal wires and the die is also attached at the top surface of the inner electrostatic discharge ring in a wire bonding process;

FIG. 256 illustrates another step of the exemplary process for manufacturing the exemplary QFN packaging structure in which the inner leads, the die, and the metal wires are encapsulated using an encapsulation material;

FIG. 257 illustrates another step of the exemplary process for manufacturing the exemplary QFN packaging structure in which a layer of photoresist film is formed on the top surface of the metal substrate and another layer of photoresist film is formed on the back surface of the metal substrate;

FIG. 258 illustrates another step of the exemplary process for manufacturing the exemplary QFN packaging structure in which exposure, development, and etching are carried out on the photoresist film formed on the back surface of the metal substrate to form an etching pattern in the photoresist film;

FIG. 259 illustrates another step of the exemplary process for manufacturing the exemplary QFN packaging structure in which an etching process is performed on the areas of the metal substrate exposed by the etching pattern in the photoresist film on the back surface of the metal substrate to form etched areas, an outer die pad, and I/O pads;

FIG. 260 illustrates another step of the exemplary process for manufacturing the exemplary QFN packaging structure in which the remaining photoresist film on the back surface of the metal substrate is removed to expose the etched areas on the back surface of the metal substrate and the photoresist film on the top surface of the metal substrate is also removed;

FIG. 261 illustrates another step of the exemplary process for manufacturing the exemplary QFN packaging structure in which the etched areas on the back surface of the metal substrate are filled with a sealant;

FIG. 262 illustrates another step of the exemplary process for manufacturing the exemplary QFN packaging structure in which a plating process is performed on the bottom surface of the outer die pad and the I/O pads to form a second metal layer;

FIG. 263 illustrates another step of the exemplary process for manufacturing the exemplary QFN packaging structure in which the plurality of finished encapsulated components formed on the metal substrate is cut into individual packaged integrated circuits (ICs) or individual QFN packaging structures in a package sawing process;

FIG. 264 is a cross-sectional view of another exemplary QFN packaging structure in accordance with one embodiment of the invention;

FIG. 265 illustrates a step of an exemplary process for manufacturing another exemplary QFN packaging structure in accordance with one embodiment of the invention in which a metal substrate is provided for the lead frame manufacturing and packaging process;

FIG. 266 illustrates another step of the exemplary process for manufacturing the exemplary QFN packaging structure in which layers of photoresist film are formed on the top surface and the back surface of the metal substrate, respectively;

FIG. 267 illustrates another step of the exemplary process for manufacturing the exemplary QFN packaging structure in which portions of the photoresist film on the top surface of the metal substrate are removed to form a pattern by photolithography;

FIG. 268 illustrates another step of the exemplary process for manufacturing the exemplary QFN packaging structure in which a multi-layer plating process is performed to form a first metal layer in the areas of the metal substrate exposed by the plating pattern in the photoresist film;

FIG. 269 illustrates another step of the exemplary process for manufacturing the exemplary QFN packaging structure in which the remaining photoresist film on the top surface of the metal substrate is removed and inner leads are formed on the metal substrate;

FIG. 270 illustrates another step of the exemplary process for manufacturing the exemplary QFN packaging structure in which the multiple dies are attached on the top surface of the outer die pads in a die attaching process;

FIG. 271 illustrates another step of the exemplary process for manufacturing the exemplary QFN packaging structure in which each die is wired to the inner leads surrounding the three sides of the each die;

FIG. 272 illustrates another step of the exemplary process for manufacturing the exemplary QFN packaging structure in which the inner leads, the die, and the metal wires are encapsulated using an encapsulation material;

FIG. 273 illustrates another step of the exemplary process for manufacturing the exemplary QFN packaging structure in which a layer of photoresist film is formed on the top surface of the metal substrate and another layer of photoresist film is formed on the back surface of the metal substrate;

FIG. 274 illustrates another step of the exemplary process for manufacturing the exemplary QFN packaging structure in which exposure, development, and etching are carried out on the photoresist film formed on the back surface of the metal substrate to form an etching pattern in the photoresist film;

FIG. 275 illustrates another step of the exemplary process for manufacturing the exemplary QFN packaging structure in which an etching process is performed on the areas of the metal substrate exposed by the etching pattern in the photoresist film on the back surface of the metal substrate to form etched areas, multiple outer die pads, and I/O pads;

FIG. 276 illustrates another step of the exemplary process for manufacturing the exemplary QFN packaging structure in which the remaining photoresist film on the back surface of the metal substrate is removed to expose the etched areas on the back surface of the metal substrate and the photoresist film on the top surface of the metal substrate is also removed;

FIG. 277 illustrates another step of the exemplary process for manufacturing the exemplary QFN packaging structure in which the etched areas on the back surface of the metal substrate are filled with a sealant;

FIG. 278 illustrates another step of the exemplary process for manufacturing the exemplary QFN packaging structure in which a second metal layer is formed on back surface of multiple outer die pads and the inner leads in the plating process;

FIG. 279 illustrates another step of the exemplary process for manufacturing the exemplary QFN packaging structure in which the plurality of finished encapsulated components formed on the metal substrate is cut into individual packaged integrated circuits (ICs) or individual QFN packaging structures in a package sawing process;

FIG. 280 is a cross-sectional view of another exemplary QFN packaging structure in accordance with one embodiment of the invention;

FIG. 281 illustrates a step of an exemplary process for manufacturing another exemplary QFN packaging structure in accordance with one embodiment of the invention in which a metal substrate is provided for the lead frame manufacturing and packaging process;

FIG. 282 illustrates another step of the exemplary process for manufacturing the exemplary QFN packaging structure in which layers of photoresist film are formed on the top surface and the back surface of the metal substrate, respectively;

FIG. 283 illustrates another step of the exemplary process for manufacturing the exemplary QFN packaging structure in which portions of the photoresist film on the top surface of the metal substrate are removed to form a pattern by photolithography;

FIG. 284 illustrates another step of the exemplary process for manufacturing the exemplary QFN packaging structure in which a multi-layer plating process is performed to form a first metal layer containing both the multiple inner die pads and the inner leads in the areas of the metal substrate exposed by the plating pattern in the photoresist film;

FIG. 285 illustrates another step of the exemplary process for manufacturing the exemplary QFN packaging structure in which the remaining photoresist film on the top surface of the metal substrate is removed and inner leads are formed on the metal substrate;

FIG. 286 illustrates another step of the exemplary process for manufacturing the exemplary QFN packaging structure in which the multiple dies are attached on the top surface of the corresponding inner die pads in a die attaching process;

FIG. 287 illustrates another step of the exemplary process for manufacturing the exemplary QFN packaging structure in which each die is wired to the inner leads surrounding the three sides of the each die;

FIG. 288 illustrates another step of the exemplary process for manufacturing the exemplary QFN packaging structure in which the inner leads, the die, and the metal wires are encapsulated using an encapsulation material;

FIG. 289 illustrates another step of the exemplary process for manufacturing the exemplary QFN packaging structure in which a layer of photoresist film is formed on the top surface of the metal substrate and another layer of photoresist film is formed on the back surface of the metal substrate;

FIG. 290 illustrates another step of the exemplary process for manufacturing the exemplary QFN packaging structure in which exposure, development, and etching are carried out on the photoresist film formed on the back surface of the metal substrate to form an etching pattern in the photoresist film;

FIG. 291 illustrates another step of the exemplary process for manufacturing the exemplary QFN packaging structure in which an etching process is performed on the areas of the metal substrate exposed by the etching pattern in the photoresist film on the back surface of the metal substrate to form etched areas, multiple outer die pads, and I/O pads;

FIG. 292 illustrates another step of the exemplary process for manufacturing the exemplary QFN packaging structure in which the remaining photoresist film on the back surface of the metal substrate is removed to expose the etched areas on the back surface of the metal substrate and the photoresist film on the top surface of the metal substrate is also removed;

FIG. 293 illustrates another step of the exemplary process for manufacturing the exemplary QFN packaging structure in which the etched areas on the back surface of the metal substrate are filled with a sealant;

FIG. 294 illustrates another step of the exemplary process for manufacturing the exemplary QFN packaging structure in which a second metal layer is formed on back surface of multiple outer die pads and the inner leads in the plating process;

FIG. 295 illustrates another step of the exemplary process for manufacturing the exemplary QFN packaging structure in which the plurality of finished encapsulated components formed on the metal substrate is cut into individual packaged integrated circuits (ICs) or individual QFN packaging structures in a package sawing process;

FIG. 296 is a cross-sectional view of another exemplary QFN packaging structure in accordance with one embodiment of the invention;

FIG. 297 illustrates a step of an exemplary process for manufacturing another exemplary QFN packaging structure in accordance with one embodiment of the invention in which a metal substrate is provided for the lead frame manufacturing and packaging process;

FIG. 298 illustrates another step of the exemplary process for manufacturing the exemplary QFN packaging structure in which layers of photoresist film are formed on the top surface and the back surface of the metal substrate, respectively;

FIG. 299 illustrates another step of the exemplary process for manufacturing the exemplary QFN packaging structure in which portions of the photoresist film on the top surface of the metal substrate are removed to form a pattern by photolithography;

FIG. 300 illustrates another step of the exemplary process for manufacturing the exemplary QFN packaging structure in which a multi-layer plating process is performed to form a first metal layer in the areas of the metal substrate exposed by the plating pattern in the photoresist film;

FIG. 301 illustrates another step of the exemplary process for manufacturing the exemplary QFN packaging structure in which the remaining photoresist film on the top surface of the metal substrate is removed and inner leads are formed on the metal substrate;

FIG. 302 illustrates another step of the exemplary process for manufacturing the exemplary QFN packaging structure in which one or more passive devices are coupled between inner leads using a conductive or non-conductive adhesive material;

FIG. 303 illustrates another step of the exemplary process for manufacturing the exemplary QFN packaging structure in which the multiple dies are attached at the top surface of the outer die pads in a die attaching process;

FIG. 304 illustrates another step of the exemplary process for manufacturing the exemplary QFN packaging structure in which each die is wired to the inner leads surrounding the three sides of the each die;

FIG. 305 illustrates another step of the exemplary process for manufacturing the exemplary QFN packaging structure in which the inner leads, the die, and the metal wires are encapsulated using an encapsulation material;

FIG. 306 illustrates another step of the exemplary process for manufacturing the exemplary QFN packaging structure in which a layer of photoresist film is formed on the top surface of the metal substrate and another layer of photoresist film is formed on the back surface of the metal substrate;

FIG. 307 illustrates another step of the exemplary process for manufacturing the exemplary QFN packaging structure in which exposure, development, and etching are carried out on the photoresist film formed on the back surface of the metal substrate to form an etching pattern in the photoresist film;

FIG. 308 illustrates another step of the exemplary process for manufacturing the exemplary QFN packaging structure in which an etching process is performed on the areas of the metal substrate exposed by the etching pattern in the photoresist film on the back surface of the metal substrate to form etched areas, multiple outer die pads, and I/O pads;

FIG. 309 illustrates another step of the exemplary process for manufacturing the exemplary QFN packaging structure in which the remaining photoresist film on the back surface of the metal substrate is removed to expose the etched areas on the back surface of the metal substrate and the photoresist film on the top surface of the metal substrate is also removed;

FIG. 310 illustrates another step of the exemplary process for manufacturing the exemplary QFN packaging structure in which the etched areas on the back surface of the metal substrate are filled with a sealant;

FIG. 311 illustrates another step of the exemplary process for manufacturing the exemplary QFN packaging structure in which a second metal layer is formed on back surface of multiple outer die pads and the inner leads in the plating process;

FIG. 312 illustrates another step of the exemplary process for manufacturing the exemplary QFN packaging structure in which the plurality of finished encapsulated components formed on the metal substrate is cut into individual packaged integrated circuits (ICs) or individual QFN packaging structures in a package sawing process;

FIG. 313 is a cross-sectional view of another exemplary QFN packaging structure in accordance with one embodiment of the invention;

FIG. 314 illustrates a step of an exemplary process for manufacturing another exemplary QFN packaging structure in accordance with one embodiment of the invention in which a metal substrate is provided for the lead frame manufacturing and packaging process;

FIG. 315 illustrates another step of the exemplary process for manufacturing the exemplary QFN packaging structure in which layers of photoresist film are formed on the top surface and the back surface of the metal substrate, respectively;

FIG. 316 illustrates another step of the exemplary process for manufacturing the exemplary QFN packaging structure in which portions of the photoresist film on the top surface of the metal substrate are removed to form a pattern by photolithography;

FIG. 317 illustrates another step of the exemplary process for manufacturing the exemplary QFN packaging structure in which a multi-layer plating process is performed to form a first metal layer containing both the multiple inner die pads and the inner leads in the areas of the metal substrate exposed by the plating pattern in the photoresist film;

FIG. 318 illustrates another step of the exemplary process for manufacturing the exemplary QFN packaging structure in which the remaining photoresist film on the top surface of the metal substrate is removed and inner leads are formed on the metal substrate;

FIG. 319 illustrates another step of the exemplary process for manufacturing the exemplary QFN packaging structure in which one or more passive devices are coupled between inner leads using a conductive or non-conductive adhesive material;

FIG. 320 illustrates another step of the exemplary process for manufacturing the exemplary QFN packaging structure in which the multiple dies are attached at the top surface of the corresponding inner die pads in a die attaching process;

FIG. 321 illustrates another step of the exemplary process for manufacturing the exemplary QFN packaging structure in which each die is wired to the inner leads surrounding the three sides of the each die;

FIG. 322 illustrates another step of the exemplary process for manufacturing the exemplary QFN packaging structure in which the inner leads, the die, and the metal wires are encapsulated using an encapsulation material;

FIG. 323 illustrates another step of the exemplary process for manufacturing the exemplary QFN packaging structure in which a layer of photoresist film is formed on the top surface of the metal substrate and another layer of photoresist film is formed on the back surface of the metal substrate;

FIG. 324 illustrates another step of the exemplary process for manufacturing the exemplary QFN packaging structure in which exposure, development, and etching are carried out on the photoresist film formed on the back surface of the metal substrate to form an etching pattern in the photoresist film;

FIG. 325 illustrates another step of the exemplary process for manufacturing the exemplary QFN packaging structure in which an etching process is performed on the areas of the metal substrate exposed by the etching pattern in the photoresist film on the back surface of the metal substrate to form etched areas, multiple outer die pads, and I/O pads;

FIG. 326 illustrates another step of the exemplary process for manufacturing the exemplary QFN packaging structure in which the remaining photoresist film on the back surface of the metal substrate is removed to expose the etched areas on the back surface of the metal substrate and the photoresist film on the top surface of the metal substrate is also removed;

FIG. 327 illustrates another step of the exemplary process for manufacturing the exemplary QFN packaging structure in which the etched areas on the back surface of the metal substrate are filled with a sealant;

FIG. 328 illustrates another step of the exemplary process for manufacturing the exemplary QFN packaging structure in which a second metal layer is formed on back surface of multiple outer die pads and the inner leads in the plating process;

FIG. 329 illustrates another step of the exemplary process for manufacturing the exemplary QFN packaging structure in which the plurality of finished encapsulated components formed on the metal substrate is cut into individual packaged integrated circuits (ICs) or individual QFN packaging structures in a package sawing process;

FIG. 330 is a cross-sectional view of another exemplary QFN packaging structure in accordance with one embodiment of the invention;

FIG. 331 illustrates step of an exemplary process for manufacturing another exemplary QFN packaging structure in accordance with one embodiment of the invention in which a metal substrate is provided for the lead frame manufacturing and packaging process;

FIG. 332 illustrates another step of the exemplary process for manufacturing the exemplary QFN packaging structure in which layers of photoresist film are formed on the top surface and the back surface of the metal substrate, respectively;

FIG. 333 illustrates another step of the exemplary process for manufacturing the exemplary QFN packaging structure in which portions of the photoresist film on the top surface of the metal substrate are removed to form a pattern by photolithography;

FIG. 334 illustrates another step of the exemplary process for manufacturing the exemplary QFN packaging structure in which a multi-layer plating process is performed to form a first metal layer containing inner leads and an inner electrostatic discharge ring in the areas of the metal substrate exposed by the plating pattern in the photoresist film;

FIG. 335 illustrates another step of the exemplary process for manufacturing the exemplary QFN packaging structure in which the remaining photoresist film on the top surface of the metal substrate is removed and inner leads are formed on the metal substrate;

FIG. 336 illustrates another step of the exemplary process for manufacturing the exemplary QFN packaging structure in which a die is attached on a predetermined die area of the metal substrate in a die attaching process;

FIG. 337 illustrates another step of the exemplary process for manufacturing the exemplary QFN packaging structure in which the top surface of the die and the top surface of the inner leads are connected with metal wires and the die is also attached to the top surface of the inner electrostatic discharge ring in a wire bonding process;

FIG. 338 illustrates another step of the exemplary process for manufacturing the exemplary QFN packaging structure in which the inner leads, the die, and the metal wires are encapsulated using an encapsulation material;

FIG. 339 illustrates another step of the exemplary process for manufacturing the exemplary QFN packaging structure in which a layer of photoresist film is formed on the top surface of the metal substrate and another layer of photoresist film is formed on the back surface of the metal substrate;

FIG. 340 illustrates another step of the exemplary process for manufacturing the exemplary QFN packaging structure in which exposure, development, and etching are carried out on the photoresist film formed on the back surface of the metal substrate to form an etching pattern in the photoresist film;

FIG. 341 illustrates another step of the exemplary process for manufacturing the exemplary QFN packaging structure in which an etching process is performed on the areas of the metal substrate exposed by the etching pattern in the photoresist film on the back surface of the metal substrate to form etched areas, an outer die pad, and I/O pads;

FIG. 342 illustrates another step of the exemplary process for manufacturing the exemplary QFN packaging structure in which the remaining photoresist film on the back surface of the metal substrate is removed to expose the etched areas on the back surface of the metal substrate and the photoresist film on the top surface of the metal substrate is also removed;

FIG. 343 illustrates another step of the exemplary process for manufacturing the exemplary QFN packaging structure in which the etched areas on the back surface of the metal substrate are filled with a sealant;

FIG. 344 illustrates another step of the exemplary process for manufacturing the exemplary QFN packaging structure in which a plating process is performed on the bottom surface of the outer die pad and the I/O pads to form a second metal layer;

FIG. 345 illustrates another step of the exemplary process for manufacturing the exemplary QFN packaging structure in which the plurality of finished encapsulated components formed on the metal substrate is cut into individual packaged integrated circuits (ICs) or individual QFN packaging structures in a package sawing process;

FIG. 346 is a cross-sectional view of another exemplary QFN packaging structure in accordance with one embodiment of the invention;

FIG. 347 illustrates a step of an exemplary process for manufacturing another exemplary QFN packaging structure in accordance with one embodiment of the invention in which a metal substrate is provided for the lead frame manufacturing and packaging process;

FIG. 348 illustrates another step of the exemplary process for manufacturing the exemplary QFN packaging structure in which layers of photoresist film are formed on the top surface and the back surface of the metal substrate, respectively;

FIG. 349 illustrates another step of the exemplary process for manufacturing the exemplary QFN packaging structure in which portions of the photoresist film on the top surface of the metal substrate are removed to form a pattern by photolithography;

FIG. 350 illustrates another step of the exemplary process for manufacturing the exemplary QFN packaging structure in which a multi-layer plating process is performed to form a first metal layer containing both the multiple inner die pads and the inner leads in the areas of the metal substrate exposed by the plating pattern in the photoresist film;

FIG. 351 illustrates another step of the exemplary process for manufacturing the exemplary QFN packaging structure in which the remaining photoresist film on the top surface of the metal substrate is removed and inner leads are formed on the metal substrate;

FIG. 352 illustrates another step of the exemplary process for manufacturing the exemplary QFN packaging structure in which the multiple dies are attached at the top surface of the corresponding inner die pads in a die attaching process;

FIG. 353 illustrates another step of the exemplary process for manufacturing the exemplary QFN packaging structure in which the top surface of the die and the top surface of the inner leads are connected with metal wires and the die is also attached to the top surface of the inner electrostatic discharge ring in a wire bonding process;

FIG. 354 illustrates another step of the exemplary process for manufacturing the exemplary QFN packaging structure in which the inner leads, the die, and the metal wires are encapsulated using an encapsulation material;

FIG. 355 illustrates another step of the exemplary process for manufacturing the exemplary QFN packaging structure in which a layer of photoresist film is formed on the top surface of the metal substrate and another layer of photoresist film is formed on the back surface of the metal substrate;

FIG. 356 illustrates another step of the exemplary process for manufacturing the exemplary QFN packaging structure in which exposure, development, and etching are carried out on the photoresist film formed on the back surface of the metal substrate to form an etching pattern in the photoresist film;

FIG. 357 illustrates another step of the exemplary process for manufacturing the exemplary QFN packaging structure in which an etching process is performed on the areas of the metal substrate exposed by the etching pattern in the photoresist film on the back surface of the metal substrate to form etched areas, an outer die pad, and I/O pads;

FIG. 358 illustrates another step of the exemplary process for manufacturing the exemplary QFN packaging structure in which the remaining photoresist film on the back surface of the metal substrate is removed to expose the etched areas on the back surface of the metal substrate and the photoresist film on the top surface of the metal substrate is also removed;

FIG. 359 illustrates another step of the exemplary process for manufacturing the exemplary QFN packaging structure in which the etched areas on the back surface of the metal substrate are filled with a sealant;

FIG. 360 illustrates another step of the exemplary process for manufacturing the exemplary QFN packaging structure in which a plating process is performed on the bottom surface of the outer die pad and the I/O pads to form a second metal layer;

FIG. 361 illustrates another step of the exemplary process for manufacturing the exemplary QFN packaging structure in which the plurality of finished encapsulated components formed on the metal substrate is cut into individual packaged integrated circuits (ICs) or individual QFN packaging structures in a package sawing process;

FIG. 362 is a cross-sectional view of another exemplary QFN packaging structure in accordance with one embodiment of the invention;

FIG. 363 illustrates a step of an exemplary process for manufacturing another exemplary QFN packaging structure in accordance with one embodiment of the invention in which a metal substrate is provided for the lead frame manufacturing and packaging process;

FIG. 364 illustrates another step of the exemplary process for manufacturing the exemplary QFN packaging structure in which layers of photoresist film are formed on the top surface and the back surface of the metal substrate, respectively;

FIG. 365 illustrates another step of the exemplary process for manufacturing the exemplary QFN packaging structure in which portions of the photoresist film on the top surface of the metal substrate are removed to form a pattern by photolithography;

FIG. 366 illustrates another step of the exemplary process for manufacturing the exemplary QFN packaging structure in which a multi-layer plating process is performed to form a first metal layer containing inner leads and an inner electrostatic discharge ring in the areas of the metal substrate exposed by the plating pattern in the photoresist film;

FIG. 367 illustrates another step of the exemplary process for manufacturing the exemplary QFN packaging structure in which the remaining photoresist film on the top surface of the metal substrate is removed and inner leads are formed on the metal substrate;

FIG. 368 illustrates another step of the exemplary process for manufacturing the exemplary QFN packaging structure in which one or more passive devices are coupled between the inner leads using a conductive or non-conductive adhesive material;

FIG. 369 illustrates another step of the exemplary process for manufacturing the exemplary QFN packaging structure in which a die is attached on a predetermined die area of the metal substrate in a die attaching process;

FIG. 370 illustrates another step of the exemplary process for manufacturing the exemplary QFN packaging structure in which the top surface of the die and the top surface of the inner leads are connected with metal wires and the die is also attached to the top surface of the inner electrostatic discharge ring in a wire bonding process;

FIG. 371 illustrates another step of the exemplary process for manufacturing the exemplary QFN packaging structure in which the inner leads, the die, and the metal wires are encapsulated using an encapsulation material;

FIG. 372 illustrates another step of the exemplary process for manufacturing the exemplary QFN packaging structure in which a layer of photoresist film is formed on the top surface of the metal substrate and another layer of photoresist film is formed on the back surface of the metal substrate;

FIG. 373 illustrates another step of the exemplary process for manufacturing the exemplary QFN packaging structure in which exposure, development, and etching are carried out on the photoresist film formed on the back surface of the metal substrate to form an etching pattern in the photoresist film;

FIG. 374 illustrates another step of the exemplary process for manufacturing the exemplary QFN packaging structure in which an etching process is performed on the areas of the metal substrate exposed by the etching pattern in the photoresist film on the back surface of the metal substrate to form etched areas, an outer die pad, and I/O pads;

FIG. 375 illustrates another step of the exemplary process for manufacturing the exemplary QFN packaging structure in which the remaining photoresist film on the back surface of the metal substrate is removed to expose the etched areas on the back surface of the metal substrate and the photoresist film on the top surface of the metal substrate is also removed;

FIG. 376 illustrates another step of the exemplary process for manufacturing the exemplary QFN packaging structure in which the etched areas on the back surface of the metal substrate are filled with a sealant;

FIG. 377 illustrates another step of the exemplary process for manufacturing the exemplary QFN packaging structure in which the second metal layer is formed on back surface of multiple outer die pads and the inner leads in the plating process;

FIG. 378 illustrates another step of the exemplary process for manufacturing the exemplary QFN packaging structure in which the plurality of finished encapsulated components formed on the metal substrate is cut into individual packaged integrated circuits (ICs) or individual QFN packaging structures in a package sawing process;

FIG. 379 is a cross-sectional view of another exemplary QFN packaging structure in accordance with one embodiment of the invention;

FIG. 380 illustrates a step of an exemplary process for manufacturing another exemplary QFN packaging structure in accordance with one embodiment of the invention in which a metal substrate is provided for the lead frame manufacturing and packaging process;

FIG. 381 illustrates another step of the exemplary process for manufacturing the exemplary QFN packaging structure in which layers of photoresist film are formed on the top surface and the back surface of the metal substrate, respectively;

FIG. 382 illustrates another step of the exemplary process for manufacturing the exemplary QFN packaging structure in which portions of the photoresist film on the top surface of the metal substrate are removed to form a pattern by photolithography;

FIG. 383 illustrates another step of the exemplary process for manufacturing the exemplary QFN packaging structure in which a multi-layer plating process is performed to form a first metal layer containing both the multiple inner die pads and the inner leads in the areas of the metal substrate exposed by the plating pattern in the photoresist film;

FIG. 384 illustrates another step of the exemplary process for manufacturing the exemplary QFN packaging structure in which the remaining photoresist film on the top surface of the metal substrate is removed and inner leads are formed on the metal substrate;

FIG. 385 illustrates another step of the exemplary process for manufacturing the exemplary QFN packaging structure in which one or more passive devices are coupled between the inner leads using a conductive or non-conductive adhesive material;

FIG. 386 illustrates another step of the exemplary process for manufacturing the exemplary QFN packaging structure in which the multiple dies are attached at the top surface of the corresponding inner die pads in a die attaching process;

FIG. 387 illustrates another step of the exemplary process for manufacturing the exemplary QFN packaging structure in which the top surface of the die and the top surface of the inner leads are connected with metal wires and the die is also attached to the top surface of the inner electrostatic discharge ring in a wire bonding process;

FIG. 388 illustrates another step of the exemplary process for manufacturing the exemplary QFN packaging structure in which the inner leads, the die, and the metal wires are encapsulated using an encapsulation material;

FIG. 389 illustrates another step of the exemplary process for manufacturing the exemplary QFN packaging structure in which a layer of photoresist film is formed on the top surface of the metal substrate and another layer of photoresist film is formed on the back surface of the metal substrate;

FIG. 390 illustrates another step of the exemplary process for manufacturing the exemplary QFN packaging structure in which exposure, development, and etching are carried out on the photoresist film formed on the back surface of the metal substrate to form an etching pattern in the photoresist film;

FIG. 391 illustrates another step of the exemplary process for manufacturing the exemplary QFN packaging structure in which an etching process is performed on the areas of the metal substrate exposed by the etching pattern in the photoresist film on the back surface of the metal substrate to form etched areas, an outer die pad, and I/O pads;

FIG. 392 illustrates another step of the exemplary process for manufacturing the exemplary QFN packaging structure in which the remaining photoresist film on the back surface of the metal substrate is removed to expose the etched areas on the back surface of the metal substrate and the photoresist film on the top surface of the metal substrate is also removed;

FIG. 393 illustrates another step of the exemplary process for manufacturing the exemplary QFN packaging structure in which the etched areas on the back surface of the metal substrate are filled with a sealant;

FIG. 394 illustrates another step of the exemplary process for manufacturing the exemplary QFN packaging structure in which the second metal layer is formed on back surface of multiple outer die pads and the inner leads in the plating process;

FIG. 395 illustrates another step of the exemplary process for manufacturing the exemplary QFN packaging structure in which the plurality of finished encapsulated components formed on the metal substrate is cut into individual packaged integrated circuits (ICs) or individual QFN packaging structures in a package sawing process;

FIG. 396 is a cross-sectional view of another exemplary QFN packaging structure in accordance with one embodiment of the invention;

FIG. 397 illustrates a step of an exemplary process for manufacturing another exemplary QFN packaging structure in accordance with one embodiment of the invention in which a metal substrate is provided for the lead frame manufacturing and packaging process;

FIG. 398 illustrates another step of the exemplary process for manufacturing the exemplary QFN packaging structure in which layers of photoresist film are formed on the top surface and the back surface of the metal substrate, respectively;

FIG. 399 illustrates another step of the exemplary process for manufacturing the exemplary QFN packaging structure in which portions of the photoresist film on the top surface of the metal substrate are removed to form a pattern by photolithography;

FIG. 400 illustrates another step of the exemplary process for manufacturing the exemplary QFN packaging structure in which a multi-layer plating process is performed to form a first metal layer containing both the inner die pad and the inner leads arranged in a multiple ring configuration in the areas of the metal substrate exposed by the plating pattern in the photoresist film;

FIG. 401 illustrates another step of the exemplary process for manufacturing the exemplary QFN packaging structure in which the remaining photoresist film on the top surface of the metal substrate is removed and inner leads are formed on the metal substrate;

FIG. 402 illustrates another step of the exemplary process for manufacturing the exemplary QFN packaging structure in which the multiple dies are attached on the top surface of the outer die pads in a die attaching process;

FIG. 403 illustrates another step of the exemplary process for manufacturing the exemplary QFN packaging structure in which each die is wired to the inner leads surrounding the three sides of the each die;

FIG. 404 illustrates another step of the exemplary process for manufacturing the exemplary QFN packaging structure in which the inner leads, the die, and the metal wires are encapsulated using an encapsulation material;

FIG. 405 illustrates another step of the exemplary process for manufacturing the exemplary QFN packaging structure in which a layer of photoresist film is formed on the top surface of the metal substrate and another layer of photoresist film is formed on the back surface of the metal substrate;

FIG. 406 illustrates another step of the exemplary process for manufacturing the exemplary QFN packaging structure in which exposure, development, and etching are carried out on the photoresist film formed on the back surface of the metal substrate to form an etching pattern in the photoresist film;

FIG. 407 illustrates another step of the exemplary process for manufacturing the exemplary QFN packaging structure in which an etching process is performed on the areas of the metal substrate exposed by the etching pattern in the photoresist film on the back surface of the metal substrate to form etched areas, multiple outer die pads, and I/O pads;

FIG. 408 illustrates another step of the exemplary process for manufacturing the exemplary QFN packaging structure in which the remaining photoresist film on the back surface of the metal substrate is removed to expose the etched areas on the back surface of the metal substrate and the photoresist film on the top surface of the metal substrate is also removed;

FIG. 409 illustrates another step of the exemplary process for manufacturing the exemplary QFN packaging structure in which the etched areas on the back surface of the metal substrate are filled with a sealant;

FIG. 410 illustrates another step of the exemplary process for manufacturing the exemplary QFN packaging structure in which a second metal layer is formed on back surface of multiple outer die pads and the inner leads in the plating process;

FIG. 411 illustrates another step of the exemplary process for manufacturing the exemplary QFN packaging structure in which the plurality of finished encapsulated components formed on the metal substrate is cut into individual packaged integrated circuits (ICs) or individual QFN packaging structures in a package sawing process;

FIG. 412 is a cross-sectional view of another exemplary QFN packaging structure in accordance with one embodiment of the invention;

FIG. 413 illustrates a step of an exemplary process for manufacturing another exemplary QFN packaging structure in accordance with one embodiment of the invention in which a metal substrate is provided for the lead frame manufacturing and packaging process;

FIG. 414 illustrates another step of the exemplary process for manufacturing the exemplary QFN packaging structure in which layers of photoresist film are formed on the top surface and the back surface of the metal substrate, respectively;

FIG. 415 illustrates another step of the exemplary process for manufacturing the exemplary QFN packaging structure in which portions of the photoresist film on the top surface of the metal substrate are removed to form a pattern by photolithography;

FIG. 416 illustrates another step of the exemplary process for manufacturing the exemplary QFN packaging structure in which a multi-layer plating process is performed to form a first metal layer containing both the multiple inner die pads and the inner leads in the areas of the metal substrate exposed by the plating pattern in the photoresist film;

FIG. 417 illustrates another step of the exemplary process for manufacturing the exemplary QFN packaging structure in which the remaining photoresist film on the top surface of the metal substrate is removed and inner leads are formed on the metal substrate;

FIG. 418 illustrates another step of the exemplary process for manufacturing the exemplary QFN packaging structure in which the multiple dies are attached at the top surface of the corresponding inner die pads in a die attaching process;

FIG. 419 illustrates another step of the exemplary process for manufacturing the exemplary QFN packaging structure in which each die is wired to the inner leads surrounding the three sides of the each die;

FIG. 420 illustrates another step of the exemplary process for manufacturing the exemplary QFN packaging structure in which the inner leads, the die, and the metal wires are encapsulated using an encapsulation material;

FIG. 421 illustrates another step of the exemplary process for manufacturing the exemplary QFN packaging structure in which a layer of photoresist film is formed on the top surface of the metal substrate and another layer of photoresist film is formed on the back surface of the metal substrate;

FIG. 422 illustrates another step of the exemplary process for manufacturing the exemplary QFN packaging structure in which exposure, development, and etching are carried out on the photoresist film formed on the back surface of the metal substrate to form an etching pattern in the photoresist film;

FIG. 423 illustrates another step of the exemplary process for manufacturing the exemplary QFN packaging structure in which an etching process is performed on the areas of the metal substrate exposed by the etching pattern in the photoresist film on the back surface of the metal substrate to form etched areas, multiple outer die pads, and I/O pads;

FIG. 424 illustrates another step of the exemplary process for manufacturing the exemplary QFN packaging structure in which the remaining photoresist film on the back surface of the metal substrate is removed to expose the etched areas on the back surface of the metal substrate and the photoresist film on the top surface of the metal substrate is also removed;

FIG. 425 illustrates another step of the exemplary process for manufacturing the exemplary QFN packaging structure in which the etched areas on the back surface of the metal substrate are filled with a sealant;

FIG. 426 illustrates another step of the exemplary process for manufacturing the exemplary QFN packaging structure in which a second metal layer is formed on back surface of multiple outer die pads and the inner leads in the plating process;

FIG. 427 illustrates another step of the exemplary process for manufacturing the exemplary QFN packaging structure in which the plurality of finished encapsulated components formed on the metal substrate is cut into individual packaged integrated circuits (ICs) or individual QFN packaging structures in a package sawing process;

FIG. 428 is a cross-sectional view of another exemplary QFN packaging structure in accordance with one embodiment of the invention;

FIG. 429 illustrates a step of an exemplary process for manufacturing another exemplary QFN packaging structure in accordance with one embodiment of the invention in which a metal substrate is provided for the lead frame manufacturing and packaging process;

FIG. 430 illustrates another step of the exemplary process for manufacturing the exemplary QFN packaging structure in which layers of photoresist film are formed on the top surface and the back surface of the metal substrate, respectively;

FIG. 431 illustrates another step of the exemplary process for manufacturing the exemplary QFN packaging structure in which portions of the photoresist film on the top surface of the metal substrate are removed to form a pattern by photolithography;

FIG. 432 illustrates another step of the exemplary process for manufacturing the exemplary QFN packaging structure in which a multi-layer plating process is performed to form a first metal layer containing both the inner die pad and the inner leads arranged in a multiple ring configuration in the areas of the metal substrate exposed by the plating pattern in the photoresist film;

FIG. 433 illustrates another step of the exemplary process for manufacturing the exemplary QFN packaging structure in which the remaining photoresist film on the top surface of the metal substrate is removed and inner leads are formed on the metal substrate;

FIG. 434 illustrates another step of the exemplary process for manufacturing the exemplary QFN packaging structure in which one or more passive devices are coupled between inner leads using a conductive or non-conductive adhesive material;

FIG. 435 illustrates another step of the exemplary process for manufacturing the exemplary QFN packaging structure in which the multiple dies are attached at the top surface of the outer die pads in a die attaching process and each die is surrounded by the inner leads from three outer sides;

FIG. 436 illustrates another step of the exemplary process for manufacturing the exemplary QFN packaging structure in which each die is wired to the inner leads surrounding the three sides of the each die;

FIG. 437 illustrates another step of the exemplary process for manufacturing the exemplary QFN packaging structure in which the inner leads, the die, and the metal wires are encapsulated using an encapsulation material;

FIG. 438 illustrates another step of the exemplary process for manufacturing the exemplary QFN packaging structure in which a layer of photoresist film is formed on the top surface of the metal substrate and another layer of photoresist film is formed on the back surface of the metal substrate;

FIG. 439 illustrates another step of the exemplary process for manufacturing the exemplary QFN packaging structure in which exposure, development, and etching are carried out on the photoresist film formed on the back surface of the metal substrate to form an etching pattern in the photoresist film;

FIG. 440 illustrates another step of the exemplary process for manufacturing the exemplary QFN packaging structure in which an etching process is performed on the areas of the metal substrate exposed by the etching pattern in the photoresist film on the back surface of the metal substrate to form etched areas, multiple outer die pads, and I/O pads;

FIG. 441 illustrates another step of the exemplary process for manufacturing the exemplary QFN packaging structure in which the remaining photoresist film on the back surface of the metal substrate is removed to expose the etched areas on the back surface of the metal substrate and the photoresist film on the top surface of the metal substrate is also removed;

FIG. 442 illustrates another step of the exemplary process for manufacturing the exemplary QFN packaging structure in which the etched areas on the back surface of the metal substrate are filled with a sealant;

FIG. 443 illustrates another step of the exemplary process for manufacturing the exemplary QFN packaging structure in which a second metal layer is formed on back surface of multiple outer die pads and the inner leads in the plating process;

FIG. 444 illustrates another step of the exemplary process for manufacturing the exemplary QFN packaging structure in which the plurality of finished encapsulated components formed on the metal substrate is cut into individual packaged integrated circuits (ICs) or individual QFN packaging structures in a package sawing process;

FIG. 445 is a cross-sectional view of another exemplary QFN packaging structure in accordance with one embodiment of the invention;

FIG. 446 illustrates a step of an exemplary process for manufacturing another exemplary QFN packaging structure in accordance with one embodiment of the invention in which a metal substrate is provided for the lead frame manufacturing and packaging process;

FIG. 447 illustrates another step of the exemplary process for manufacturing the exemplary QFN packaging structure in which layers of photoresist film are formed on the top surface and the back surface of the metal substrate, respectively;

FIG. 448 illustrates another step of the exemplary process for manufacturing the exemplary QFN packaging structure in which portions of the photoresist film on the top surface of the metal substrate are removed to form a pattern by photolithography;

FIG. 449 illustrates another step of the exemplary process for manufacturing the exemplary QFN packaging structure in which a multi-layer plating process is performed to form a first metal layer containing both the multiple inner die pads and the inner leads in the areas of the metal substrate exposed by the plating pattern in the photoresist film;

FIG. 450 illustrates another step of the exemplary process for manufacturing the exemplary QFN packaging structure in which the remaining photoresist film on the top surface of the metal substrate is removed and inner leads are formed on the metal substrate;

FIG. 451 illustrates another step of the exemplary process for manufacturing the exemplary QFN packaging structure in which one or more passive devices are coupled between inner leads using a conductive or non-conductive adhesive material;

FIG. 452 illustrates another step of the exemplary process for manufacturing the exemplary QFN packaging structure in which the multiple dies are attached at the top surface of the corresponding inner die pads in a die attaching process and each die is surrounded by the inner leads from three outer sides;

FIG. 453 illustrates another step of the exemplary process for manufacturing the exemplary QFN packaging structure in which each die is wired to the inner leads surrounding the three sides of the each die;

FIG. 454 illustrates another step of the exemplary process for manufacturing the exemplary QFN packaging structure in which the inner leads, the die, and the metal wires are encapsulated using an encapsulation material;

FIG. 455 illustrates another step of the exemplary process for manufacturing the exemplary QFN packaging structure in which a layer of photoresist film is formed on the top surface of the metal substrate and another layer of photoresist film is formed on the back surface of the metal substrate;

FIG. 456 illustrates another step of the exemplary process for manufacturing the exemplary QFN packaging structure in which exposure, development, and etching are carried out on the photoresist film formed on the back surface of the metal substrate to form an etching pattern in the photoresist film;

FIG. 457 illustrates another step of the exemplary process for manufacturing the exemplary QFN packaging structure in which an etching process is performed on the areas of the metal substrate exposed by the etching pattern in the photoresist film on the back surface of the metal substrate to form etched areas, multiple outer die pads, and I/O pads;

FIG. 458 illustrates another step of the exemplary process for manufacturing the exemplary QFN packaging structure in which the remaining photoresist film on the back surface of the metal substrate is removed to expose the etched areas on the back surface of the metal substrate and the photoresist film on the top surface of the metal substrate is also removed;

FIG. 459 illustrates another step of the exemplary process for manufacturing the exemplary QFN packaging structure in which the etched areas on the back surface of the metal substrate are filled with a sealant;

FIG. 460 illustrates another step of the exemplary process for manufacturing the exemplary QFN packaging structure in which a second metal layer is formed on back surface of multiple outer die pads and the inner leads in the plating process;

FIG. 461 illustrates another step of the exemplary process for manufacturing the exemplary QFN packaging structure in which the plurality of finished encapsulated components formed on the metal substrate is cut into individual packaged integrated circuits (ICs) or individual QFN packaging structures in a package sawing process;

FIG. 462 is a cross-sectional view of another exemplary QFN packaging structure in accordance with one embodiment of the invention;

FIG. 463 illustrates an exemplary process for manufacturing another exemplary QFN packaging structure in accordance with one embodiment of the invention in which a metal substrate is provided for the lead frame manufacturing and packaging process;

FIG. 464 illustrates another step of the exemplary process for manufacturing the exemplary QFN packaging structure in which layers of photoresist film are formed on the top surface and the back surface of the metal substrate, respectively;

FIG. 465 illustrates another step of the exemplary process for manufacturing the exemplary QFN packaging structure in which portions of the photoresist film on the top surface of the metal substrate are removed to form a pattern by photolithography;

FIG. 466 illustrates another step of the exemplary process for manufacturing the exemplary QFN packaging structure in which a multi-layer plating process is performed to form a first metal layer containing both the inner die pad and the inner leads arranged in a multiple ring configuration in the areas of the metal substrate exposed by the plating pattern in the photoresist film;

FIG. 467 illustrates another step of the exemplary process for manufacturing the exemplary QFN packaging structure in which the remaining photoresist film on the top surface of the metal substrate is removed and inner leads are formed on the metal substrate;

FIG. 468 illustrates another step of the exemplary process for manufacturing the exemplary QFN packaging structure in which a die is attached on a predetermined die area of the metal substrate in a die attaching process;

FIG. 469 illustrates another step of the exemplary process for manufacturing the exemplary QFN packaging structure in which the top surface of the die and the top surface of the inner leads are connected with metal wires and the die is also attached to the top surface of the inner electrostatic discharge ring in a wire bonding process;

FIG. 470 illustrates another step of the exemplary process for manufacturing the exemplary QFN packaging structure in which the inner leads, the die, and the metal wires are encapsulated using an encapsulation material;

FIG. 471 illustrates another step of the exemplary process for manufacturing the exemplary QFN packaging structure in which a layer of photoresist film is formed on the top surface of the metal substrate and another layer of photoresist film is formed on the back surface of the metal substrate;

FIG. 472 illustrates another step of the exemplary process for manufacturing the exemplary QFN packaging structure in which exposure, development, and etching are carried out on the photoresist film formed on the back surface of the metal substrate to form an etching pattern in the photoresist film;

FIG. 473 illustrates another step of the exemplary process for manufacturing the exemplary QFN packaging structure in which an etching process is performed on the areas of the metal substrate exposed by the etching pattern in the photoresist film on the back surface of the metal substrate to form etched areas, an outer die pad, and I/O pads;

FIG. 474 illustrates another step of the exemplary process for manufacturing the exemplary QFN packaging structure in which the remaining photoresist film on the back surface of the metal substrate is removed to expose the etched areas on the back surface of the metal substrate and the photoresist film on the top surface of the metal substrate is also removed;

FIG. 475 illustrates another step of the exemplary process for manufacturing the exemplary QFN packaging structure in which the etched areas on the back surface of the metal substrate are filled with a sealant;

FIG. 476 illustrates another step of the exemplary process for manufacturing the exemplary QFN packaging structure in which a plating process is performed on the bottom surface of the outer die pad and the I/O pads to form a second metal layer;

FIG. 477 illustrates another step of the exemplary process for manufacturing the exemplary QFN packaging structure in which the plurality of finished encapsulated components formed on the metal substrate is cut into individual packaged integrated circuits (ICs) or individual QFN packaging structures in a package sawing process;

FIG. 478 is a cross-sectional view of another exemplary QFN packaging structure in accordance with one embodiment of the invention;

FIG. 479 illustrates an exemplary process for manufacturing another exemplary QFN packaging structure in accordance with one embodiment of the invention in which a metal substrate is provided for the lead frame manufacturing and packaging process;

FIG. 480 illustrates another step of the exemplary process for manufacturing the exemplary QFN packaging structure in which layers of photoresist film are formed on the top surface and the back surface of the metal substrate, respectively;

FIG. 481 illustrates another step of the exemplary process for manufacturing the exemplary QFN packaging structure in which portions of the photoresist film on the top surface of the metal substrate are removed to form a pattern by photolithography;

FIG. 482 illustrates another step of the exemplary process for manufacturing the exemplary QFN packaging structure in which a multi-layer plating process is performed to form a first metal layer containing both the multiple inner die pads and the inner leads in the areas of the metal substrate exposed by the plating pattern in the photoresist film;

FIG. 483 illustrates another step of the exemplary process for manufacturing the exemplary QFN packaging structure in which the remaining photoresist film on the top surface of the metal substrate is removed and inner leads are formed on the metal substrate;

FIG. 484 illustrates another step of the exemplary process for manufacturing the exemplary QFN packaging structure in which the multiple dies are attached at the top surface of the corresponding inner die pads in a die attaching process;

FIG. 485 illustrates another step of the exemplary process for manufacturing the exemplary QFN packaging structure in which the top surface of the die and the top surface of the inner leads are connected with metal wires and the die is also attached to the top surface of the inner electrostatic discharge ring in a wire bonding process;

FIG. 486 illustrates another step of the exemplary process for manufacturing the exemplary QFN packaging structure in which the inner leads, the die, and the metal wires are encapsulated using an encapsulation material;

FIG. 487 illustrates another step of the exemplary process for manufacturing the exemplary QFN packaging structure in which a layer of photoresist film is formed on the top surface of the metal substrate and another layer of photoresist film is formed on the back surface of the metal substrate;

FIG. 488 illustrates another step of the exemplary process for manufacturing the exemplary QFN packaging structure in which exposure, development, and etching are carried out on the photoresist film formed on the back surface of the metal substrate to form an etching pattern in the photoresist film;

FIG. 489 illustrates another step of the exemplary process for manufacturing the exemplary QFN packaging structure in which an etching process is performed on the areas of the metal substrate exposed by the etching pattern in the photoresist film on the back surface of the metal substrate to form etched areas, an outer die pad, and I/O pads;

FIG. 490 illustrates another step of the exemplary process for manufacturing the exemplary QFN packaging structure in which the remaining photoresist film on the back surface of the metal substrate is removed to expose the etched areas on the back surface of the metal substrate and the photoresist film on the top surface of the metal substrate is also removed;

FIG. 491 illustrates another step of the exemplary process for manufacturing the exemplary QFN packaging structure in which the etched areas on the back surface of the metal substrate are filled with a sealant;

FIG. 492 illustrates another step of the exemplary process for manufacturing the exemplary QFN packaging structure in which a plating process is performed on the bottom surface of the outer die pad and the I/O pads to form a second metal layer;

FIG. 493 illustrates another step of the exemplary process for manufacturing the exemplary QFN packaging structure in which the plurality of finished encapsulated components formed on the metal substrate is cut into individual packaged integrated circuits (ICs) or individual QFN packaging structures in a package sawing process;

FIG. 494 is a cross-sectional view of another exemplary QFN packaging structure in accordance with one embodiment of the invention;

FIG. 495 illustrates a step of an exemplary process for manufacturing another exemplary QFN packaging structure in accordance with one embodiment of the invention in which a metal substrate is provided for the lead frame manufacturing and packaging process;

FIG. 496 illustrates another step of the exemplary process for manufacturing the exemplary QFN packaging structure in which layers of photoresist film are formed on the top surface and the back surface of the metal substrate, respectively;

FIG. 497 illustrates another step of the exemplary process for manufacturing the exemplary QFN packaging structure in which portions of the photoresist film on the top surface of the metal substrate are removed to form a pattern by photolithography;

FIG. 498 illustrates another step of the exemplary process for manufacturing the exemplary QFN packaging structure in which a multi-layer plating process is performed to form a first metal layer containing both the inner die pad and the inner leads arranged in a multiple ring configuration in the areas of the metal substrate exposed by the plating pattern in the photoresist film;

FIG. 499 illustrates another step of the exemplary process for manufacturing the exemplary QFN packaging structure in which the remaining photoresist film on the top surface of the metal substrate is removed and inner leads are formed on the metal substrate;

FIG. 500 illustrates another step of the exemplary process for manufacturing the exemplary QFN packaging structure in which one or more passive devices are coupled between the inner leads using a conductive or non-conductive adhesive material;

FIG. 501 illustrates another step of the exemplary process for manufacturing the exemplary QFN packaging structure in which a die is attached on a predetermined die area of the metal substrate in a die attaching process;

FIG. 502 illustrates another step of the exemplary process for manufacturing the exemplary QFN packaging structure in which the top surface of the die and the top surface of the inner leads are connected with metal wires and the die is also attached to the top surface of the inner electrostatic discharge ring in a wire bonding process;

FIG. 503 illustrates another step of the exemplary process for manufacturing the exemplary QFN packaging structure in which the inner leads, the die, and the metal wires are encapsulated using an encapsulation material;

FIG. 504 illustrates another step of the exemplary process for manufacturing the exemplary QFN packaging structure in which a layer of photoresist film is formed on the top surface of the metal substrate and another layer of photoresist film is formed on the back surface of the metal substrate;

FIG. 505 illustrates another step of the exemplary process for manufacturing the exemplary QFN packaging structure in which exposure, development, and etching are carried out on the photoresist film formed on the back surface of the metal substrate to form an etching pattern in the photoresist film;

FIG. 506 illustrates another step of the exemplary process for manufacturing the exemplary QFN packaging structure in which an etching process is performed on the areas of the metal substrate exposed by the etching pattern in the photoresist film on the back surface of the metal substrate to form etched areas, an outer die pad, and I/O pads;

FIG. 507 illustrates another step of the exemplary process for manufacturing the exemplary QFN packaging structure in which the remaining photoresist film on the back surface of the metal substrate is removed to expose the etched areas on the back surface of the metal substrate and the photoresist film on the top surface of the metal substrate is also removed;

FIG. 508 illustrates another step of the exemplary process for manufacturing the exemplary QFN packaging structure in which the etched areas on the back surface of the metal substrate are filled with a sealant;

FIG. 509 illustrates another step of the exemplary process for manufacturing the exemplary QFN packaging structure in which the second metal layer is formed on back surface of multiple outer die pads and the inner leads in the plating process;

FIG. 510 illustrates another step of the exemplary process for manufacturing the exemplary QFN packaging structure in which the plurality of finished encapsulated components formed on the metal substrate is cut into individual packaged integrated circuits (ICs) or individual QFN packaging structures in a package sawing process;

FIG. 511 is a cross-sectional view of another exemplary QFN packaging structure in accordance with one embodiment of the invention;

FIG. 512 illustrates a step of an exemplary process for manufacturing another exemplary QFN packaging structure in accordance with one embodiment of the invention in which a metal substrate is provided for the lead frame manufacturing and packaging process;

FIG. 513 illustrates another step of the exemplary process for manufacturing the exemplary QFN packaging structure in which layers of photoresist film are formed on the top surface and the back surface of the metal substrate, respectively;

FIG. 514 illustrates another step of the exemplary process for manufacturing the exemplary QFN packaging structure in which portions of the photoresist film on the top surface of the metal substrate are removed to form a pattern by photolithography;

FIG. 515 illustrates another step of the exemplary process for manufacturing the exemplary QFN packaging structure in which a multi-layer plating process is performed to form a first metal layer containing both the multiple inner die pads and the inner leads in the areas of the metal substrate exposed by the plating pattern in the photoresist film;

FIG. 516 illustrates another step of the exemplary process for manufacturing the exemplary QFN packaging structure in which the remaining photoresist film on the top surface of the metal substrate is removed and inner leads are formed on the metal substrate;

FIG. 517 illustrates another step of the exemplary process for manufacturing the exemplary QFN packaging structure in which one or more passive devices are coupled between the inner leads using a conductive or non-conductive adhesive material;

FIG. 518 illustrates another step of the exemplary process for manufacturing the exemplary QFN packaging structure in which the multiple dies are attached at the top surface of the corresponding inner die pads in a die attaching process;

FIG. 519 illustrates another step of the exemplary process for manufacturing the exemplary QFN packaging structure in which the top surface of the die and the top surface of the inner leads are connected with metal wires and the die is also attached to the top surface of the inner electrostatic discharge ring in a wire bonding process;

FIG. 520 illustrates another step of the exemplary process for manufacturing the exemplary QFN packaging structure in which the inner leads, the die, and the metal wires are encapsulated using an encapsulation material;

FIG. 521 illustrates another step of the exemplary process for manufacturing the exemplary QFN packaging structure in which a layer of photoresist film is formed on the top surface of the metal substrate and another layer of photoresist film is formed on the back surface of the metal substrate;

FIG. 522 illustrates another step of the exemplary process for manufacturing the exemplary QFN packaging structure in which exposure, development, and etching are carried out on the photoresist film formed on the back surface of the metal substrate to form an etching pattern in the photoresist film;

FIG. 523 illustrates another step of the exemplary process for manufacturing the exemplary QFN packaging structure in which an etching process is performed on the areas of the metal substrate exposed by the etching pattern in the photoresist film on the back surface of the metal substrate to form etched areas, an outer die pad, and I/O pads;

FIG. 524 illustrates another step of the exemplary process for manufacturing the exemplary QFN packaging structure in which the remaining photoresist film on the back surface of the metal substrate is removed to expose the etched areas on the back surface of the metal substrate and the photoresist film on the top surface of the metal substrate is also removed;

FIG. 525 illustrates another step of the exemplary process for manufacturing the exemplary QFN packaging structure in which the etched areas on the back surface of the metal substrate are filled with a sealant;

FIG. 526 illustrates another step of the exemplary process for manufacturing the exemplary QFN packaging structure in which the second metal layer is formed on back surface of multiple outer die pads and the inner leads in the plating process;

FIG. 527 illustrates another step of the exemplary process for manufacturing the exemplary QFN packaging structure in which the plurality of finished encapsulated components formed on the metal substrate is cut into individual packaged integrated circuits (ICs) or individual QFN packaging structures in a package sawing process;

FIG. 528 is a cross-sectional view of another exemplary QFN packaging structure in accordance with one embodiment of the invention;

FIG. 529 shows a high-temperature resistant film affixed on a lead frame;

FIG. 530 shows molding material infiltrated the high-temperature resistant film affixed on the lead frame; and FIG. 531 shows a two-side etched lead frame.

DETAILED DESCRIPTION OF THE EMBODIMENTS

For further illustrating the invention, experiments detailing a quad flat no-lead (QFN) packaging structure and method for manufacturing the same are described below. It should be noted that the following examples are intended to describe and not to limit the invention.

FIG. 16 illustrates an exemplary quad flat no-lead (QFN) packaging structure with single die pad in accordance with one embodiment of the invention. As shown in FIG. 16, the QFN packaging structure comprises outer die pad 1, input/output (I/O) pad(s) 2, inner lead(s) 4, die 5, metal wire(s) 6, and encapsulation material 7, such as EMC compound. Certain components can be omitted and other components can be added.

The outer die pad 1 comprises any structure to be configured as a die pad to provide contact (e.g., thermal, electrical, etc.) to the die 5, and the outer die pad 1 may be in any appropriate shape, such as a rectangle, a square, or a circle, etc. The die 5 comprises any pre-made semiconductor chip to be assembled or packaged. Further, I/O pads 2 comprise a plurality of metal pads or traces to provide external connections to the die 5 or any other components inside the QFN packaging structure through inner leads 4. The I/O pads 2 may be in any appropriate shape, such as rectangle, square, circle, or polygon, etc., and may also be leads without extending out of the QFN packaging structure. The plurality of pads or leads of the I/O pads 2 are arranged in a predetermined configuration, such as a ring, an array, multiple rows, or any other appropriate configuration. For example, in certain embodiments, the I/O pads 2 are arranged in a single ring configuration in a rectangle shape.

The die 5 is mounted on the top surface of the outer die pad 1 through a conductive or non-conductive adhesive material 8, such as epoxy, soft solder, or other conductive or non-conductive material. Further, from the top surface of the I/O pads 2, an electrical plating (or simply plating) process such as multi-plating is used to form inner leads 4. More specifically, multiple layers are formed by plating such that the distance between adjacent inner leads (i.e., inner lead pitch) is substantially reduced. The top surface of the inner leads 4 and the top surface of die 5 may be connected by the metal wires 6. Further, the inner leads 4 may be formed significantly close to the die 5 via lead traces, such that the length of metal wires 6 connecting the die 5 to the inner leads 4 may also be substantially reduced.

All inner leads 4 may be referred as the first metal layer 14. That is, the first metal layer 14 comprises all leads of inner leads 4. The inner leads 4, the die 5, and the metal wires 6 are covered with encapsulation material 7, such as EMC compound. Further, at the backside of the substrate, sealant 10 are filled in the peripheral areas of the outer die pad 1 and I/O pads 2, in the area between the outer die pad 1 and I/O pads 2, and in the area between adjacent I/O pads 2. The back surface of the outer die pad 1 and I/O pads 2 are exposed from the sealant 10 and a second metal layer 9 is formed on the back surface of the outer die pad 1 and I/O pads 2. The sealant 10 comprises any appropriate type of sealant, such as a no-filler compound or a small-filler compound.

The process for manufacturing the above described QFN packaging structure may be explained below in detail with corresponding drawings. The process is used to make a plurality of components (packaged ICs). Because each component or packaged IC may be made in a same way, only a single packaged IC may be described for illustrative purposes.

Figure 1:
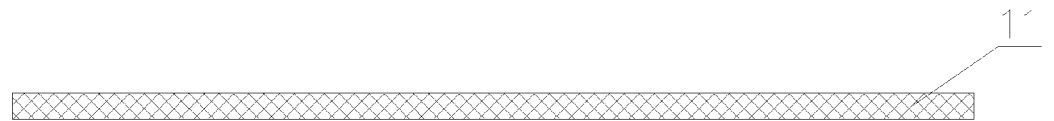
FIG. 1 illustrates a step of an exemplary process for manufacturing an exemplary QFN packaging structure in accordance with one embodiment of the invention in which a metal substrate is provided for the lead frame manufacturing and packaging process.

As shown in FIG. 1, at the beginning, a metal substrate 11 is provided for the lead frame manufacturing and packaging process. The metal substrate 11 has a desired thickness and be made from various metal materials depending on particular types of die 5. For example, metal substrate 11 may be made from one of copper, aluminum, iron, copper alloy, stainless steel or nickel-iron alloy. Other materials may also be used.

Figure 2:
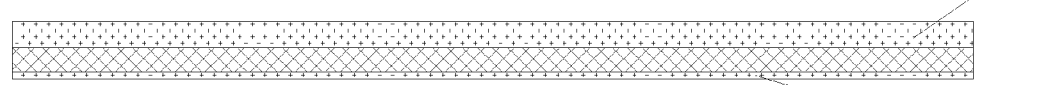
FIG. 2 illustrates another step of the exemplary process for manufacturing the exemplary QFN packaging structure in which layers of photoresist film are formed on the top surface and the back surface of the metal substrate, respectively.

Further, as shown in FIG. 2, a layer of photoresist film 12 and a layer of photoresist film 13 may be formed (pasted or coated) on the top surface and the back surface of the metal substrate 11, respectively. The photoresist film 12 and/or photoresist film 13 may be formed using various ways. For example, photoresist film 12 and/or photoresist film 13 may be coated on the surface or may be pasted on the surface. The photoresist films 12 and 13 may be used to protect the metal substrate 11 in subsequent plating processes, and the photoresist films 12 or 13 comprise a dry photoresist film or a wet photoresist film. Other types of photoresist films may also be used.

Figure 3:
FIG. 3 illustrates another step of the exemplary process for manufacturing the exemplary QFN packaging structure in which portions of the photoresist film on the top surface of the metal substrate are removed to form a pattern by photolithography.

Further, as shown in FIG. 3, portions of the photoresist film 12 on the top surface of the metal substrate 11 may be removed to form a pattern by photolithography. As shown in FIG. 3, photolithography equipment may be used to perform exposure, development, and etching on the photoresist film 12 using a corresponding mask to form a plating pattern in the photoresist film 12. The plating pattern may expose the predetermined areas of the metal substrate 11 for subsequent plating process to form the first metal layer 14, i.e., a first metal layer pattern.

Figure 4:
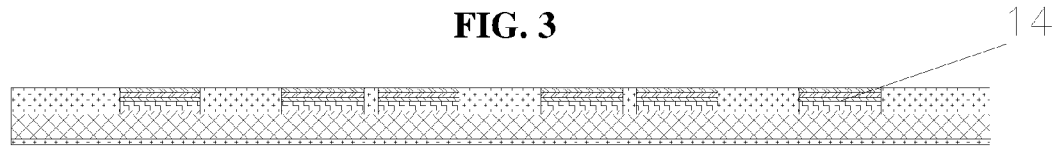
FIG. 4 illustrates another step of the exemplary process for manufacturing the exemplary QFN packaging structure in which a multi-layer plating process is performed to form a first metal layer in the areas of the metal substrate exposed by the plating pattern in the photoresist film.

After forming the plating pattern or the first metal layer pattern, as shown in FIG. 4, a multi-layer plating process may be performed to form the first metal layer 14 in the areas of the metal substrate 11 exposed by the plating pattern in the photoresist film 12. In other words, the multi-layer plating process is performed on the top surface of the metal substrate 11 using the pattern in the photoresist film 12 as a mask to form inner leads 4 (the first metal layer 14). The inner leads 4 may also be formed corresponding to the I/O pads 2 and may also be arranged in a corresponding shape (e.g., a rectangle) and configuration (e.g., a single ring configuration). Other shapes and configurations may also be used.

Because the inner leads 4 are formed by the plating process, the lead pitch of the inner leads 4 and the distance between the inner leads 4 and the die 5 may be substantially reduced. For example, the inner leads 4 may be formed by a thin-line plating method on the top surface of the metal substrate 11. The width of the inner leads 4 may be approximately 25 µm, and the lead pitch of the inner leads 4 may also be approximately 25 µm. Comparing the lead pitch of about 100 µm in conventional lead frames, the width of the inner leads 4 and the lead pitch of the inner leads 4 may be significantly reduced, which may achieve high density for inner leads 4. Further, the inner leads 4 may extend to the proximity of the die 5 via lead traces. Using the plating process, the distance between the die and the inner leads 4 can also be significantly reduced such that the inner leads 4 can extend substantially close to the die 5, which can substantially reduce the package size.

The first metal layer 14 (e.g., the inner leads 4) may comprise any appropriate number of layers of metal materials and/or metal layer structure. For example, the first metal layer 14 may comprise, from bottom to the top, a total of five layers of nickel, copper, nickel, palladium, and gold, respectively, or a total of three layers of nickel, copper, and silver. Other materials and number of layers and/or layer structures may also be used.

Different metal layers in the first metal layer 14 may provide different functionalities. For example, in a five-layer structure (nickel, copper, nickel, palladium, and gold), the bottom layer of nickel may be used as an erosion resistant and barrier layer, the middle layers of copper, nickel and palladium may be used to increase the thickness of the first metal layer 14, and the top layer of gold may be used for wire bonding. Other functionalities may also be provided and other metal layer structures may also be used.

Figure 5:
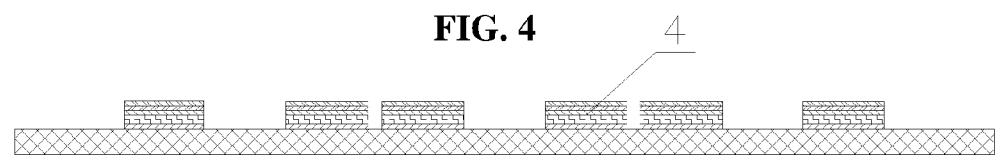
FIG. 5 illustrates another step of the exemplary process for manufacturing the exemplary QFN packaging structure in which the remaining photoresist film on the top surface of the metal substrate is removed and inner leads are formed on the metal substrate.

Further, as shown in FIG. 5, the remaining top surface photoresist film 12 is removed and inner leads 4 are formed on the metal substrate 11. The back surface photoresist film 13 is also removed.

Figure 6:
FIG. 6 illustrates another step of the exemplary process for manufacturing the exemplary QFN packaging structure in which a die is attached on a predetermined die area of the metal substrate in a die attaching process.
Figure 7:
FIG. 7 illustrates another step of the exemplary process for manufacturing the exemplary QFN packaging structure in which the top surface of the die and the top surface of the inner leads are connected with metal wires in a wire bonding process.

After removing the photoresist films, the die 5 may be attached on a predetermined die area of the metal substrate 11 using the conductive or non-conductive adhesive material 8, as shown in FIG. 6, in a die attaching process. The predetermined die area of the metal substrate 11 may correspond to the outer die pad 1 to be formed in a subsequent process. The top surface of die 5 and the top surface of the inner leads 4 are connected with metal wires 6 in a wire bonding process, as shown in FIG. 7.

Figure 8:
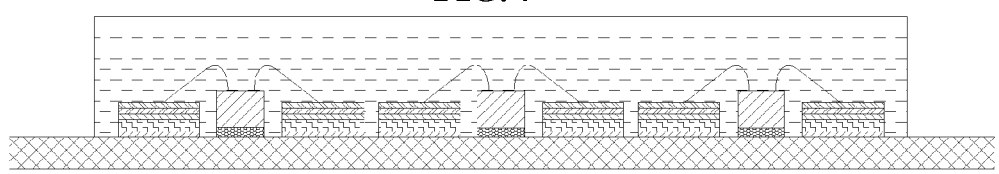
FIG. 8 illustrates another step of the exemplary process for manufacturing the exemplary QFN packaging structure in which the inner leads, the die, and the metal wires are encapsulated using an encapsulation material.

The inner leads 4, the die 5, and the metal wires 6 are then encapsulated using encapsulation material, as shown in FIG. 8. For example, molding equipment may be used to seal or encapsulate the metal substrate 11 completed die attaching and wire bonding by a molding compound. Post-molding curing may also be performed such that the molding compound or other encapsulation materials may also be cured before the next manufacturing process.

Figure 9:
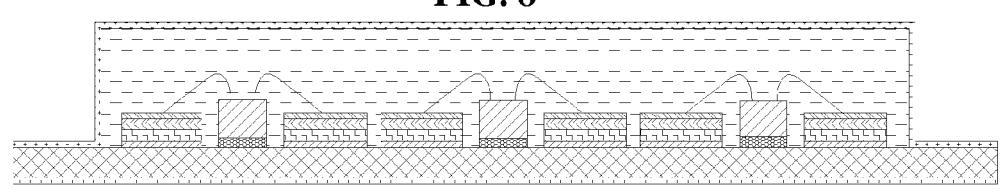
FIG. 9 illustrates another step of the exemplary process for manufacturing the exemplary QFN packaging structure in which a layer of photoresist film is formed on the top surface of the metal substrate and another layer of photoresist film is formed on the back surface of the metal substrate.

As shown in FIG. 9, after the encapsulation process (e.g., molding and post-molding curing), a layer of photoresist film 13 may be formed on the top surface of the metal substrate 11 and another layer of photoresist film 13 may be formed on the back surface of the metal substrate 11. The photoresist films may be used to protect the metal substrate 11 in subsequent etching processes, and the photoresist films may comprise a dry photoresist film or a wet photoresist film. Other types of photoresist films may also be used.

Figure 10:
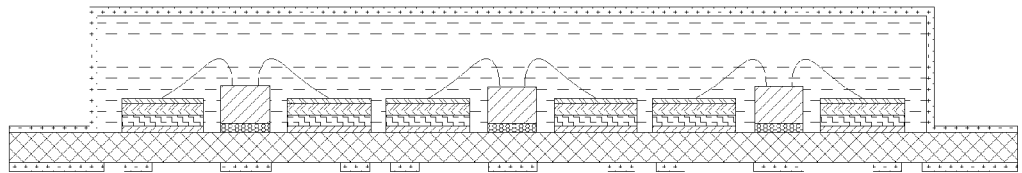
FIG. 10 illustrates another step of the exemplary process for manufacturing the exemplary QFN packaging structure in which exposure, development, and etching are carried out on the photoresist film formed on the back surface of the metal substrate to form an etching pattern in the photoresist film.

Further, portion of the photoresist film 13 on the back surface of the metal substrate 11 may be removed to form a pattern using photolithography. As shown in FIG. 10, photolithography equipment may be used to perform exposure, development, and etching on the photoresist film 13 on the back surface of the metal substrate 11 using a corresponding mask to form an etching pattern in the photoresist film 13. The etching pattern may expose the predetermined areas on the back surface of the metal substrate 11 for subsequent etching process to form die pad 1 and I/O pads 2, i.e., the die pad and I/O pad pattern.

Figure 11:
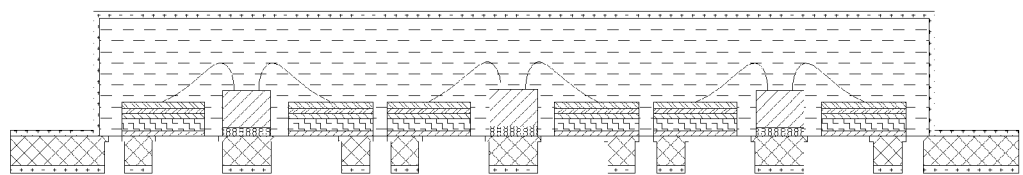
FIG. 11 illustrates another step of the exemplary process for manufacturing the exemplary QFN packaging structure in which an etching process is performed on the areas of the metal substrate exposed by the etching pattern in the photoresist film on the back surface of the metal substrate to form etched areas, an outer die pad, and I/O pads.

After forming the etching pattern, as shown in FIG. 11, an etching process may be performed on the areas of the metal substrate 11 exposed by the etching pattern in the photoresist film 13. In other words, the etching process is performed on the metal substrate 11 using the pattern in the photoresist film 13 as a mask. The etching process may be full etching or half etching. Etched areas are thus formed at the back surface of the metal substrate 11, and the outer die pad 1 and the I/O pads 2 are also formed after the etching process.

Figure 12:
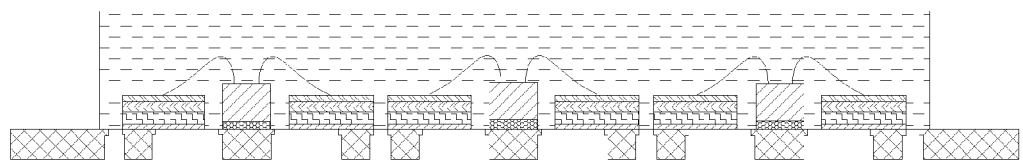
FIG. 12 illustrates another step of the exemplary process for manufacturing the exemplary QFN packaging structure in which the remaining photoresist film on the back surface of the metal substrate is removed to expose the etched areas on the back surface of the metal substrate and the photoresist film on the top surface of the metal substrate is also removed.

Further, as shown in FIG. 12, after the etching process, the remaining photoresist film 13 on the back surface of the metal substrate 11 is removed to expose the etched areas on the back surface of the metal substrate 11 comprising the areas outside the outer die pad 1 and the I/O pads 2, the areas between the outer die pad 1 and the I/O pads 2, and the areas between the plurality pads of the I/O pads 2. The photoresist film 13 on the top surface of the metal substrate 11 is also removed.

Figure 13:
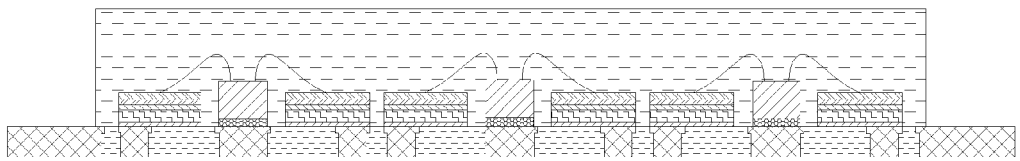
FIG. 13 illustrates another step of the exemplary process for manufacturing the exemplary QFN packaging structure in which the etched areas on the back surface of the metal substrate are filled with a sealant.

Afterwards, as shown in FIG. 13, the etched areas on the back surface of the metal substrate 11 are filled with sealant 10 using filling equipment. Post-molding curing may be performed on the sealant 10. The sealant 10 may comprise any appropriate sealant, such a no-filler compound or a small-filler compound.

Figure 14:
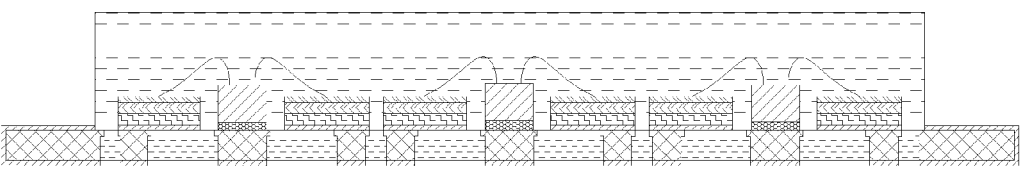
FIG. 14 illustrates another step of the exemplary process for manufacturing the exemplary QFN packaging structure in which a plating process is performed on the bottom surface of the outer die pad and the I/O pads to form a second metal layer.

Further, as shown in FIG. 14, a plating process may be performed on the bottom surface of the outer die pad 1 and the I/O pads 2 to form a second metal layer 9. The second metal layer 9 may be made from various materials, such as gold, nickel, copper, palladium, silver or tin, etc.

Figure 15:
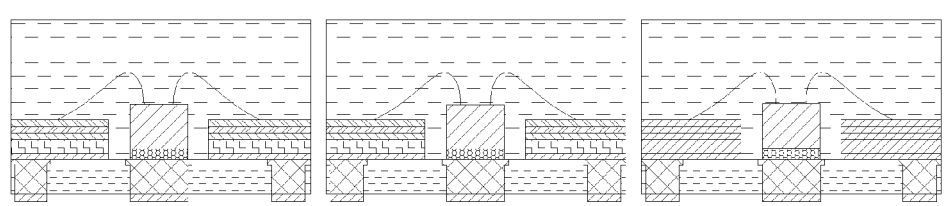
FIG. 15 illustrates another step of the exemplary process for manufacturing the exemplary QFN packaging structure in which the plurality of finished encapsulated components formed on the metal substrate is cut into individual packaged integrated circuits (ICs) or individual QFN packaging structures in a package sawing process.
Figure 22:
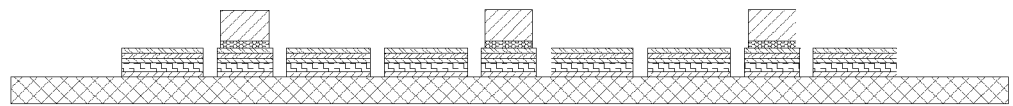
FIG. 22 illustrates another step of the exemplary process for manufacturing the exemplary QFN packaging structure in which a die is attached on the top surface of the inner die pad in a die attaching process.
Figure 23:
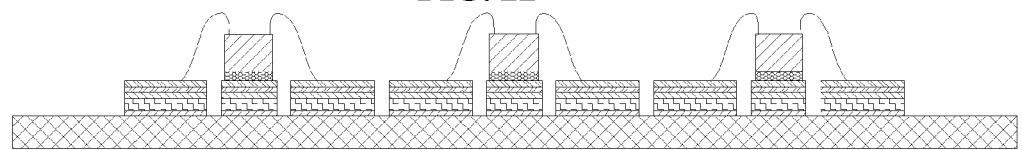
FIG. 23 illustrates another step of the exemplary process for manufacturing the exemplary QFN packaging structure in which the top surface of the die and the top surface of the inner leads are connected with metal wires in a wire bonding process.
Figure 24:
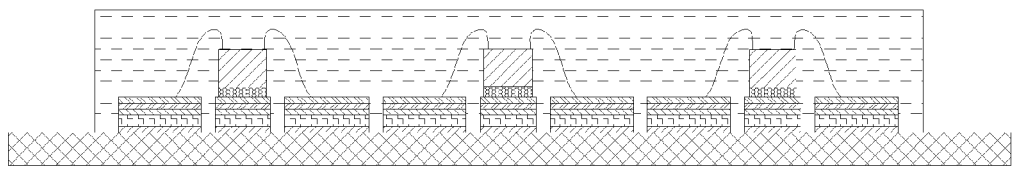
FIG. 24 illustrates another step of the exemplary process for manufacturing the exemplary QFN packaging structure in which the inner leads, the die, and the metal wires are encapsulated using an encapsulation material.
Figure 25:
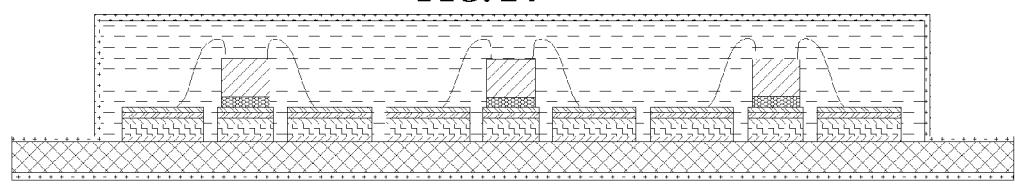
FIG. 25 illustrates another step of the exemplary process for manufacturing the exemplary QFN packaging structure in which a layer of photoresist film is formed on the top surface of the metal substrate and another layer of photoresist film is formed on the back surface of the metal substrate.
Figure 26:
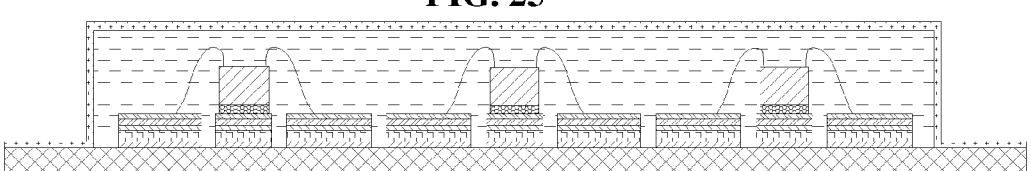
FIG. 26 illustrates another step of the exemplary process for manufacturing the exemplary QFN packaging structure in which exposure, development, and etching are carried out on the photoresist film formed on the back surface of the metal substrate to form an etching pattern in the photoresist film.
Figure 27:
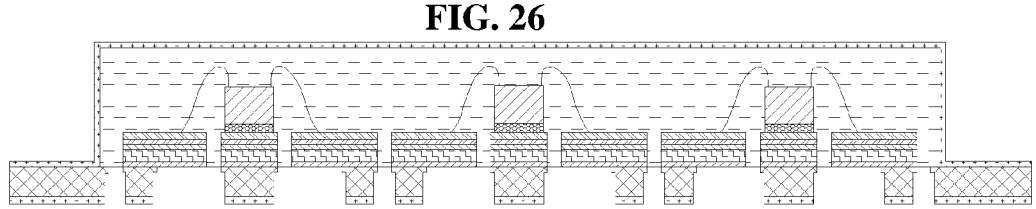
FIG. 27 illustrates another step of the exemplary process for manufacturing the exemplary QFN packaging structure in which an etching process is performed on the areas of the metal substrate exposed by the etching pattern in the photoresist film on the back surface of the metal substrate to form etched areas, an outer die pad, and I/O pads.
Figure 28:
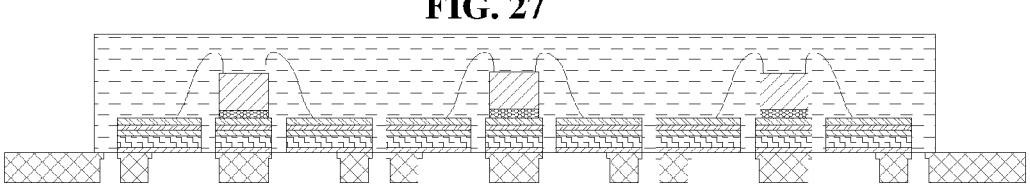
FIG. 28 illustrates another step of the exemplary process for manufacturing the exemplary QFN packaging structure in which the remaining photoresist film on the back surface of the metal substrate is removed to expose the etched areas on the back surface of the metal substrate and the photoresist film on the top surface of the metal substrate is also removed.
Figure 29:
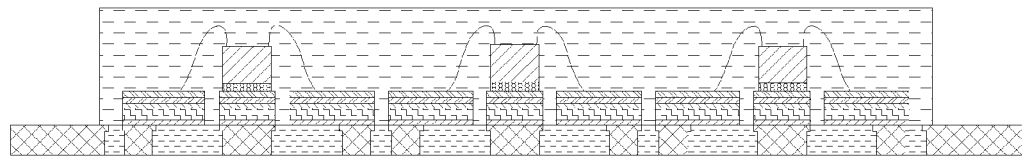
FIG. 29 illustrates another step of the exemplary process for manufacturing the exemplary QFN packaging structure in which the etched areas on the back surface of the metal substrate are filled with a sealant.
Figure 30:
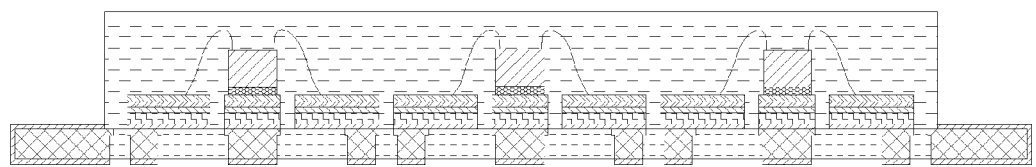
FIG. 30 illustrates another step of the exemplary process for manufacturing the exemplary QFN packaging structure in which a plating process is performed on the bottom surface of the outer die pad and the I/O pads to form a second metal layer.
Figure 31:
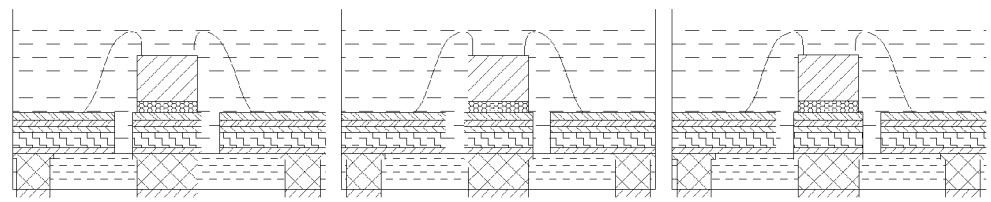
FIG. 31 illustrates another step of the exemplary process for manufacturing the exemplary QFN packaging structure in which the plurality of finished encapsulated components formed on the metal substrate is cut into individual packaged integrated circuits (ICs) or individual QFN packaging structures in a package sawing process.

Thus, a QFN packaging structure with single die pad and single lead ring may be formed. Afterwards, as shown in FIG. 15, the plurality of finished encapsulated components formed on the metal substrate 11 may be individually cut to obtain individual packaged ICs or individual QFN packaging structures in a package sawing process. Other cutting methods may also be used.

Figure 32:
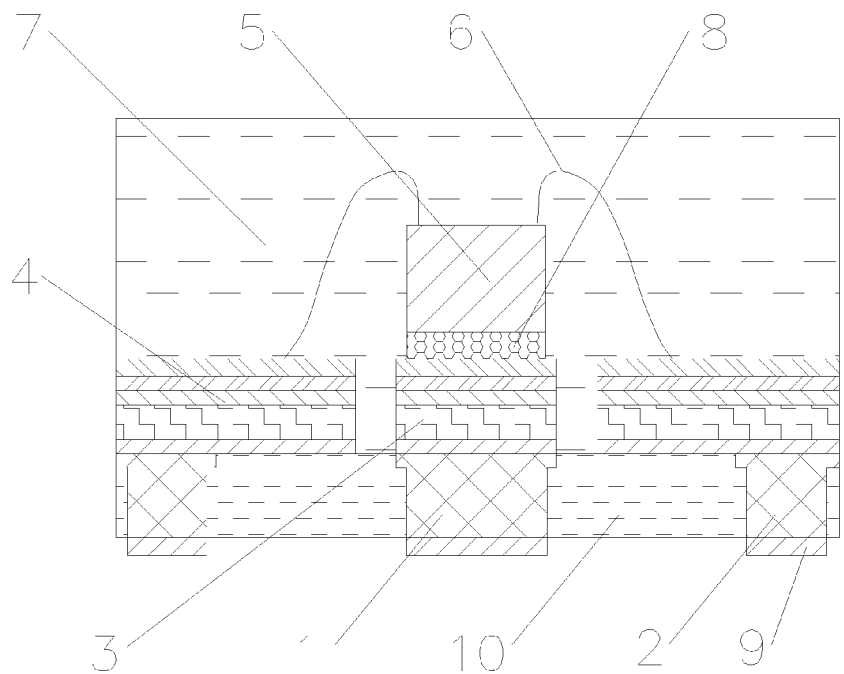
FIG. 32 is a cross-sectional view of another exemplary QFN packaging structure in accordance with one embodiment of the invention.
Figure 33:
FIG. 33 illustrates a step of an exemplary process for manufacturing another exemplary QFN packaging structure in accordance with one embodiment of the invention in which a metal substrate is provided for the lead frame manufacturing and packaging process.
Figure 34:
FIG. 34 illustrates another step of the exemplary process for manufacturing the exemplary QFN packaging structure in which layers of photoresist film are formed on the top surface and the back surface of the metal substrate, respectively.
Figure 35:
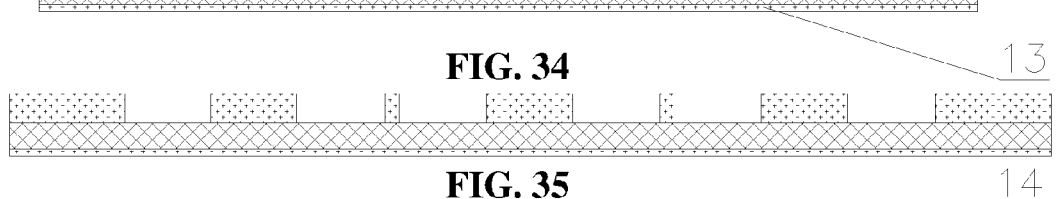
FIG. 35 illustrates another step of the exemplary process for manufacturing the exemplary QFN packaging structure in which portions of the photoresist film on the top surface of the metal substrate are removed to form a pattern by photolithography.
Figure 36:
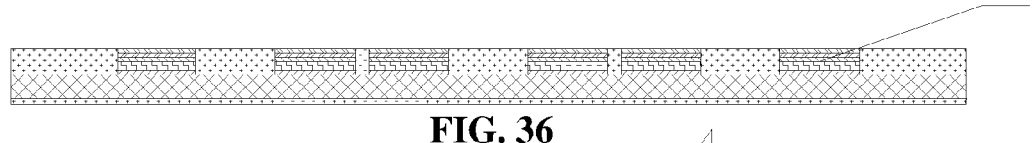
FIG. 36 illustrates another step of the exemplary process for manufacturing the exemplary QFN packaging structure in which a multi-layer plating process is performed to form a first metal layer in the areas of the metal substrate exposed by the plating pattern in the photoresist film.
Figure 37:
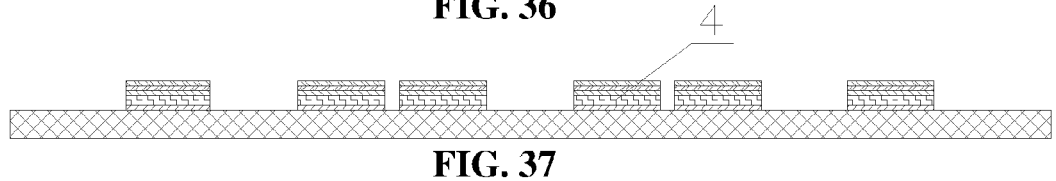
FIG. 37 illustrates another step of the exemplary process for manufacturing the exemplary QFN packaging structure in which the remaining photoresist film on the top surface of the metal substrate is removed and inner leads are formed on the metal substrate.

Further, the QFN packaging structure may also comprise various different structures and/or configurations. For example, FIG. 32 illustrates another exemplary QFN packaging structure. FIGS. 17-31 illustrate a corresponding exemplary process for manufacturing the QFN packaging structure.

As shown in FIG. 32, the QFN packaging structure in FIG. 32 is similar to the QFN packaging structure in FIG. 16. However, the QFN packaging structure in FIG. 32 also comprises an inner die pad 3 formed on the top surface of the outer die pad 1. That is, the inner die pad 3 may also be formed by the multi-layer plating process for forming the inner leads 4. The inner die pad 3 may also be comprised in the first metal layer 14. Further, the die 5 is attached at the top surface of the inner die pad 3 via the conductive or non-conductive adhesive material 8.

FIGS. 17-31 show the corresponding process for manufacturing the QFN packaging structure, which is similar to FIGS. 1-15, respectively. However, as shown in FIGS. 17-31, the first metal layer 14 is formed to comprise both the inner die pad 3 and inner leads 4 in the multi-layer plating process and the die 5 is attached at the top surface of the inner die pad 3 in the die attaching process. Thus, a QFN packaging structure with outer and inner die pads and single lead ring may be formed.

Figure 49:
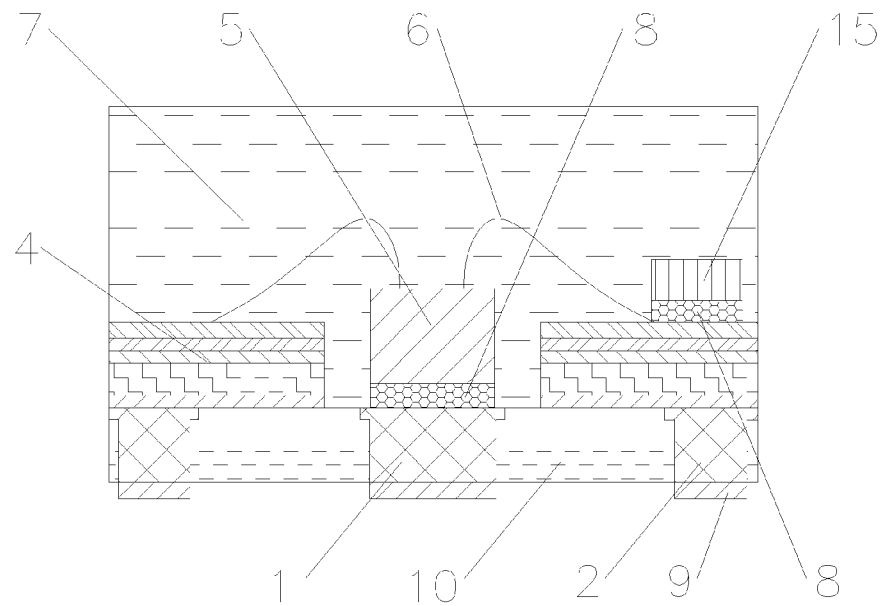
FIG. 49 is a cross-sectional view of another exemplary QFN packaging structure in accordance with one embodiment of the invention.
Figure 50:
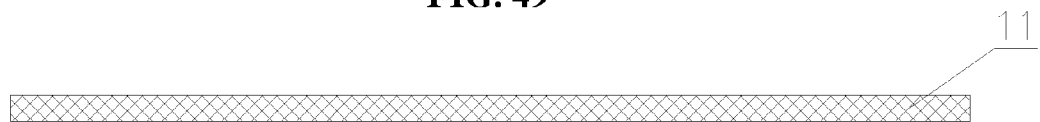
FIG. 50 illustrates a step of an exemplary process for manufacturing another exemplary QFN packaging structure in accordance with one embodiment of the invention in which a metal substrate is provided for the lead frame manufacturing and packaging process.
Figure 51:
FIG. 51 illustrates another step of the exemplary process for manufacturing the exemplary QFN packaging structure in which layers of photoresist film are formed on the top surface and the back surface of the metal substrate, respectively.
Figure 52:
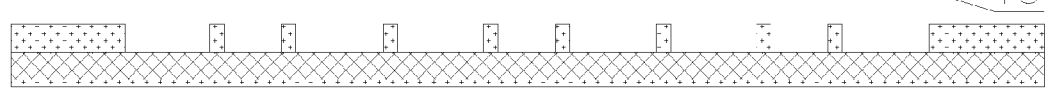
FIG. 52 illustrates another step of the exemplary process for manufacturing the exemplary QFN packaging structure in which portions of the photoresist film on the top surface of the metal substrate are removed to form a pattern by photolithography.
Figure 53:
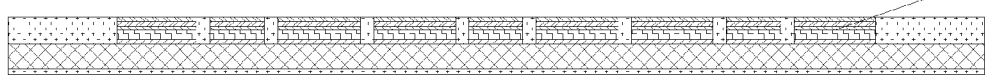
FIG. 53 illustrates another step of the exemplary process for manufacturing the exemplary QFN packaging structure in which a multi-layer plating process is performed to form a first metal layer containing an inner die pad and inner leads in the areas of the metal substrate exposed by the plating pattern in the photoresist film.
Figure 54:
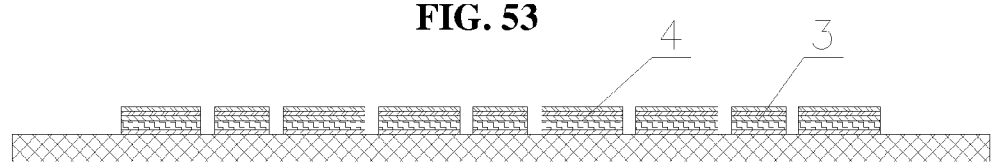
FIG. 54 illustrates another step of the exemplary process for manufacturing the exemplary QFN packaging structure in which the remaining photoresist film on the top surface of the metal substrate is removed and inner leads are formed on the metal substrate.
Figure 55:
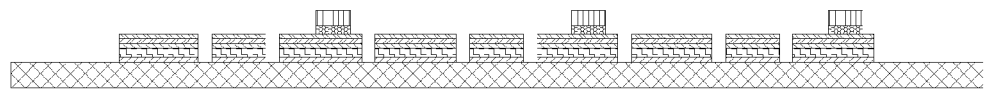
FIG. 55 illustrates another step of the exemplary process for manufacturing the exemplary QFN packaging structure in which one or more passive devices are coupled between the inner leads using a conductive or non-conductive adhesive material.
Figure 56:
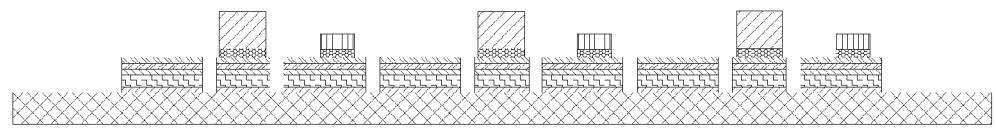
FIG. 56 illustrates another step of the exemplary process for manufacturing the exemplary QFN packaging structure in which a die is attached on the top surface of the inner die pad in a die attaching process.
Figure 57:
FIG. 57 illustrates another step of the exemplary process for manufacturing the exemplary QFN packaging structure in which the top surface of the die and the top surface of the inner leads are connected with metal wires in a wire bonding process.
Figure 58:
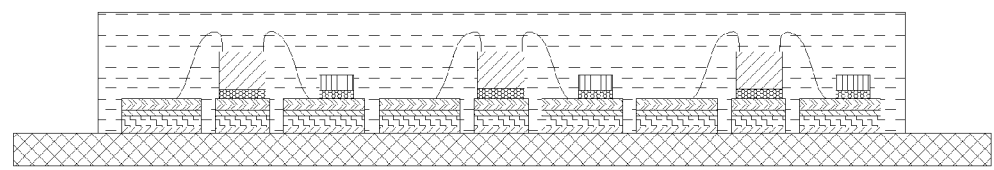
FIG. 58 illustrates another step of the exemplary process for manufacturing the exemplary QFN packaging structure in which the inner leads, the die, and the metal wires are encapsulated using an encapsulation material.
Figure 59:
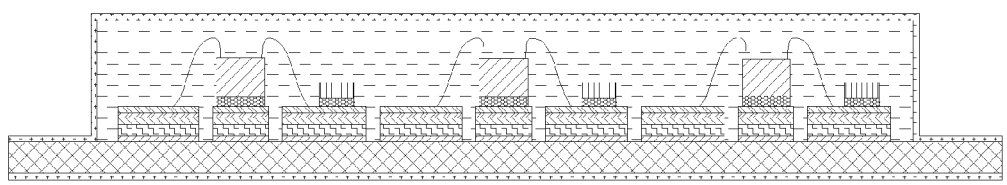
FIG. 59 illustrates another step of the exemplary process for manufacturing the exemplary QFN packaging structure in which a layer of photoresist film is formed on the top surface of the metal substrate and another layer of photoresist film is formed on the back surface of the metal substrate.
Figure 60:
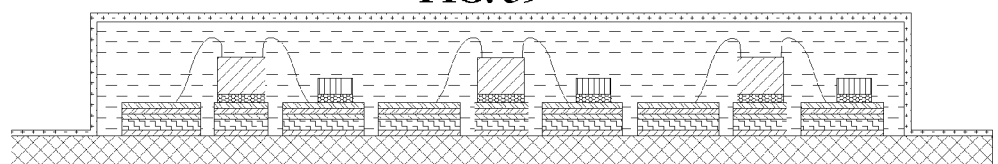
FIG. 60 illustrates another step of the exemplary process for manufacturing the exemplary QFN packaging structure in which exposure, development, and etching are carried out on the photoresist film formed on the back surface of the metal substrate to form an etching pattern in the photoresist film.
Figure 61:
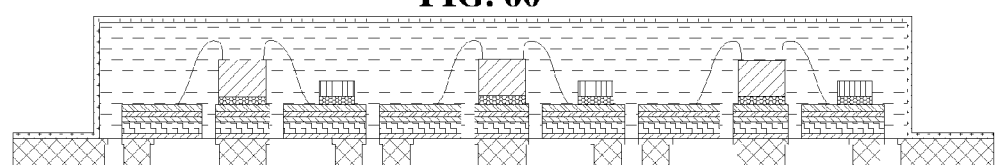
FIG. 61 illustrates another step of the exemplary process for manufacturing the exemplary QFN packaging structure in which an etching process is performed on the areas of the metal substrate exposed by the etching pattern in the photoresist film on the back surface of the metal substrate to form etched areas, an outer die pad, and I/O pads.
Figure 62:
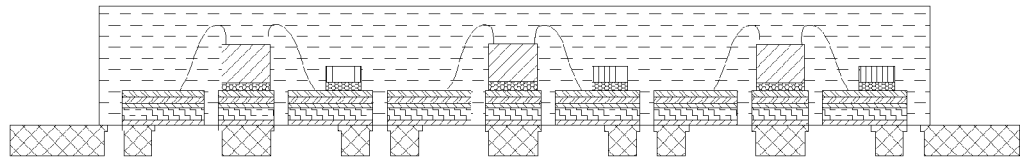
FIG. 62 illustrates another step of the exemplary process for manufacturing the exemplary QFN packaging structure in which the remaining photoresist film on the back surface of the metal substrate is removed to expose the etched areas on the back surface of the metal substrate and the photoresist film on the top surface of the metal substrate is also removed.
Figure 63:
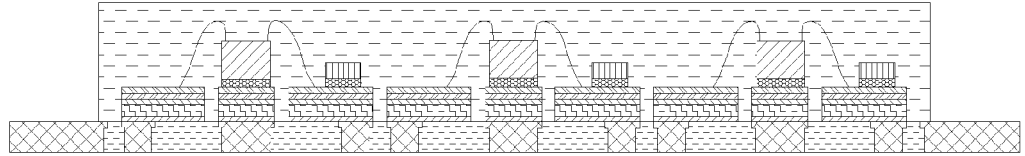
FIG. 63 illustrates another step of the exemplary process for manufacturing the exemplary QFN packaging structure in which the etched areas on the back surface of the metal substrate are filled with a sealant.
Figure 64:
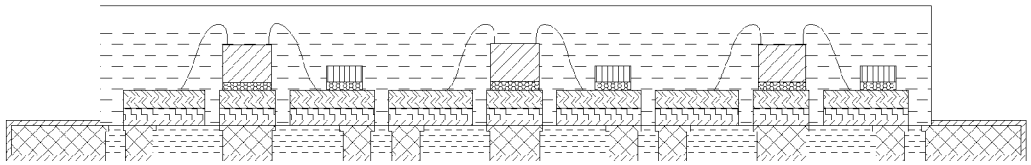
FIG. 64 illustrates another step of the exemplary process for manufacturing the exemplary QFN packaging structure in which a plating process is performed on the bottom surface of the outer die pad and the I/O pads to form a second metal layer.
Figure 65:
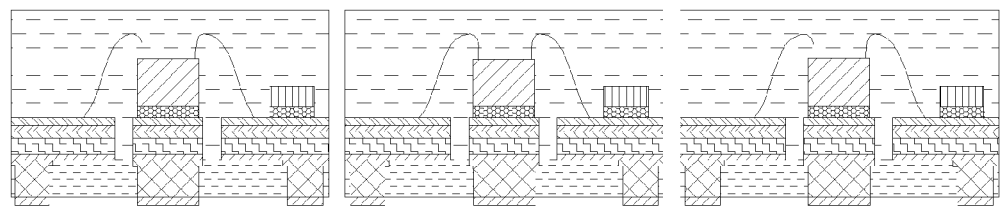
FIG. 65 illustrates another step of the exemplary process for manufacturing the exemplary QFN packaging structure in which the plurality of finished encapsulated components formed on the metal substrate is cut into individual packaged integrated circuits (ICs) or individual QFN packaging structures in a package sawing process.

FIG. 49 illustrates another exemplary QFN packaging structure. FIGS. 33-48 illustrate a corresponding exemplary process for manufacturing the QFN packaging structure.

As shown in FIG. 49, the QFN packaging structure in FIG. 49 is similar to the QFN packaging structure in FIG. 16. However, the QFN packaging structure in FIG. 49 also comprises one or more passive device 15 coupled between inner leads 4 using conductive or non-conductive adhesive material 8.

Figure 38:
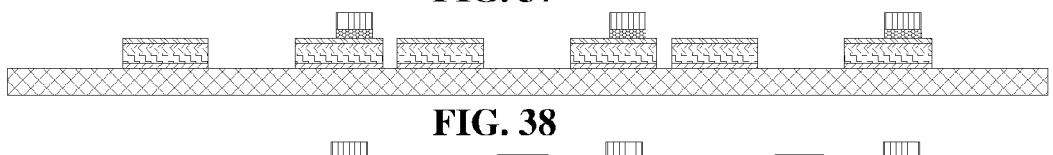
FIG. 38 illustrates another step of the exemplary process for manufacturing the exemplary QFN packaging structure in which one or more passive devices are coupled between inner leads using a conductive or non-conductive adhesive material.
Figure 39:
FIG. 39 illustrates another step of the exemplary process for manufacturing the exemplary QFN packaging structure in which a die is attached on a predetermined die area of the metal substrate in a die attaching process.
Figure 40:
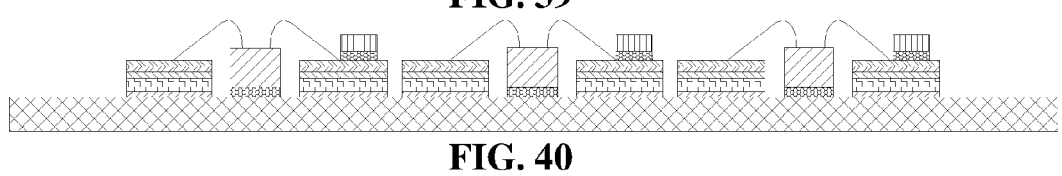
FIG. 40 illustrates another step of the exemplary process for manufacturing the exemplary QFN packaging structure in which the top surface of the die and the top surface of the inner leads are connected with metal wires in a wire bonding process.
Figure 41:
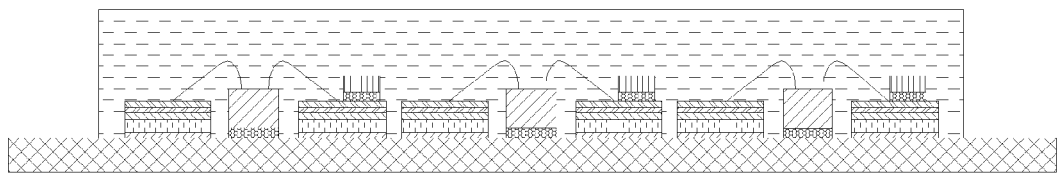
FIG. 41 illustrates another step of the exemplary process for manufacturing the exemplary QFN packaging structure in which the inner leads, the die, and the metal wires are encapsulated using an encapsulation material.
Figure 42:
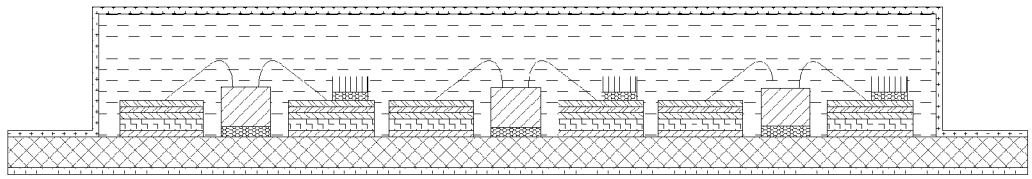
FIG. 42 illustrates another step of the exemplary process for manufacturing the exemplary QFN packaging structure in which a layer of photoresist film is formed on the top surface of the metal substrate and another layer of photoresist film is formed on the back surface of the metal substrate.
Figure 43:
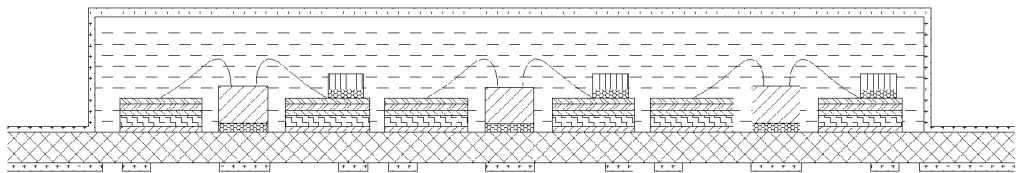
FIG. 43 illustrates another step of the exemplary process for manufacturing the exemplary QFN packaging structure in which exposure, development, and etching are carried out on the photoresist film formed on the back surface of the metal substrate to form an etching pattern in the photoresist film.
Figure 44:
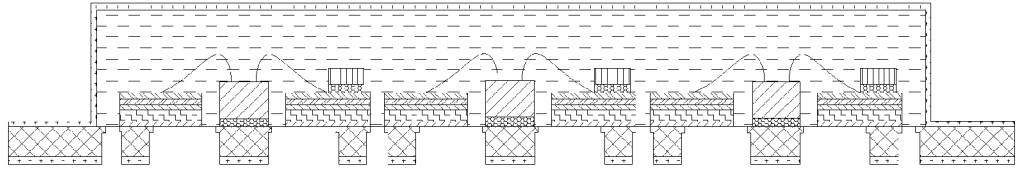
FIG. 44 illustrates another step of the exemplary process for manufacturing the exemplary QFN packaging structure in which an etching process is performed on the areas of the metal substrate exposed by the etching pattern in the photoresist film on the back surface of the metal substrate to form etched areas, an outer die pad, and I/O pads.
Figure 45:
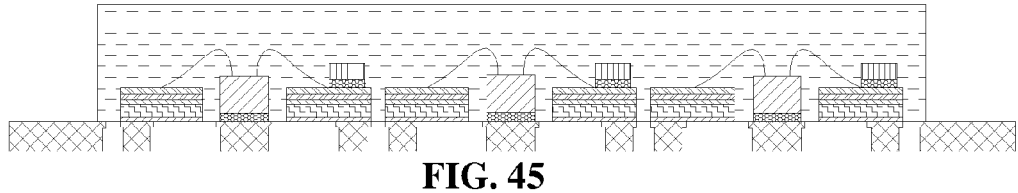
FIG. 45 illustrates another step of the exemplary process for manufacturing the exemplary QFN packaging structure in which the remaining photoresist film on the back surface of the metal substrate is removed to expose the etched areas on the back surface of the metal substrate and the photoresist film on the top surface of the metal substrate is also removed.
Figure 46:
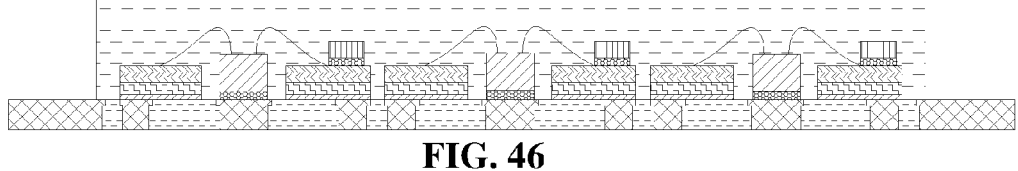
FIG. 46 illustrates another step of the exemplary process for manufacturing the exemplary QFN packaging structure in which the etched areas on the back surface of the metal substrate are filled with a sealant.
Figure 47:
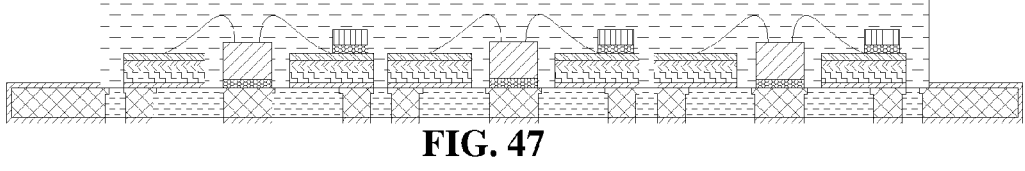
FIG. 47 illustrates another step of the exemplary process for manufacturing the exemplary QFN packaging structure in which a plating process is performed on the bottom surface of the outer die pad and the I/O pads to form a second metal layer.
Figure 48:
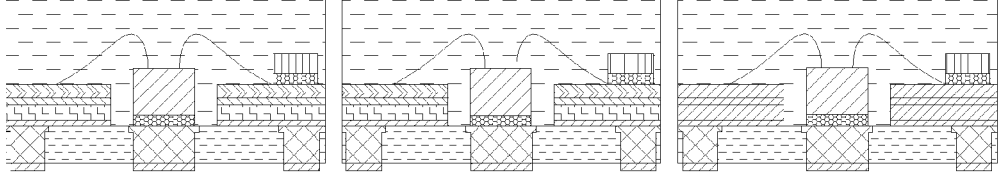
FIG. 48 illustrates another step of the exemplary process for manufacturing the exemplary QFN packaging structure in which the plurality of finished encapsulated components formed on the metal substrate is cut into individual packaged integrated circuits (ICs) or individual QFN packaging structures in a package sawing process.

FIGS. 33-48 show the corresponding process for manufacturing the QFN packaging structure, which is similar to FIGS. 1-15. However, as shown in FIGS. 33-48, the one or more passive device 15 is coupled between inner leads 4 using conductive or non-conductive adhesive material 8, specifically as shown in the newly added FIG. 38. Although FIG. 38 shows that the one or more passive device 15 is coupled between inner leads 4 before the die 5 is attached, the one or more passive device 15 can also be coupled between inner leads 4 after the die 5 is attached or at the same time attaching the die 5 (i.e., during the die attaching process). Thus, a QFN packaging structure with single die pad and single lead ring coupled with passive device may be formed.

Figure 66:
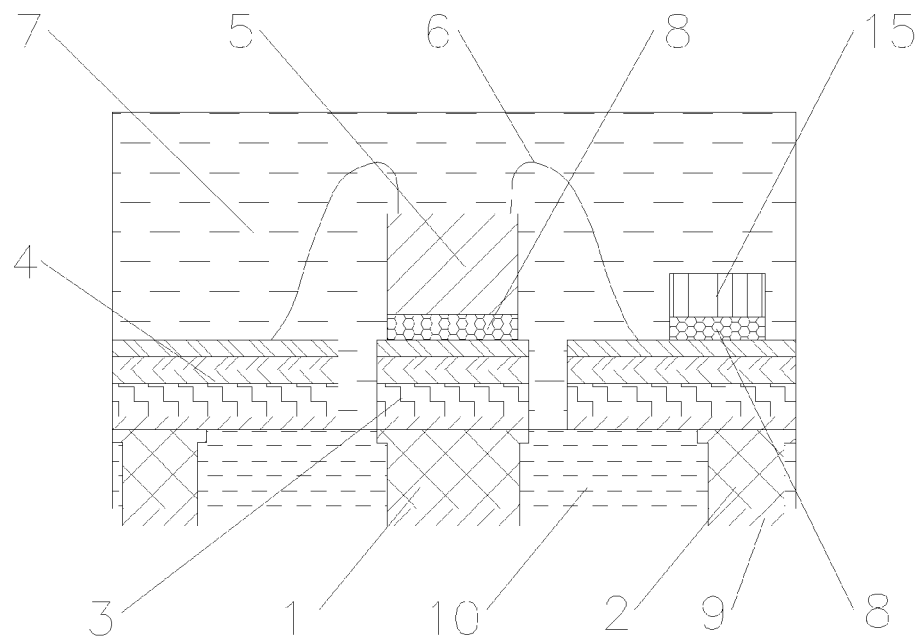
FIG. 66 is a cross-sectional view of another exemplary QFN packaging structure in accordance with one embodiment of the invention.
Figure 67:
FIG. 67 illustrates a step of an exemplary process for manufacturing another exemplary QFN packaging structure in accordance with one embodiment of the invention in which a metal substrate is provided for the lead frame manufacturing and packaging process.
Figure 68:
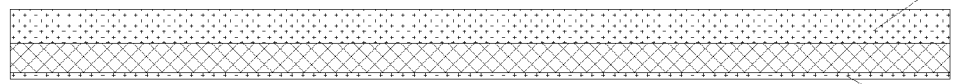
FIG. 68 illustrates another step of the exemplary process for manufacturing the exemplary QFN packaging structure in which layers of photoresist film are formed on the top surface and the back surface of the metal substrate, respectively.
Figure 69:
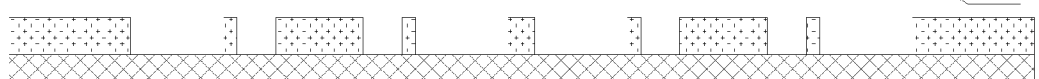
FIG. 69 illustrates another step of the exemplary process for manufacturing the exemplary QFN packaging structure in which portions of the photoresist film on the top surface of the metal substrate are removed to form a pattern by photolithography.
Figure 70:
FIG. 70 illustrates another step of the exemplary process for manufacturing the exemplary QFN packaging structure in which a multi-layer plating process is performed to form a first metal layer containing inner leads and an inner electrostatic discharge ring in the areas of the metal substrate exposed by the plating pattern in the photoresist film.
Figure 71:
FIG. 71 illustrates another step of the exemplary process for manufacturing the exemplary QFN packaging structure in which the remaining photoresist film on the top surface of the metal substrate is removed and inner leads are formed on the metal substrate.
Figure 72:
FIG. 72 illustrates another step of the exemplary process for manufacturing the exemplary QFN packaging structure in which a die is attached on a predetermined die area of the metal substrate in a die attaching process.
Figure 73:
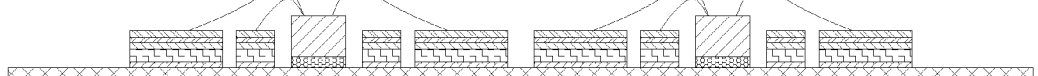
FIG. 73 illustrates another step of the exemplary process for manufacturing the exemplary QFN packaging structure in which the top surface of the die and the top surface of the inner leads are connected with metal wires and the die is also attached to the top surface of the inner electrostatic discharge ring in a wire bonding process.
Figure 74:
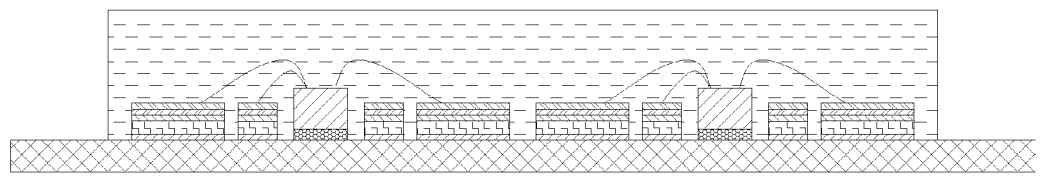
FIG. 74 illustrates another step of the exemplary process for manufacturing the exemplary QFN packaging structure in which the inner leads, the die, and the metal wires are encapsulated using an encapsulation material.
Figure 75:
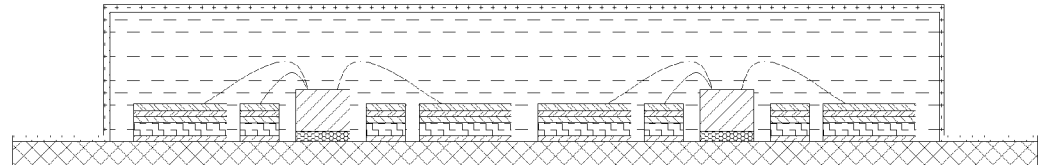
FIG. 75 illustrates another step of the exemplary process for manufacturing the exemplary QFN packaging structure in which a layer of photoresist film is formed on the top surface of the metal substrate and another layer of photoresist film is formed on the back surface of the metal substrate.
Figure 76:
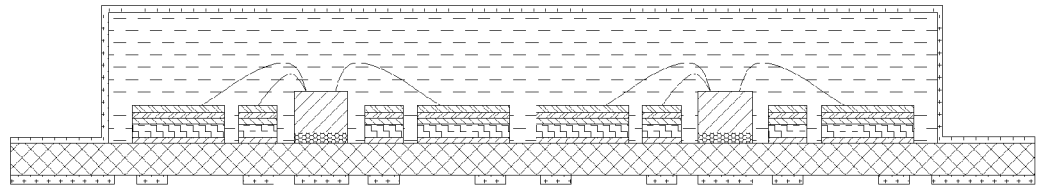
FIG. 76 illustrates another step of the exemplary process for manufacturing the exemplary QFN packaging structure in which exposure, development, and etching are carried out on the photoresist film formed on the back surface of the metal substrate to form an etching pattern in the photoresist film.
Figure 77:
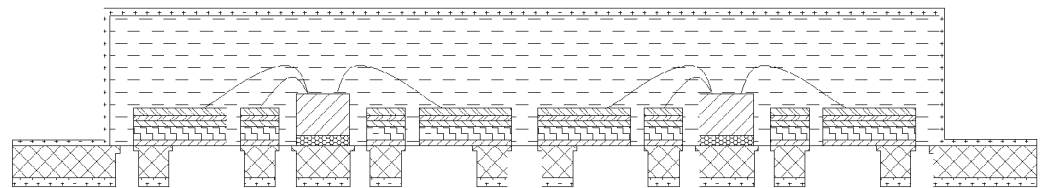
FIG. 77 illustrates another step of the exemplary process for manufacturing the exemplary QFN packaging structure in which an etching process is performed on the areas of the metal substrate exposed by the etching pattern in the photoresist film on the back surface of the metal substrate to form etched areas, an outer die pad, and I/O pads.
Figure 78:
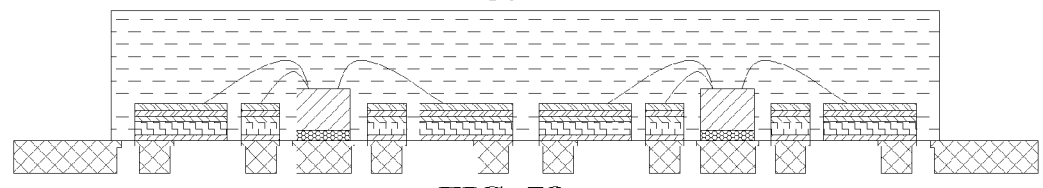
FIG. 78 illustrates another step of the exemplary process for manufacturing the exemplary QFN packaging structure in which the remaining photoresist film on the back surface of the metal substrate is removed to expose the etched areas on the back surface of the metal substrate and the photoresist film on the top surface of the metal substrate is also removed.
Figure 79:
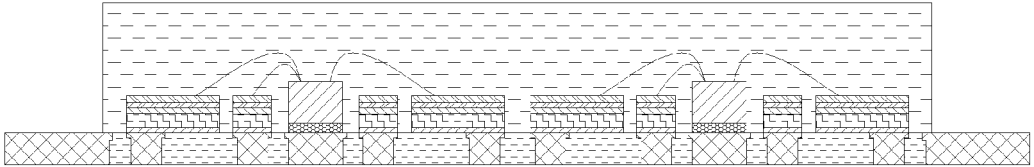
FIG. 79 illustrates another step of the exemplary process for manufacturing the exemplary QFN packaging structure in which the etched areas on the back surface of the metal substrate are filled with a sealant.
Figure 80:
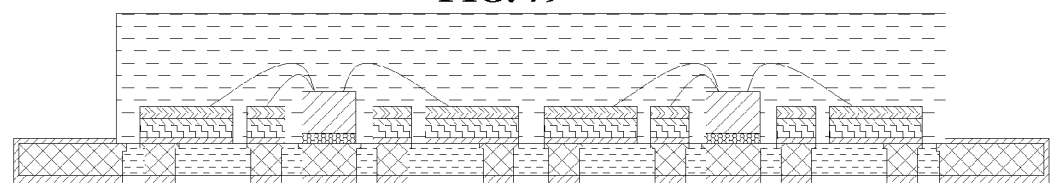
FIG. 80 illustrates another step of the exemplary process for manufacturing the exemplary QFN packaging structure in which a plating process is performed on the bottom surface of the outer die pad and the I/O pads to form a second metal layer.
Figure 81:
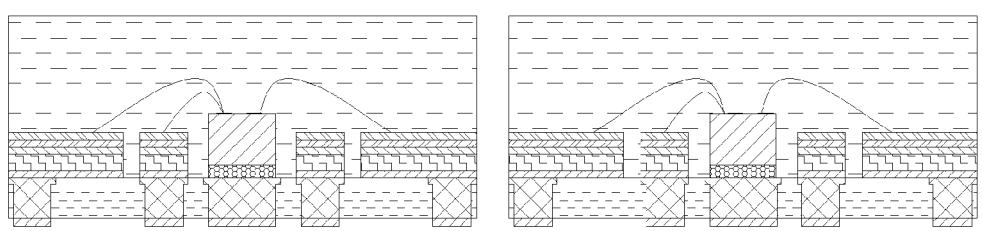
FIG. 81 illustrates another step of the exemplary process for manufacturing the exemplary QFN packaging structure in which the plurality of finished encapsulated components formed on the metal substrate is cut into individual packaged integrated circuits (ICs) or individual QFN packaging structures in a package sawing process.

FIG. 66 illustrates another exemplary QFN packaging structure. FIGS. 50-65 illustrate a corresponding exemplary process for manufacturing the QFN packaging structure.

As shown in FIG. 66, the QFN packaging structure in FIG. 66 is similar to the QFN packaging structure in FIG. 49. However, the QFN packaging structure in FIG. 66 also comprises inner die pad 3 formed on the top surface of the outer die pad 1. That is, the inner die pad 3 may also be formed by the multi-layer plating process for forming the inner leads 4. The inner die pad 3 may also be comprised in the first metal layer 14. Further, the die 5 is attached at the top surface of the inner die pad 3 via the conductive or non-conductive adhesive material 8.

FIGS. 55-65 show the corresponding process for manufacturing the QFN packaging structure, which is similar to FIGS. 33-48, respectively. However, as shown in FIGS. 55-65, the first metal layer 14 is formed to comprise both the inner die pad 3 and inner leads 4 in the multi-layer plating process and the die 5 is attached at the top surface of the inner die pad 3 in the die attaching process. Thus, a QFN packaging structure with outer and inner die pads and single lead ring coupled with passive device may be formed.

Figure 82:
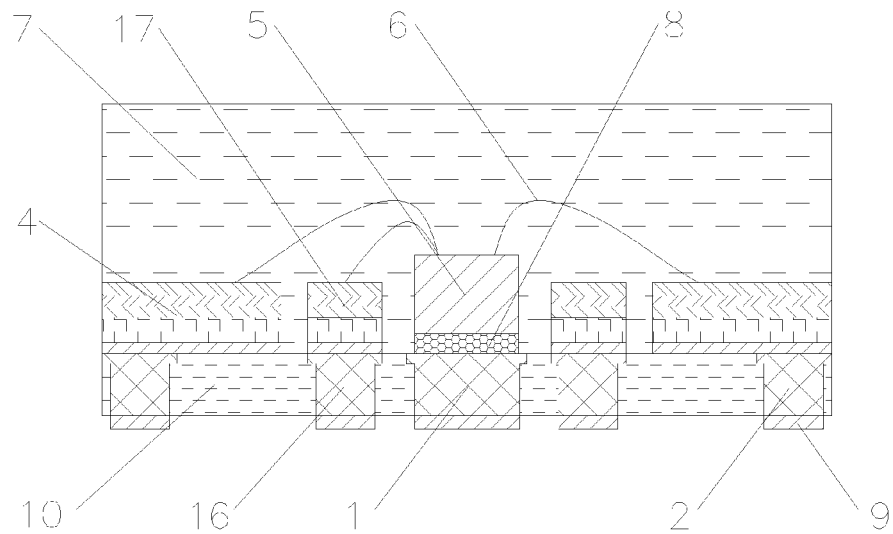
FIG. 82 is a cross-sectional view of another exemplary QFN packaging structure in accordance with one embodiment of the invention.
Figure 83:
FIG. 83 illustrates a step of an exemplary process for manufacturing another exemplary QFN packaging structure in accordance with one embodiment of the invention in which a metal substrate is provided for the lead frame manufacturing and packaging process.
Figure 84:
FIG. 84 illustrates another step of the exemplary process for manufacturing the exemplary QFN packaging structure in which layers of photoresist film are formed on the top surface and the back surface of the metal substrate, respectively.
Figure 85:
FIG. 85 illustrates another step of the exemplary process for manufacturing the exemplary QFN packaging structure in which portions of the photoresist film on the top surface of the metal substrate are removed to form a pattern by photolithography.
Figure 86:
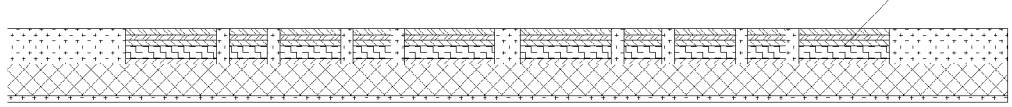
FIG. 86 illustrates another step of the exemplary process for manufacturing the exemplary QFN packaging structure in which a multi-layer plating process is performed to form a first metal layer containing an inner die pad, inner leads, and an inner electrostatic discharge ring in the areas of the metal substrate exposed by the plating pattern in the photoresist film.
Figure 87:
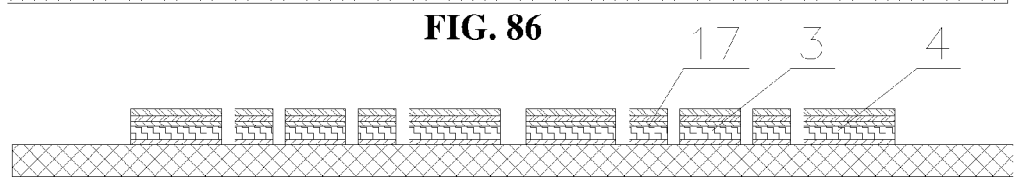
FIG. 87 illustrates another step of the exemplary process for manufacturing the exemplary QFN packaging structure in which the remaining photoresist film on the top surface of the metal substrate is removed and inner leads are formed on the metal substrate.
Figure 88:
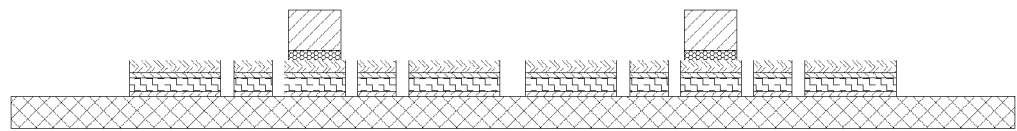
FIG. 88 illustrates another step of the exemplary process for manufacturing the exemplary QFN packaging structure in which a die is attached on the top surface of the inner die pad in a die attaching process.
Figure 89:
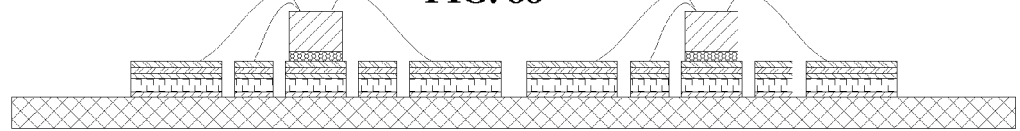
FIG. 89 illustrates another step of the exemplary process for manufacturing the exemplary QFN packaging structure in which the top surface of the die and the top surface of the inner leads are connected with metal wires and the die is also attached to the top surface of the inner electrostatic discharge ring in a wire bonding process.
Figure 90:
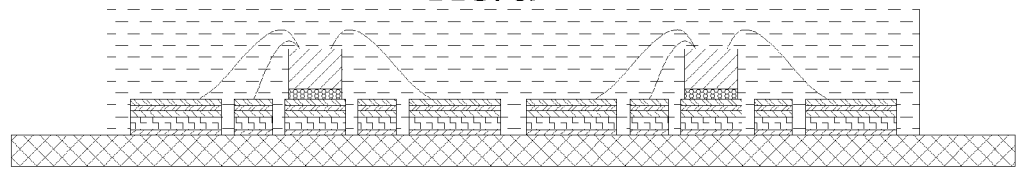
FIG. 90 illustrates another step of the exemplary process for manufacturing the exemplary QFN packaging structure in which the inner leads, the die, and the metal wires are encapsulated using an encapsulation material.
Figure 91:
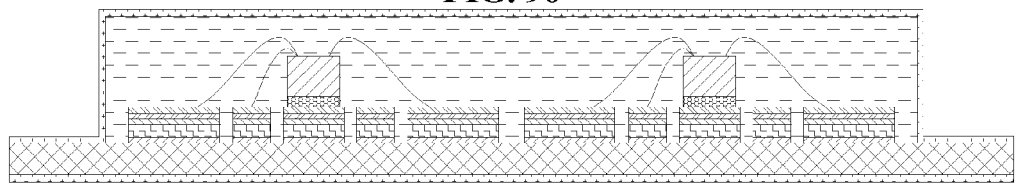
FIG. 91 illustrates another step of the exemplary process for manufacturing the exemplary QFN packaging structure in which a layer of photoresist film is formed on the top surface of the metal substrate and another layer of photoresist film is formed on the back surface of the metal substrate.
Figure 92:
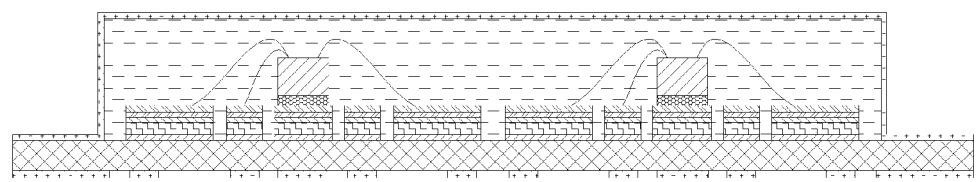
FIG. 92 illustrates another step of the exemplary process for manufacturing the exemplary QFN packaging structure in which exposure, development, and etching are carried out on the photoresist film formed on the back surface of the metal substrate to form an etching pattern in the photoresist film.
Figure 93:
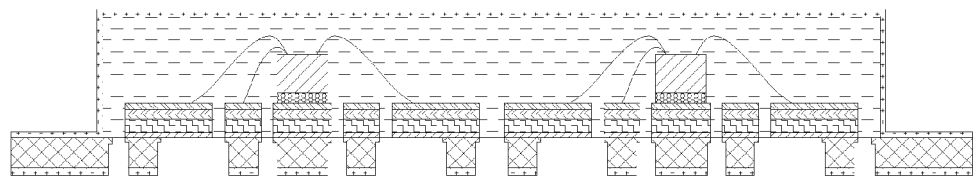
FIG. 93 illustrates another step of the exemplary process for manufacturing the exemplary QFN packaging structure in which an etching process is performed on the areas of the metal substrate exposed by the etching pattern in the photoresist film on the back surface of the metal substrate to form etched areas, an outer die pad, and I/O pads.
Figure 94:
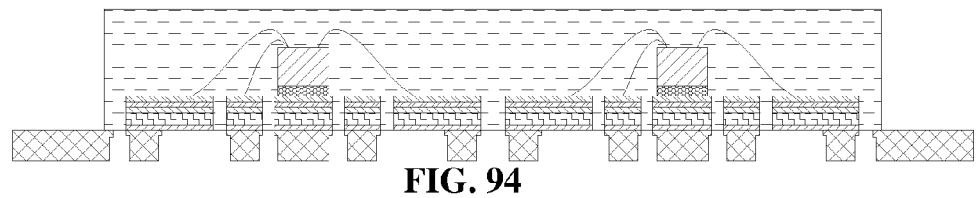
FIG. 94 illustrates another step of the exemplary process for manufacturing the exemplary QFN packaging structure in which the remaining photoresist film on the back surface of the metal substrate is removed to expose the etched areas on the back surface of the metal substrate and the photoresist film on the top surface of the metal substrate is also removed.
Figure 95:
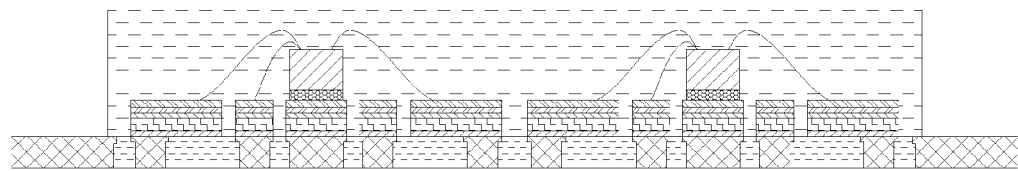
FIG. 95 illustrates another step of the exemplary process for manufacturing the exemplary QFN packaging structure in which the etched areas on the back surface of the metal substrate are filled with a sealant.
Figure 96:
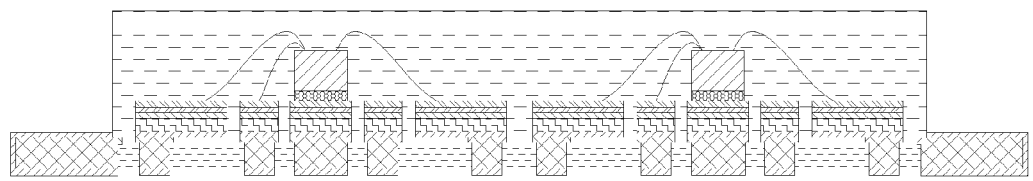
FIG. 96 illustrates another step of the exemplary process for manufacturing the exemplary QFN packaging structure in which a plating process is performed on the bottom surface of the outer die pad and the I/O pads to form a second metal layer.
Figure 97:
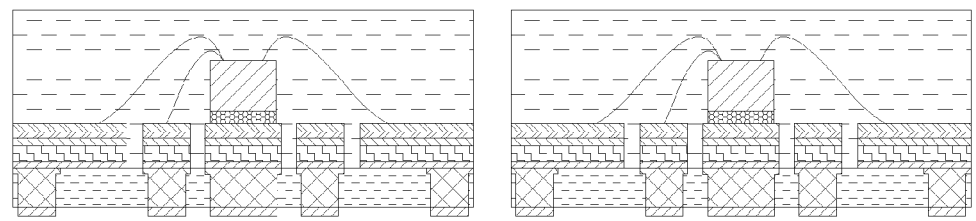
FIG. 97 illustrates another step of the exemplary process for manufacturing the exemplary QFN packaging structure in which the plurality of finished encapsulated components formed on the metal substrate is cut into individual packaged integrated circuits (ICs) or individual QFN packaging structures in a package sawing process.

FIG. 82 illustrates another exemplary QFN packaging structure. FIGS. 67-81 illustrate a corresponding exemplary process for manufacturing the QFN packaging structure.

As shown in FIG. 82, the QFN packaging structure in FIG. 82 is similar to the QFN packaging structure in FIG. 16. However, the QFN packaging structure in FIG. 82 also comprises an outer electrostatic discharge ring 16 arranged between the outer die pad 1 and I/O pads 2. Further, an inner electrostatic discharge ring 17 may be formed on the top surface of the outer electrostatic discharge ring 16. That is, the inner electrostatic discharge ring 17 may also be formed by the multi-layer plating process for forming the first metal layer 14. The inner electrostatic discharge ring 17 may also be arranged between the inner die pad 3 and inner leads 4. Further, the top surface of the die 5 is connected to the top surface of the inner electrostatic discharge ring 17 by the metal wire 6 such that the die 5 may be protected from the static by the internal and outer electrostatic discharge rings 16 and 17.

FIGS. 67-81 show the corresponding process for manufacturing the QFN packaging structure, which is similar to FIGS. 1-15, respectively. However, as shown in FIGS. 67-81, the first metal layer 14 is formed to comprise both the inner leads 4 and the inner electrostatic discharge ring 17 in the multi-layer plating process and the die 5 is also attached at the top surface of the inner electrostatic discharge ring 17 in the wire bonding process. Thus, a QFN packaging structure with single die pad, single lead ring, and electrostatic discharge ring may be formed.

Figure 98:
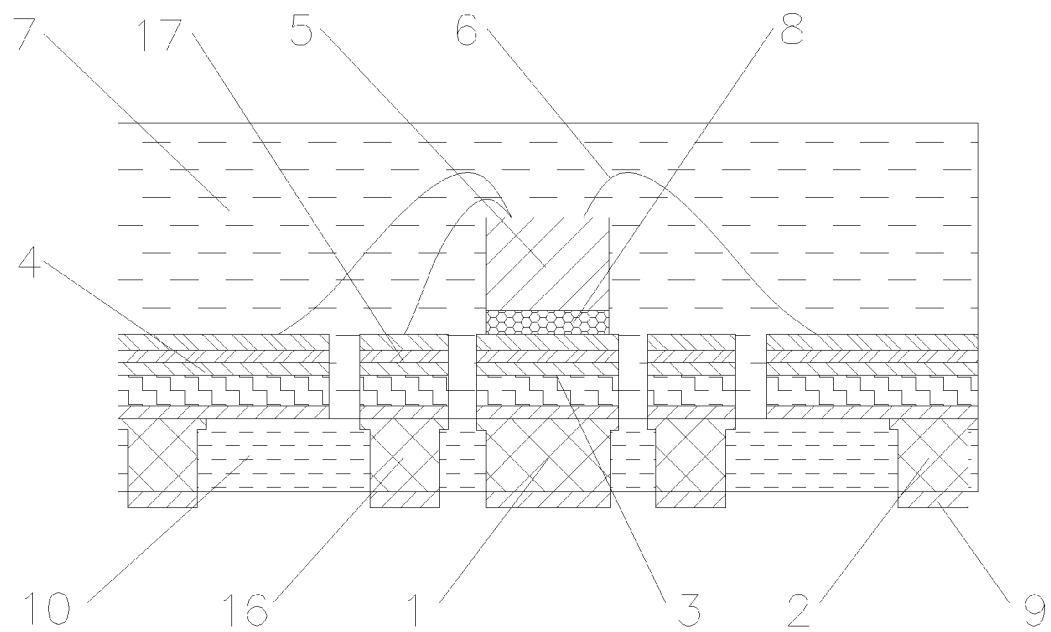
FIG. 98 is a cross-sectional view of another exemplary QFN packaging structure in accordance with one embodiment of the invention.
Figure 99:
FIG. 99 illustrates a step of an exemplary process for manufacturing another exemplary QFN packaging structure in accordance with one embodiment of the invention in which a metal substrate is provided for the lead frame manufacturing and packaging process.
Figure 100:
FIG. 100 illustrates another step of the exemplary process for manufacturing the exemplary QFN packaging structure in which layers of photoresist film are formed on the top surface and the back surface of the metal substrate, respectively.
Figure 101:
FIG. 101 illustrates another step of the exemplary process for manufacturing the exemplary QFN packaging structure in which portions of the photoresist film on the top surface of the metal substrate are removed to form a pattern by photolithography.
Figure 102:
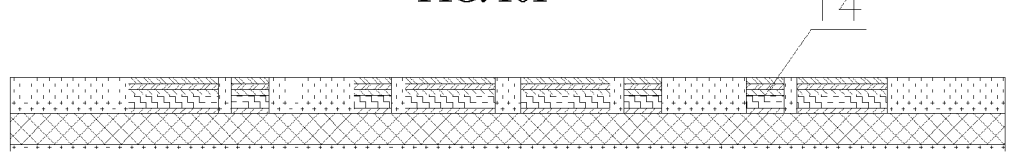
FIG. 102 illustrates another step of the exemplary process for manufacturing the exemplary QFN packaging structure in which a multi-layer plating process is performed to form a first metal layer containing inner leads and an inner electrostatic discharge ring in the areas of the metal substrate exposed by the plating pattern in the photoresist film.
Figure 103:
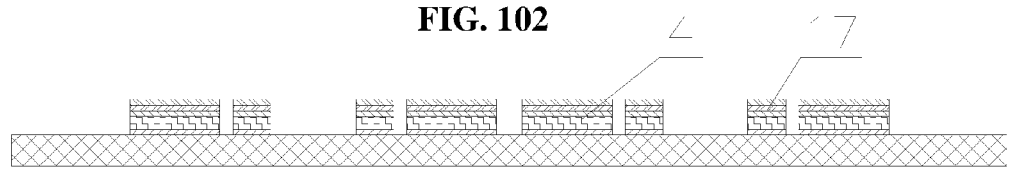
FIG. 103 illustrates another step of the exemplary process for manufacturing the exemplary QFN packaging structure in which the remaining photoresist film on the top surface of the metal substrate is removed and inner leads are formed on the metal substrate.

FIG. 98 illustrates another exemplary QFN packaging structure. FIGS. 83-97 illustrate a corresponding exemplary process for manufacturing the QFN packaging structure.

As shown in FIG. 98, the QFN packaging structure in FIG. 98 is similar to the QFN packaging structure in FIG. 82.

However, the QFN packaging structure in FIG. 98 also comprises one or more inner die pads 3 formed on the top surface of the outer die pad 1. That is, the one or more inner die pads 3 may also be formed by the multi-layer plating process for forming the first metal layer 14. Further, the die 5 is attached at the top surface of the one or more inner die pads 3 via the conductive or non-conductive adhesive material 8.

FIGS. 83-97 show the corresponding process for manufacturing the QFN packaging structure, which is similar to FIGS. 67-81, respectively. However, as shown in FIGS. 83-97, the first metal layer 14 is formed to comprise both the inner die pad 3, the inner leads 4, and the inner electrostatic ring 17 in the multi-layer plating process and the die 5 is attached at the top surface of the inner die pad 3 in the die attaching process. Thus, a QFN packaging structure with outer and inner die pads, single lead ring, and electrostatic discharge ring may be formed.

Figure 115:
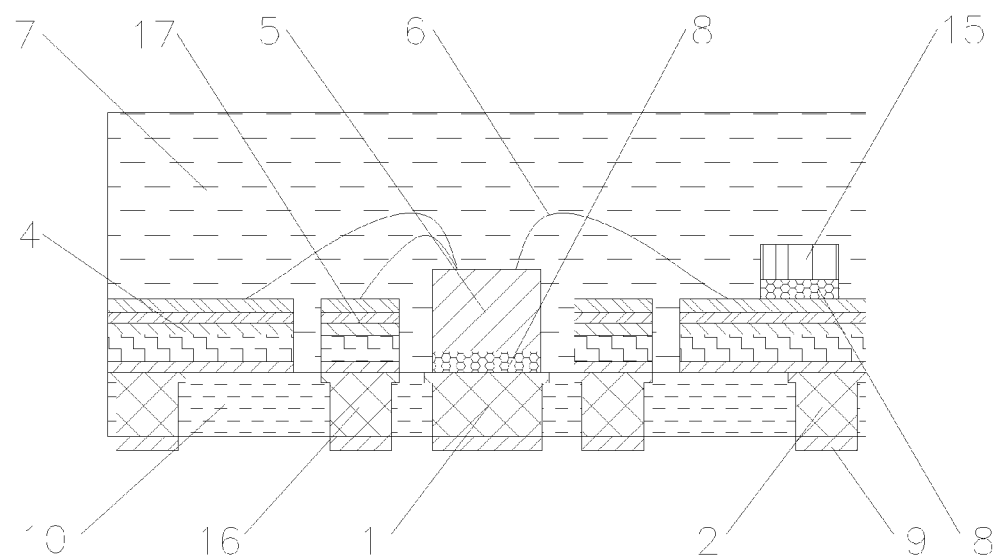
FIG. 115 is a cross-sectional view of another exemplary QFN packaging structure in accordance with one embodiment of the invention.
Figure 116:
FIG. 116 illustrates a step of an exemplary process for manufacturing another exemplary QFN packaging structure in accordance with one embodiment of the invention in which a metal substrate is provided for the lead frame manufacturing and packaging process.
Figure 117:
FIG. 117 illustrates another step of the exemplary process for manufacturing the exemplary QFN packaging structure in which layers of photoresist film are formed on the top surface and the back surface of the metal substrate, respectively.
Figure 118:
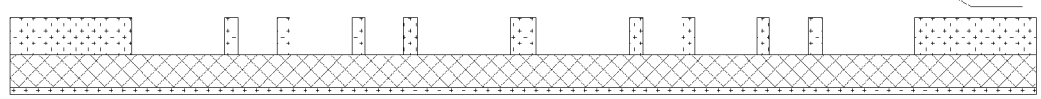
FIG. 118 illustrates another step of the exemplary process for manufacturing the exemplary QFN packaging structure in which portions of the photoresist film on the top surface of the metal substrate are removed to form a pattern by photolithography.
Figure 119:
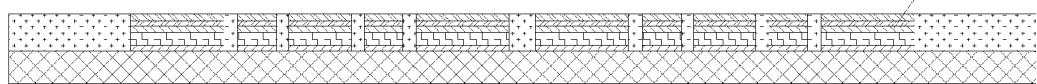
FIG. 119 illustrates another step of the exemplary process for manufacturing the exemplary QFN packaging structure in which a multi-layer plating process is performed to form a first metal layer containing an inner die pad, inner leads, and an inner electrostatic discharge ring in the areas of the metal substrate exposed by the plating pattern in the photoresist film.
Figure 120:
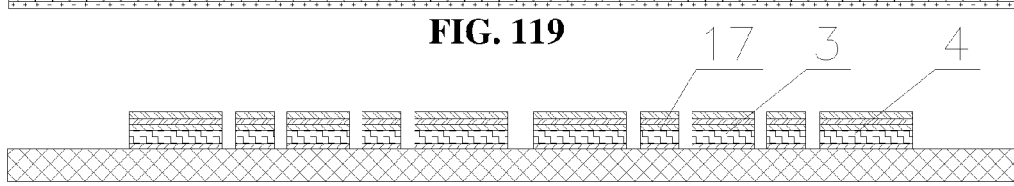
Figure 121:
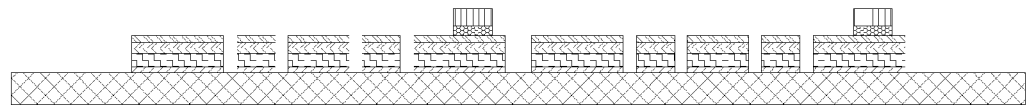
Figure 122:
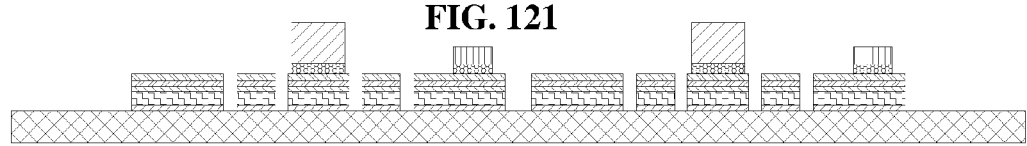
Figure 123:
Figure 124:
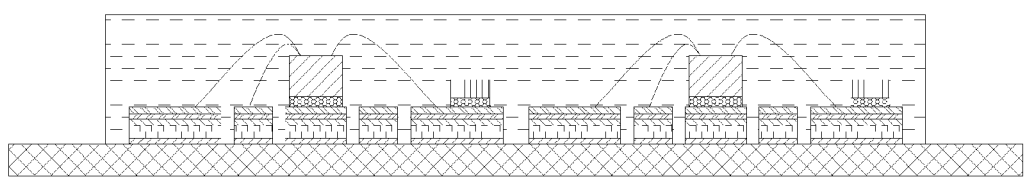
Figure 125:
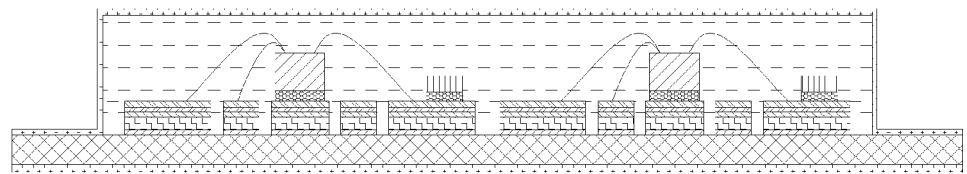
Figure 126:
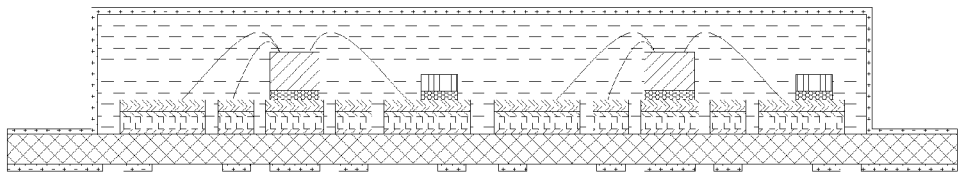
Figure 127:
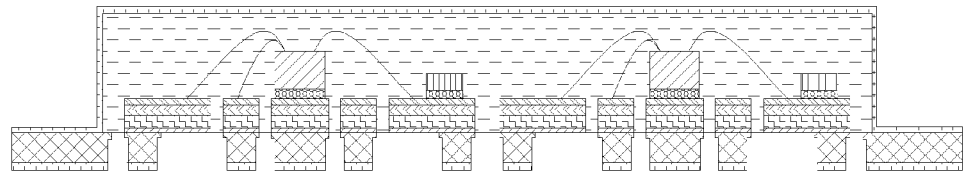
Figure 128:
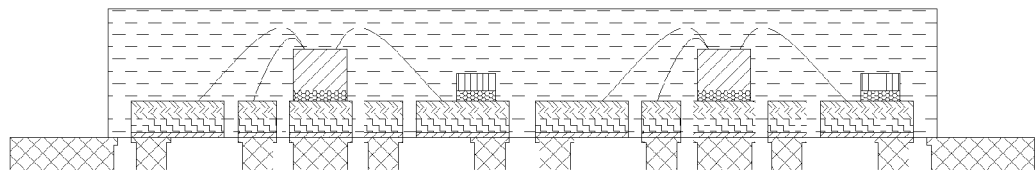
Figure 129:
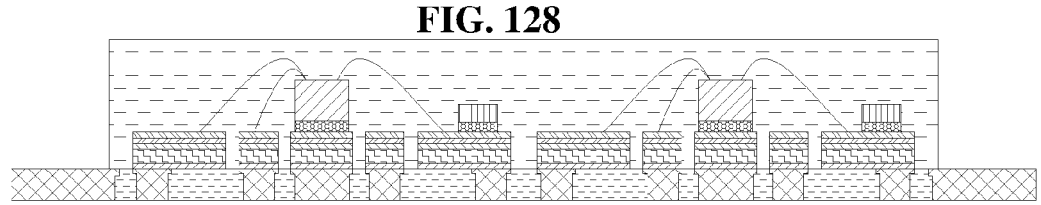
Figure 130:
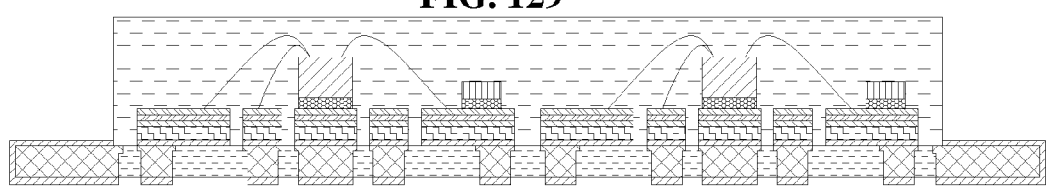
Figure 131:
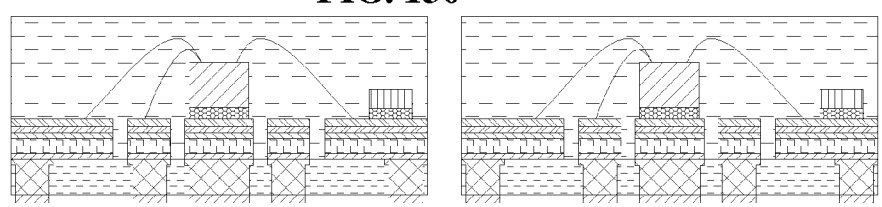

FIG. 115 illustrates another exemplary QFN packaging structure. FIGS. 99-114 illustrate a corresponding exemplary process for manufacturing the QFN packaging structure.

As shown in FIG. 115, the QFN packaging structure in FIG. 115 is similar to the QFN packaging structure in FIG. 82. However, the QFN packaging structure in FIG. 115 also comprises one or more passive device 15 coupled between inner leads 4 using conductive or non-conductive adhesive material 8.

Figure 104:
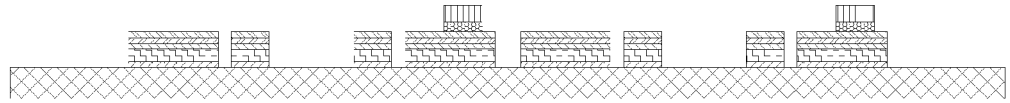
FIG. 104 illustrates another step of the exemplary process for manufacturing the exemplary QFN packaging structure in which one or more passive devices are coupled between the inner leads using a conductive or non-conductive adhesive material.
Figure 105:
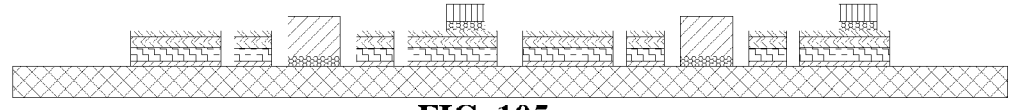
FIG. 105 illustrates another step of the exemplary process for manufacturing the exemplary QFN packaging structure in which a die is attached on a predetermined die area of the metal substrate in a die attaching process.
Figure 106:
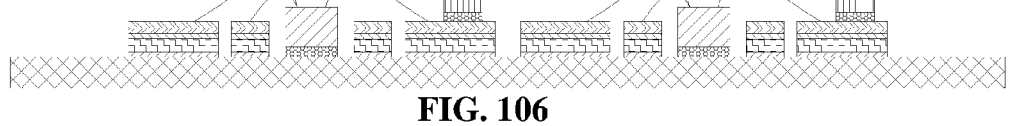
FIG. 106 illustrates another step of the exemplary process for manufacturing the exemplary QFN packaging structure in which the top surface of the die and the top surface of the inner leads are connected with metal wires and the die is also attached to the top surface of the inner electrostatic discharge ring in a wire bonding process.
Figure 107:
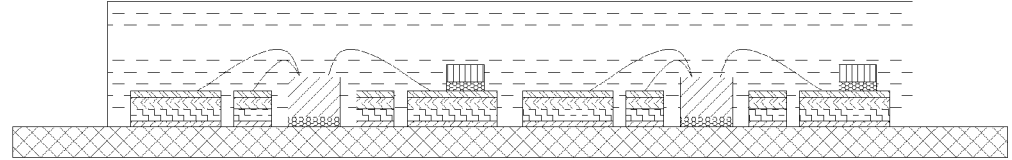
FIG. 107 illustrates another step of the exemplary process for manufacturing the exemplary QFN packaging structure in which the inner leads, the die, and the metal wires are encapsulated using an encapsulation material.
Figure 108:
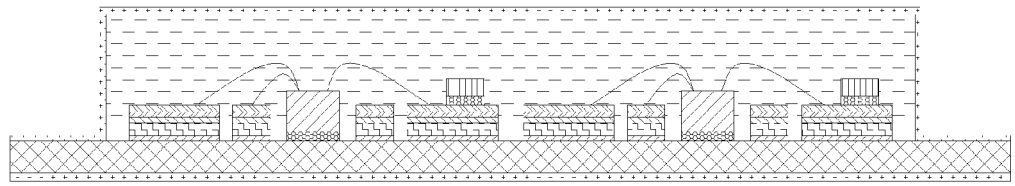
FIG. 108 illustrates another step of the exemplary process for manufacturing the exemplary QFN packaging structure in which a layer of photoresist film is formed on the top surface of the metal substrate and another layer of photoresist film is formed on the back surface of the metal substrate.
Figure 109:
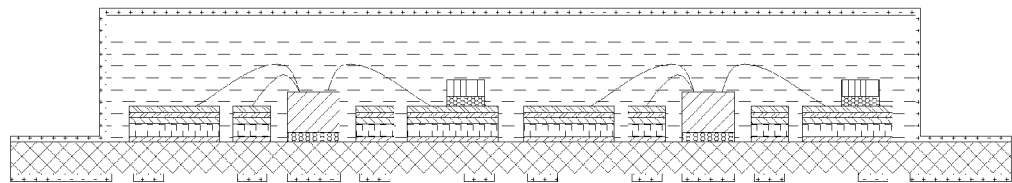
FIG. 109 illustrates another step of the exemplary process for manufacturing the exemplary QFN packaging structure in which exposure, development, and etching are carried out on the photoresist film formed on the back surface of the metal substrate to form an etching pattern in the photoresist film.
Figure 110:
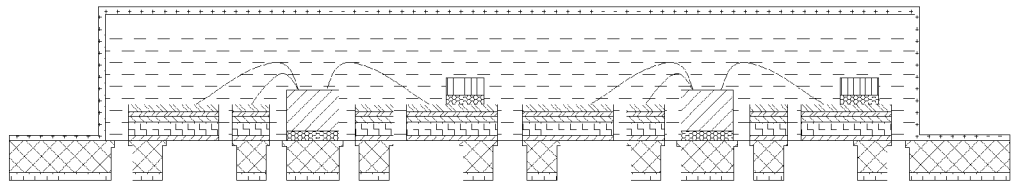
FIG. 110 illustrates another step of the exemplary process for manufacturing the exemplary QFN packaging structure in which an etching process is performed on the areas of the metal substrate exposed by the etching pattern in the photoresist film on the back surface of the metal substrate to form etched areas, an outer die pad, and I/O pads.
Figure 111:
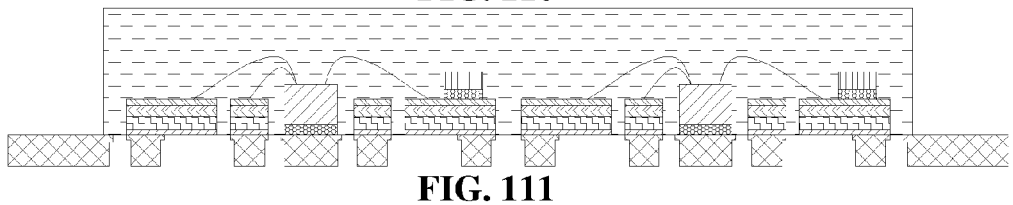
FIG. 111 illustrates another step of the exemplary process for manufacturing the exemplary QFN packaging structure in which the remaining photoresist film on the back surface of the metal substrate is removed to expose the etched areas on the back surface of the metal substrate and the photoresist film on the top surface of the metal substrate is also removed.
Figure 112:
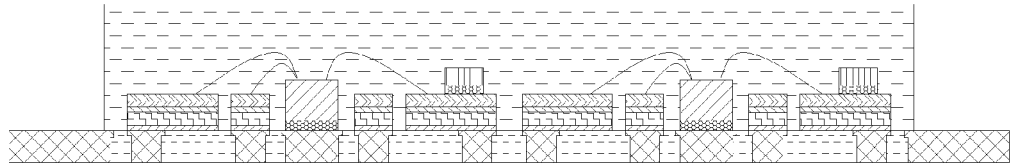
FIG. 112 illustrates another step of the exemplary process for manufacturing the exemplary QFN packaging structure in which the etched areas on the back surface of the metal substrate are filled with a sealant.
Figure 113:
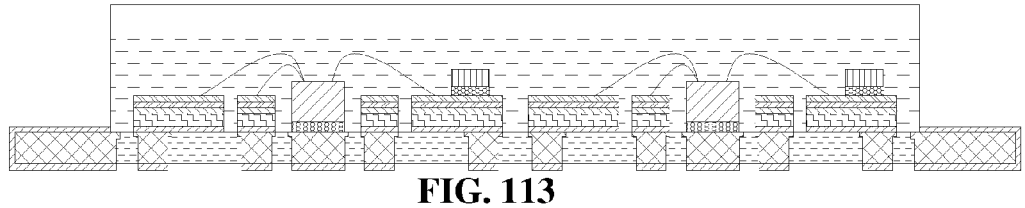
FIG. 113 illustrates another step of the exemplary process for manufacturing the exemplary QFN packaging structure in which a plating process is performed on the bottom surface of the outer die pad and the I/O pads to form a second metal layer.
Figure 114:
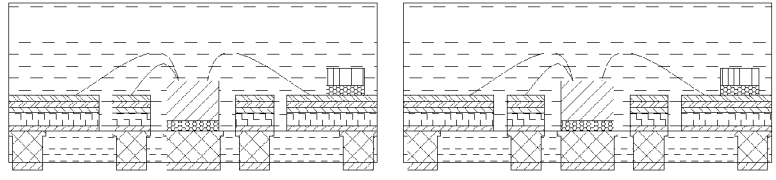
FIG. 114 illustrates another step of the exemplary process for manufacturing the exemplary QFN packaging structure in which the plurality of finished encapsulated components formed on the metal substrate is cut into individual packaged integrated circuits (ICs) or individual QFN packaging structures in a package sawing process.

FIGS. 99-114 show the corresponding process for manufacturing the QFN packaging structure, which is similar to FIGS. 67-81. However, as shown in FIGS. 99-114, the one or more passive device 15 is coupled between inner leads 4 using conductive or non-conductive adhesive material 8, specifically as shown in the newly added FIG. 104. Although FIG. 104 shows that the one or more passive device 15 is coupled between inner leads 4 before the die 5 is attached, the one or more passive device 15 can also be coupled between inner leads 4 after the die 5 is attached or at the same time attaching the die 5 (i.e., during the die attaching process). Thus, a QFN packaging structure with single die pad, single lead ring coupled with passive device, and electrostatic discharge ring may be formed.

FIG. 132 illustrates another exemplary QFN packaging structure. FIGS. 116-131 illustrate a corresponding exemplary process for manufacturing the QFN packaging structure.

As shown in FIG. 132, the QFN packaging structure in FIG. 132 is similar to the QFN packaging structure in FIG. 115. However, the QFN packaging structure in FIG. 132 also comprises one or more inner die pads 3 formed on the top surface of the outer die pad 1. That is, the one or more inner die pads 3 may also be formed by the multi-layer plating process for forming the first metal layer 14. Further, the die 5 is attached at the top surface of the one or more inner die pads 3 via the conductive or non-conductive adhesive material 8.

FIGS. 116-131 show the corresponding process for manufacturing the QFN packaging structure, which is similar to FIGS. 99-114, respectively. However, as shown in FIGS. 116-131, the first metal layer 14 is formed to comprise both the inner die pad 3, the inner leads 4, and the inner electrostatic discharge ring 17 in the multi-layer plating process and the die 5 is attached at the top surface of the inner die pad 3 in the die attaching process. Thus, a QFN packaging structure with outer and inner die pads, single lead ring coupled with passive device, and electrostatic discharge ring may be formed.

FIG. 148 illustrates another exemplary QFN packaging structure. FIGS. 133-147 illustrate a corresponding exemplary process for manufacturing the QFN packaging structure.

As shown in FIG. 148, the QFN packaging structure in FIG. 148 is similar to the QFN packaging structure in FIG. 16. However, the QFN packaging structure in FIG. 148 comprises multiple rings of I/O pads 2. In other words, I/O pads 2 are arranged in a multiple-ring configuration. Further, multiple rings of inner leads 4 may be formed on the top surface of the I/O pads 2. That is, multiple rings of inner leads 4 may also be formed by the multi-layer plating process for forming the first metal layer 14. Because the multiple rings of inner leads 4 are formed by the multi-layer plating process, the lead pitch of inner leads from a same ring and the lead pitch of inner leads from different rings may be significantly reduced.

FIGS. 133-147 show the corresponding process for manufacturing the QFN packaging structure, which is similar to FIGS. 1-15, respectively. However, as shown in FIGS. 133-147, the first metal layer 14 is formed to comprise both the inner die pad 3 and the inner leads 4 arranged in a multiple ring configuration in the multi-layer plating process. Thus, a QFN packaging structure with single die pad and multiple lead rings may be formed.

FIG. 164 illustrates another exemplary QFN packaging structure. FIGS. 149-163 illustrate a corresponding exemplary process for manufacturing the QFN packaging structure.

As shown in FIG. 164, the QFN packaging structure in FIG. 164 is similar to the QFN packaging structure in FIG. 148. However, the QFN packaging structure in FIG. 164 comprises one or more inner die pads 3 formed on the top surface of the outer die pad 1. That is, the one or more inner die pads 3 may also be formed by the multi-layer plating process for forming the first metal layer 14. Further, the die 5 is attached at the top surface of the one or more inner die pads 3 via the conductive or non-conductive adhesive material 8.

FIGS. 149-163 show the corresponding process for manufacturing the QFN packaging structure, which is similar to FIGS. 133-147, respectively. However, as shown in FIGS. 149-163, the first metal layer 14 is formed to comprise both the inner die pad 3 and the inner leads 4 in the multi-layer plating process and the die 5 is attached at the top surface of the inner die pad 3 in the die attaching process. Thus, a QFN packaging structure with outer and inner die pads and multiple lead rings may be formed.

FIG. 181 illustrates another exemplary QFN packaging structure. FIGS. 165-180 illustrate a corresponding exemplary process for manufacturing the QFN packaging structure.

As shown in FIG. 181, the QFN packaging structure in FIG. 181 is similar to the QFN packaging structure in FIG. 148. However, the QFN packaging structure in FIG. 181 comprises one or more passive device 15 coupled between inner leads 4 using conductive or non-conductive adhesive material 8.

FIGS. 165-180 show the corresponding process for manufacturing the QFN packaging structure, which is similar to FIGS. 133-147. However, as shown in FIGS. 165-180, the one or more passive device 15 is coupled between inner leads 4 using conductive or non-conductive adhesive material 8, specifically as shown in the newly added FIG. 170. Although FIG. 170 shows that the one or more passive device 15 is coupled between inner leads 4 before the die 5 is attached, the one or more passive device 15 can also be coupled between inner leads 4 after the die 5 is attached or at the same time attaching the die 5 (i.e., during the die attaching process).

Thus, a QFN packaging structure with single die pad and multiple lead rings coupled with passive device may be formed.

FIG. 198 illustrates another exemplary QFN packaging structure. FIGS. 182-197 illustrate a corresponding exemplary process for manufacturing the QFN packaging structure.

As shown in FIG. 198, the QFN packaging structure in FIG. 198 is similar to the QFN packaging structure in FIG. 181. However, the QFN packaging structure in FIG. 198 comprises one or more inner die pads 3 formed on the top surface of the outer die pad 1. That is, the one or more inner die pads 3 is also be formed by the multi-layer plating process for forming the first metal layer 14. Further, the die 5 is attached at the top surface of the one or more inner die pads 3 via the conductive or non-conductive adhesive material 8.

FIGS. 182-197 show the corresponding process for manufacturing the QFN packaging structure, which is similar to FIGS. 165-180, respectively. However, as shown in FIGS. 182-197, the first metal layer 14 is formed to comprise both the inner die pad 3 and the inner leads 4 in the multi-layer plating process and the die 5 is attached at the top surface of the inner die pad 3 in the die attaching process. Thus, a QFN packaging structure with outer and inner die pads and multiple lead rings coupled with passive device may be formed.

FIG. 214 illustrates another exemplary QFN packaging structure. FIGS. 199-213 illustrate a corresponding exemplary process for manufacturing the QFN packaging structure.

As shown in FIG. 214, the QFN packaging structure in FIG. 214 is similar to the QFN packaging structure in FIG. 148. However, the QFN packaging structure in FIG. 214 comprises an outer electrostatic discharge ring 16 arranged between the outer die pad 1 and I/O pads 2. Further, an inner electrostatic discharge ring 17 is formed on the top surface of the outer electrostatic discharge ring 16. That is, the inner electrostatic discharge ring 17 may also be formed by the multi-layer plating process for forming the first metal layer 14. The inner electrostatic discharge ring 17 may also be arranged between the inner die pad 3 and inner leads 4. Further, the top surface of the die 5 is connected to the top surface of the inner electrostatic discharge ring 17 by the metal wire 6 such that the die 5 may be protected from the static by the internal and outer electrostatic discharge rings 16 and 17. Thus, a QFN packaging structure with single die pad, multiple lead rings, and electrostatic discharge ring may be formed.

FIGS. 199-213 show the corresponding process for manufacturing the QFN packaging structure, which is similar to FIGS. 133-147, respectively. However, as shown in FIGS. 199-213, the first metal layer 14 is formed to comprise both the inner leads 4 and the inner electrostatic discharge ring 17 in the multi-layer plating process and the die 5 is also attached at the top surface of the inner electrostatic discharge ring 17 in the wire bonding process. Thus, a QFN packaging structure with single die pad, multiple lead rings, and electrostatic discharge ring may be formed.

FIG. 230 illustrates another exemplary QFN packaging structure. FIGS. 215-229 illustrate a corresponding exemplary process for manufacturing the QFN packaging structure.

As shown in FIG. 230, the QFN packaging structure in FIG. 230 is similar to the QFN packaging structure in FIG. 214. However, the QFN packaging structure in FIG. 230 comprises one or more inner die pads 3 formed on the top surface of the outer die pad 1. That is, the one or more inner die pads 3 may also be formed by the multi-layer plating process for forming the first metal layer 14. Further, the die 5 is attached at the top surface of the one or more inner die pads 3 via the conductive or non-conductive adhesive material 8.

FIGS. 215-229 show the corresponding process for manufacturing the QFN packaging structure, which is similar to FIGS. 199-213, respectively. However, as shown in FIGS. 215-229, the first metal layer 14 is formed to comprise both the inner die pad 3, the inner leads 4, and electrostatic discharge ring 17 in the multi-layer plating process and the die 5 is attached at the top surface of the inner die pad 3 in the die attaching process. Thus, a QFN packaging structure with outer and inner die pads, multiple lead rings, and electrostatic discharge ring may be formed.

FIG. 247 illustrates another exemplary QFN packaging structure. FIGS. 231-246 illustrate a corresponding exemplary process for manufacturing the QFN packaging structure.

As shown in FIG. 247, the QFN packaging structure in FIG. 247 is similar to the QFN packaging structure in FIG. 214. However, the QFN packaging structure in FIG. 247 comprises one or more passive device 15 coupled between inner leads 4 using conductive or non-conductive adhesive material 8.

FIGS. 231-246 show the corresponding process for manufacturing the QFN packaging structure, which is similar to FIGS. 199-213. However, as shown in FIGS. 231-246, the one or more passive device 15 is coupled between inner leads 4 using conductive or non-conductive adhesive material 8, specifically as shown in the newly added FIG. 236. Although FIG. 236 shows that the one or more passive device 15 is coupled between inner leads 4 before the die 5 is attached, the one or more passive device 15 can also be coupled between inner leads 4 after the die 5 is attached or at the same time attaching the die 5 (i.e., during the die attaching process). Thus, a QFN packaging structure with single die pad, multiple lead rings coupled with passive device, and electrostatic discharge ring may be formed.

FIG. 264 illustrates another exemplary QFN packaging structure. FIGS. 248-263 illustrate a corresponding exemplary process for manufacturing the QFN packaging structure.

As shown in FIG. 264, the QFN packaging structure in FIG. 264 is similar to the QFN packaging structure in FIG. 247. However, the QFN packaging structure in FIG. 264 comprises one or more inner die pads 3 formed on the top surface of the outer die pad 1. That is, the one or more inner die pads 3 may also be formed by the multi-layer plating process for forming the first metal layer 14. Further, the die 5 is attached at the top surface of the one or more inner die pads 3 via the conductive or non-conductive adhesive material 8.

FIGS. 248-263 show the corresponding process for manufacturing the QFN packaging structure, which is similar to FIGS. 231-246, respectively. However, as shown in FIGS. 248-263, the first metal layer 14 is formed to comprise both the inner die pad 3, the inner leads 4, and inner discharge ring 17 in the multi-layer plating process and the die 5 is attached at the top surface of the inner die pad 3 in the die attaching process. Thus, a QFN packaging structure with outer and inner die pads, multiple lead rings coupled with passive device, and electrostatic discharge ring may be formed.

FIG. 280 illustrates another exemplary QFN packaging structure. FIGS. 265-279 illustrate a corresponding exemplary process for manufacturing the QFN packaging structure.

As shown in FIG. 280, the QFN packaging structure in FIG. 280 is similar to the QFN packaging structure in FIG. 16. However, the QFN packaging structure in FIG. 280 comprises a plurality of outer die pads 1 and a plurality of dies 5. Each of the plurality of dies 5 is attached on the top surface of a corresponding outer die pad 1 by conductive or non-conductive adhesive material 8. For example, a second outer die pad 1 is arranged in a side-by-side configuration with respect to the first or the original outer die pad 1, and a second die is attached on the top surface of the corresponding second outer die pad 1. Further, the top surface of each die 5 may be connected by metal wires 6.

FIGS. 265-279 show the corresponding process for manufacturing the QFN packaging structure, which is similar to FIGS. 1-15, respectively. However, as shown in FIGS. 265-279, multiple outer die pads 1 are formed and each corresponds to a die 5, and the second metal layer 9 is formed on back surface of multiple outer die pads 1 and the inner leads 4 in the plating process. Further, the multiple dies 5 are attached at the top surface of the outer die pads 1 in the die attaching process and each die 5 is wired to the inner leads surrounding the three sides of the each die 5. Thus, a QFN packaging structure with multiple die pads and single lead ring may be formed.

FIG. 296 illustrates another exemplary QFN packaging structure. FIGS. 281-295 illustrate a corresponding exemplary process for manufacturing the QFN packaging structure.

As shown in FIG. 296, the QFN packaging structure in FIG. 296 is similar to the QFN packaging structure in FIG. 280. However, the QFN packaging structure in FIG. 296 comprises a plurality of inner die pads 3 formed on the top surface of the plurality of outer die pads 1. That is, the plurality of inner die pads 3 may also be formed by the multi-layer plating process for forming the first metal layer 14. Further, the plurality of dies 5 are attached at the top surface of the corresponding plurality of inner die pads 3 via the conductive or non-conductive adhesive material 8.

FIGS. 281-295 show the corresponding process for manufacturing the QFN packaging structure, which is similar to FIGS. 265-279, respectively. However, as shown in FIGS. 281-295, the first metal layer 14 is formed to comprise both the multiple inner die pads 3 and the inner leads 4 in the multi-layer plating process and the multiple dies 5 are attached at the top surface of the corresponding inner die pads 3 in the die attaching process. Thus, a QFN packaging structure with multiple outer and inner die pads and single lead ring may be formed.

FIG. 313 illustrates another exemplary QFN packaging structure. FIGS. 297-312 illustrate a corresponding exemplary process for manufacturing the QFN packaging structure.

As shown in FIG. 313, the QFN packaging structure in FIG. 313 is similar to the QFN packaging structure in FIG. 49. However, the QFN packaging structure in FIG. 313 comprises a plurality of outer die pads 1 and a plurality of dies 5. Each of the plurality of dies 5 is attached on the top surface of a corresponding outer die pad 1 by conductive or non-conductive adhesive material 8. Further, the top surface of each die 5 may be connected by metal wires 6. Other configurations may also be used.

FIGS. 297-312 show the corresponding process for manufacturing the QFN packaging structure, which is similar to FIGS. 33-48, respectively. However, as shown in FIGS. 297-312, multiple outer die pads 1 are formed and each corresponds to a die 5, and the second metal layer 9 is formed on back surface of multiple outer die pads 1 and the inner leads 4 in the plating process. Further, the multiple dies 5 are attached at the top surface of the outer die pads 1 in the die attaching process and each die 5 is wired to the inner leads surround the three sides of the each die 5. Thus, a QFN packaging structure with multiple die pads and single lead ring coupled with passive device may be formed.

FIG. 330 illustrates another exemplary QFN packaging structure. FIGS. 314-329 illustrate a corresponding exemplary process for manufacturing the QFN packaging structure.

As shown in FIG. 330, the QFN packaging structure in FIG. 330 is similar to the QFN packaging structure in FIG. 313. However, the QFN packaging structure in FIG. 330 comprises a plurality of inner die pads 3 formed on the top surface of the plurality of outer die pads 1. That is, the plurality of inner die pads 3 may also be formed by the multi-layer plating process for forming the first metal layer 14. Further, the plurality of dies 5 are attached at the top surface of the corresponding plurality of inner die pads 3 via the conductive or non-conductive adhesive material 8.

FIGS. 314-329 show the corresponding process for manufacturing the QFN packaging structure, which is similar to FIGS. 297-312, respectively. However, as shown in FIGS. 314-329, the first metal layer 14 is formed to comprise both the multiple inner die pads 3 and the inner leads 4 in the multi-layer plating process and the multiple dies 5 are attached at the top surface of the corresponding inner die pads 3 in the die attaching process. Thus, a QFN packaging structure with multiple outer and inner die pads and single lead ring coupled with passive device may be formed.

FIG. 346 illustrates another exemplary QFN packaging structure. FIGS. 331-345 illustrate a corresponding exemplary process for manufacturing the QFN packaging structure.

As shown in FIG. 346, the QFN packaging structure in FIG. 346 is similar to the QFN packaging structure in FIG. 82. However, the QFN packaging structure in FIG. 346 comprises a plurality of outer die pads 1 and a plurality of dies 5. Each of the plurality of dies 5 is attached on the top surface of a corresponding outer die pad 1 by conductive or non-conductive adhesive material 8. Further, the top surface of each die 5 may be connected by metal wires 6. Other configurations may also be used.

FIGS. 331-345 show the corresponding process for manufacturing the QFN packaging structure, which is similar to FIGS. 67-81, respectively. However, as shown in FIGS. 331-345, multiple outer die pads 1 are formed and each corresponds to a die 5, and the second metal layer 9 is formed on back surface of multiple outer die pads 1 and the inner leads 4 in the plating process. Further, the multiple dies 5 are attached at the top surface of the outer die pads 1 in the die attaching process and each die 5 is wired to the inner leads surround the three sides of the each die 5. Thus, a QFN packaging structure with multiple die pads, single lead ring, and electrostatic discharge ring may be formed.

FIG. 362 illustrates another exemplary QFN packaging structure. FIGS. 347-361 illustrate a corresponding exemplary process for manufacturing the QFN packaging structure.

As shown in FIG. 362, the QFN packaging structure in FIG. 362 is similar to the QFN packaging structure in FIG. 346. However, the QFN packaging structure in FIG. 362 comprises a plurality of inner die pads 3 formed on the top surface of the plurality of outer die pads 1. That is, the plurality of inner die pads 3 may also be formed by the multi-layer plating process for forming the first metal layer 14. Further, the plurality of dies 5 are attached at the top surface of the corresponding plurality of inner die pads 3 via the conductive or non-conductive adhesive material 8.

FIGS. 347-361 show the corresponding process for manufacturing the QFN packaging structure, which is similar to FIGS. 331-345, respectively. However, as shown in FIGS. 347-361, the first metal layer 14 is formed to comprise both the multiple inner die pads 3 and the inner leads 4 in the multi-layer plating process and the multiple dies 5 are attached at the top surface of the corresponding inner die pads 3 in the die attaching process. Thus, a QFN packaging structure with multiple outer and inner die pads, single lead ring, and electrostatic discharge ring may be formed.

FIG. 379 illustrates another exemplary QFN packaging structure. FIGS. 363-378 illustrate a corresponding exemplary process for manufacturing the QFN packaging structure.

As shown in FIG. 379, the QFN packaging structure in FIG. 379 is similar to the QFN packaging structure in FIG. 115. However, the QFN packaging structure in FIG. 379 comprises a plurality of outer die pads 1 and a plurality of dies 5. Each of the plurality of dies 5 is attached on the top surface of a corresponding outer die pad 1 by conductive or non-conductive adhesive material 8. Further, the top surface of each die 5 may be connected by metal wires 6. Other configurations may also be used.

FIGS. 363-378 show the corresponding process for manufacturing the QFN packaging structure, which is similar to FIGS. 99-114, respectively. However, as shown in FIGS. 363-378, multiple outer die pads 1 are formed and each corresponds to a die 5, and the second metal layer 9 is formed on back surface of multiple outer die pads 1 and the inner leads 4 in the plating process. Further, the multiple dies 5 are attached at the top surface of the outer die pads 1 in the die attaching process and each die 5 is wired to the inner leads surround the three sides of the each die 5. Thus, a QFN packaging structure with multiple die pads, single lead ring coupled with passive device, and electrostatic discharge ring may be formed.

FIG. 396 illustrates another exemplary QFN packaging structure. FIGS. 380-395 illustrate a corresponding exemplary process for manufacturing the QFN packaging structure.

As shown in FIG. 396, the QFN packaging structure in FIG. 396 is similar to the QFN packaging structure in FIG. 379. However, the QFN packaging structure in FIG. 40 comprises a plurality of inner die pads 3 formed on the top surface of the plurality of outer die pads 1. That is, the plurality of inner die pads 3 may also be formed by the multi-layer plating process for forming the first metal layer 14. Further, the plurality of dies 5 are attached at the top surface of the corresponding plurality of inner die pads 3 via the conductive or non-conductive adhesive material 8.

FIGS. 380-395 show the corresponding process for manufacturing the QFN packaging structure, which is similar to FIGS. 363-378, respectively. However, as shown in FIGS. 380-395, the first metal layer 14 is formed to comprise both the multiple inner die pads 3 and the inner leads 4 in the multi-layer plating process and the multiple dies 5 are attached at the top surface of the corresponding inner die pads 3 in the die attaching process. Thus, a QFN packaging structure with multiple outer and inner die pads, single lead ring coupled with passive device, and electrostatic discharge ring may be formed.

FIG. 412 illustrates another exemplary QFN packaging structure. FIGS. 397-411 illustrate a corresponding exemplary process for manufacturing the QFN packaging structure.

As shown in FIG. 412, the QFN packaging structure in FIG. 412 is similar to the QFN packaging structure in FIG. 280. However, the QFN packaging structure in FIG. 412 comprises multiple rings of I/O pads 2. In other words, I/O pads 2 are arranged in a multiple-ring configuration. Further, multiple rings of inner leads 4 may be formed on the top surface of the I/O pads 2. That is, multiple rings of inner leads 4 may also be formed by the multi-layer plating process for forming the first metal layer 14. Because the multiple rings of inner leads 4 are formed by the multi-layer plating process, the lead pitch of inner leads from a same ring and the lead pitch of inner leads from different rings may be significantly reduced.

FIGS. 397-411 show the corresponding process for manufacturing the QFN packaging structure, which is similar to FIGS. 265-279, respectively. However, as shown in FIGS. 397-411, the first metal layer 14 is formed to comprise both the inner die pad 3 and the inner leads 4 arranged in a multiple ring configuration in the multi-layer plating process. Thus, a QFN packaging structure with multiple die pads and multiple lead rings may be formed.

FIG. 428 illustrates another exemplary QFN packaging structure. FIGS. 413-427 illustrate a corresponding exemplary process for manufacturing the QFN packaging structure.

As shown in FIG. 428, the QFN packaging structure in FIG. 428 is similar to the QFN packaging structure in FIG. 412. However, the QFN packaging structure in FIG. 428 comprises a plurality of inner die pads 3 formed on the top surface of the plurality of outer die pads 1. That is, the plurality of inner die pads 3 may also be formed by the multi-layer plating process for forming the first metal layer 14. Further, the plurality of dies 5 are attached at the top surface of the corresponding plurality of inner die pads 3 via the conductive or non-conductive adhesive material 8.

FIGS. 413-427 show the corresponding process for manufacturing the QFN packaging structure, which is similar to FIGS. 397-411, respectively. However, as shown in FIGS. 413-427, the first metal layer 14 is formed to comprise both the multiple inner die pads 3 and the inner leads 4 in the multi-layer plating process and the multiple dies 5 are attached at the top surface of the corresponding inner die pads 3 in the die attaching process. Thus, a QFN packaging structure with multiple outer and inner die pads and multiple lead rings may be formed.

FIG. 445 illustrates another exemplary QFN packaging structure. FIGS. 429-444 illustrate a corresponding exemplary process for manufacturing the QFN packaging structure.

As shown in FIG. 445, the QFN packaging structure in FIG. 445 is similar to the QFN packaging structure in FIG. 313. However, the QFN packaging structure in FIG. 445 comprises multiple rings of I/O pads 2. In other words, I/O pads 2 are arranged in a multiple-ring configuration. Further, multiple rings of inner leads 4 may be formed on the top surface of the I/O pads 2. That is, multiple rings of inner leads 4 may also be formed by the multi-layer plating process for forming the first metal layer 14. Because the multiple rings of inner leads 4 are formed by the multi-layer plating process, the lead pitch of inner leads from a same ring and the lead pitch of inner leads from different rings may be significantly reduced.

FIGS. 429-444 show the corresponding process for manufacturing the QFN packaging structure, which is similar to FIGS. 297-312, respectively. However, as shown in FIGS. 429-444, the first metal layer 14 is formed to comprise both the inner die pad 3 and the inner leads 4 arranged in a multiple ring configuration in the multi-layer plating process. Each die 5 may be surrounded by the inner leads 4 from three outer sides. Thus, a QFN packaging structure with multiple die pads and multiple lead rings coupled with passive device may be formed.

FIG. 462 illustrates another exemplary QFN packaging structure. FIGS. 446-461 illustrate a corresponding exemplary process for manufacturing the QFN packaging structure.

As shown in FIG. 462, the QFN packaging structure in FIG. 462 is similar to the QFN packaging structure in FIG. 445. However, the QFN packaging structure in FIG. 462 comprises a plurality of inner die pads 3 formed on the top surface of the plurality of outer die pads 1. That is, the plurality of inner die pads 3 may also be formed by the multi-layer plating process for forming the first metal layer 14. Further, the plurality of dies 5 are attached at the top surface of the corresponding plurality of inner die pads 3 via the conductive or non-conductive adhesive material 8.

FIGS. 446-461 show the corresponding process for manufacturing the QFN packaging structure, which is similar to FIGS. 429-444, respectively. However, as shown in FIGS. 446-461, the first metal layer 14 is formed to comprise both the multiple inner die pads 3 and the inner leads 4 in the multi-layer plating process and the multiple dies 5 are attached at the top surface of the corresponding inner die pads 3 in the die attaching process. Thus, a QFN packaging structure with multiple outer and inner die pads and multiple lead rings coupled with passive device may be formed.

FIG. 478 illustrates another exemplary QFN packaging structure. FIGS. 463-477 illustrate a corresponding exemplary process for manufacturing the QFN packaging structure.

As shown in FIG. 478, the QFN packaging structure in FIG. 478 is similar to the QFN packaging structure in FIG. 346. However, the QFN packaging structure in FIG. 478 comprises multiple rings of I/O pads 2. In other words, I/O pads 2 are arranged in a multiple-ring configuration. Further, multiple rings of inner leads 4 may be formed on the top surface of the I/O pads 2. That is, multiple rings of inner leads 4 may also be formed by the multi-layer plating process for forming the first metal layer 14. Because the multiple rings of inner leads 4 are formed by the multi-layer plating process, the lead pitch of inner leads from a same ring and the lead pitch of inner leads from different rings may be significantly reduced.

FIGS. 463-477 show the corresponding process for manufacturing the QFN packaging structure, which is similar to FIGS. 331-345, respectively. However, as shown in FIGS. 463-477, the first metal layer 14 is formed to comprise both the inner die pad 3 and the inner leads 4 arranged in a multiple ring configuration in the multi-layer plating process. Thus, a QFN packaging structure with multiple die pads, multiple lead rings, and electrostatic discharge ring may be formed.

FIG. 494 illustrates another exemplary QFN packaging structure. FIGS. 479-493 illustrate a corresponding exemplary process for manufacturing the QFN packaging structure.

As shown in FIG. 494, the QFN packaging structure in FIG. 494 is similar to the QFN packaging structure in FIG. 478. However, the QFN packaging structure in FIG. 494 comprises a plurality of inner die pads 3 formed on the top surface of the plurality of outer die pads 1. That is, the plurality of inner die pads 3 may also be formed by the multi-layer plating process for forming the first metal layer 14. Further, the plurality of dies 5 are attached at the top surface of the corresponding plurality of inner die pads 3 via the conductive or non-conductive adhesive material 8.

FIGS. 479-493 show the corresponding process for manufacturing the QFN packaging structure, which is similar to FIGS. 463-477, respectively. However, as shown in FIGS. 479-493, the first metal layer 14 is formed to comprise both the multiple inner die pads 3 and the inner leads 4 in the multi-layer plating process and the multiple dies 5 are attached at the top surface of the corresponding inner die pads 3 in the die attaching process. Thus, a QFN packaging structure with multiple outer and inner die pads, multiple lead rings, and electrostatic discharge ring may be formed.

FIG. 511 illustrates another exemplary QFN packaging structure. FIGS. 495-510 illustrate a corresponding exemplary process for manufacturing the QFN packaging structure.

As shown in FIG. 511, the QFN packaging structure in FIG. 511 is similar to the QFN packaging structure in FIG. 379. However, the QFN packaging structure in FIG. 511 comprises multiple rings of I/O pads 2. In other words, I/O pads 2 are arranged in a multiple-ring configuration. Further, multiple rings of inner leads 4 may be formed on the top surface of the I/O pads 2. That is, multiple rings of inner leads 4 may also be formed by the multi-layer plating process for forming the first metal layer 14. Because the multiple rings of inner leads 4 are formed by the multi-layer plating process, the lead pitch of inner leads from a same ring and the lead pitch of inner leads from different rings may be significantly reduced.

FIGS. 495-510 show the corresponding process for manufacturing the QFN packaging structure, which is similar to FIGS. 363-378, respectively. However, as shown in FIGS. 495-510, the first metal layer 14 is formed to comprise both the inner die pad 3 and the inner leads 4 arranged in a multiple ring configuration in the multi-layer plating process. Thus, a QFN packaging structure with multiple die pads, multiple lead rings coupled with passive device, and electrostatic discharge ring may be formed.

FIG. 528 illustrates another exemplary QFN packaging structure. FIGS. 512-527 illustrate a corresponding exemplary process for manufacturing the QFN packaging structure.

As shown in FIG. 528, the QFN packaging structure in FIG. 528 is similar to the QFN packaging structure in FIG. 511. However, the QFN packaging structure in FIG. 528 comprises a plurality of inner die pads 3 formed on the top surface of the plurality of outer die pads 1. That is, the plurality of inner die pads 3 may also be formed by the multi-layer plating process for forming the first metal layer 14. The inner electrostatic discharge ring 17 may also be arranged between the inner die pad 3 and inner leads 4. Further, the plurality of dies 5 are attached at the top surface of the corresponding plurality of inner die pads 3 via the conductive or non-conductive adhesive material 8.

FIGS. 512-527 show the corresponding process for manufacturing the QFN packaging structure, which is similar to FIGS. 495-511, respectively. However, as shown in FIGS. 512-527, the first metal layer 14 is formed to comprise both the multiple inner die pads 3 and the inner leads 4 in the multi-layer plating process and the multiple dies 5 are attached at the top surface of the corresponding inner die pads 3 in the die attaching process. Thus, a QFN packaging structure with multiple outer and inner die pads, multiple lead rings coupled with passive device, and electrostatic discharge ring may be formed.

By using the disclosed methods, processes, and devices, various advantageous applications may be implemented. For example, using the disclosed processes and devices, separate etching processes on both sides of the metal substrate can be avoided, and the process cost, time, personnel, power, and materials can be reduced. At the same time, the amount of potential environment-harmful substances generated in the etching processes can also be reduced. Further, because the use of the thin-line plating method on the top surface of the substrate, the minimum width of the inner leads is approximately 25 μm, and the lead pitch of the inner leads may be as small as approximately 25 μm. Thus, the lead density in the lead frame can be significantly increased.

By using the disclosed processes and devices, only lead frame is involved in the die attaching process and wire bonding process. Thus, the lead frame may be tolerant substantially high temperature, such as in a range of approximately 380-420 Celsius degrees, without warping.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:

1. A method for manufacturing a quad flat no-lead (QFN) packaging structure, the method comprising:
   a) providing a metal substrate;
   b) forming a first photoresist film on a top surface of the metal substrate;
   c) forming a plating pattern in the first photoresist film using photolithography;
   d) forming a first metal layer containing a plurality of inner leads by a multi-layer electrical plating process using the plating pattern in the first photoresist film as a mask, such that a lead pitch of the plurality of inner leads is significantly reduced;
   e) attaching a die in a predetermined region on the top surface of the metal substrate;
   f) connecting the die and the plurality of inner leads using metal wires by a wire bonding process;
   g) sealing the die, the plurality of inner leads, and the metal wires with a molding compound;
   h) etching the metal substrate from a back surface of the metal substrate to form an outer die pad, corresponding to the predetermined area mounted with the die, and a plurality of I/O pads corresponding to the plurality of inner leads; and
   i) forming a second metal layer on a back surface of the plurality of I/O pads and the outer die pad.

2. The method of claim 1, wherein forming the first photoresist film further comprises: forming a second photoresist film on the back surface of the metal substrate to protect the metal substrate during the multi-layer electrical plating process.

3. The method of claim 1, wherein forming the first metal layer further comprises: removing the first photoresist film and the second photoresist film.

4. The method of claim 1, wherein etching the metal substrate further comprises:
   forming a third photoresist film on the back surface of the metal substrate;
   forming an etching pattern in the third photoresist film using photolithography; and
   etching the metal substrate using the etching pattern in the third photoresist film on the back surface of the metal substrate.

5. The method of claim 4, wherein forming the third photoresist further comprises: forming a fourth photoresist film on top of the metal substrate comprising an encapsulation material to protect the metal substrate from the etching process.

6. The method of claim 5, wherein etching the metal substrate further comprises: removing the third photoresist film and the fourth photoresist film after the metal substrate is etched.

7. The method of claim 1, further comprising: filling sealant in peripheral areas of the outer die pad and the I/O pads, areas between the outer die pad and the I/O pads, and areas between the I/O pads at the back surface of the metal substrate.

8. The method of claim 1, wherein attaching the die further comprises: attaching the die in the predetermined region on the top surface of the metal substrate using an adhesive material and corresponding to the outer die pad.

9. The method of claim 1, further comprising: forming one or more inner die pads on the top surface of the outer die pad by the multi-layer electrical plating process, wherein the die is attached to the one or more inner die pads by an adhesive material.

10. The method of claim 1, wherein: the plurality of I/O pads is arranged in a single-ring configuration; and the plurality of inner leads is also arranged in a corresponding single-ring configuration.

11. The method of claim 1, wherein: the plurality I/O pads are arranged in a multi-ring configuration; and the plurality of inner leads is also arranged in a corresponding multi-ring configuration.

12. The method of claim 1, further comprising: one or more passive devices coupled between the plurality of inner leads by an adhesive material.

13. The method of claim 1, further comprising:
   forming an outer electrostatic discharge ring on the metal substrate between the outer die pad and the plurality of I/O pads;
   forming an inner electrostatic discharge ring at a top surface of the outer electrostatic discharge ring; and
   connecting the inner electrostatic discharge ring and the die.

* * * * *